US012581791B2

(12) United States Patent
Park et al.

(10) Patent No.: US 12,581,791 B2
(45) Date of Patent: Mar. 17, 2026

(54) ORGANIC LIGHT EMITTING DIODE AND ORGANIC LIGHT EMITTING DEVICE HAVING THEREOF

(71) Applicant: LG DISPLAY CO., LTD., Seoul (KR)

(72) Inventors: Han-Sol Park, Paju-si (KR); Yoo-Jeong Jeong, Paju-si (KR); Ku-Sun Choung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 839 days.

(21) Appl. No.: 17/957,313

(22) Filed: Sep. 30, 2022

(65) Prior Publication Data

US 2023/0171979 A1 Jun. 1, 2023

(30) Foreign Application Priority Data

Nov. 26, 2021 (KR) ........................ 10-2021-0165654

(51) Int. Cl.

| | |
|---|---|
| ***H01L 51/54*** | (2006.01) |
| ***H10K 50/12*** | (2023.01) |
| ***H10K 50/13*** | (2023.01) |
| ***H10K 85/30*** | (2023.01) |
| ***H10K 85/60*** | (2023.01) |
| *H10K 50/11* | (2023.01) |
| *H10K 50/19* | (2023.01) |

(52) U.S. Cl.

CPC ............. *H10K 50/12* (2023.02); *H10K 50/13* (2023.02); *H10K 85/342* (2023.02); *H10K 85/615* (2023.02); *H10K 85/622* (2023.02); *H10K 85/631* (2023.02); *H10K 85/633* (2023.02); *H10K 85/654* (2023.02); *H10K 85/6572* (2023.02); *H10K 85/6574* (2023.02); *H10K 85/6576* (2023.02); *H10K 50/11* (2023.02); *H10K 50/19* (2023.02)

(58) Field of Classification Search

None

See application file for complete search history.

(56) References Cited

U.S. PATENT DOCUMENTS

2022/0069237 A1 * 3/2022 Kwon .................. H10K 85/342

* cited by examiner

*Primary Examiner* — Andrew K Bohaty

(74) *Attorney, Agent, or Firm* — Morgan, Lewis & Bockius LLP

(57) ABSTRACT

The present disclosure relates to an organic light emitting diode (OLED) in which at least one emitting material layer includes a dopant having the following structure of Formula 1 and a (hetero) aryl-amine-based material having with a fluorenyl moiety and/or an azine-based material, and an organic light emitting device including the OLED. The OLED and the organic light emitting device including the host and the dopant can improve their luminous efficiency and luminous lifespan.

$$Ir(L_A)_m(L_B)_n \quad \text{[Formula 1]}$$

25 Claims, 6 Drawing Sheets

ORGANIC LIGHT EMITTING DIODE AND ORGANIC LIGHT EMITTING DEVICE HAVING THEREOF

CROSS-REFERENCE TO RELATED APPLICATIONS

This application claims the priority benefit under 35 U.S.C. § 119(a) of Korean Patent Application No. 10-2021-0165654, filed in the Republic of Korea on Nov. 26, 2021, which is expressly incorporated hereby in its entirety into the present application.

BACKGROUND

Technical Field

The present disclosure relates to an organic light emitting diode, and more specifically, to an organic light emitting diode having improved luminous efficiency and luminous lifespan and an organic light emitting device including thereof.

Discussion of the Related Art

An organic light emitting diode (OLED) among a flat display device used widely has come into the spotlight as a display device replacing rapidly a liquid crystal display device (LCD). The OLED can be formed as a thin organic film less than 2000 Å and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

Since fluorescent material uses only singlet exciton energy in the luminous process, the related art fluorescent material shows low luminous efficiency. On the contrary, phosphorescent material can show high luminous efficiency since it uses triplet exciton energy as well as singlet exciton energy in the luminous process. However, metal complex, representative phosphorescent material, has short luminous lifespan for commercial use. Therefore, there remains a need to develop a luminous compound or an organic light emitting diode that can enhance luminous efficiency and luminous lifespan.

SUMMARY

Accordingly, embodiments of the present disclosure are directed to an organic light emitting diode and an organic light emitting device that substantially obviate one or more of the problems due to the limitations and disadvantages of the related art.

An aspect of the present disclosure is to provide an organic light emitting diode with improved luminous efficiency and luminous lifespan and an organic light emitting device including thereof.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, in one aspect, the present disclosure provides an organic light emitting diode that includes a first electrode; a second electrode facing the first electrode; and an emissive layer disposed between the first and second electrodes and including at least one emitting material layer, wherein the at least one emitting material layer includes a host and a dopant, wherein the dopant includes an organic metal compound having the following structure of Formula 1:

$$Ir(L_A)_m(L_B)_n$$ [Formula 1]

wherein, in Formula 1, $L_A$ has the following structure of Formula 2;

$L_B$ is an auxiliary ligand having the following structure of Formula 3;

m is an integer of 1 to 3;

n is an integer of 0 to 2; and m+n is 3;

[Formula 2]

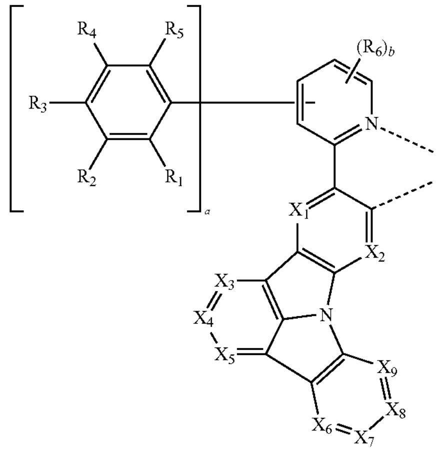

wherein, in Formula 2, each of $X_1$ and $X_2$ is independently $CR_7$ or N;

each of $X_3$ to $X_5$ is independently $CR_9$ or N and at least one of $X_3$ to $X_5$ is $CR_8$;

each of $X_6$ to $X_9$ is independently is $CR_9$ or N and at least one of $X_6$ to $X_9$ is $CR_9$;

each of $R_1$ to $R_9$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and wherein each $R_6$ is identical to or different from each other when b is an integer of 2 or more;

optionally, two adjacent groups among $R_1$ to $R_5$, and/or two adjacent $R_6$ when b is an integer of 2 or more, and/or $X_3$ and $X_4$ or $X_4$ and $X_5$, and/or $X_6$ and $X_7$, $X_7$ and $X_8$, or $X_8$ and $X_9$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is an integer of 0 to 2; and b is an integer of 0 to 4,

[Formula 3]

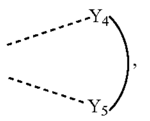

and wherein the host includes a first host having the following structure of Formula 7 and a second host having the following structure of Formula 9:

[Formula 7]

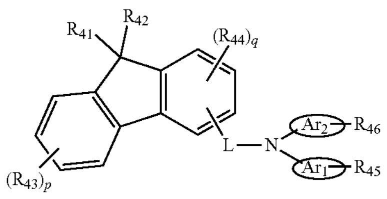

wherein, in Formula 7, each of $R_{41}$ and $R_{42}$ is independently hydrogen, deuterium, unsubstituted or substituted $C_1$-$C_{20}$ alkyl, unsubstituted or substituted $C_6$-$C_{30}$ aryl or unsubstituted or substituted $C_3$-$C_{30}$ hetero aryl, optionally, each substituent on the $C_6$-$C_{30}$ aryl and $C_3$-$C_{30}$ hetero aryl is independently unsubstituted or further substituted with at least one of $C_6$-$C_{30}$ aryl and $C_3$-$C_{30}$ hetero aryl, or $R_{41}$ and $R_{42}$ form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the $C_6$-$C_{30}$ aryl, $C_3$-$C_{30}$ hetero aryl, $C_6$-$C_{30}$ aryl amino and $C_3$-$C_{30}$ hetero aryl amino is independently unsubstituted or further substituted with at least one of $C_6$-$C_{30}$ aryl and $C_3$-$C_{30}$ hetero aryl, wherein each $R_{43}$ is identical to or different from each other when p is an integer of 2 or more and each $R_{44}$ is identical to or different from each other when q is an integer of 2 or more;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3,

[Formula 9]

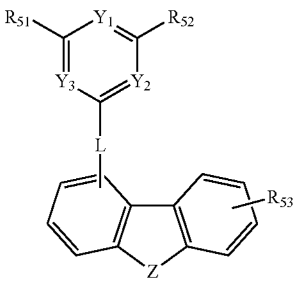

wherein, in Formula 9, each of $R_{51}$ and $R_{52}$ is independently unsubstituted or substituted $C_6$-$C_{30}$ aryl or unsubstituted or substituted $C_3$-$C_{30}$ hetero aryl;

$R_{53}$ is hydrogen or unsubstituted or substituted $C_6$-$C_{30}$ aryl, optionally, the $C_6$-$C_{30}$ aryl forms a spiro structure with an unsubstituted or substituted $C_6$-$C_{30}$ aromatic ring or an unsubstituted or substituted $C_3$-$C_{30}$ hetero aromatic ring;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{54}$ or N, wherein at least one of $Y_1$, $Y_2$ and $Y_3$ is N;

$R_{54}$ is independently hydrogen, unsubstituted or substituted $C_6$-$C_{30}$ aryl or unsubstituted or substituted $C_3$-$C_{30}$ hetero aryl, optionally, each of the $C_6$-$C_{30}$ aryl and the $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring; and Z is O or S.

The emissive layer may include a single emitting part or multiple emitting parts to form a tandem structure.

In another aspect, the present disclosure provides an organic light emitting diode that includes a first electrode; a second electrode facing the first electrode; and an emissive layer disposed between the first and second electrodes, wherein the emissive layer includes a first emitting part disposed between the first and second electrodes and including a blue emitting material layer; a second emitting part disposed between the first emitting part and the second electrode and including at least one emitting material layer; and a first charge generation layer disposed between the first and second emitting parts, wherein the at least one emitting material layer includes a host and a dopant, wherein the dopant includes an organic metal compound having the structure of Formula 1, and wherein the host includes a first host having the structure of Formula 7 and a second host having the structure of Formula 9.

In still another aspect, the present disclosure provides an organic light emitting device, for example, an organic light emitting display device or an organic light emitting illumination device, includes a substrate and the organic light emitting diode over the substrate.

The organic metal compound as used a dopant includes a metal atom linked to a fused hetero aromatic ring ligand including at least 5 rings and a pyridine ring ligand through a covalent bond or a coordination bond. The organic metal compound may be a heteroleptic metal complex including two different bidentate ligands coordinated to the metal atom, the photoluminescence color purity and emission colors of the metal compound can be can be controlled with ease by combining two different bidentate ligands.

Each of the (hetero) aryl-amine-based compound with a fluorenyl moiety and the azine-based material with a fused hetero aromatic moiety can be used as the first host and the second host in the EML, respectively. When the (hetero) aryl-amine-based compound with excellent hole transportation property and/or the azine-based material with excellent electron transportation property are used with the organic metal compound, charges and exciton energies can be transferred rapidly from the (hetero) aryl-amine-based material and the azine-based material to the organic metal compound. When an emissive layer includes the organic metal compound as the dopant and the (hetero) aryl-amine-based material and/or the azine-based material as the host, the organic light emitting diode and the organic light emitting device can reduce their driving voltages, and improve their luminous efficiency as well as luminous lifespan.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
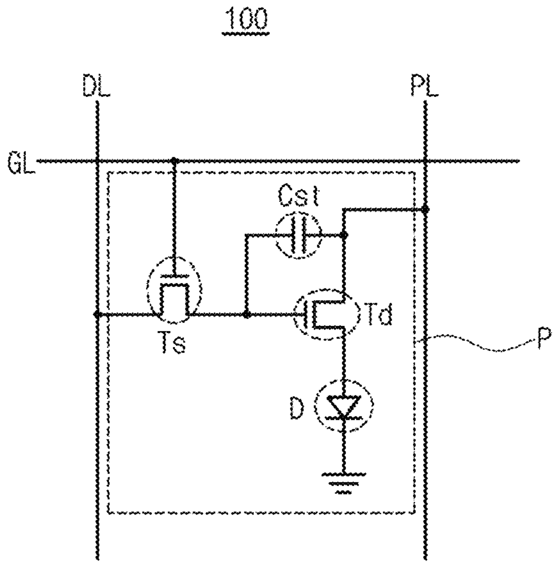
FIG. 1 is a schematic circuit diagram illustrating an organic light emitting display device in accordance with the present disclosure.

Reference will now be made in detail to aspects of the disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. The same or similar elements are designated by the same reference numerals throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, the elements should not be limited by these terms. These terms are used only to identify one element from another. For example, a first element could be termed a second element, and similarly, a second element could be termed a first element, without departing from the scope of the present disclosure.

Although the terms "first," "second," A, B, (a), (b), and the like may be used herein to describe various elements, the elements should not be interpreted to be limited by these terms as they are not used to define a particular order, precedence, or number of the corresponding elements. These terms are used only to identify one element from another.

The expression that an element or layer is "connected" to another element or layer means the element or layer can not only be directly connected to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale in which each of elements is illustrated in the accompanying drawings may differ from an actual scale. Thus, the illustrated elements are not limited to the specific scale in which they are illustrated in the drawings.

The present disclosure relates to an organic emitting diode where at least one emitting material layer includes an organic metal compound with excellent optical properties and an organic compound with excellent charge transportation properties and an organic light emitting device including the diode so that the diode and the device can reduce their driving voltages and maximize their luminous efficiency and luminous lifespan. The diode may be applied to an organic light emitting device such as an organic light emitting display device or an organic light emitting illumination device.

FIG. 1 is a schematic circuit diagram illustrating an organic light emitting display device in accordance with the present disclosure. As illustrated in FIG. 1, a gate line GL, a data line DL and power line PL, each of which cross each other to define a pixel region P, in the organic light display device 100. A switching thin film transistor Ts, a driving thin film transistor Td, a storage capacitor Cst and an organic light emitting diode D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode 130 (FIG. 2) so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
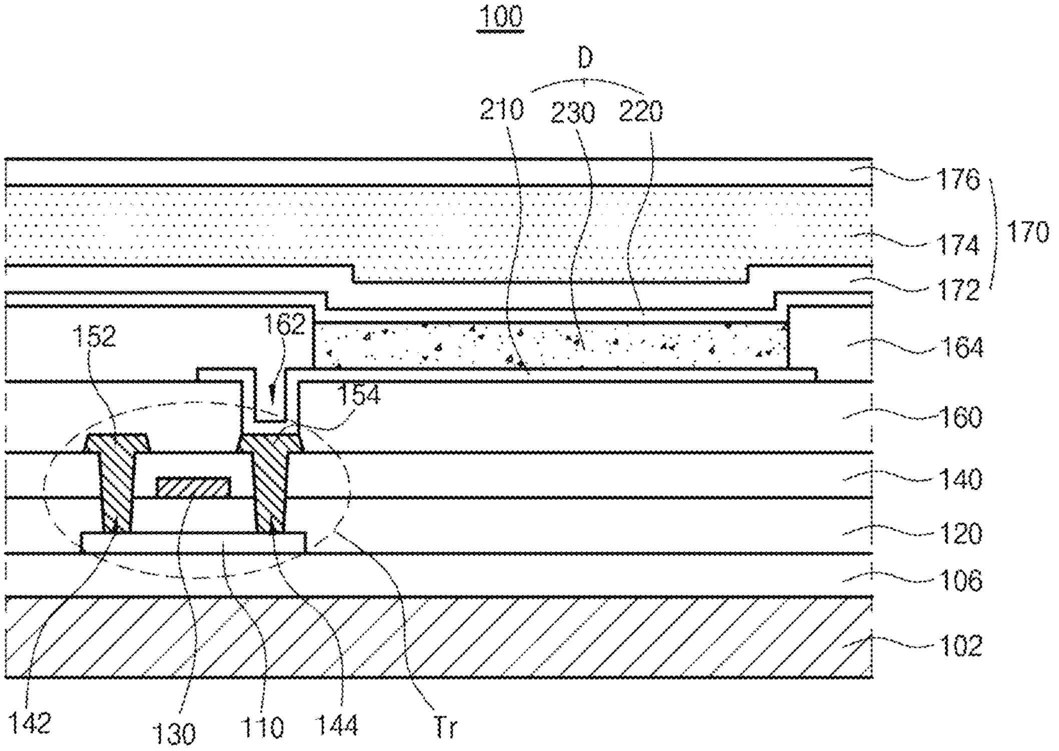
FIG. 2 is a cross-sectional view illustrating an organic light emitting display device as an example of an organic light emitting device in accordance with an exemplary aspect of the present disclosure.

FIG. 2 is a schematic cross-sectional view illustrating an organic light emitting display device in accordance with an exemplary aspect of the present disclosure. As illustrated in FIG. 2, the organic light emitting display device 100 includes a substrate 102, a thin-film transistor Tr over the substrate 102, and an organic light emitting diode D connected to the thin film transistor Tr. As an example, the substrate 102 defines a red pixel region, a green pixel region and a blue pixel region and the organic light emitting diode D is located in each pixel region. In other words, the organic light emitting diode D, each of which emits red, green or blue light, is located correspondingly in the red pixel region, the green pixel region and the blue pixel region.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode D are arranged, forms an array substrate.

A buffer layer 106 may be disposed over the substrate 102, and the thin film transistor Tr is disposed over the buffer layer 106. The buffer layer 106 may be omitted. A semiconductor layer 110 is disposed over the buffer layer 106. In one exemplary aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$, wherein $0<x\leq 2$) or silicon nitride ($SiN_x$, wherein $0<x\leq 2$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include, but is not limited to, an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

The gate line GL and the data line DL, which cross each other to define a pixel region P, and a switching element Ts, which is connected to the gate line GL and the data line DL, may be further formed in the pixel region P. The switching element Ts is connected to the thin film transistor Tr, which is a driving element. In addition, the power line PL is spaced apart in parallel from the gate line GL or the data line DL, and the thin film transistor Tr may further include a storage capacitor Cst configured to constantly keep a voltage of the gate electrode 130 for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The OLED D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive oxide (TCO). More particularly, the first electrode 210 may include indium tin oxide (ITO), indium zinc oxide (IZO), indium tin zinc oxide (ITZO), tin oxide (SnO), zinc oxide (ZnO), indium cerium oxide (ICO), aluminum doped zinc oxide (AZO), and the like.

In one exemplary aspect, when the organic light emitting display device 100 is a bottom-emission type, the first electrode 210 may have a single-layered structure of the TCO. Alternatively, when the organic light emitting display device 100 is a top-emission type, a reflective electrode or a reflective layer may be disposed under the first electrode 210. For example, the reflective electrode or the reflective layer may include, but is not limited to, silver (Ag) or aluminum-palladium-copper (APC) alloy. In the OLED D of the top-emission type, the first electrode 210 may have a triple-layered structure of ITO/Ag/ITO or ITO/APC/ITO.

In addition, a bank layer 164 is disposed on the passivation layer 160 in order to cover edges of the first electrode 210. The bank layer 164 exposes a center of the first electrode 210 corresponding to each pixel region. The bank layer 164 may be omitted.

An emissive layer 230 is disposed on the first electrode 210. In one exemplary aspect, the emissive layer 230 may have a single-layered structure of an emitting material layer (EML). Alternatively, the emissive layer 230 may have a multiple-layered structure of a hole injection layer (HIL), a hole transport layer (HTL), an electron blocking layer (EBL), an EML, a hole blocking layer (HBL), an electron transport layer (ETL) and/or an electron injection layer (EIL) (see, FIGS. 3, 5 and 6). In one aspect, the emissive layer 230 may have a single emitting part. Alternatively, the emissive layer 230 may have multiple emitting parts to form a tandem structure.

The emissive layer 230 may include at least one host and a dopant so that the OLED D and the organic light emitting display device can lower their driving voltages and enhance their luminous efficiency and luminous lifespan.

The second electrode 220 is disposed over the substrate 102 above which the emissive layer 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof or combination thereof such as aluminum-magnesium alloy (Al—Mg). When the organic light emitting display device 100 is a top-emission type, the second electrode 220 is thin so as to have light-transmissive (semi-transmissive) property.

In addition, an encapsulation film 170 may be disposed over the second electrode 220 in order to prevent outer moisture from penetrating into the organic light emitting diode D. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film to reduce reflection of external light. For example, the polarizing plate may be a circular polarizing plate. When the organic light emitting display device 100 is a bottom-emission type, the polarizer may be disposed under the substrate 102. Alternatively, when the organic light emitting display device 100 is a top-emission type, the polarizer may be disposed over the encapsulation film 170. In addition, a cover window may be attached to the encapsulation film 170 or the polarizer. In this case, the substrate 102 and the cover window may have a flexible property, thus the organic light emitting display device 100 may be a flexible display device.

Figure 3:
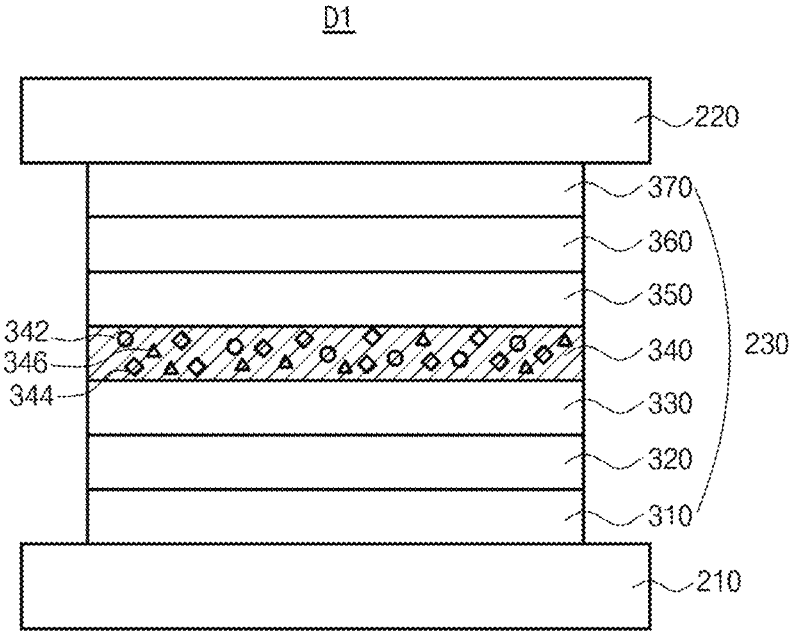
FIG. 3 is a cross-sectional view illustrating an organic light emitting diode having a single emitting part in accordance with an exemplary aspect of the present disclosure.

Next, we will describe the OLED D in more detail. FIG. 3 is a schematic cross-sectional view illustrating an organic light emitting diode having a single emitting part in accordance with an exemplary embodiment of the present disclosure. As illustrated in FIG. 3, the organic light emitting diode (OLED) D1 in accordance with the present disclosure includes first and second electrodes 210 and 220 facing each other and an emissive layer 230 disposed between the first and second electrodes 210 and 220. The organic light emitting display device 100 includes a red pixel region, a green pixel region and a blue pixel region, and the OLED D1 may be disposed in the green pixel region.

In an exemplary aspect, the emissive layer 230 includes an emitting material layer (EML) 340 disposed between the first and second electrodes 210 and 220. Also, the emissive layer 230 may include at least one of an HTL 320 disposed between the first electrode 210 and the EML 340 and an ETL 360 disposed between the second electrode 220 and the EML 340. In addition, the emissive layer 230 may further include at least one of an HIL 310 disposed between the first electrode 210 and the HTL 320 and an EIL 370 disposed between the second electrode 220 and the ETL 360. Alternatively, the emissive layer 320 may further comprise a first exciton blocking layer, i.e. an EBL 330 disposed between the HTL 320 and the EML 340 and/or a second exciton blocking layer, i.e. a HBL 350 disposed between the EML 340 and the ETL 360.

The first electrode 210 may be an anode that provides a hole into the EML 340. The first electrode 210 may include a conductive material having a relatively high work function value, for example, a transparent conductive oxide (TCO). In an exemplary embodiment, the first electrode 210 may include, but is not limited to, ITO, IZO, ITZO, SnO, ZnO, ICO, AZO, and the like.

The second electrode 220 may be a cathode that provides an electron into the EML 340. The second electrode 220 may include a conductive material having a relatively low work function values, i.e., a highly reflective material such as Al, Mg, Ca, Ag, alloy thereof or combination thereof such as Al—Mg.

The EML 340 includes a dopant 342 and a first host 344, and optionally a second host 346, a substantial light emission is occurred at the dopant 342. The dopant 342 may be an organic metal compound emitting green light and may have the following structure of Formula 1:

$$Ir(L_A)_m(L_B)_n$$ [Formula 1]

wherein $L_A$ has the following structure of Formula 2; $L_B$ is an auxiliary ligand having the following structure of Formula 3; m is an integer of 1 to 3 and n is an integer of 0 to 2, wherein m+n is 3;

[Formula 2]

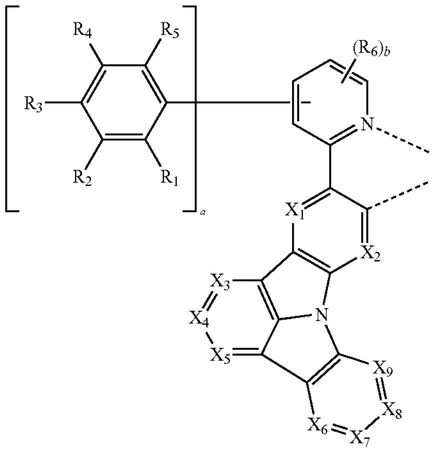

Wherein, in Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently is $CR_9$ or N and at least one of $X_6$ to $X_9$ is $CR_9$;

each of $R_1$ to $R_5$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and wherein each $R_6$ is identical to or different from each other when b is an integer of 2 or more;

optionally, two adjacent groups among $R_1$ to $R_5$, and/or two adjacent $R_6$ when b is an integer of 2 or more, and/or $X_3$ and $X_4$ or $X_4$ and $X_5$, and/or $X_6$ and $X_7$, or $X_7$ and $X_8$, or $X_8$ and $X_9$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is an integer of 0 to 2;

b is an integer of 0 to 4; and a+b is no more than 4,

[Formula 3]

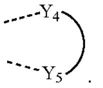

As used herein, the term "unsubstituted" means that hydrogen is linked, and in this case, hydrogen comprises protium, deuterium and tritium.

As used herein, substituent in the term "substituted" comprises, but is not limited to, unsubstituted or deuterium or halogen-substituted $C_1$-$C_{20}$ alkyl, unsubstituted or deuterium or halogen-substituted $C_1$-$C_{20}$ alkoxy, halogen, cyano, —$CF_3$, a hydroxyl group, a carboxylic group, a carbonyl group, an amino group, a $C_1$-$C_{10}$ alkyl amino group, a $C_6$-$C_{30}$ aryl amino group, a $C_3$-$C_{30}$ hetero aryl amino group, a $C_6$-$C_{30}$ aryl group, a $C_3$-$C_{30}$ hetero aryl group, a nitro group, a hydrazyl group, a sulfonate group, a $C_1$-$C_{20}$ alkyl silyl group, a $C_6$-$C_{30}$ aryl silyl group and a $C_3$-$C_{30}$ hetero aryl silyl group.

As used herein, the term "alkyl" refers to a branched or unbranched saturated hydrocarbon group of 1 to 20 carbon atoms, such as methyl, ethyl, 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, and the like.

As used herein, the term "alkenyl" is a hydrocarbon group of 2 to 20 carbon atoms containing at least one carbon-carbon double bond. The alkenyl group can be substituted with one or more substituents.

As used herein, the term "alicyclic" or "cycloalkyl" refers to non-aromatic carbon-based ring composed of at least three carbon atoms. Examples of alicyclic groups include, but are not limited to, cyclopropyl, cyclobutyl, cyclopentyl, cyclohexyl, norbornyl, and the like. The alicyclic group can be substituted with one or more substituents.

As used herein, the term "alkoxy" refers to an branched or unbranched alkyl bonded through an ether linkage represented by the formula —O(-alkyl) where alkyl is defined herein. Examples of alkoxy include methoxy, ethoxy, n-propoxy, isopropoxy, butoxy, and tert-butoxy, and the like As used herein, the term "alkyl amino" refers to a group represented by the formula —NH(-alkyl) or —N(-alkyl)$_2$ where alkyl is defined herein. Examples of alkyl amino represented by the formula —NH(-alkyl) include, but not limited to, methylamino group, ethylamino group, propylamino group, isopropylamino group, butylamino group, isobutylamino group, (sec-butyl)amino group, (tert-butyl) amino group, pentylamino group, isopentylamino group, (tert-pentyl)amino group, hexylamino group, and the like. Examples of alkyl amino represented by the formula —N(-alkyl)$_2$ include, but not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl) amino group, dihexylamino group, N-ethyl-N-methylamino group, N-methyl-N-propylamino group, N ethyl-N-propylamino group and the like.

As used herein, the term "aromatic" or "aryl" is well known in the art. The term includes monocyclic rings linked covalently or fused-ring polycyclic groups. An aromatic group can be unsubstituted or substituted. Examples of aromatic or aryl include phenyl, 1-naphthyl, 2-naphthyl, 4-biphenyl, anthracenyl, and phenanthracenyl and the like. Substituents for each of the above noted aryl ring systems are acceptable substituents are defined herein.

As used herein, the term "alkyl silyl group" refers to any linear or branched, saturated or unsaturated cyclic or acyclic alkyl, and the alkyl has 1 to 20 carbon atoms. Examples of the alkyl silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, and a phenylsilyl group.

As used herein, the term "halogen" refers to fluorine, chlorine, bromine or iodine atom.

As used herein, the term "hetero" in such as "hetero alkyl", "hetero alkenyl", "a hetero alicyclic group", "a hetero aromatic group", "a hetero cycloalkylene group", "a hetero arylene group", "a hetero aryl alkylene group", "a hetero aryl oxylene group", "a hetero cycloalkyl group", "a hetero aryl group", "a hetero aryl alkyl group", "a hetero aryloxyl group", "a hetero aryl amino group" means that at least one carbon atom, for example 1-5 carbons atoms, constituting an aliphatic chain, an alicyclic group or ring or an aromatic group or ring is substituted with at least one hetero atom selected from the group consisting of N, O, S, P and combination thereof.

As used herein, the term "hetero aromatic" or "hetero aryl" refers to a heterocycles including hetero atoms selected from N, O and S in a ring where the ring system is an aromatic ring. The term includes monocyclic rings linked covalently or fused-ring polycyclic groups. A hetero aromatic group can be unsubstituted or substituted. Examples of hetero aromatic or hetero aryl include pyridyl, pyrrolyl, pyrazinyl, pyrimidinyl, thienyl (alternatively referred to as thiophenyl), thiazolyl, furanyl, imidazolyl, pyrazolyl, triazolyl, tetrazolyl, oxazolyl, oxadiazolyl, and thiadiazolyl.

As used herein, the term "hetero aryl oxy" refers to a group represented by the formula —O-(hetero aryl) where hetero aryl is defined herein.

In one exemplary aspect, when each of $R_1$ to $R_9$ in Formula 2 is independently a $C_6$-$C_{30}$ aromatic group, each of $R_1$ to $R_9$ is independently may be, but is not limited to, a $C_6$-$C_{30}$ aryl group, a $C_7$-$C_{30}$ aryl alkyl group, a $C_6$-$C_{30}$ aryl oxy group and a $C_6$-$C_{30}$ aryl amino group. As an example, when each of $R_1$ to $R_9$ is independently a $C_6$-$C_{30}$ aryl group, each of $R_1$ to $R_9$ may independently comprise, but is not limited to, an unfused or fused aryl group such as phenyl, biphenyl, terphenyl, naphthyl, anthracenyl, pentalenyl, indenyl, indeno-indenyl, heptalenyl, biphenylenyl, indacenyl, phenalenyl, phenanthrenyl, benzo-phenanthrenyl, dibenzo-phenanthrenyl, azulenyl, pyrenyl, fluoranthenyl, triphenylenyl, chrysenyl, tetraphenylenyl, tetracenyl, pleiadenyl, picenyl, pentaphenylenyl, pentacenyl, fluorenyl, indeno-fluorenyl and spiro-fluorenyl. The unfused or fused aryl group may be substituted or unsubstituted. In some embodiments, adjacent two among $R_1$ to $R_5$ or adjacent two among $R_7$ to $R_9$ form unfused or fused aryl group may be substituted or unsubstituted.

Alternatively, when each of $R_1$ to $R_9$ in Formula 2 is independently a $C_3$-$C_{30}$ aromatic group, each of $R_1$ to $R_9$ is independently may be, but is not limited to, a $C_3$-$C_{30}$ hetero aryl group, a $C_4$-$C_{30}$ hetero aryl alkyl group, a $C_3$-$C_{30}$ hetero aryl oxy group and a $C_3$-$C_{30}$ hetero aryl amino group. As an example, when each of $R_1$ to $R_9$ is independently a $C_3$-$C_{30}$ hetero aryl group, each of $R_1$ to $R_9$ may independently comprise, but is not limited to, an unfused or fused hetero aryl group such as pyrrolyl, pyridinyl, pyrimidinyl, pyrazinyl, pyridazinyl, triazinyl, tetrazinyl, imidazolyl, pyrazolyl, indolyl, iso-indolyl, indazolyl, indolizinyl, pyrrolizinyl, carbazolyl, benzo-carbazolyl, dibenzo-carbazolyl, indolo-carbazolyl, indeno-carbazolyl, benzo-furo-carbazolyl, benzo-thieno-carbazolyl, carbolinyl, quinolinyl, iso-quinolinyl, phthlazinyl, quinoxalinyl, cinnolinyl, quinazolinyl, quinolizinyl, purinyl, benzo-quinolinyl, benzo-iso-quinolinyl, benzo-quinazolinyl, benzo-quinoxalinyl, acridinyl, phenazinyl, phenoxazinyl, phenothiazinyl, phenanthrolinyl, perimidinyl, phenanthridinyl, pteridinyl, naphthyridinyl, furanyl, pyranyl, oxazinyl, oxazolyl, oxadiazolyl, triazolyl, dioxinyl, benzo-furanyl, dibenzo-furanyl, thiopyranyl, xanthenyl, chromenyl, iso-chromenyl, thioazinyl, thiophenyl, benzo-thiophenyl, dibenzo-thiophenyl, difuro-pyrazinyl, benzo-furo-dibenzo-furanyl, benzothieno-benzo-thiophenyl, benzothieno-dibenzo-thiophenyl, benzothieno-benzo-furanyl, benzothieno-dibenzo-furanyl, xanthene-linked spiro acridinyl, dihydroacridinyl substituted with at least one $C_1$-$C_{10}$ alkyl and N-substituted spiro fluorenyl. The unfused or fused aryl group may be substituted or unsubstituted.

As an example, each of the aromatic group or the hetero aromatic group of $R_1$ to $R_9$ may consist of one to three aromatic or hetero aromatic rings. When the number of the aromatic or hetero aromatic rings of $R_1$ to $R_9$ becomes more than four, conjugated structure among the within the whole molecule becomes too long, thus, the organic metal compound may have too narrow energy bandgap. For example, each of the aryl group or the hetero aryl group of $R_1$ to $R_9$ may comprise independently, but is not limited to, phenyl, biphenyl, naphthyl, anthracenyl, pyrrolyl, triazinyl, imidazolyl, pyrazolyl, pyridinyl, pyrazinyl, pyrimidinyl, pyridazinyl, furanyl, benzo-furanyl, dibenzo-furanyl, thiophenyl, benzo-thiophenyl, dibenzo-thiophenyl, carbazolyl, acridinyl, carbolinyl, phenazinyl, phenoxazinyl and/or phenothiazinyl.

In one exemplary aspect, each of the alkyl, the hetero alkyl, the alkenyl, the hetero alkenyl, the alkoxy, the alkyl amino, the alkyl silyl, the alicyclic group, the hetero alicyclic group, the aromatic group and the hetero aromatic group of $R_1$ to $R_9$ may be independently unsubstituted or substituted with at least one of halogen, $C_1$-$C_{10}$ alkyl, a $C_4$-$C_{20}$ alicyclic group, a $C_3$-$C_{20}$ hetero alicyclic group, a $C_6$-$C_{20}$ aromatic group and a $C_3$-$C_{20}$ hetero aromatic group. In addition, each of the $C_4$-$C_{20}$ alicyclic ring, the $C_3$-$C_{20}$ hetero alicyclic ring, the $C_6$-$C_{30}$ aromatic ring and the $C_3$-$C_{30}$ hetero aromatic ring formed by adjacent two of $R_1$ to $R_6$, adjacent two of $R_8$, and/or adjacent two of $R_9$ may be independently unsubstituted or substituted with at least one $C_1$-$C_{10}$ alkyl group.

Alternatively, adjacent two of $R_1$ to $R_6$, $R_8$ and $R_9$ may form an unsubstituted or substituted $C_4$-$C_{30}$ alicyclic ring (e.g., a $C_5$-$C_{10}$ alicyclic ring), an unsubstituted or substituted $C_3$-$C_{30}$ hetero alicyclic ring (e.g. a $C_3$-$C_{10}$ hetero alicyclic ring), an unsubstituted or substituted $C_6$-$C_{30}$ aromatic ring (e.g. a $C_6$-$C_{20}$ aromatic ring) or an unsubstituted or substituted $C_3$-$C_{30}$ hetero aromatic ring (e.g. a $C_3$-$C_{20}$ hetero aromatic ring). The alicyclic ring, the hetero alicyclic ring, the aromatic ring and the hetero aromatic ring formed by adjacent two of $R_1$ to $R_6$, $R_8$ and $R_9$ are not limited to specific rings. For example, the aromatic ring or the hetero aromatic ring formed by those groups may comprise, but is not limited to, a benzene ring, a pyridine ring, an indole ring, a pyran ring, a fluorene ring unsubstituted or substituted with at least one $C_1$-$C_{10}$ alkyl group. In some embodiments, the aromatic ring or the hetero aromatic ring formed by two adjacent groups among $R_1$ to $R_6$, two adjacent $R_8$ or two adjacent $R_9$ may form an unsubstituted or substituted fused aromatic or heteroaromatic ring. The definitions of the fused aromatic ring and the fused heteroaromatic ring are the same as mentioned above.

The organic metal compound having the structure of Formula 1 has a hetero aromatic ligand consisting of at least 5 rings. Since the organic metal compound has a rigid chemical conformation, so that its conformation is not rotated in the luminous process, therefore, and it can maintain good luminous lifespan. The organic metal compound has specific ranges of photoluminescence emissions, so that its color purity can be improved.

In one exemplary aspect, each of m and n in Formula 1 may be 1 or 2. When the organic metal compound is a heteroleptic metal complex including two different bidentate ligands coordinated to the central metal atom, the photoluminescence color purity and emission colors of the organic metal compound can be controlled with ease by combining two different bidentate ligands. In addition, it is possible to control the color purity and emission peaks of the organic metal compound by introducing various substituents to each of the ligands. Alternatively, m may be 3 and n may be 0 in Formula 1. As an example, the organic metal compound having the structure of Formula 1 emits green color and can improve luminous efficiency of an organic light emitting diode.

As an example, $X_1$ is $CR_7$, $X_2$ is $CR_7$ or N, each of $X_3$ to $X_5$ is independently $CR_9$ and each of $X_6$ to $X_9$ is independently $CR_9$ in Formula 2. That is, each of $X_1$ and $X_3$ to $X_9$ may be independently an unsubstituted or substituted carbon atom.

In one exemplary aspect, the phenyl group in Formula 2 may be substituted to a meta position of the pyridine ring coordinated to the metal atom and each of $X_1$ and $X_3$ to $X_9$ in Formula 2 may be independently an unsubstituted or substituted carbon atom. Such $L_A$ may have the following structure of Formula 4A or Formula 4B:

[Formula 4A]

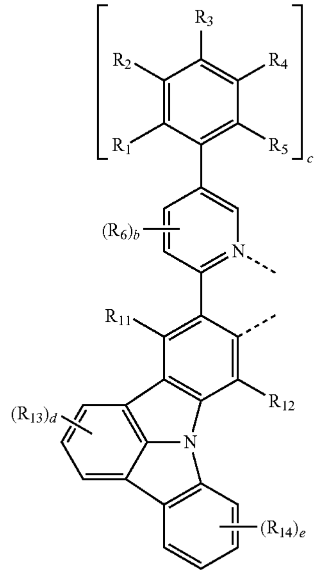

[Formula 4B]

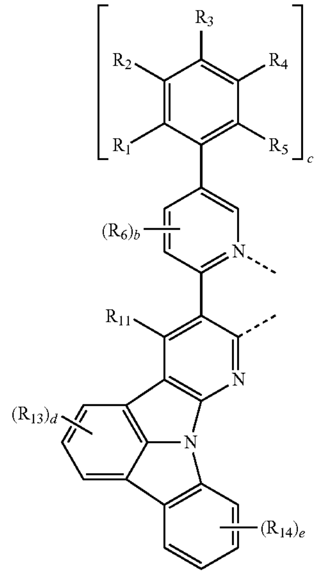

wherein, in Formulae 4A and 4B, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d an integer of 2 or more, and/or two adjacent $R_{14}$ when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring when each of d and e is an integer of two or more;

c is an integer of 0 or 1 d is an integer of 0 to 3; and e is an integer of 0 to 4.

In another exemplary aspect, the phenyl group in Formula 2 may be substituted to a para position of the pyridine ring coordinated to the metal atom and each of $X_1$ and $X_3$ to $X_9$ in Formula 2 may be independently an unsubstituted or substituted carbon atom. Such $L_A$ may have the following structure of Formula 4C or Formula 4D:

[Formula 4C]

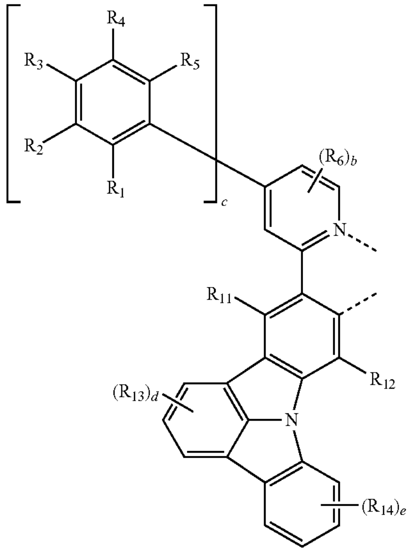

[Formula 4D]

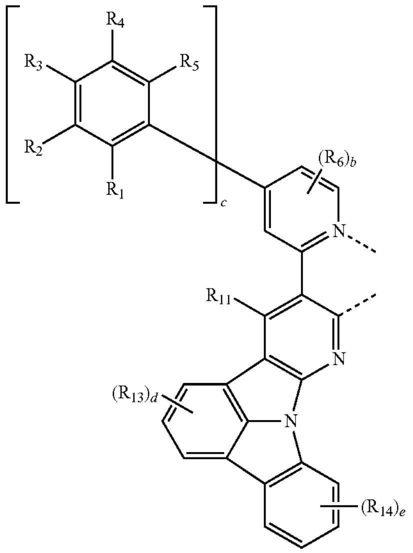

Wherein, in Formulae 4C and 4D, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d an integer of 2 or more, and/or two adjacent $R_{14}$ when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is an integer of 0 or 1;

d is an integer of 0 to 3; and e is an integer of 0 to 4.

In one exemplary aspect, each of the alkyl, the hetero alkyl, the alkenyl, the hetero alkenyl, the alkoxy, the alkyl amino, the alkyl silyl, the alicyclic group, the hetero alicyclic group, the aromatic group and the hetero aromatic group of $R_1$ to $R_6$ and $R_{11}$ to $R_{14}$ in Formulae 4A to 4D may be independently unsubstituted or substituted with at least one of deuterium, tritium, halogen, $C_1$-$C_{10}$ alkyl, a $C_4$-$C_{20}$ alicyclic group, a $C_3$-$C_{20}$ hetero alicyclic group, a $C_6$-$C_{20}$ aromatic group and a $C_3$-$C_{20}$ hetero aromatic group. In addition, each of the $C_4$-$C_{20}$ alicyclic ring, the $C_3$-$C_{20}$ hetero alicyclic ring, the $C_6$-$C_{30}$ aromatic ring and the $C_3$-$C_{30}$ hetero aromatic ring formed by adjacent two of $R_1$ to $R_6$, $R_{13}$ and $R_{14}$ in Formulae 4A to 4D may be independently unsubstituted or substituted with at least one $C_1$-$C_{10}$ alkyl group.

In still another exemplary aspect, $L_B$ as the auxiliary ligand may be a phenyl-pyridino-based ligand or an acetylacetonate-based ligand. As an example, $L_B$ may have, but is not limited to, the following structure of Formula 5A or Formula 5B:

[Formula 5A]

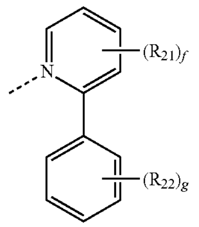

[Formula 5B]

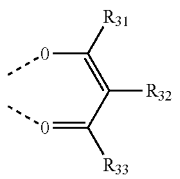

wherein, in Formulae 5A and 5B, each of $R_{21}$, $R_{22}$ and $R_{31}$ to $R_{33}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, optionally, two adjacent $R_{21}$ when f is an integer of 2 or more, and/or two adjacent $R_{22}$ when g is an integer of 2 or more, and/or $R_{31}$ and $R_{32}$ or $R_{32}$ and $R_{33}$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring; and each of f and g is an integer of 0 to 4.

The substituents of $R_{21}$ to $R_{22}$ and $R_{31}$ to $R_{33}$ or the ring formed by $R_{21}$ to $R_{22}$ and $R_{31}$ to $R_{33}$ may be identical to the substituents or the ring as described in Formula 2. In one exemplary aspect, the organic metal compound having the structure of Formulae 1 to 5B may be selected from, but is not limited to, the following organic metal compounds of Formula 6:

[Formula 6]

1

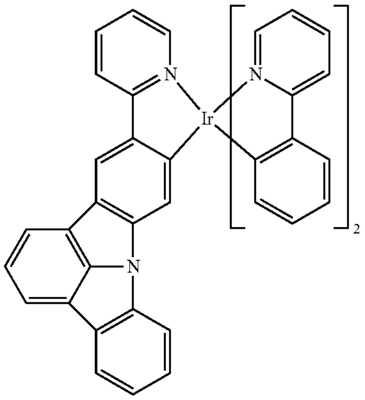

2

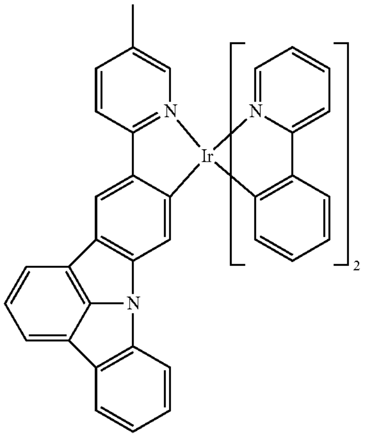

-continued

3

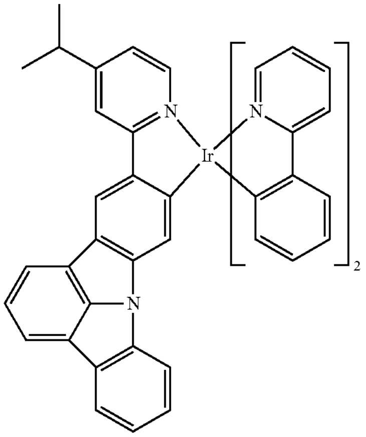

4

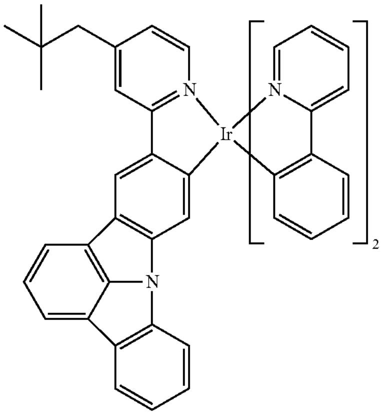

5

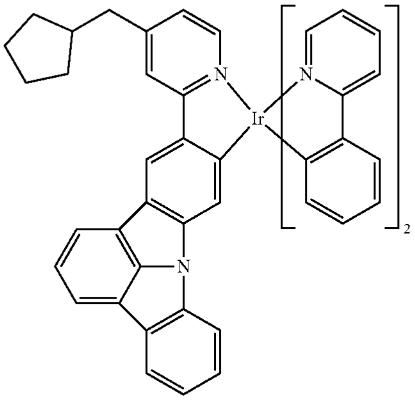

-continued
6
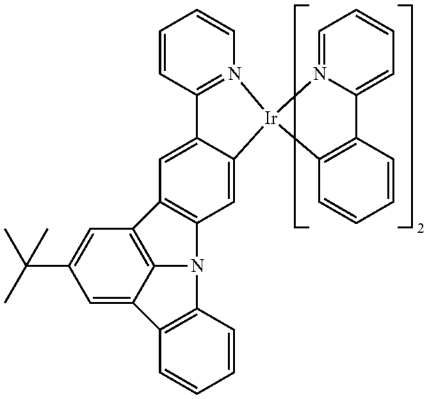
7
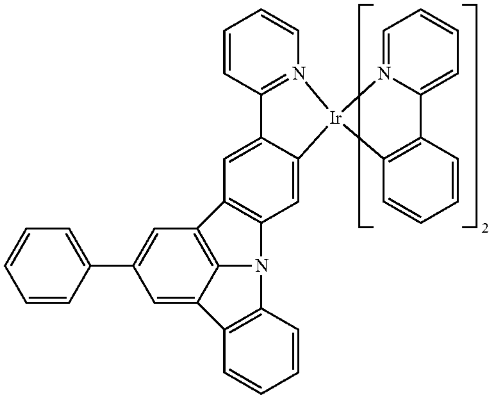
8
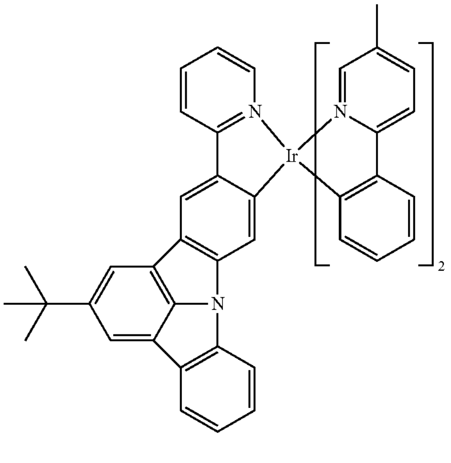
-continued
9
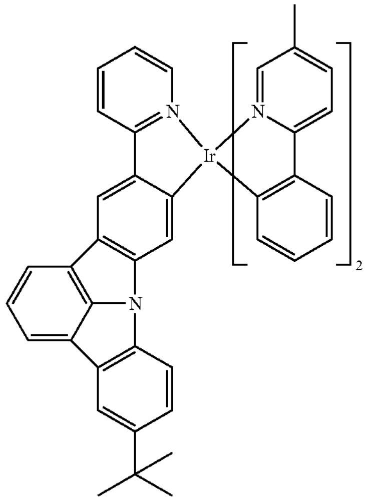
10
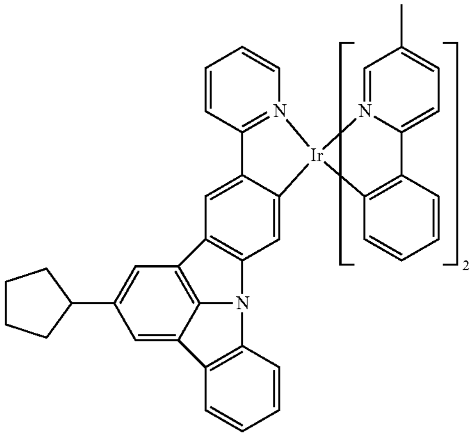
11
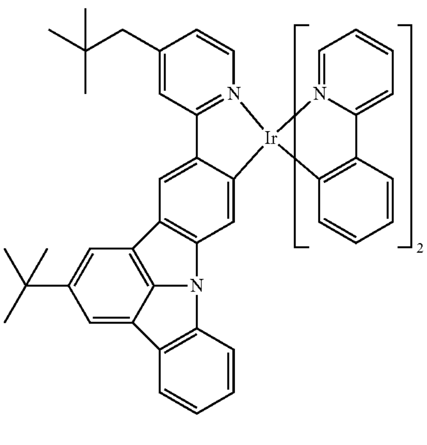

-continued
12
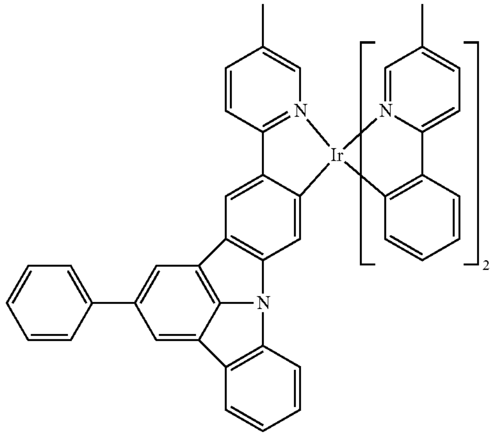
13
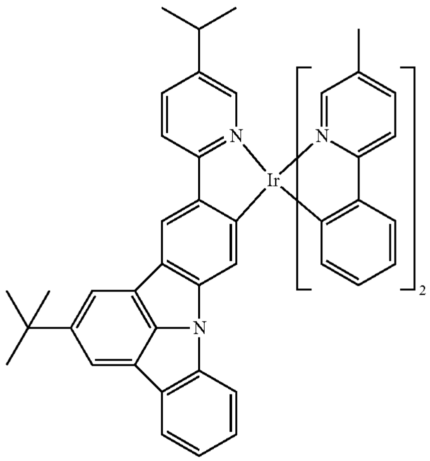
14
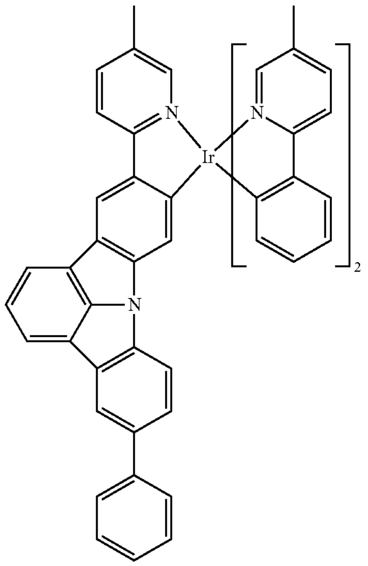
-continued
15
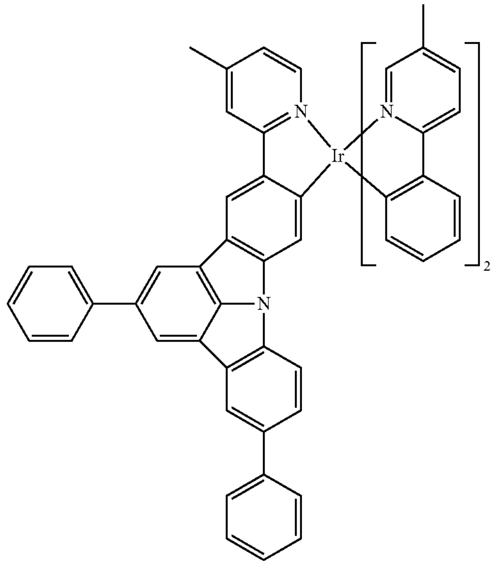
16
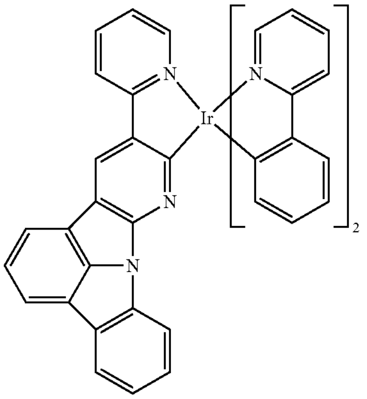
17
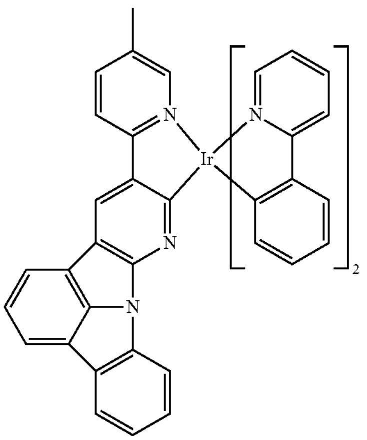

-continued
18
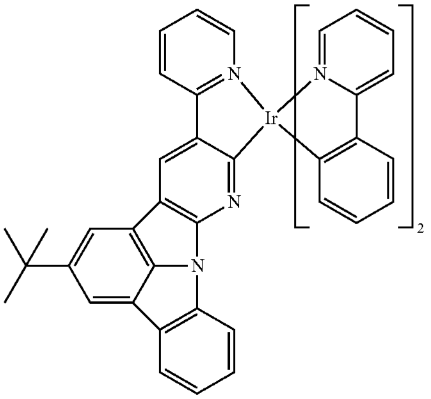
19
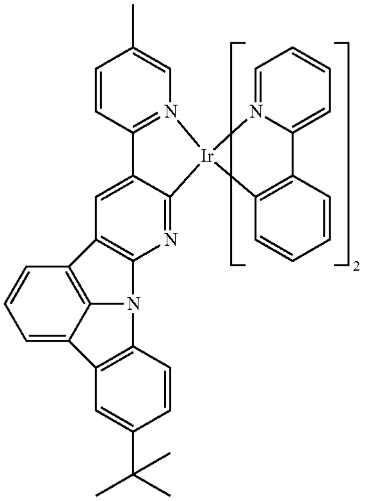
20
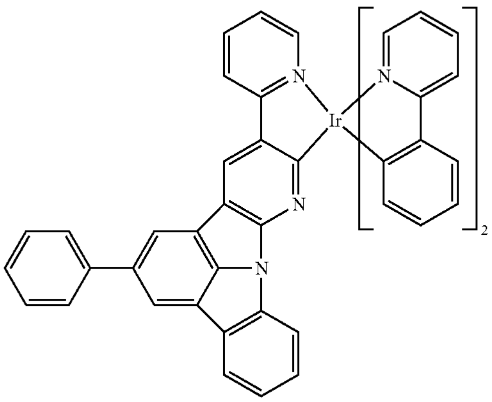
-continued
21
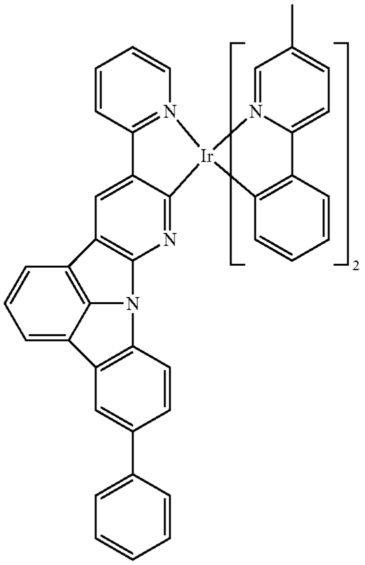
22
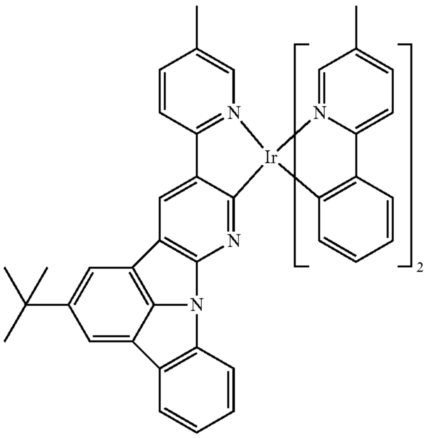
23
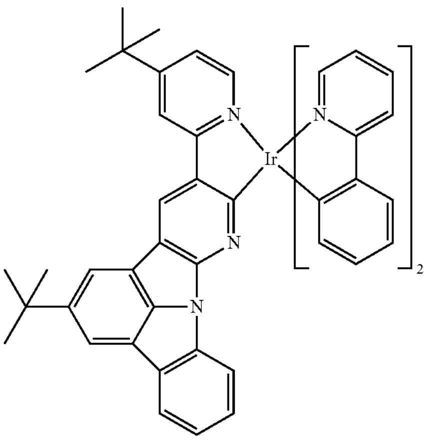

-continued
24
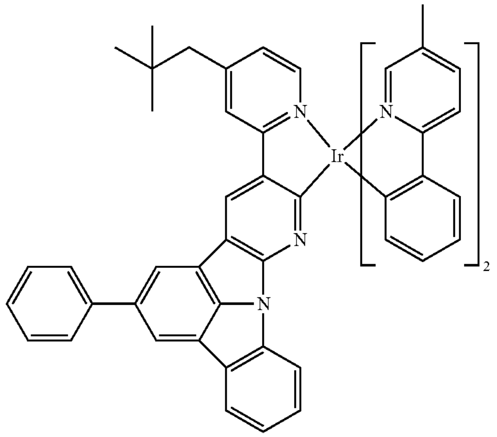
25
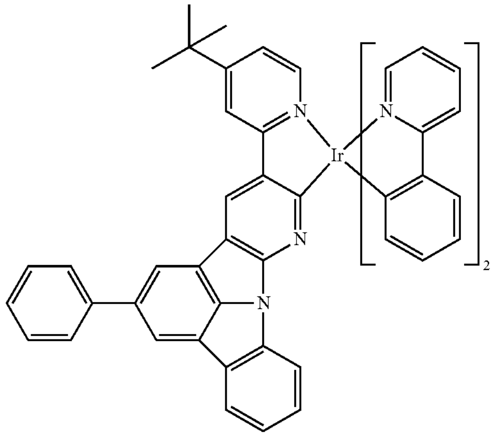
26
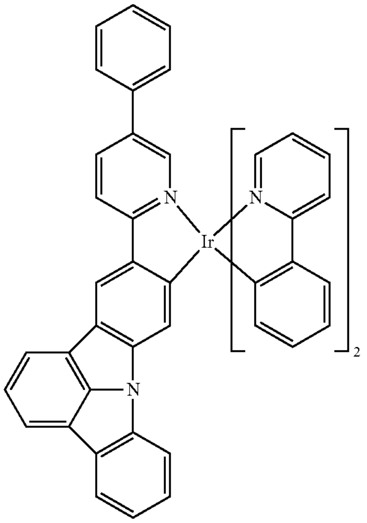
-continued
27
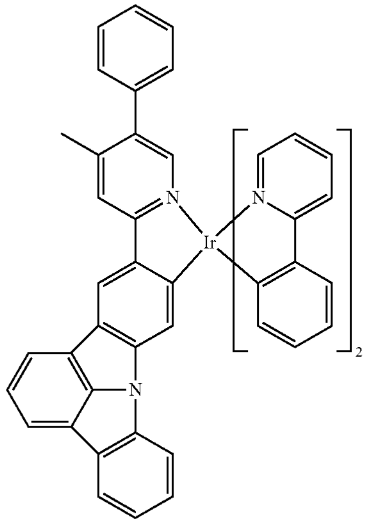
28
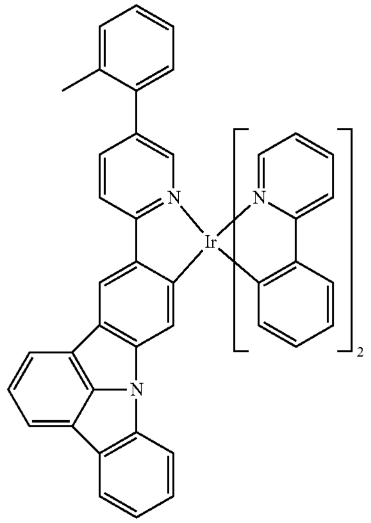
29
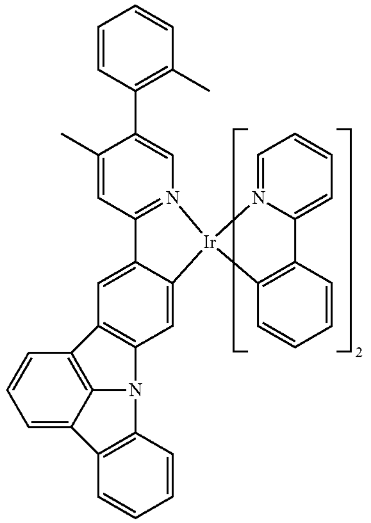

-continued
30
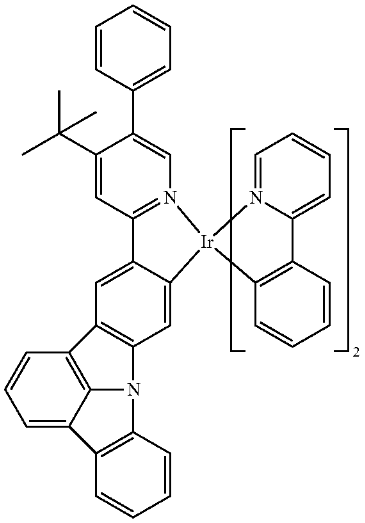
31
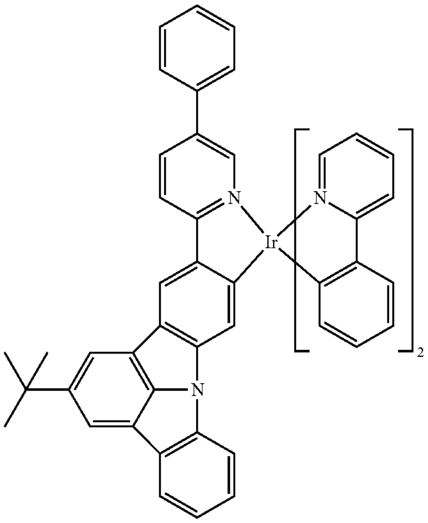
32
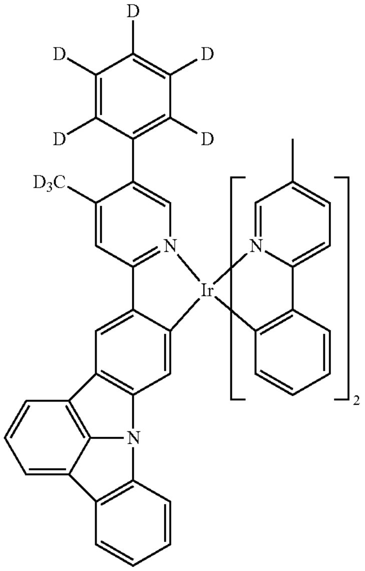
-continued
33
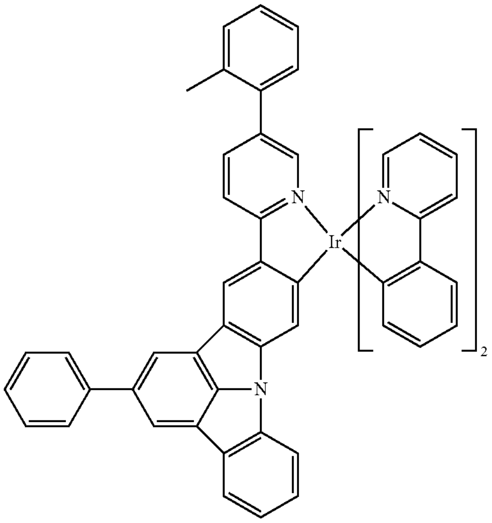
34
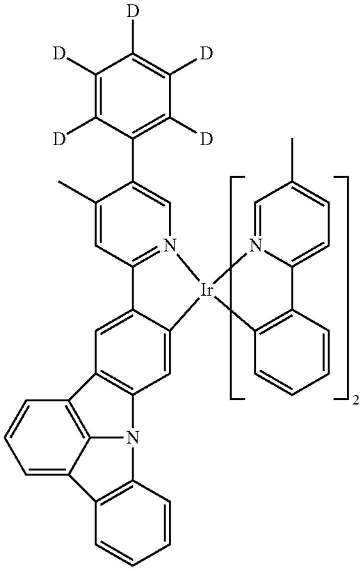
35
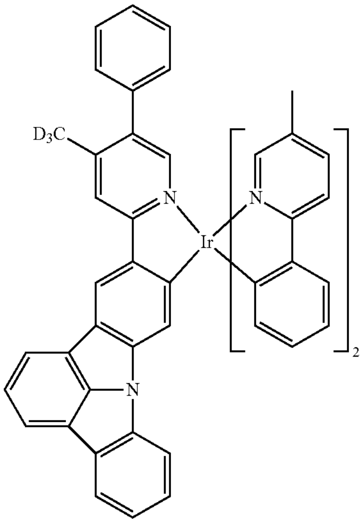

-continued
36
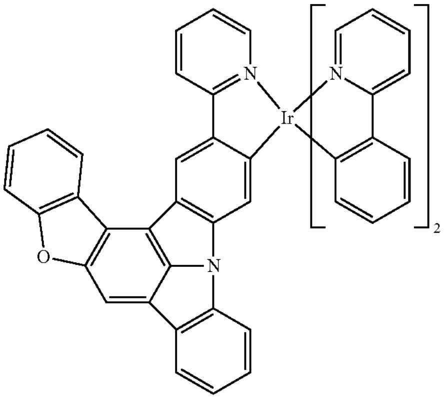
37
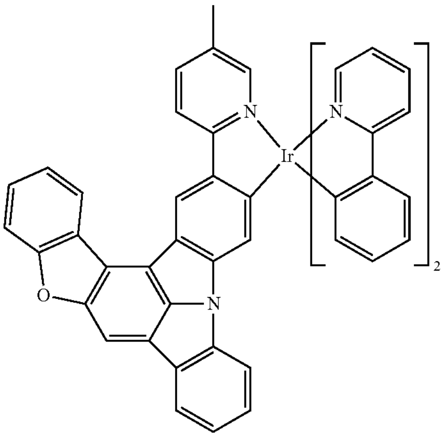
38
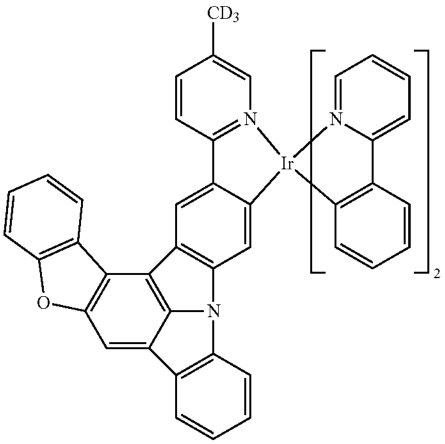
-continued
39
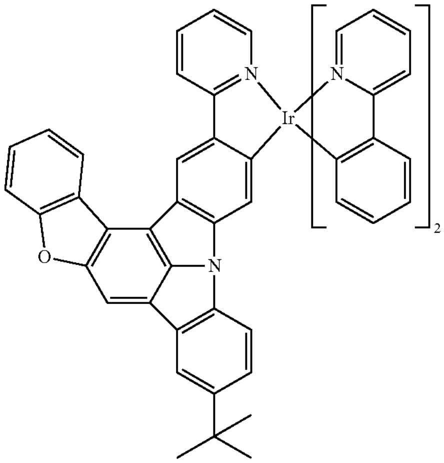
40
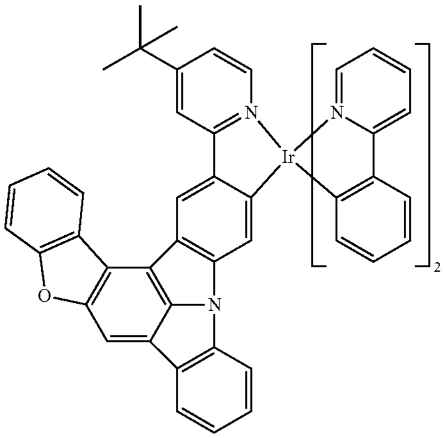
41
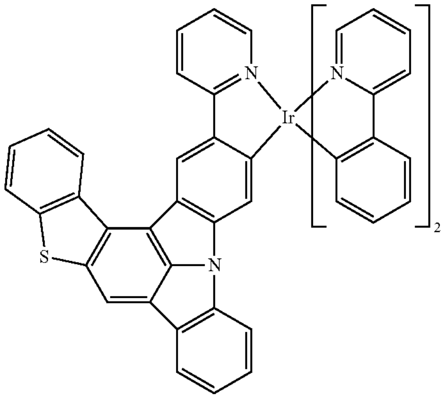

-continued
42
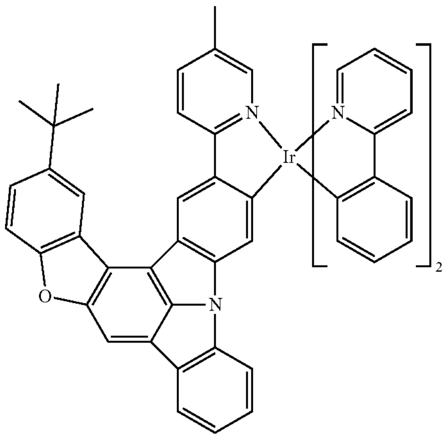
43
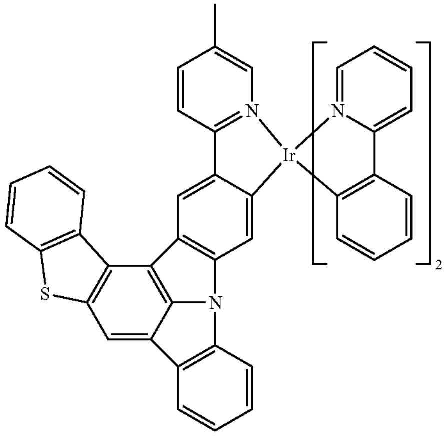
44
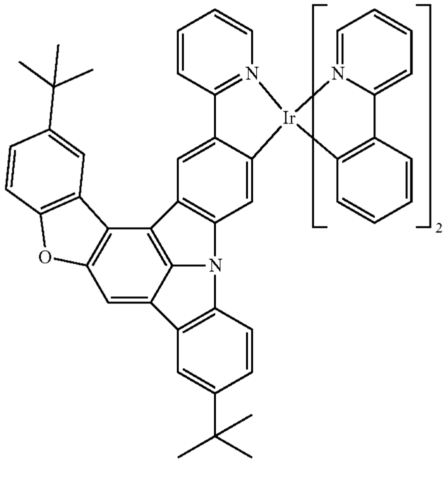
-continued
45
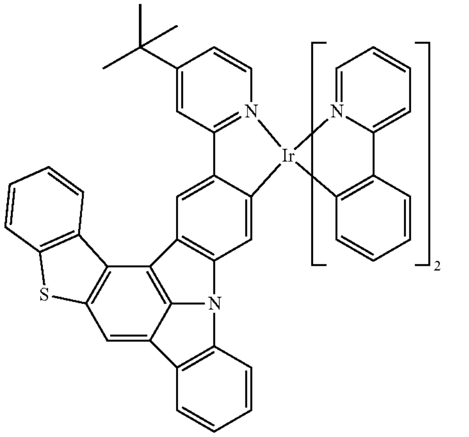
46
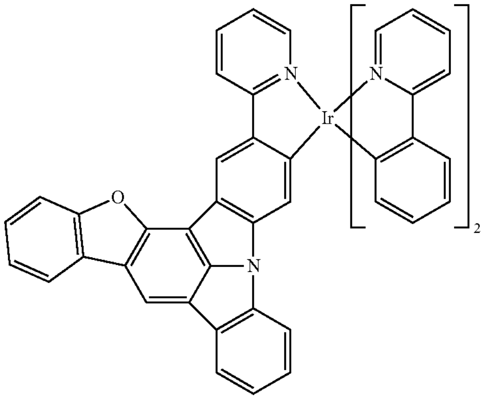
47
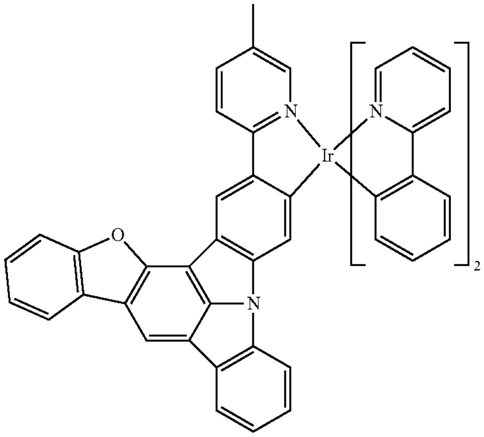

-continued
48
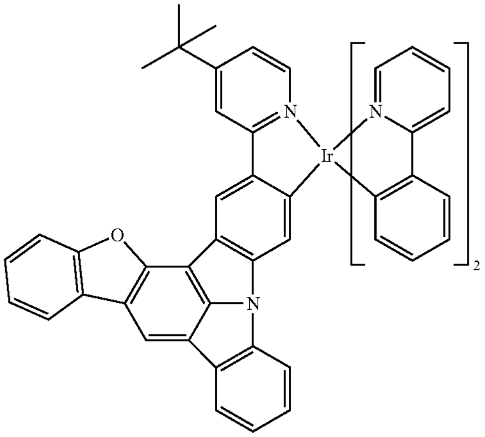
49
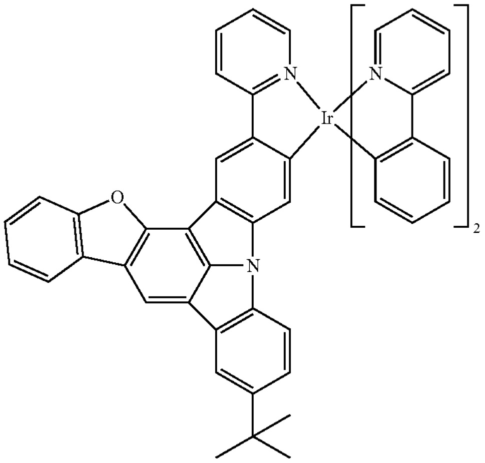
50
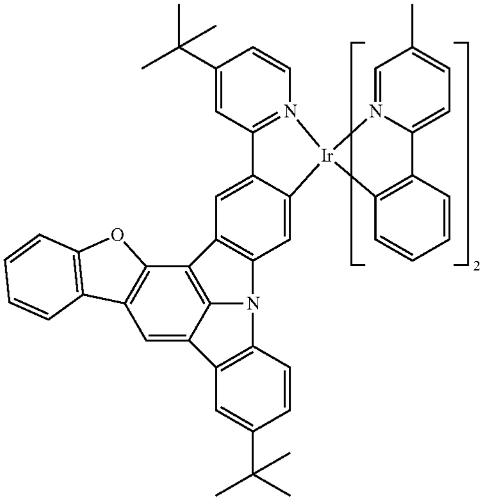
-continued
51
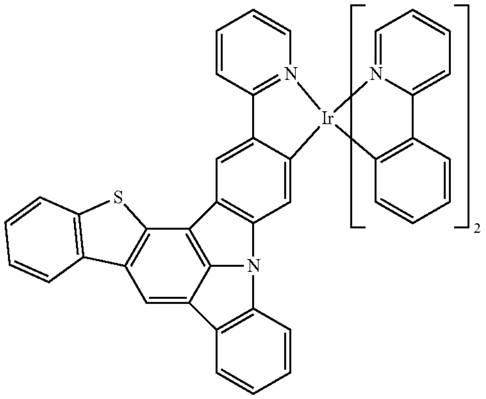
52
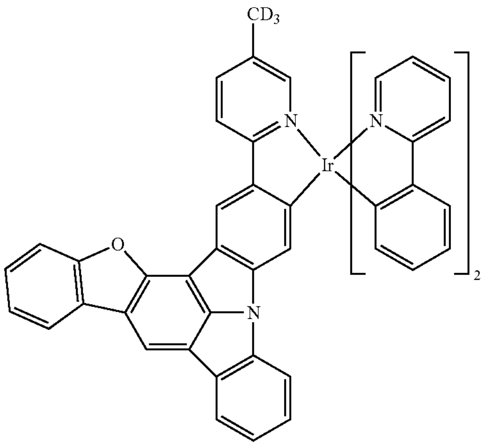
53
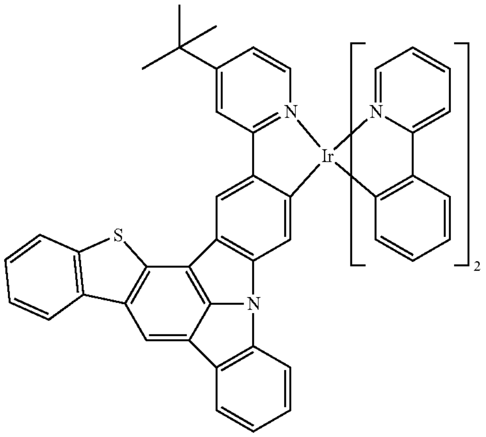

-continued
54
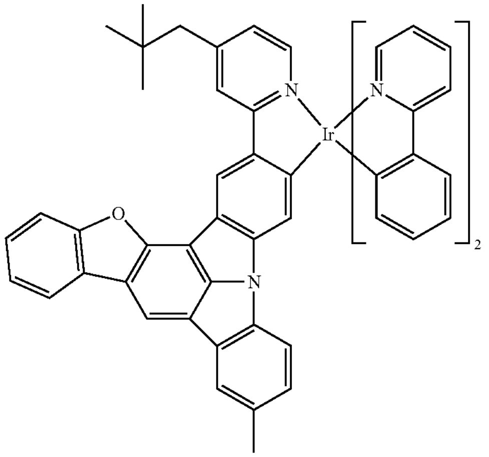
55
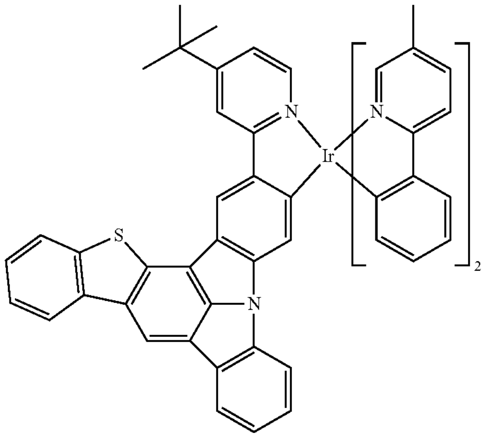
56
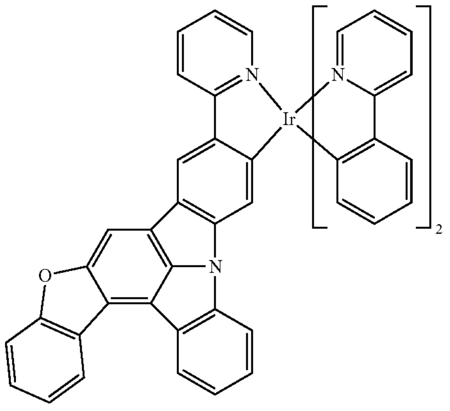
-continued
57
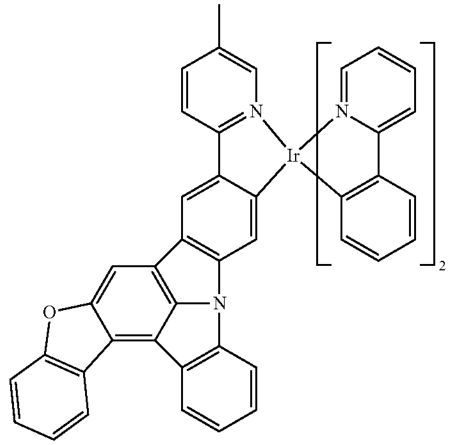
58
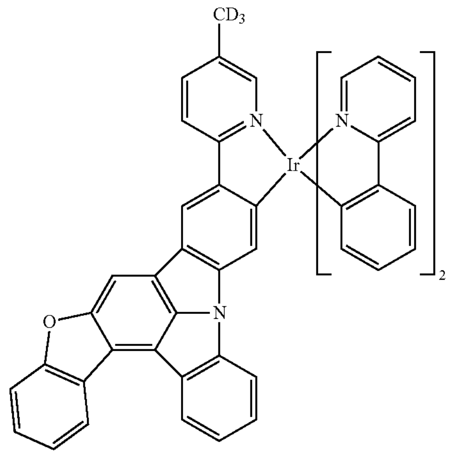
59
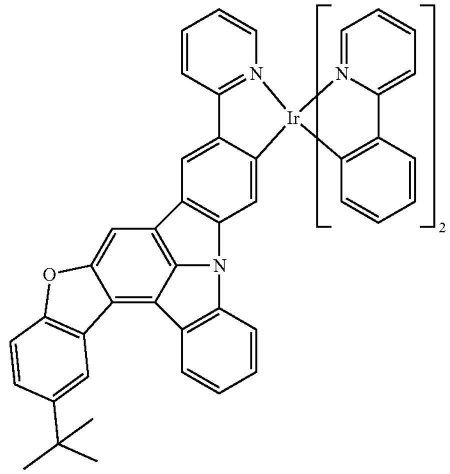

-continued
60
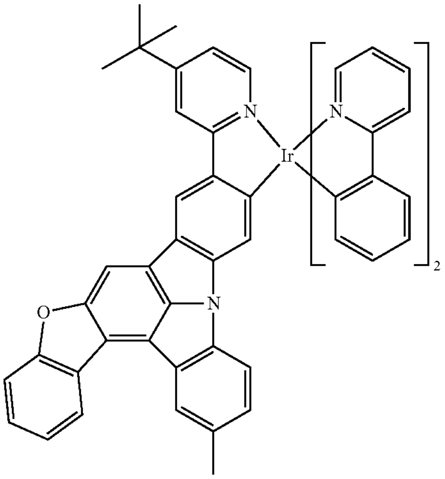
61
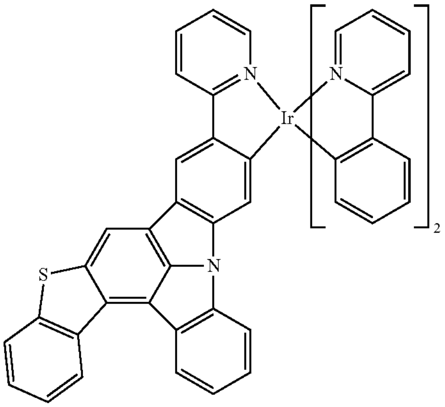
62
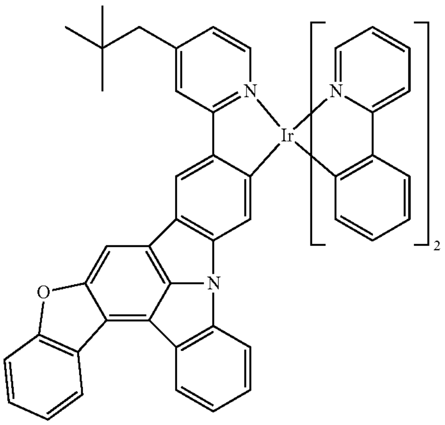
-continued
63
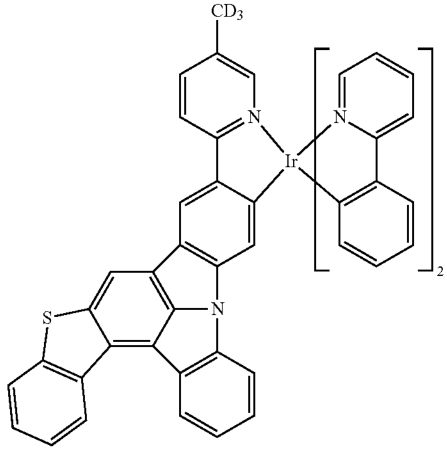
64
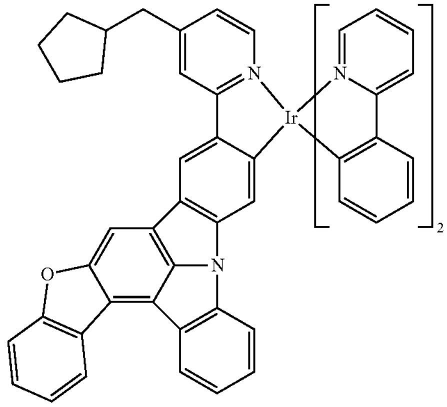
65
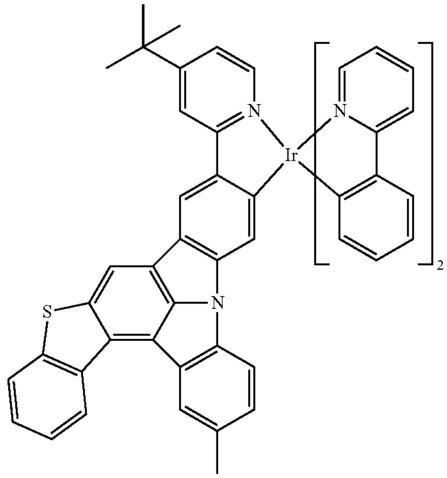

-continued
66
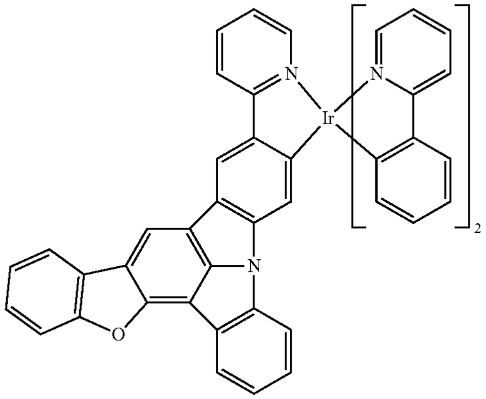
67
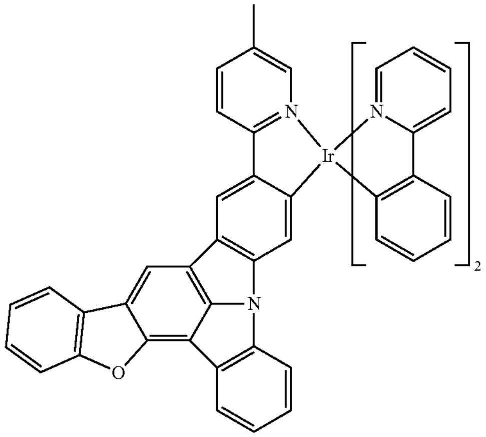
68
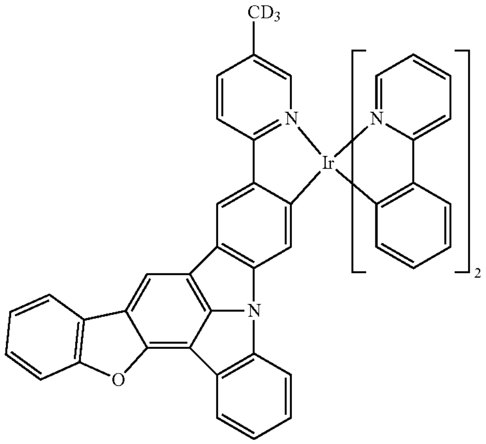
69
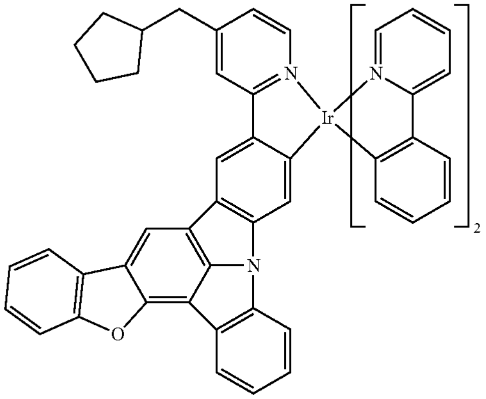
70
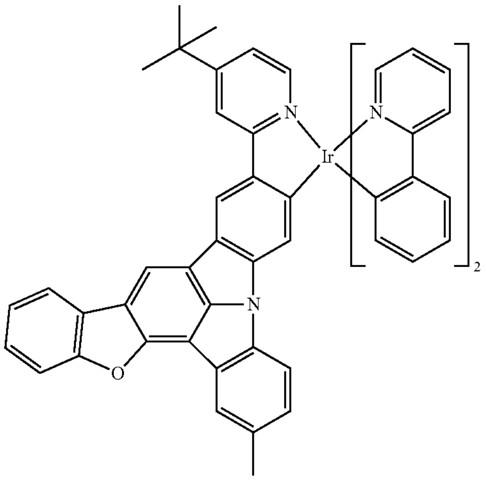
71
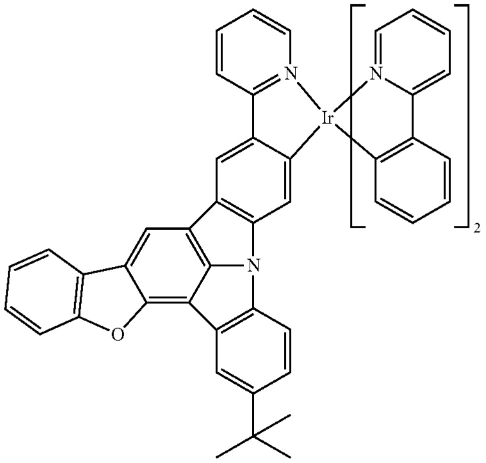

-continued
72
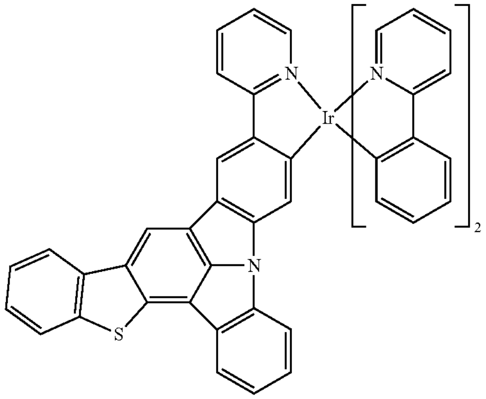
73
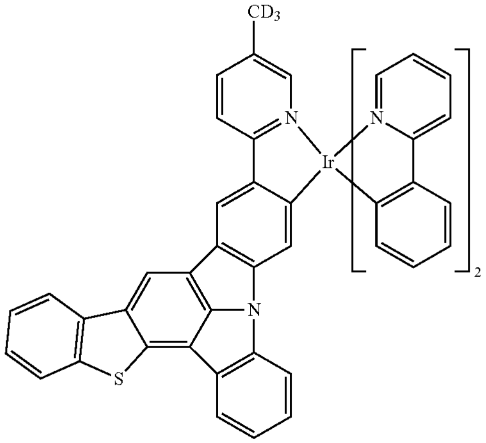
74
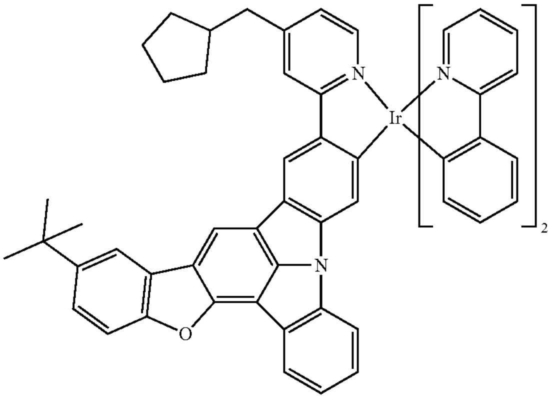
-continued
75
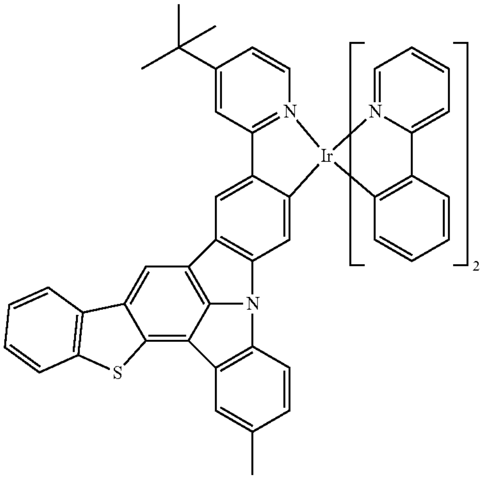
76
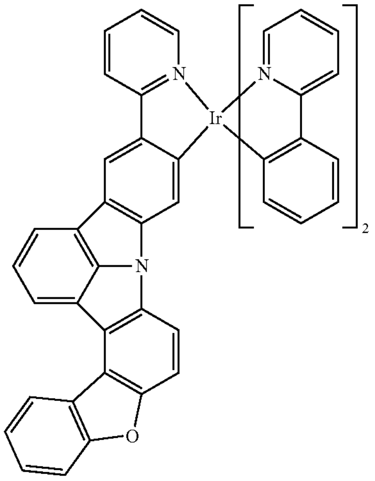
77
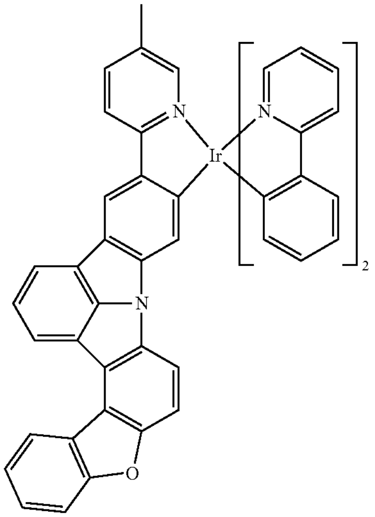

-continued
78
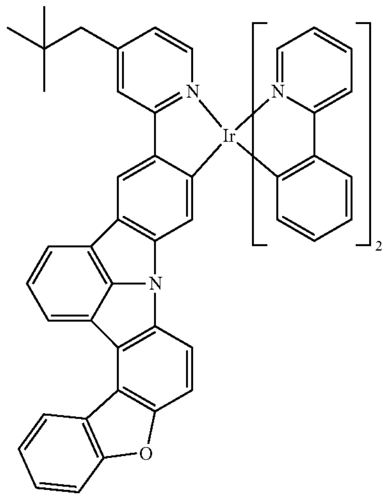
79
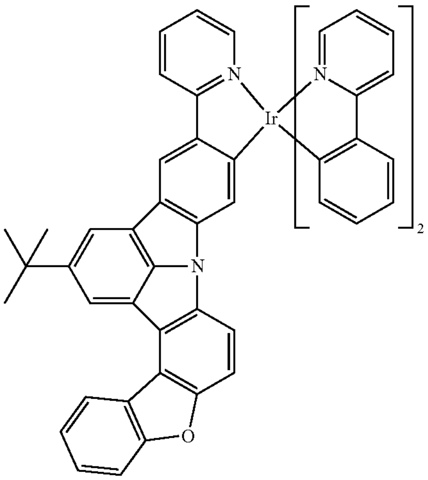
80
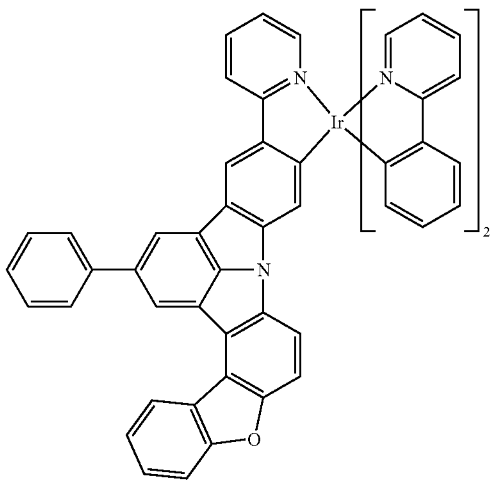
-continued
81
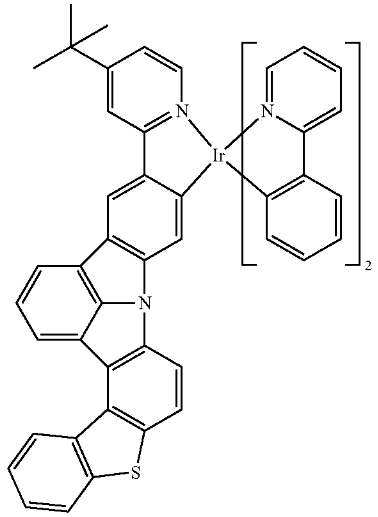
82
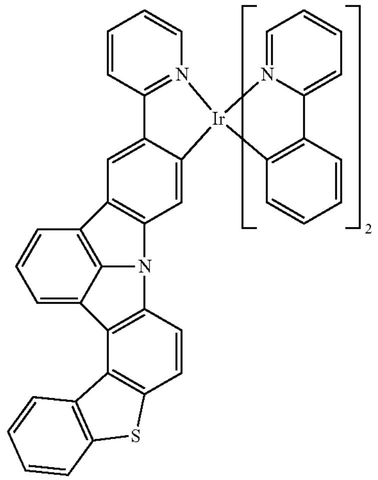
83
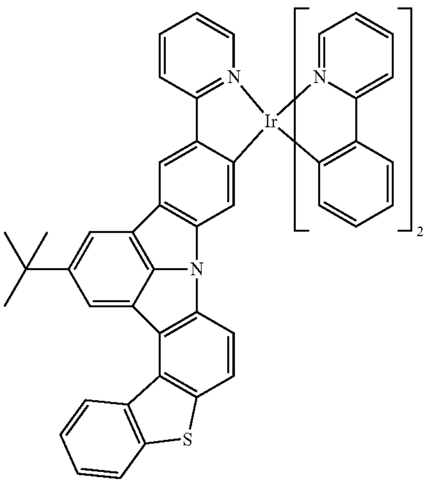

-continued
84
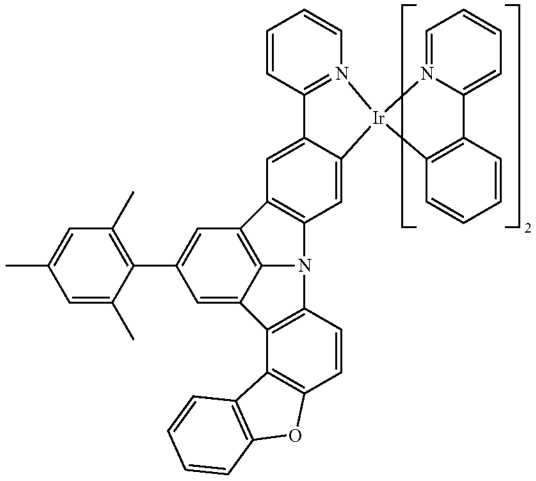
85
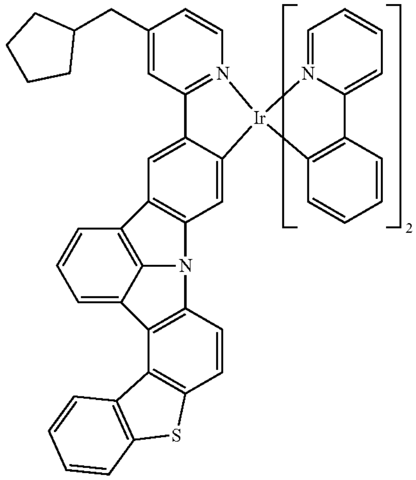
86
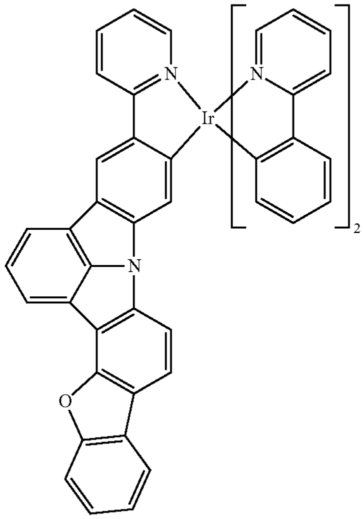
-continued
87
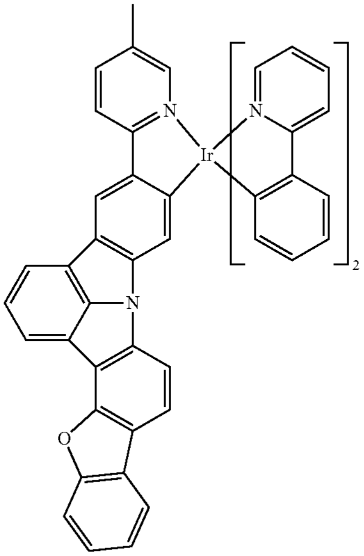
88
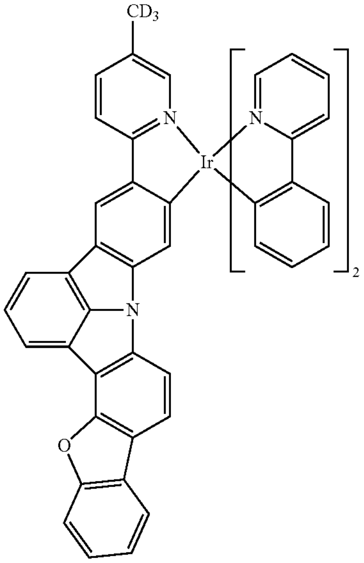
89
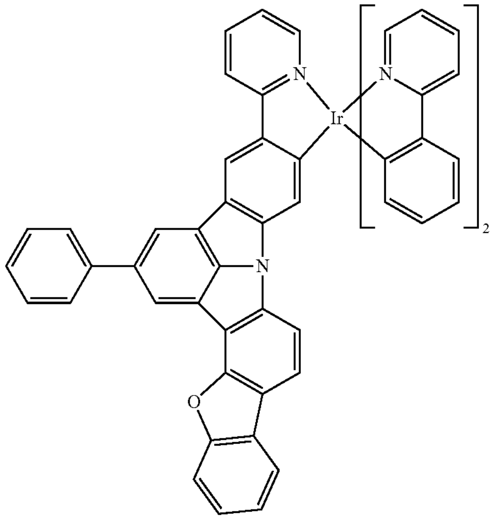

-continued
90
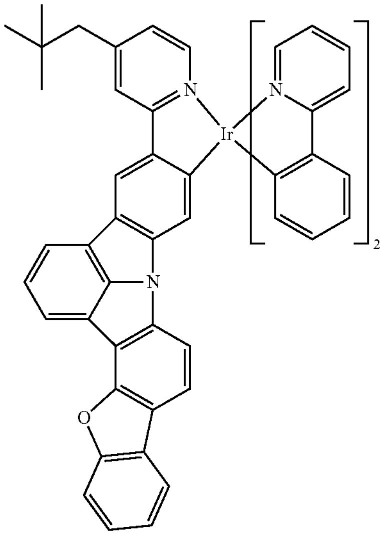
91
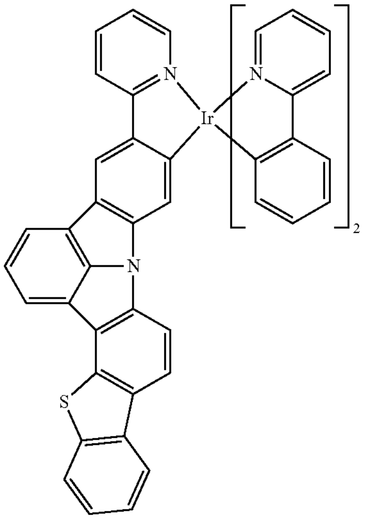
92
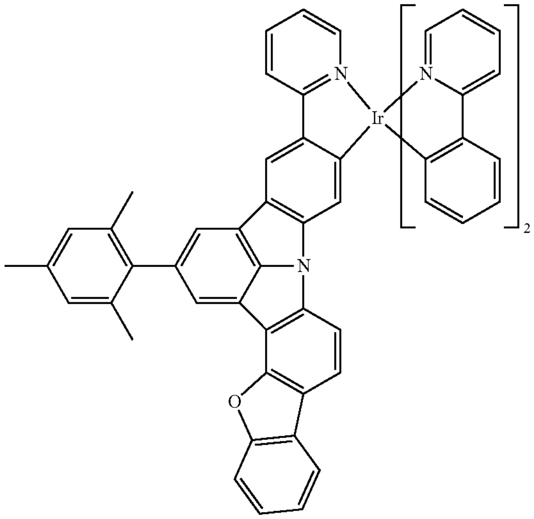
-continued
93
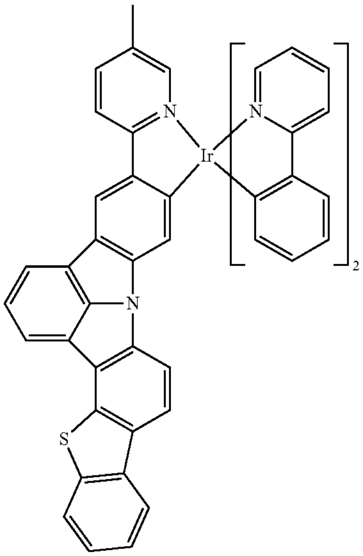
94
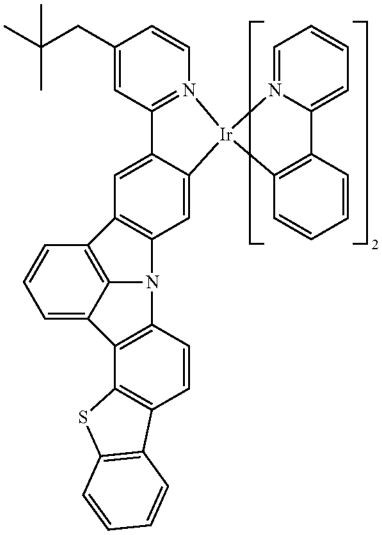
95
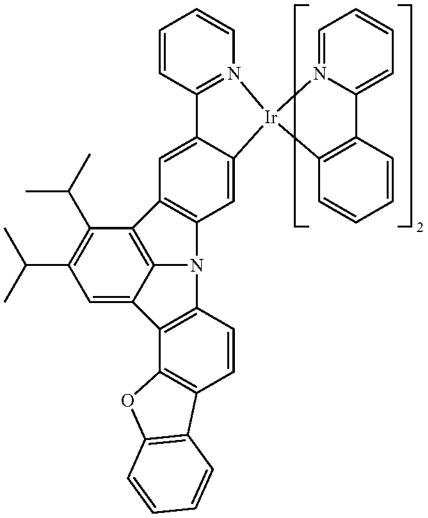

-continued
96
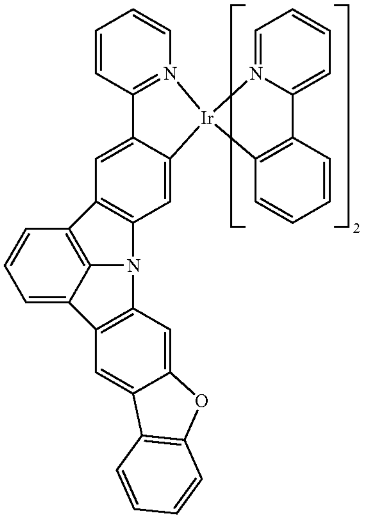
97
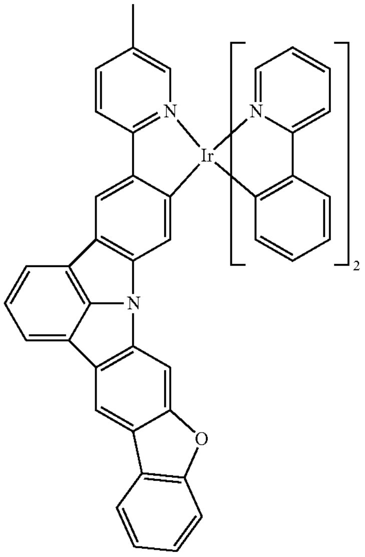
98
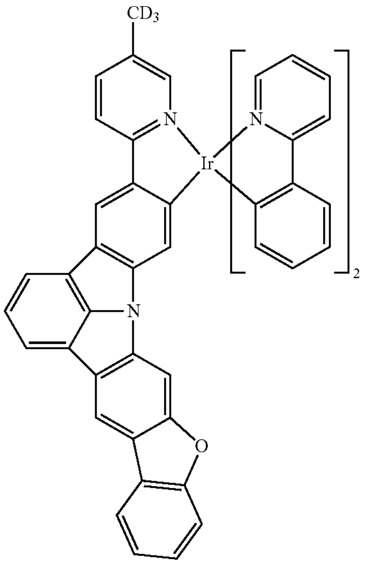
-continued
99
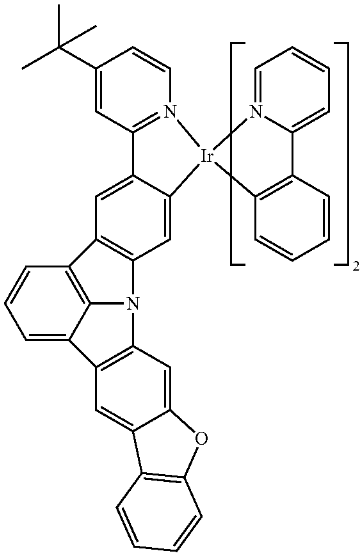
100
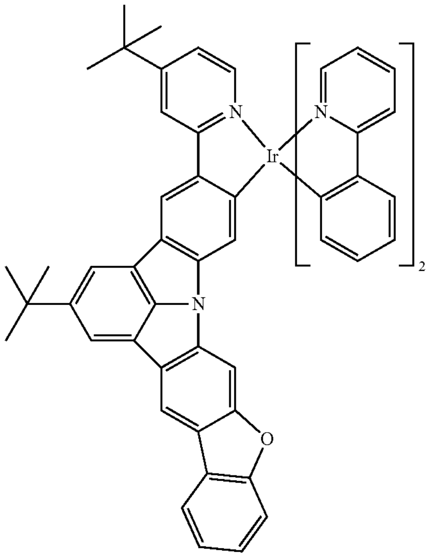
101
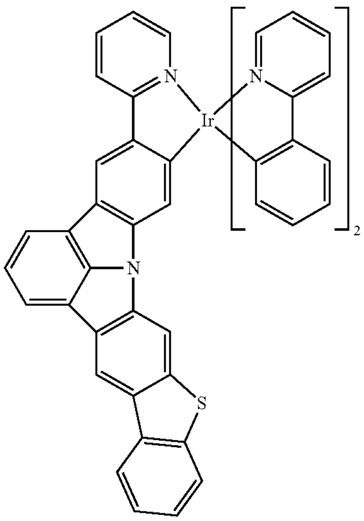

-continued
102
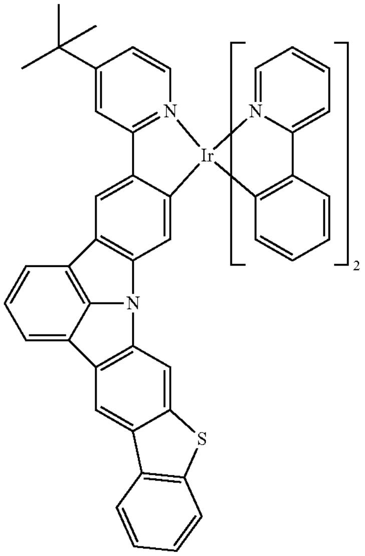
103
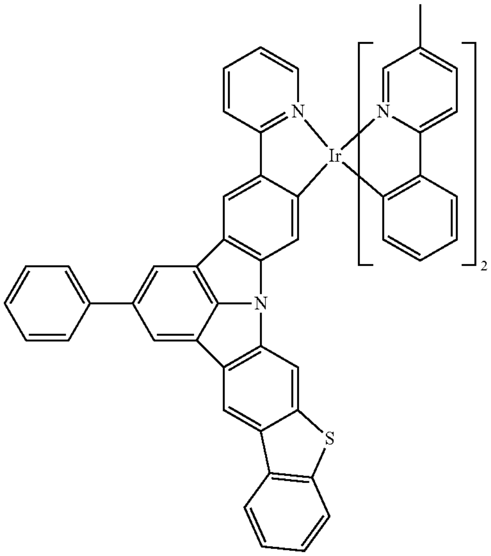
104
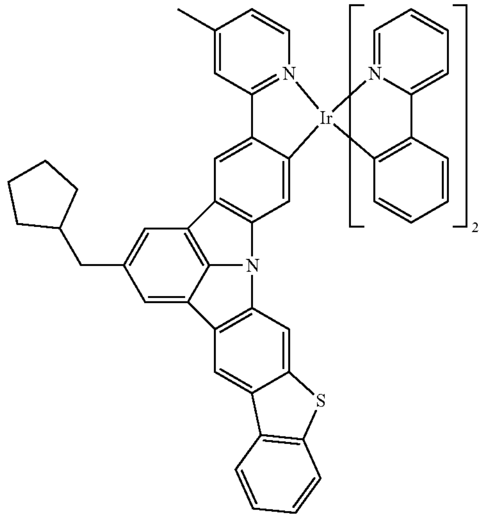
-continued
105
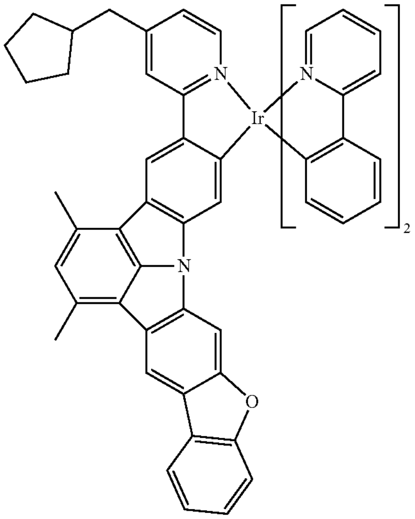
106
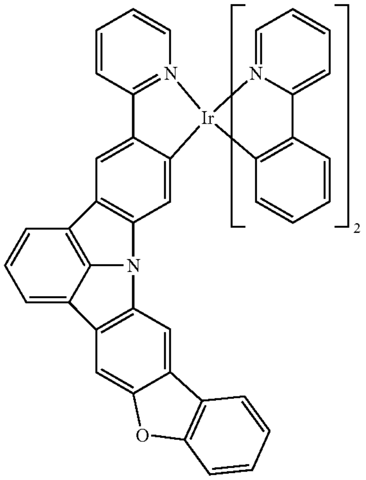
107
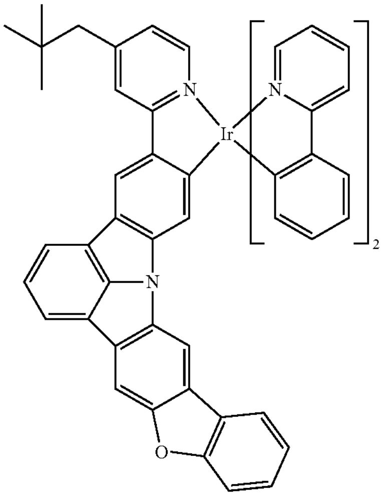

-continued
108
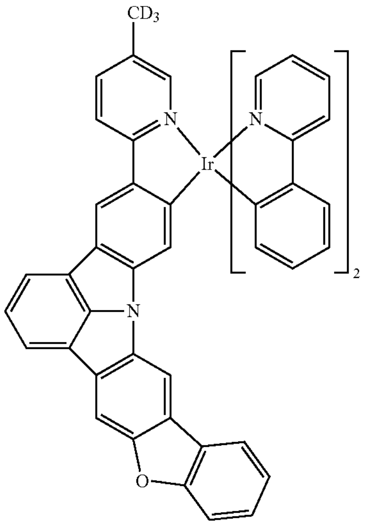
109
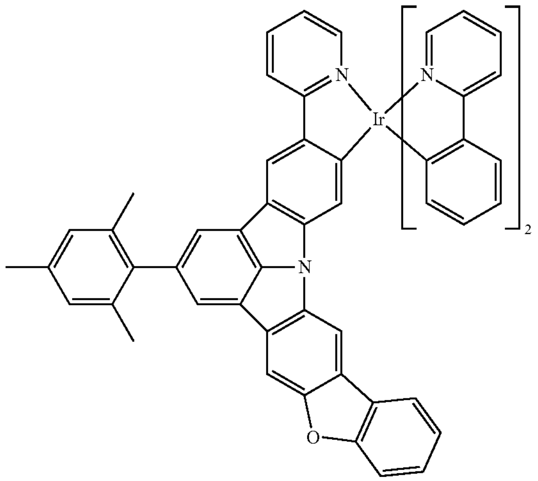
110
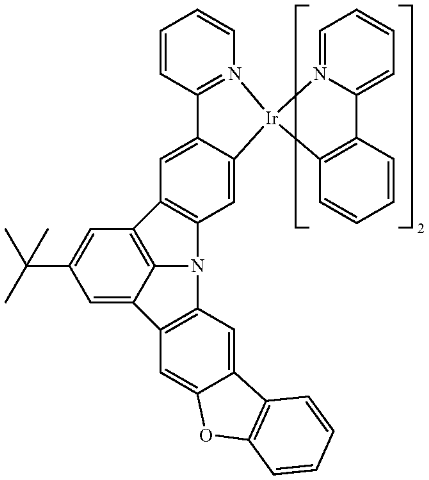
-continued
111
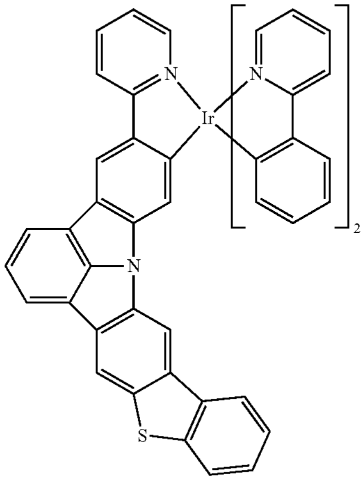
112
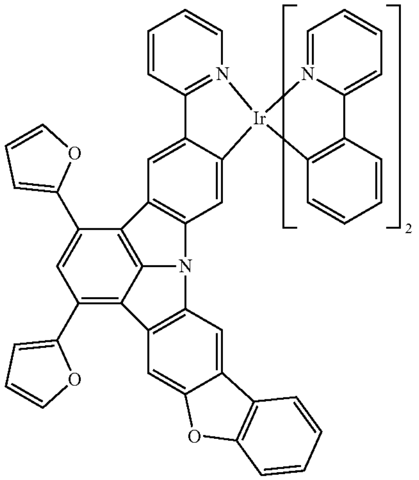
113
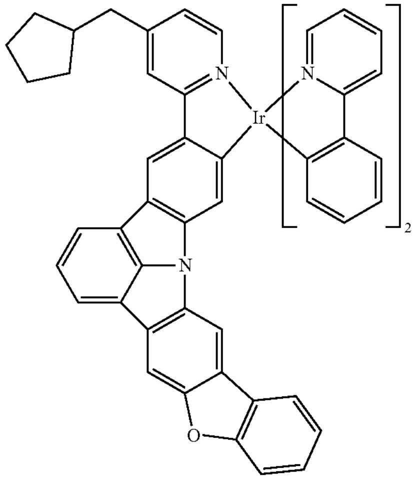

-continued
114
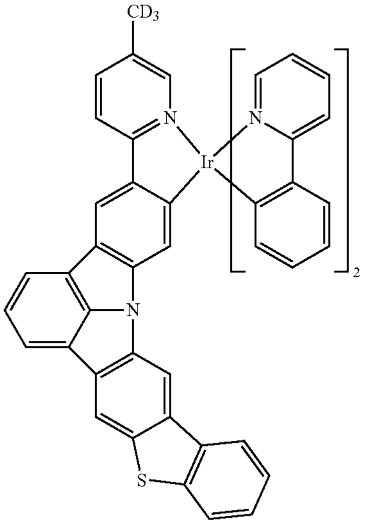
115
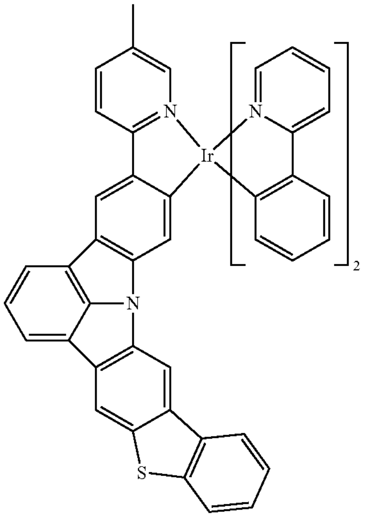
116
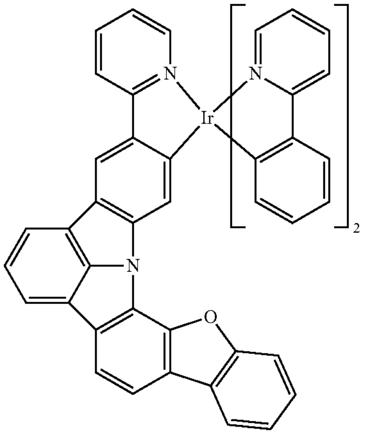
-continued
117
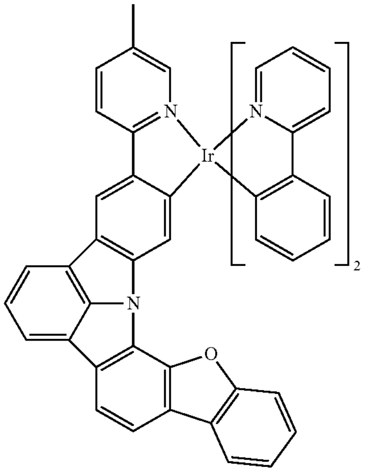
118
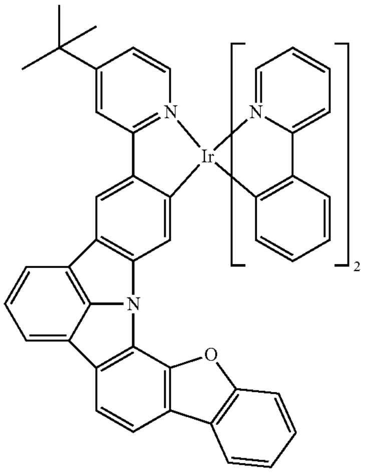
119
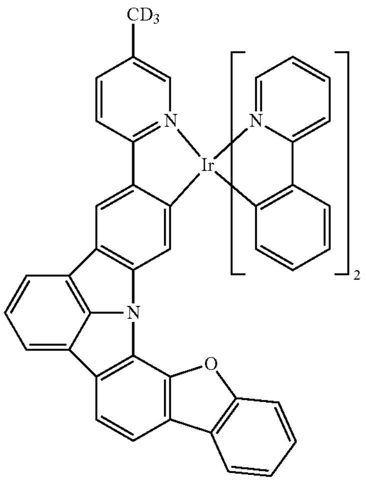

-continued
120
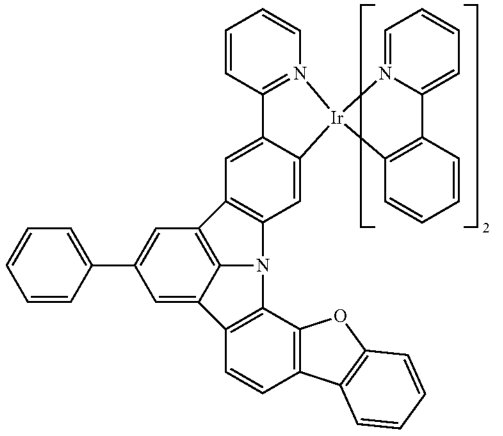
121
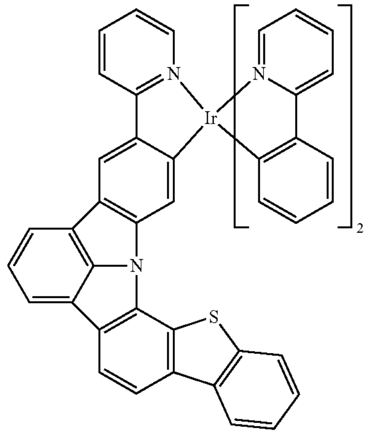
122
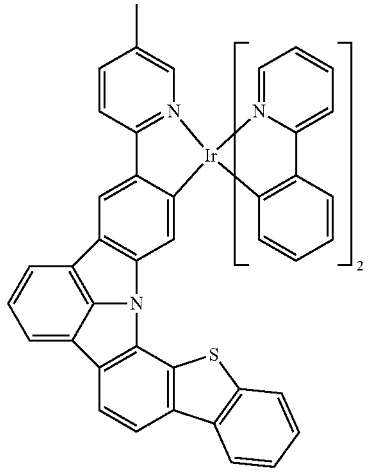
-continued
123
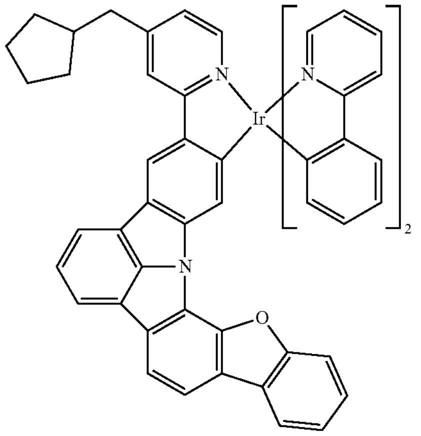
124
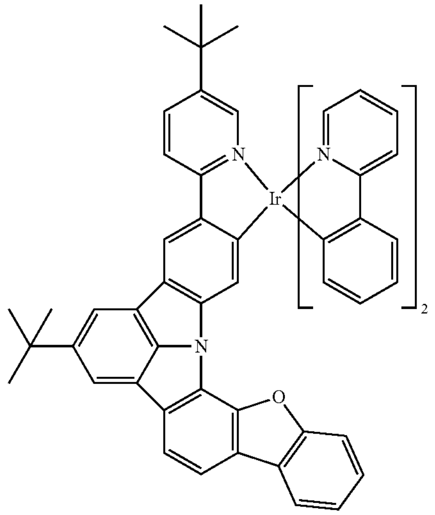
125
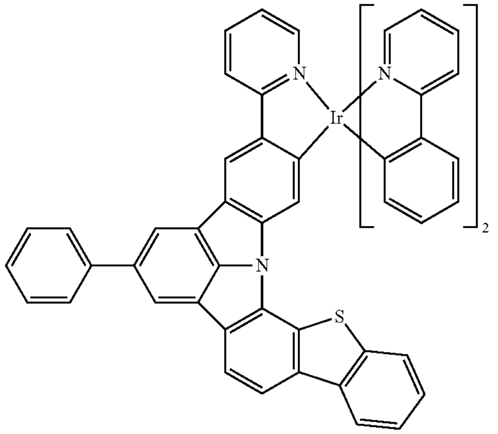

126
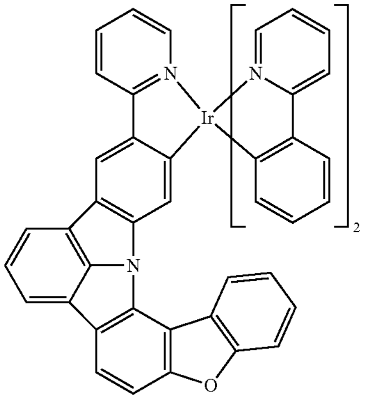
127
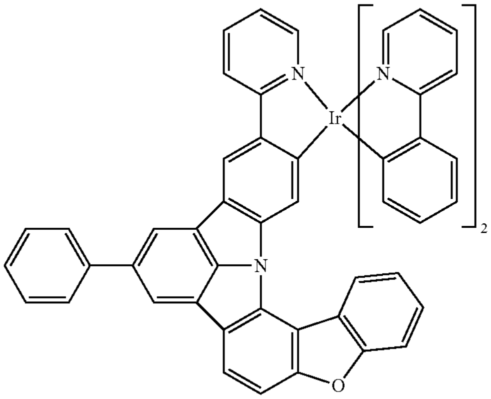
128
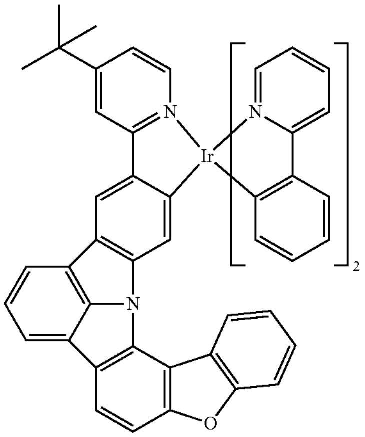
129
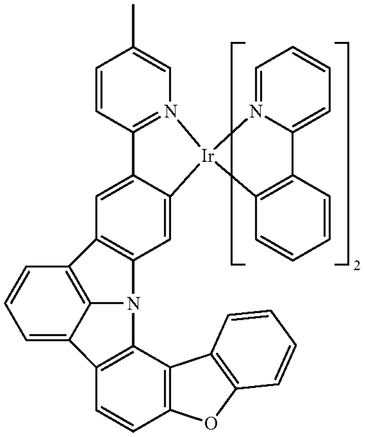
130
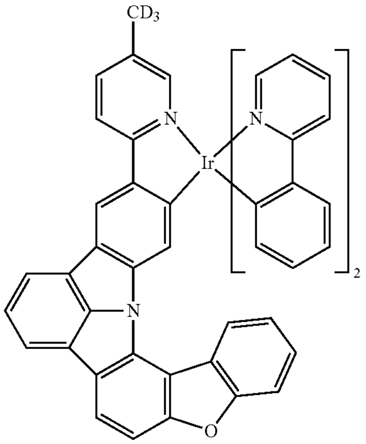
131
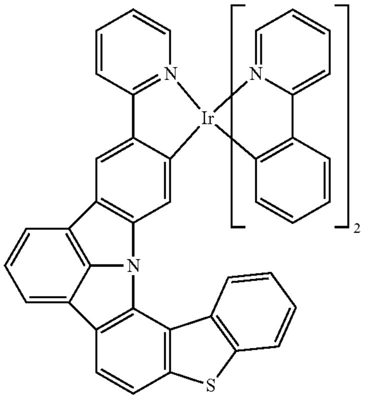

-continued
132
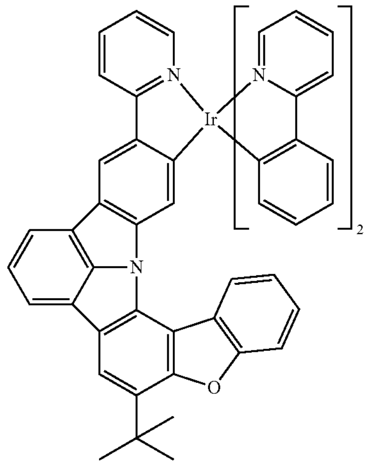
133
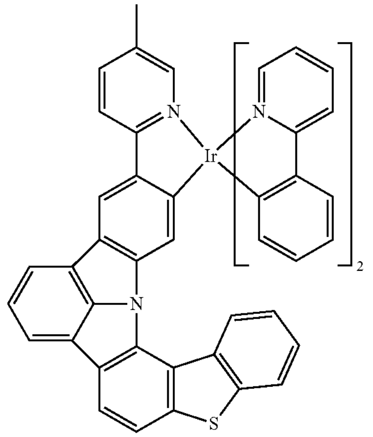
134
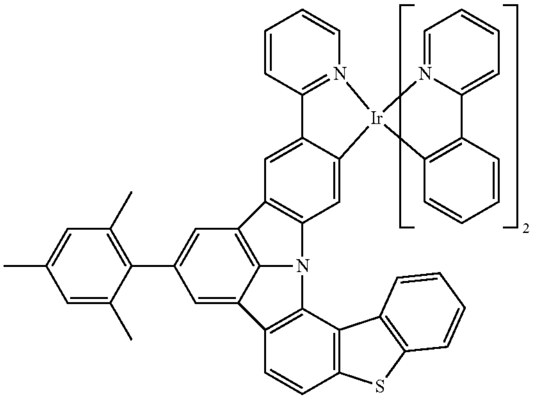
-continued
135
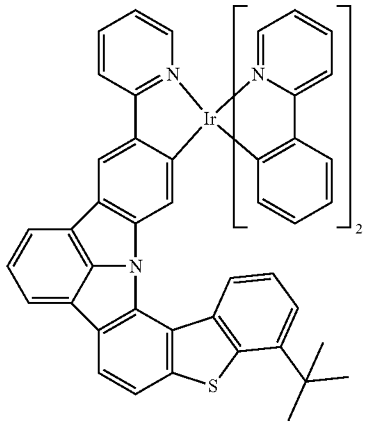
136
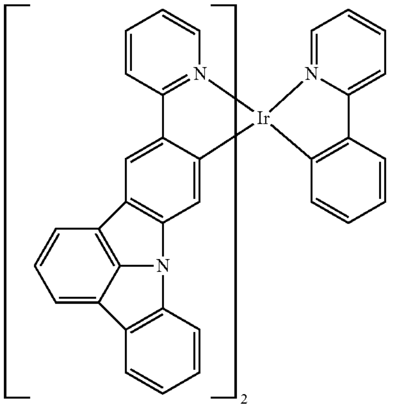
137
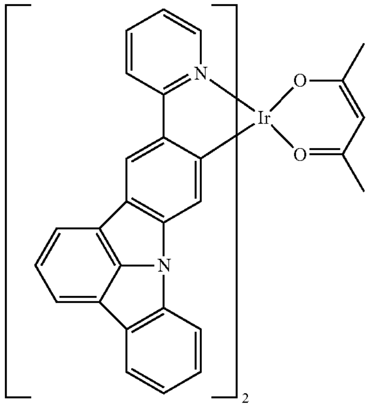

138
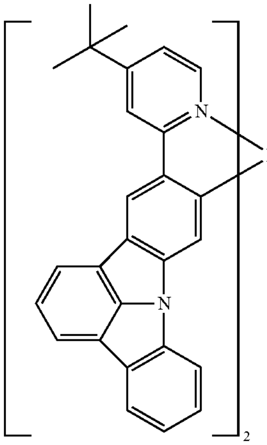
139
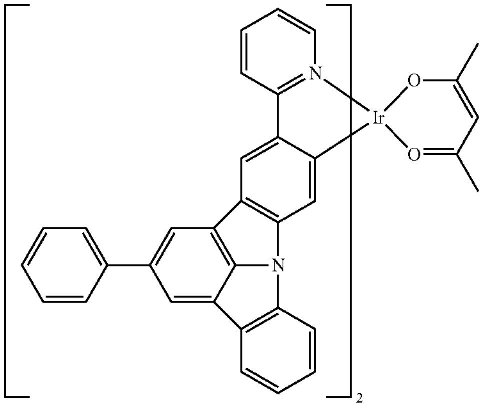
140
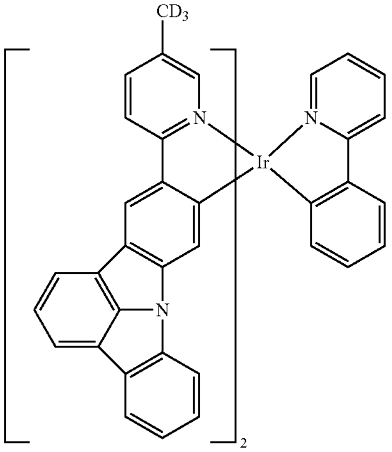
141
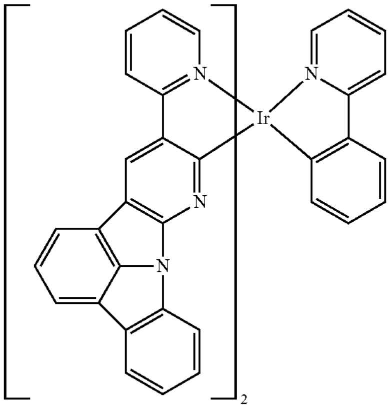
142
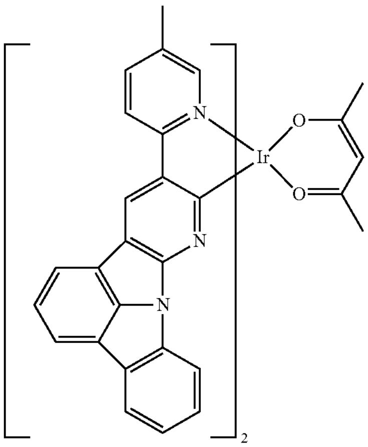
143
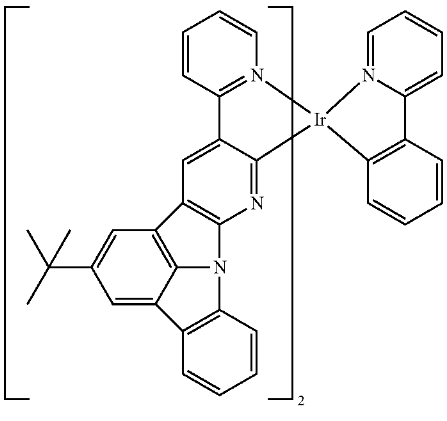

-continued
144
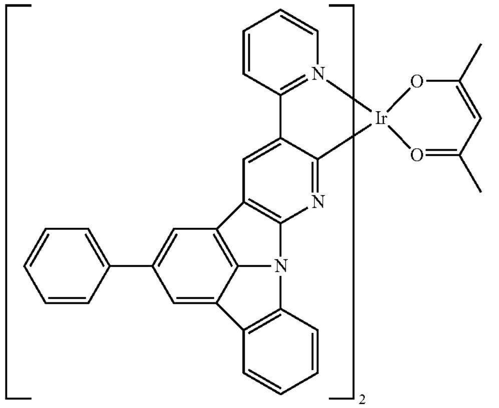
145
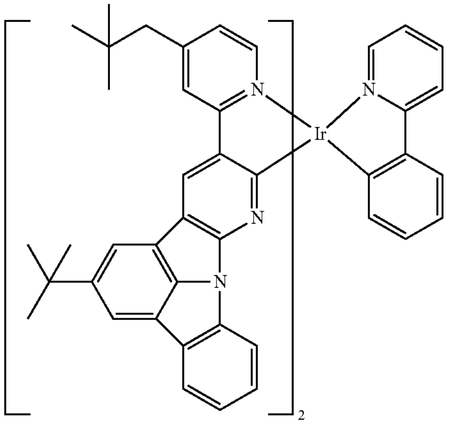
146
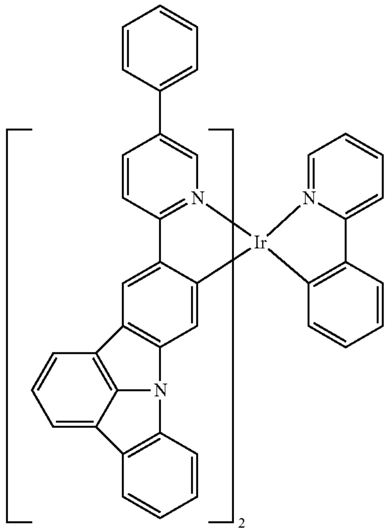
-continued
147
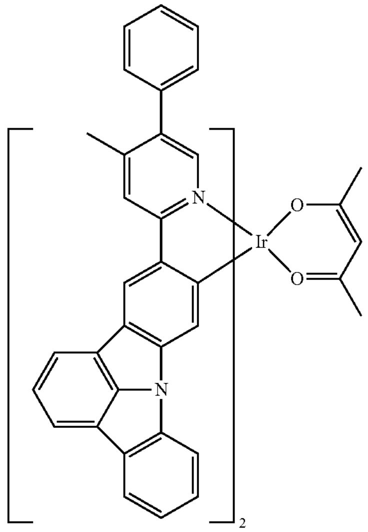
148
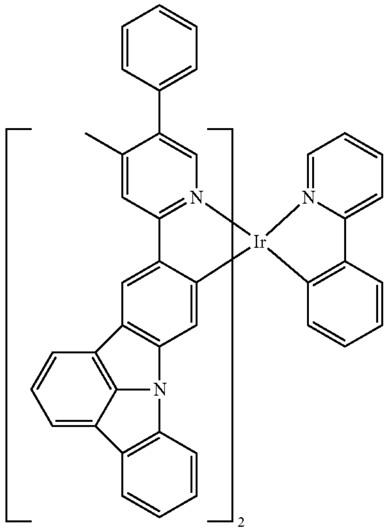
149
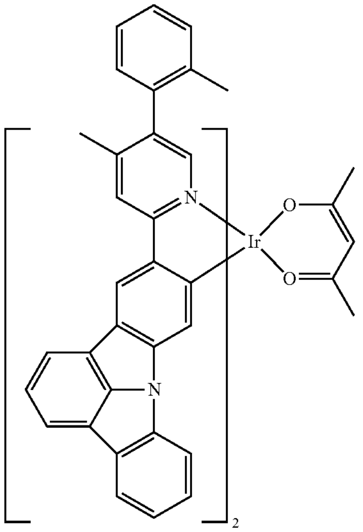

-continued
150
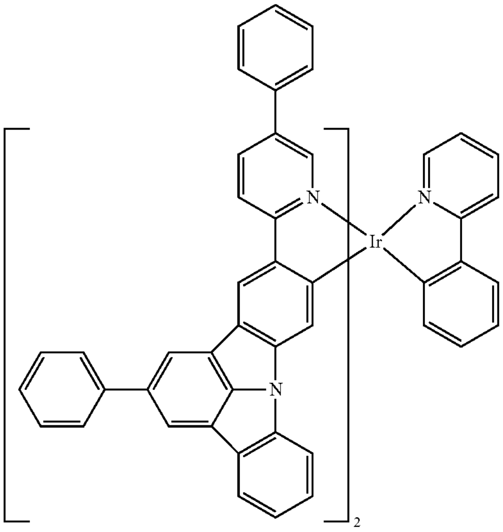
151
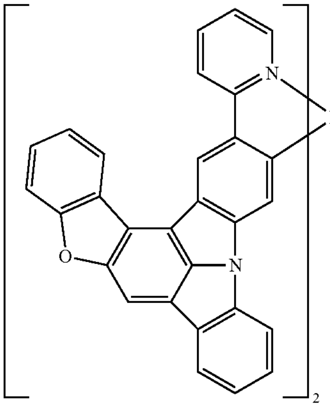
152
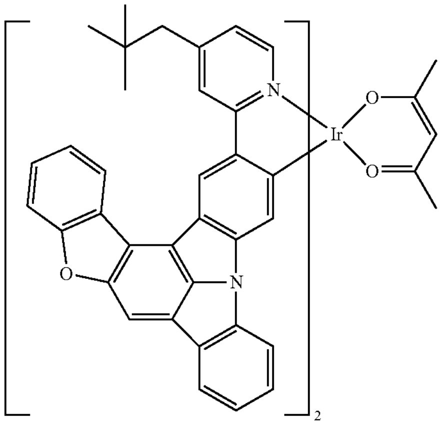
-continued
153
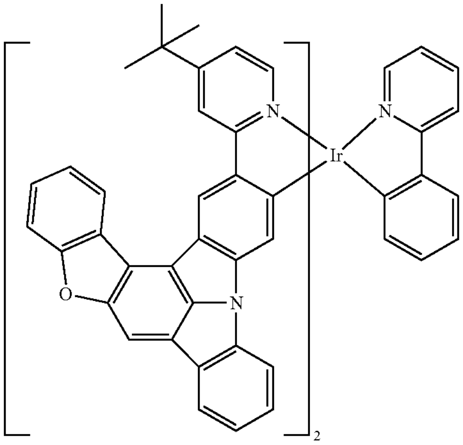
154
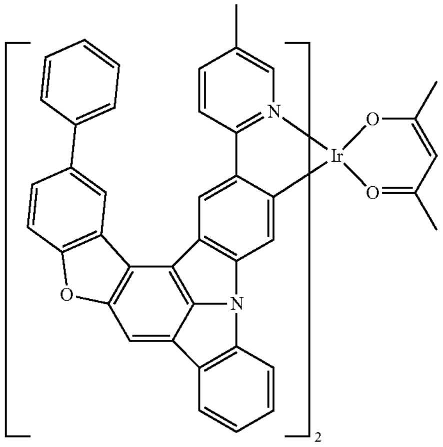
155
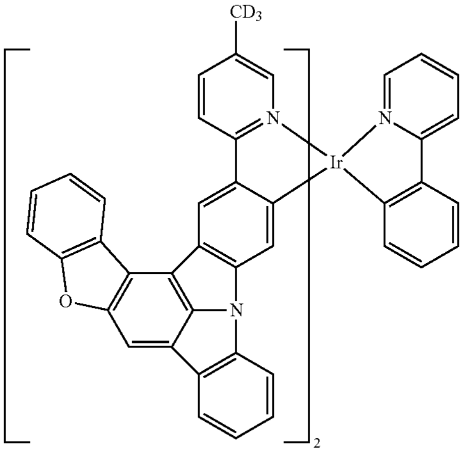

-continued
156
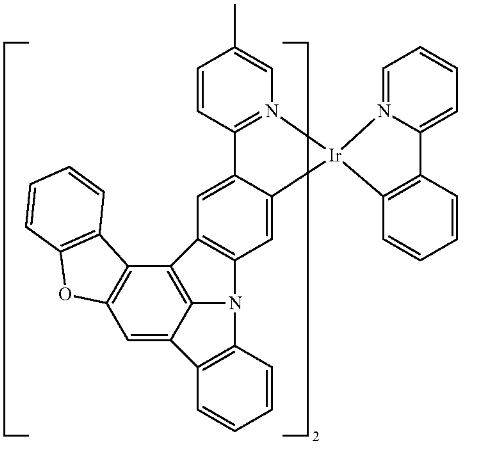
157
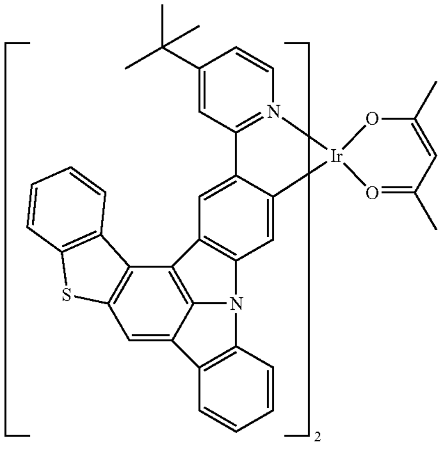
158
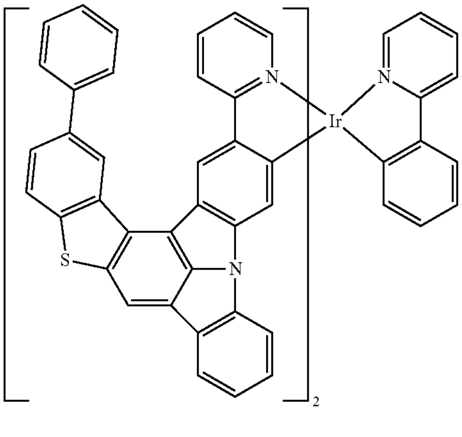
-continued
159
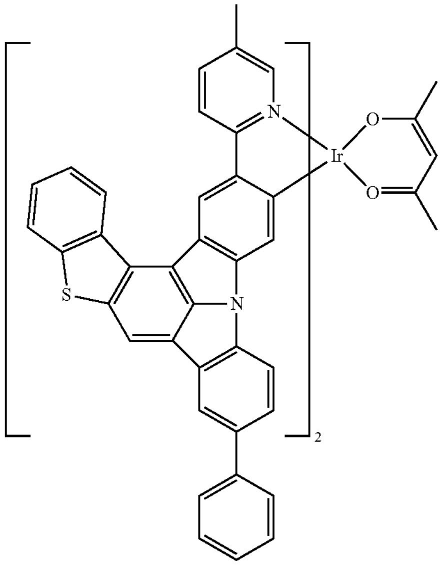
160
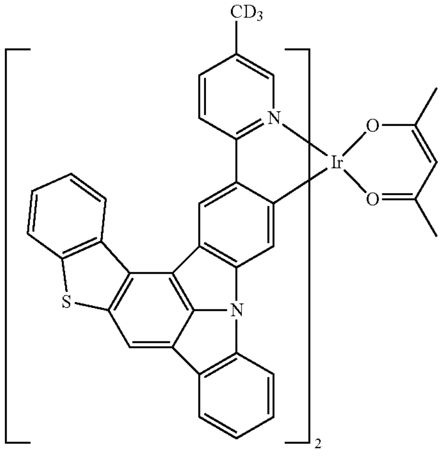
161
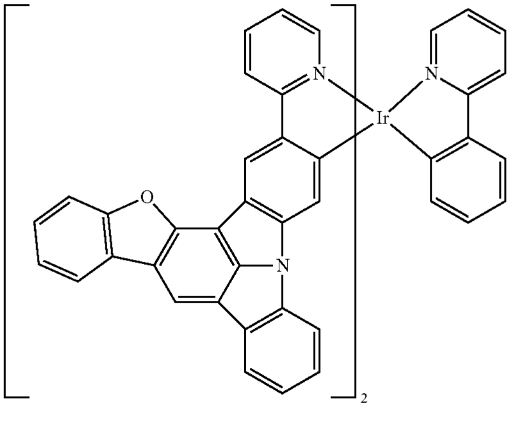

162
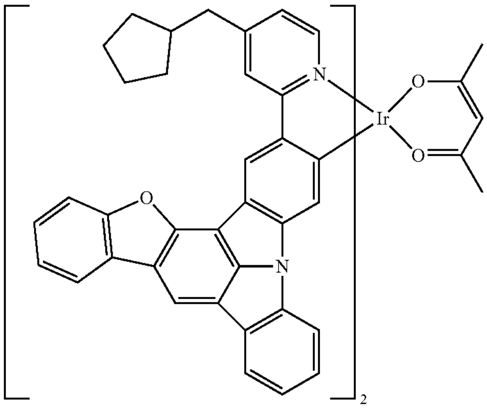
163
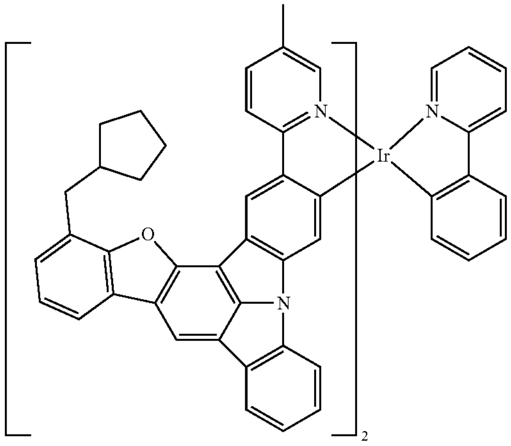
164
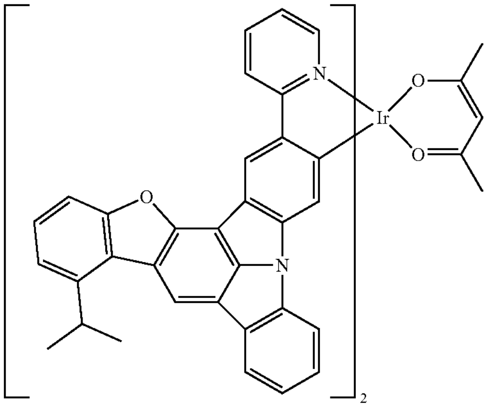
165
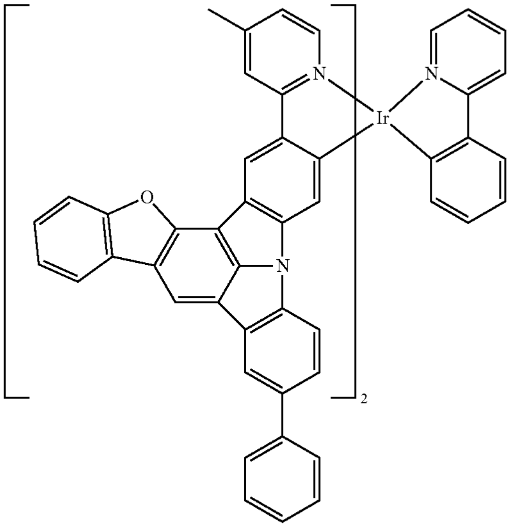
166
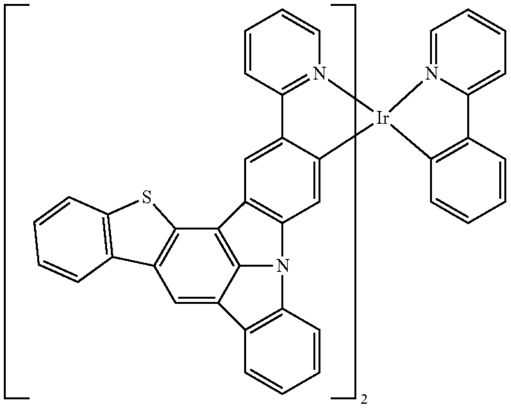
167
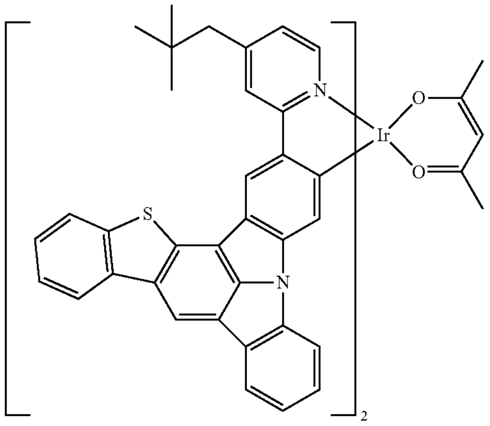

-continued
168
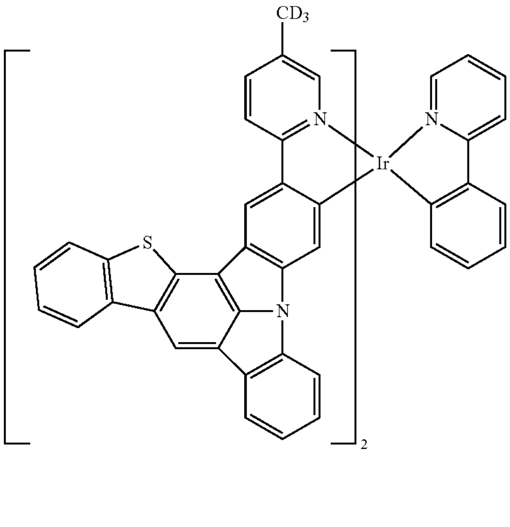
169
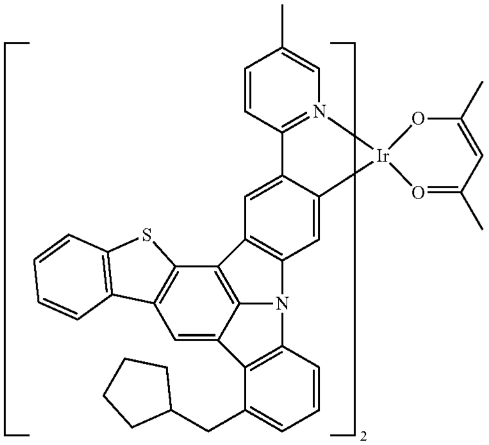
170
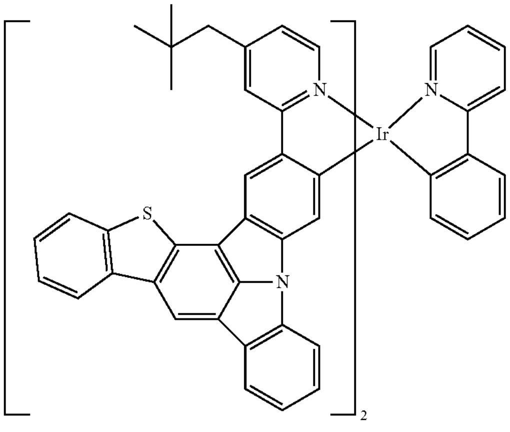
-continued
171
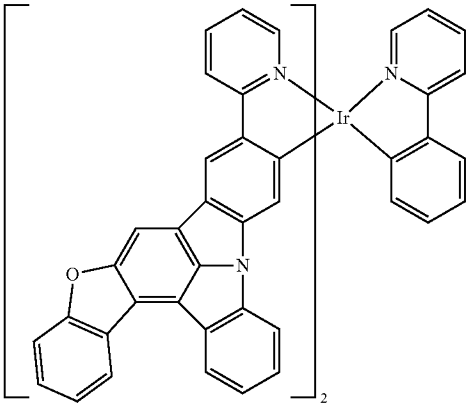
172
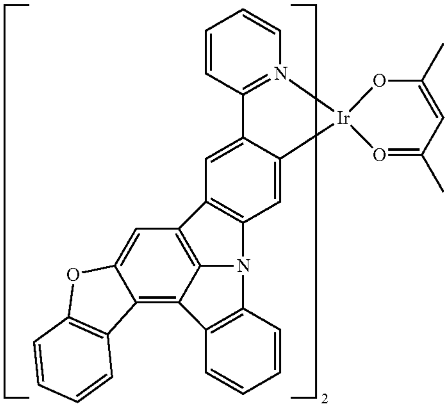
173
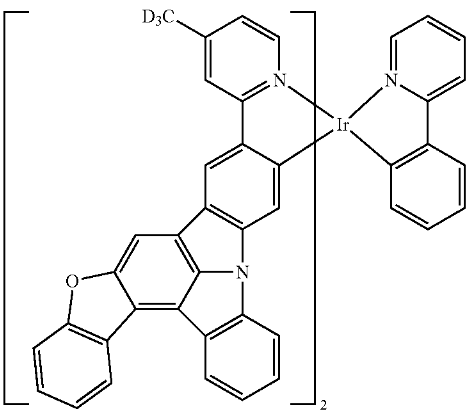

-continued
174
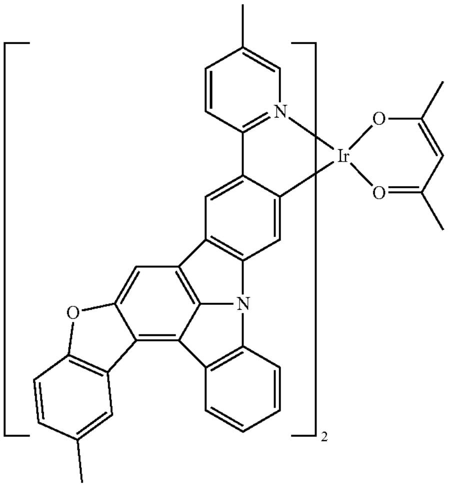
175
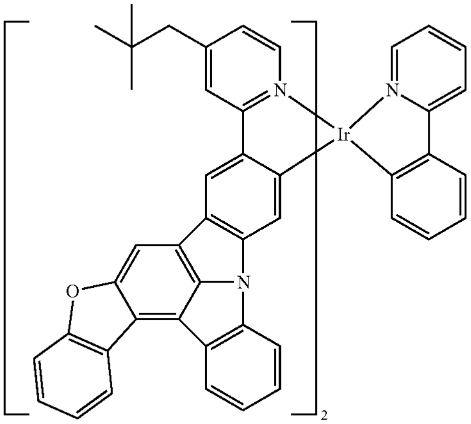
176
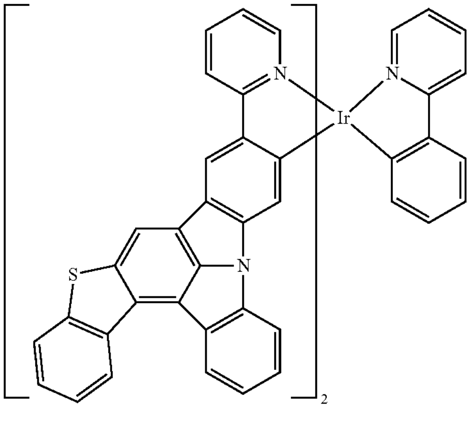
-continued
177
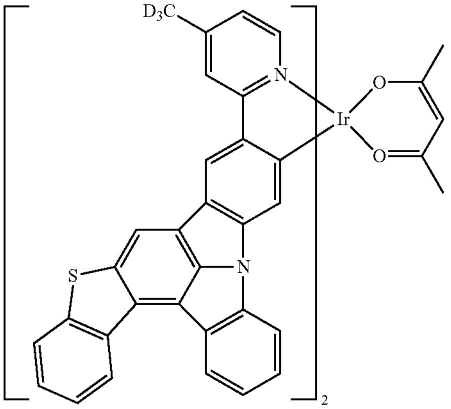
178
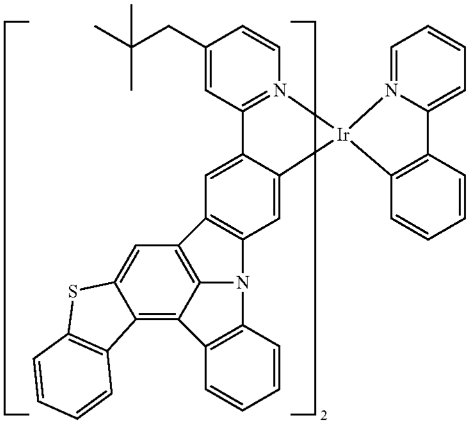
179
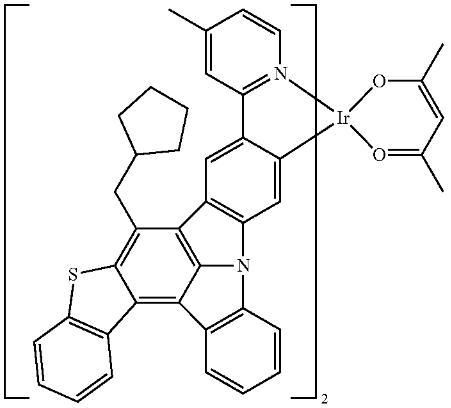

-continued
180
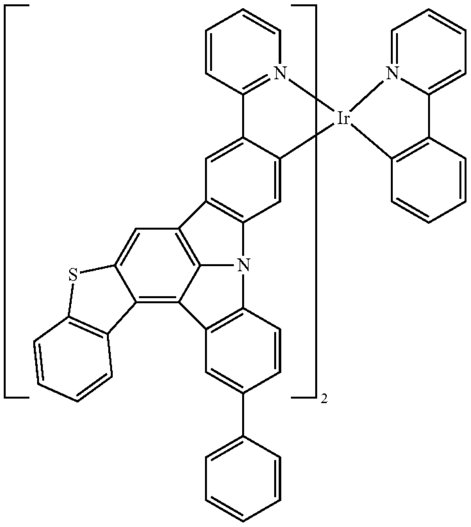
181
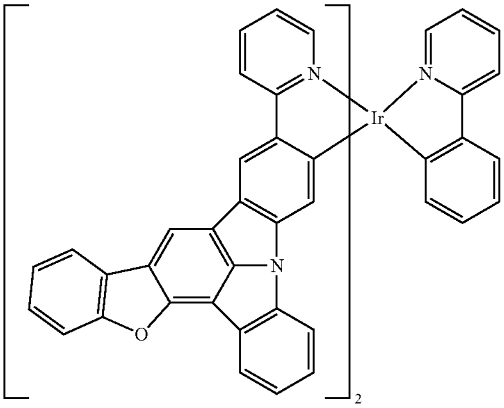
182
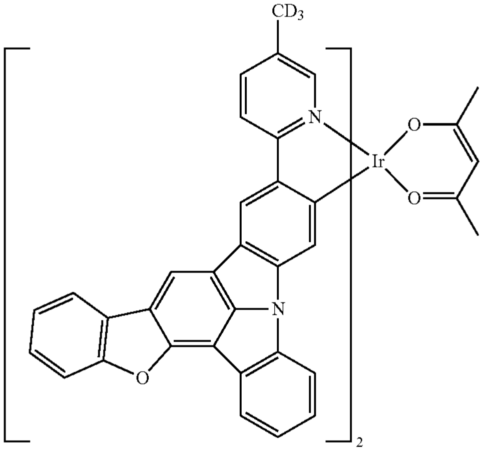
-continued
183
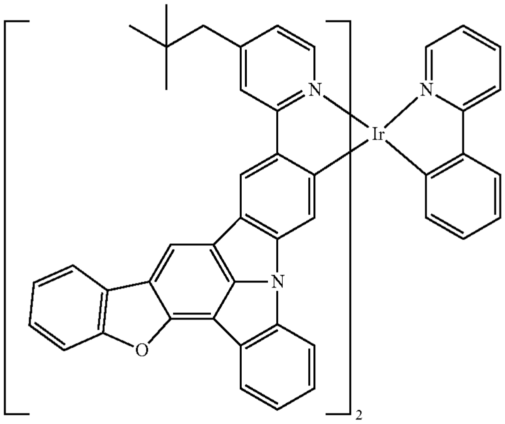
184
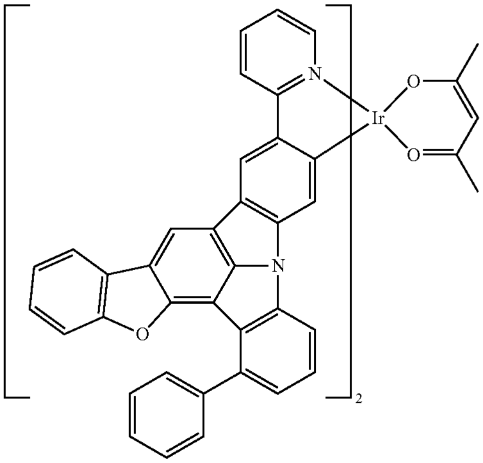
185
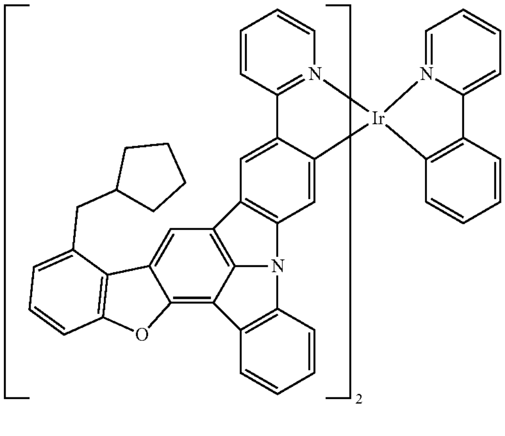

-continued
186
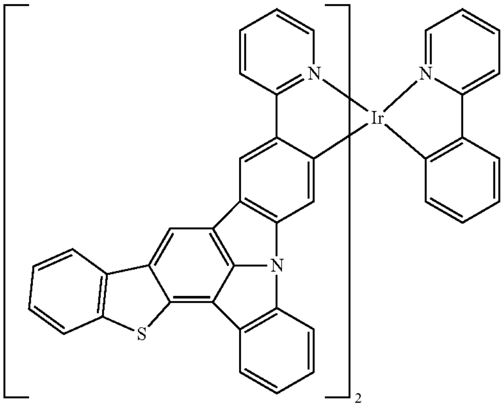
187
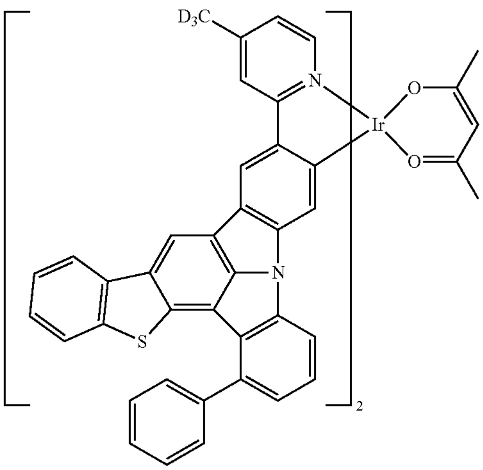
188
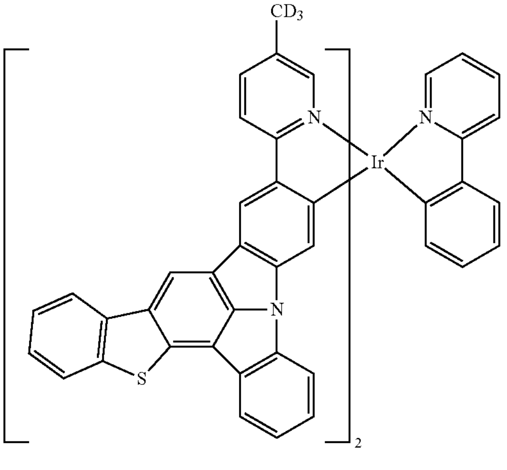
-continued
189
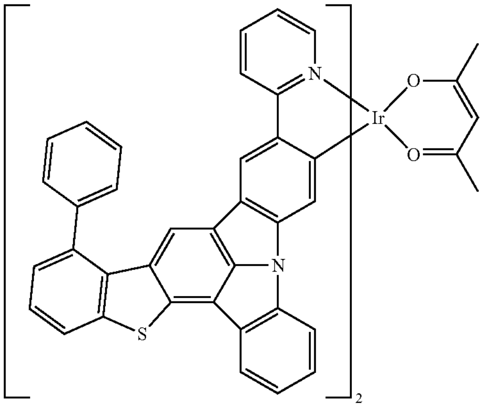
190
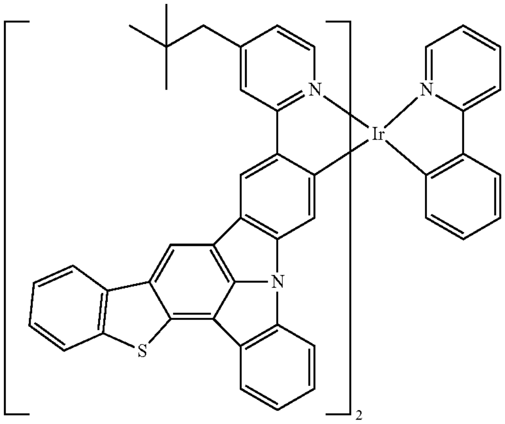
191
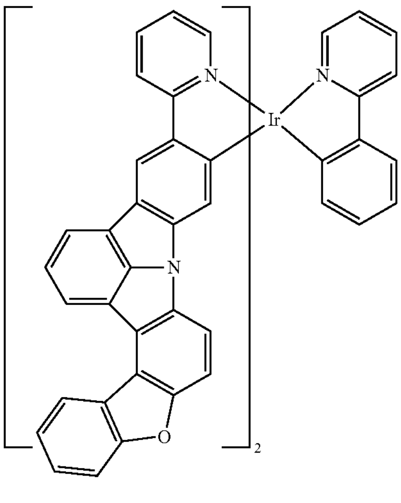

-continued
192
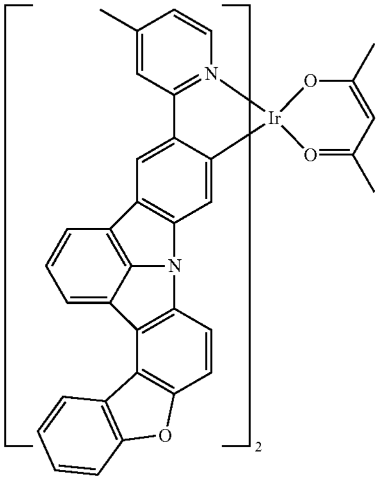
193
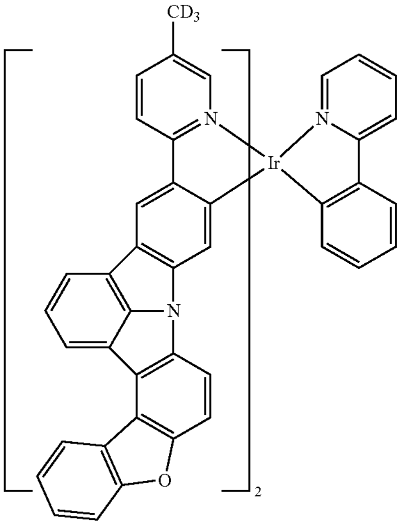
194
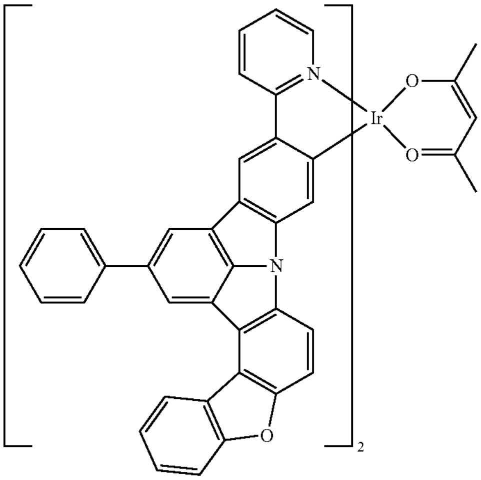
-continued
195
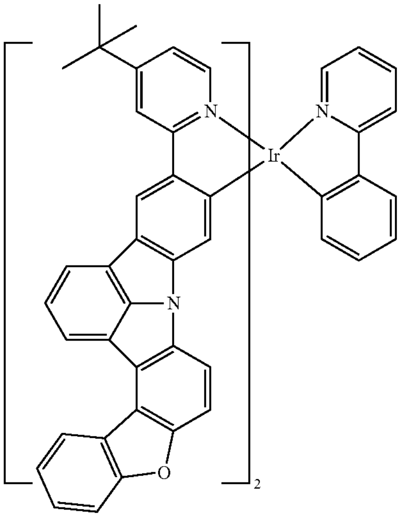
196
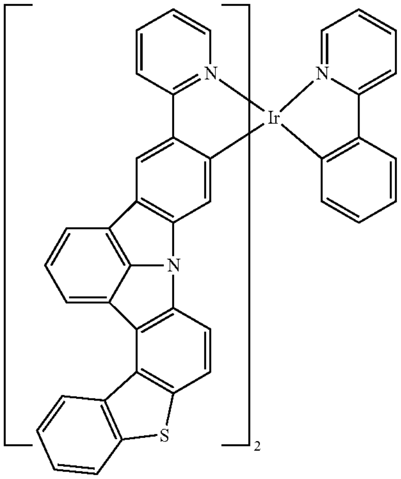
197
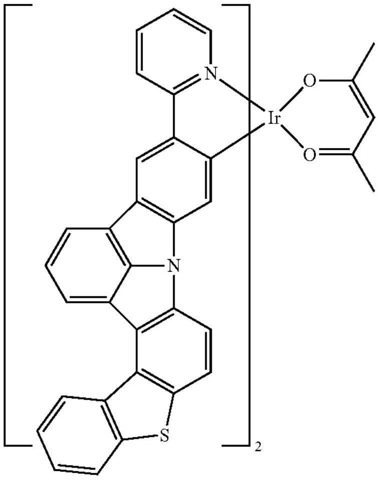

-continued
198
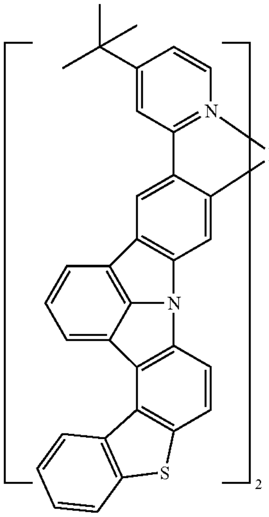
199
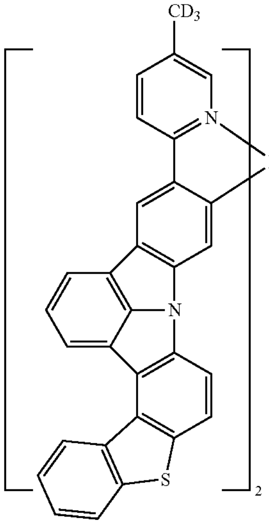
200
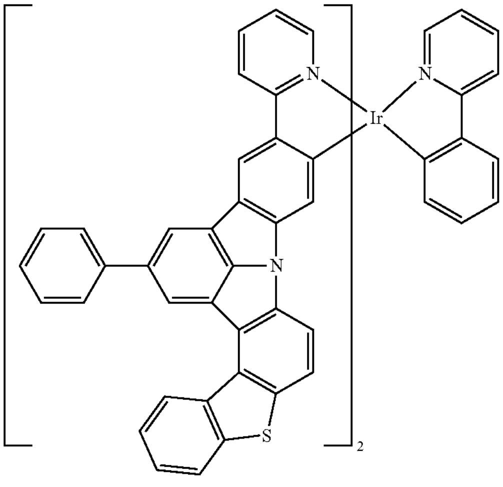
-continued
201
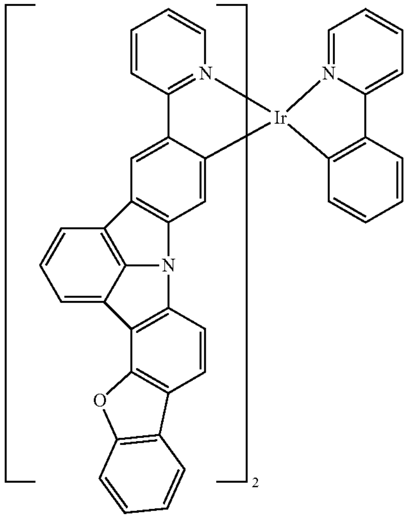
202
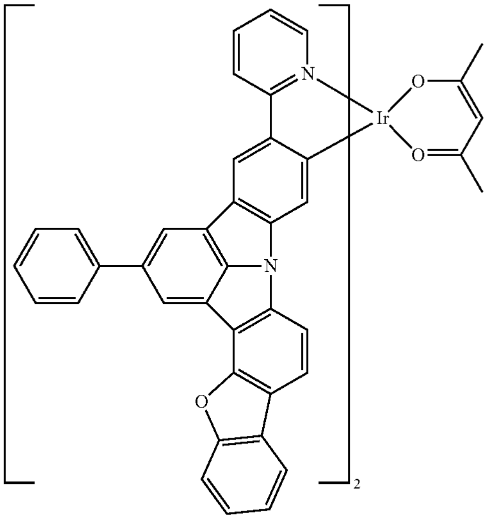
203
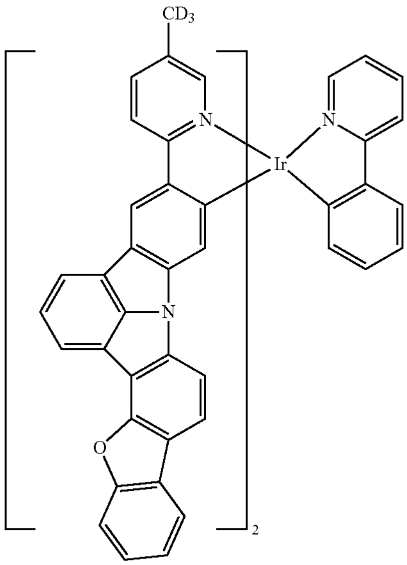

-continued
204
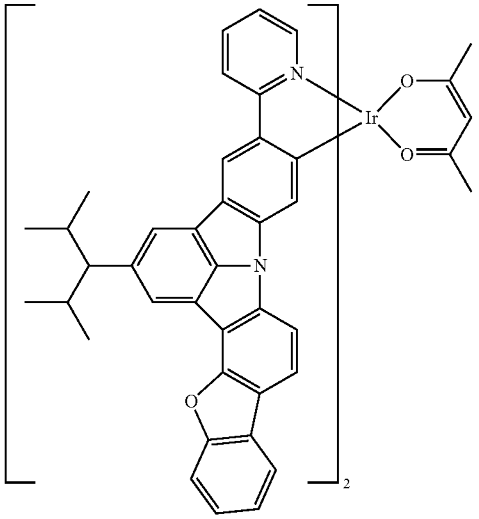
205
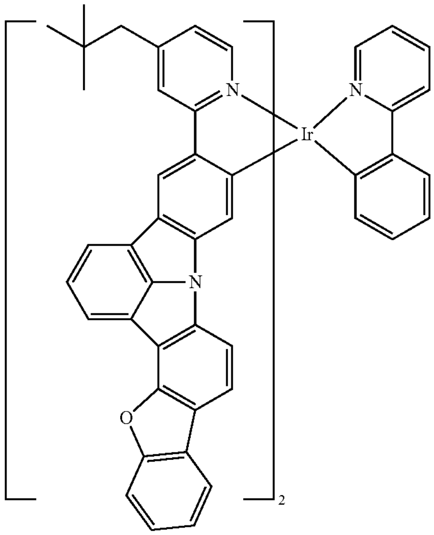
206
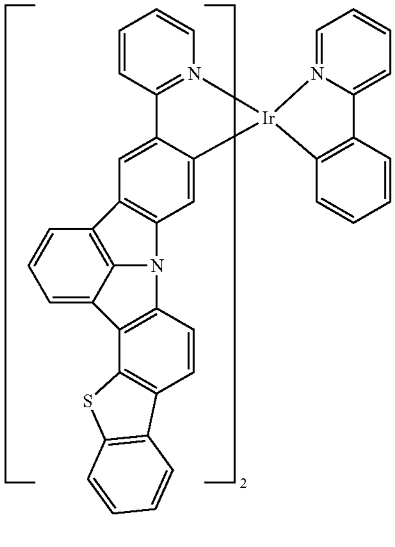
-continued
207
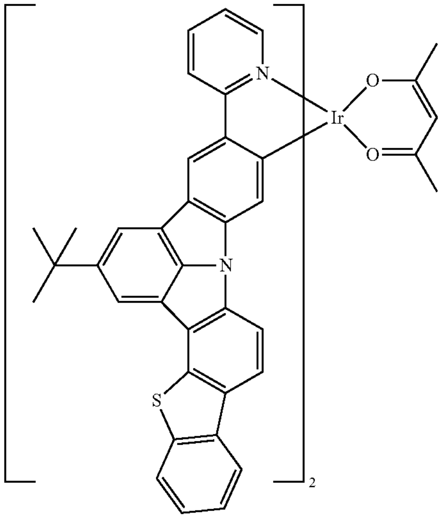
208
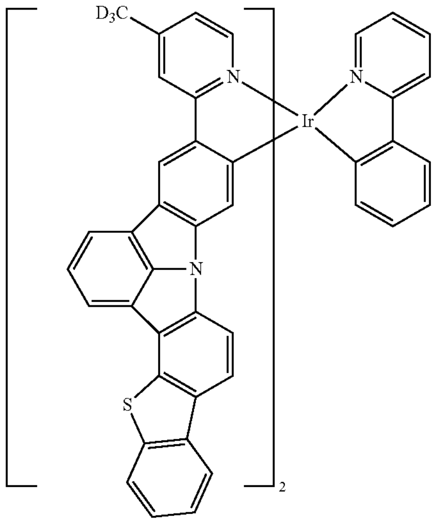
209
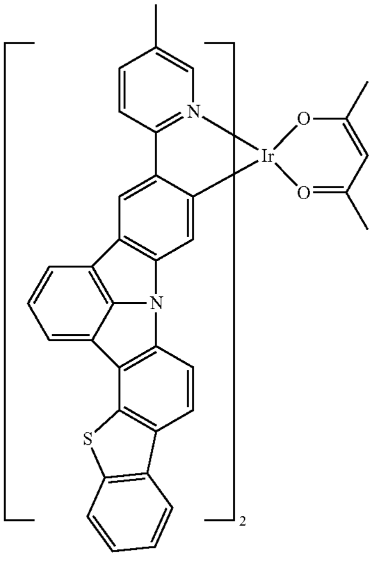

-continued
210
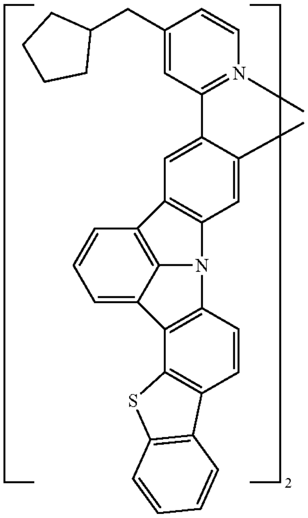
211
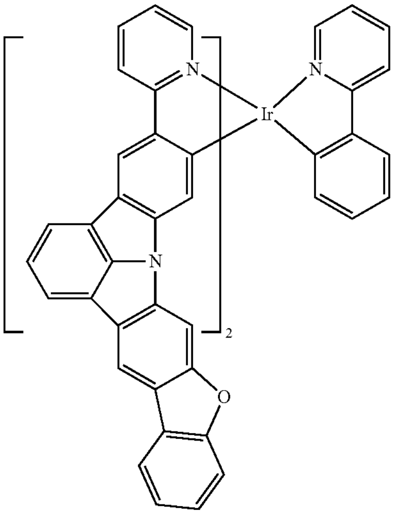
212
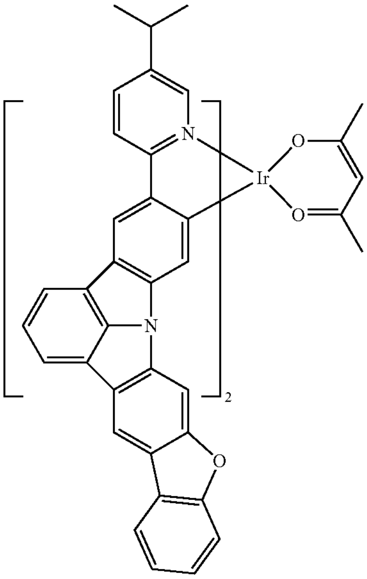
-continued
213
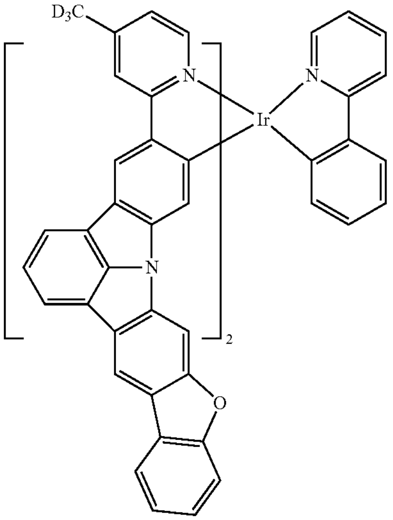
214
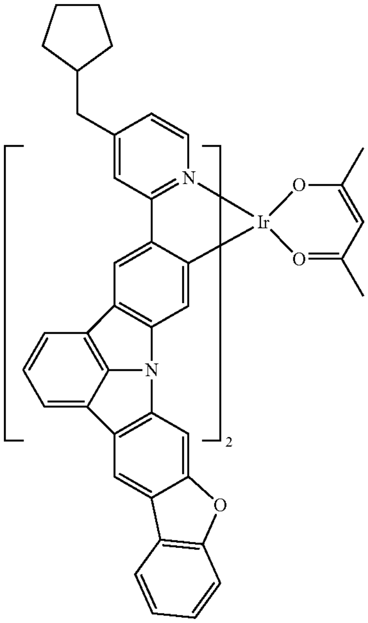
215
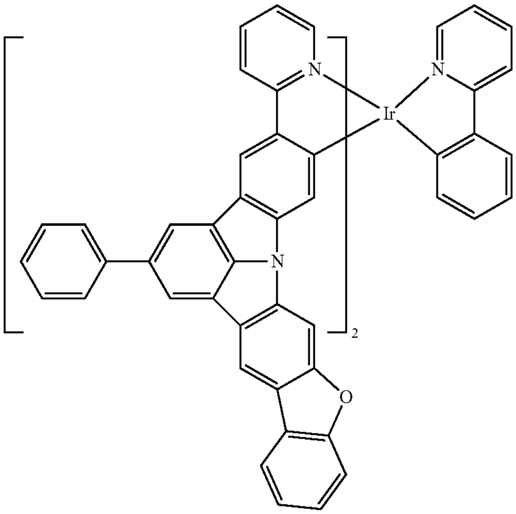

-continued
216
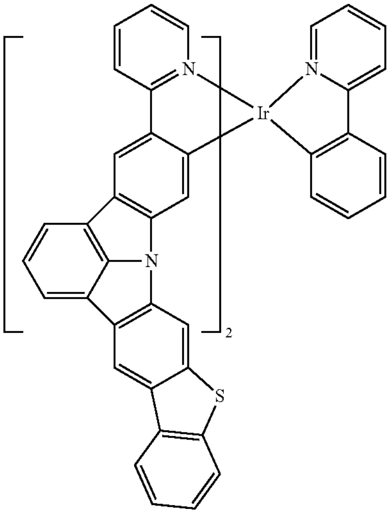
217
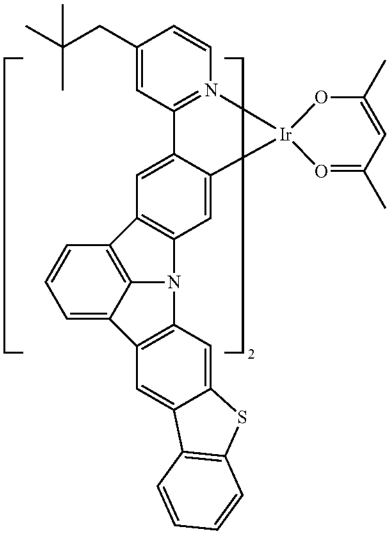
218
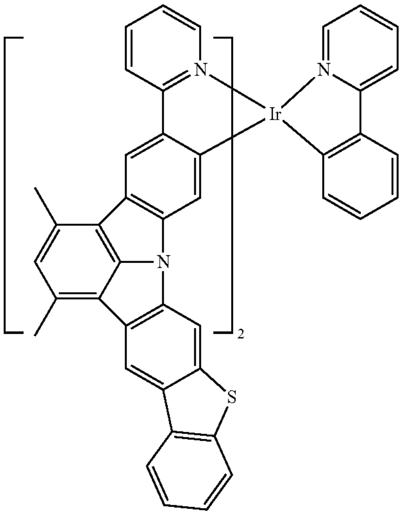
-continued
219
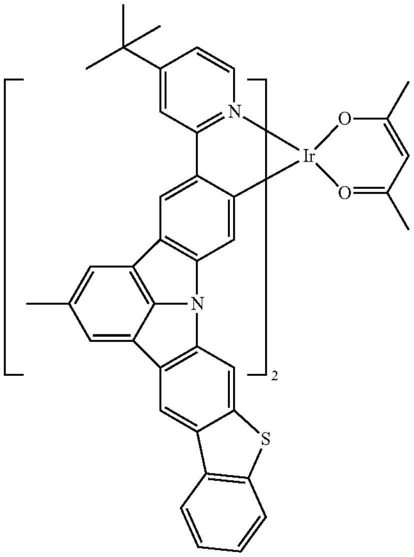
220
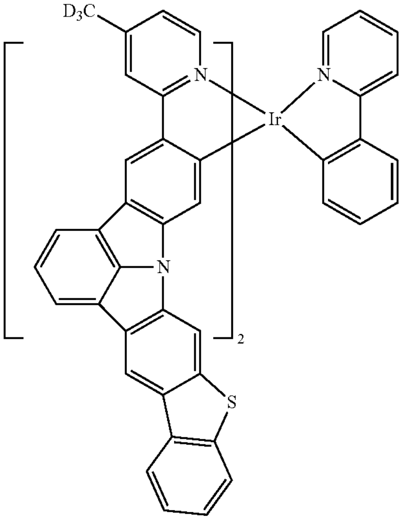
221
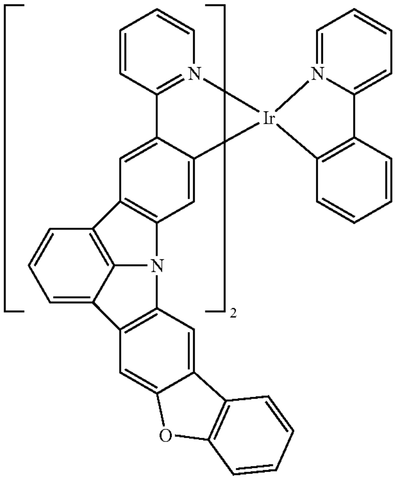

-continued
222
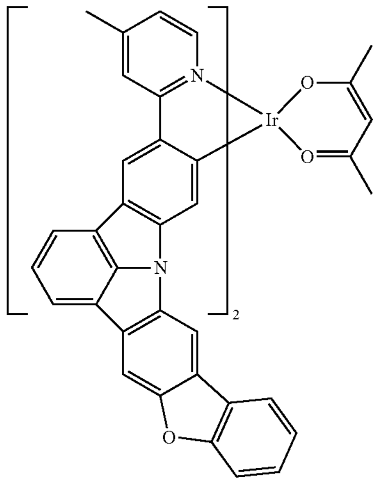
223
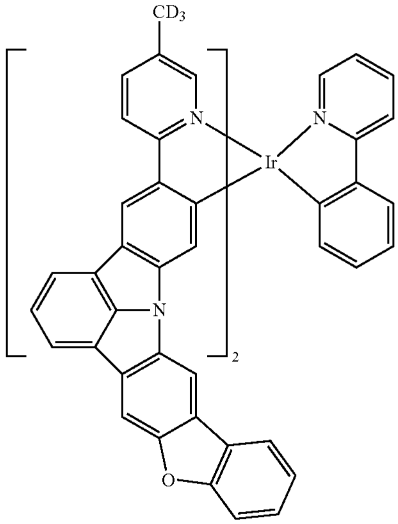
224
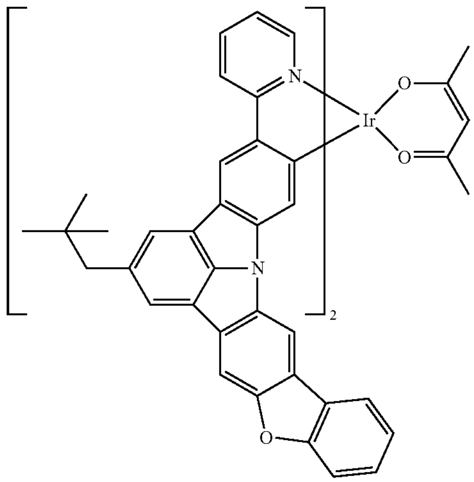
-continued
225
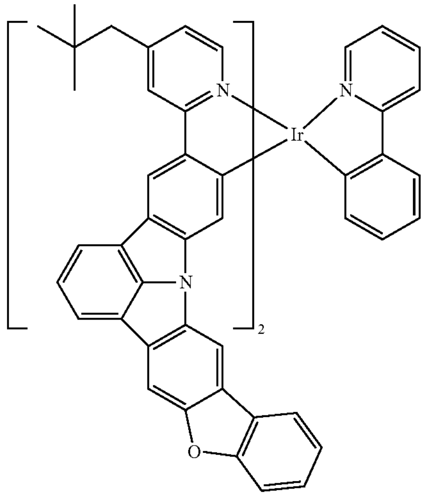
226
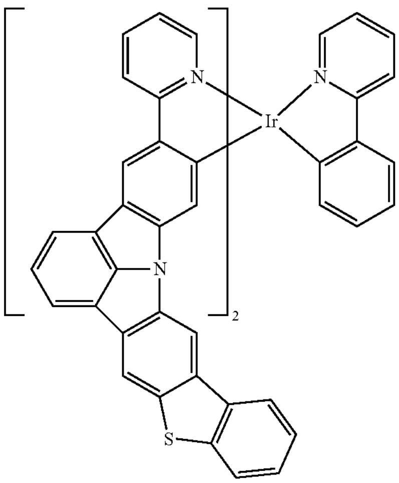
227
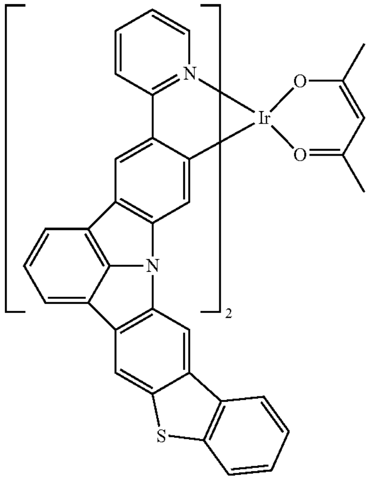

-continued
228
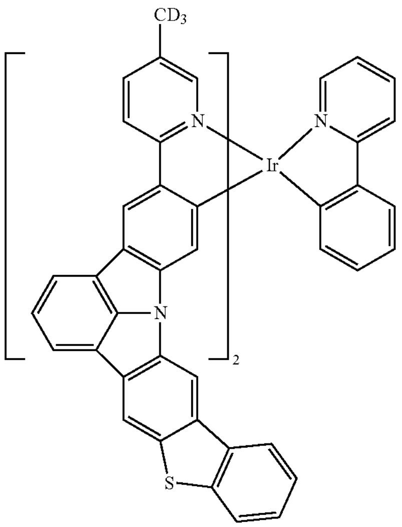
229
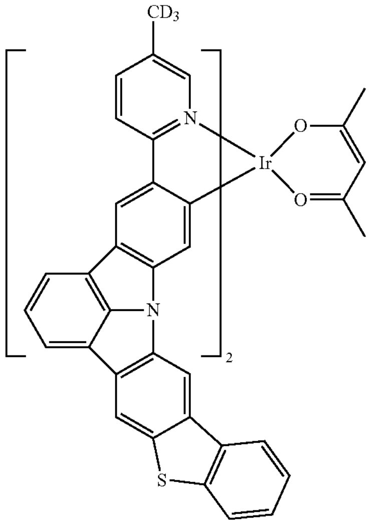
230
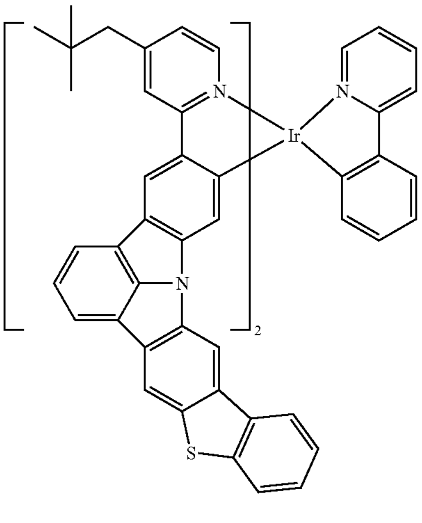
-continued
231
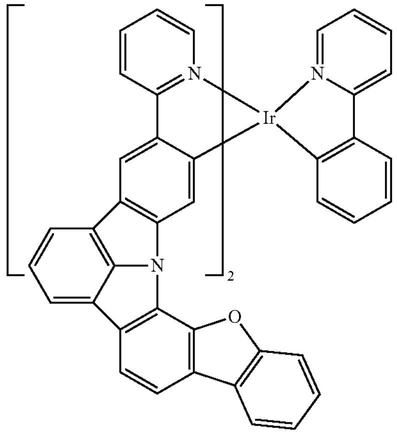
232
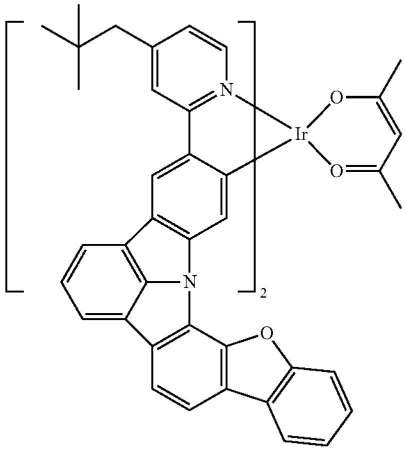
233
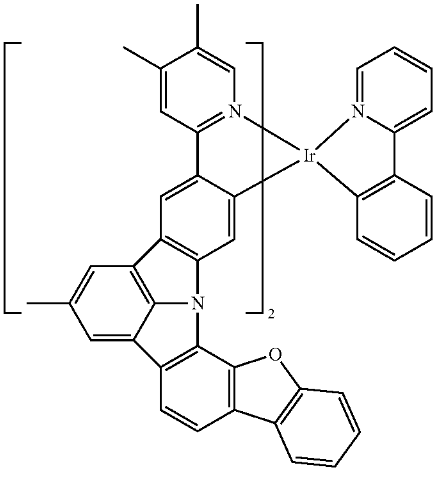

-continued
234
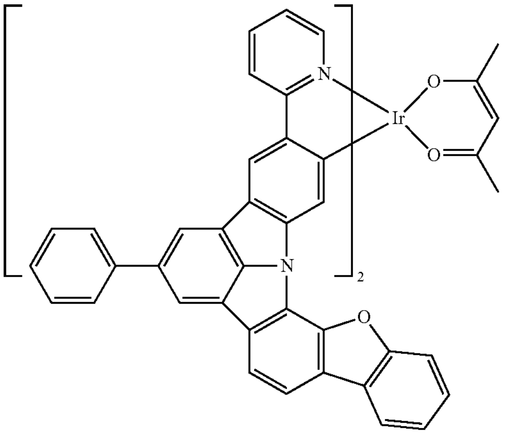
235
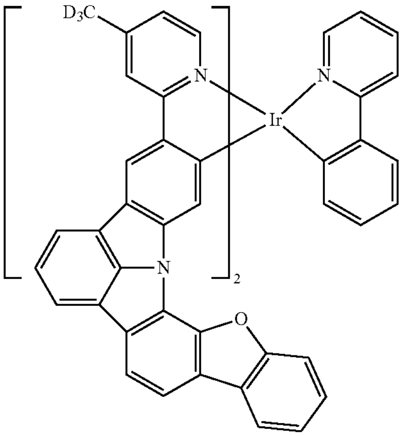
236
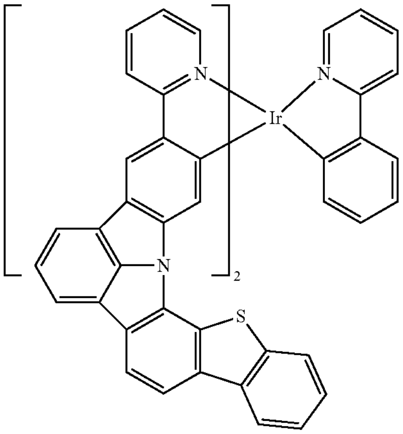
-continued
237
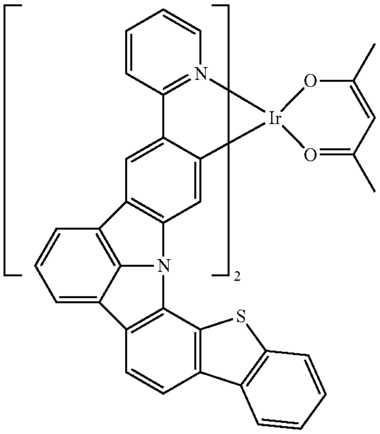
238
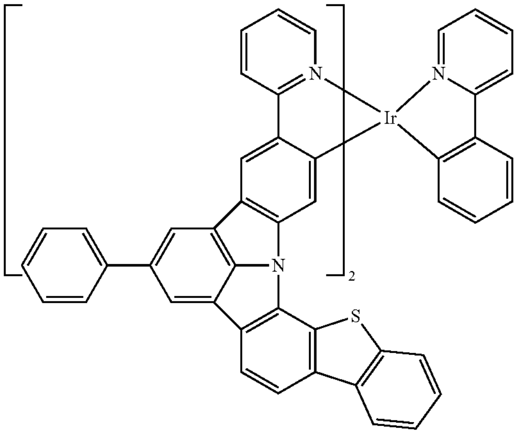
239
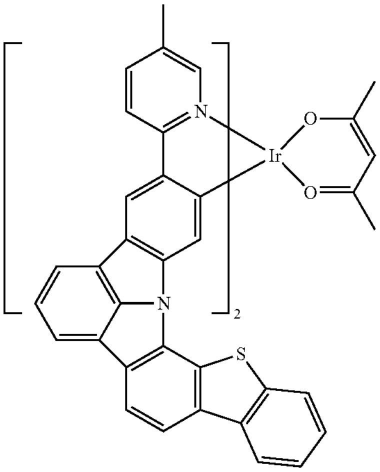

-continued
240
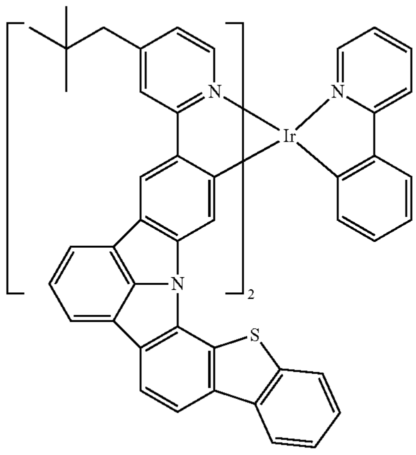
241
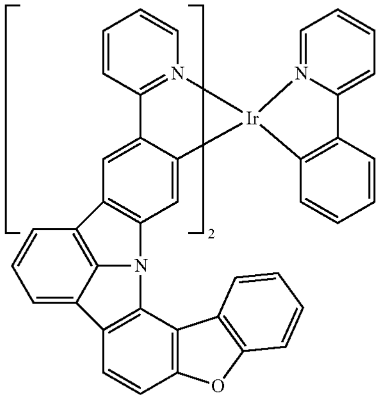
242
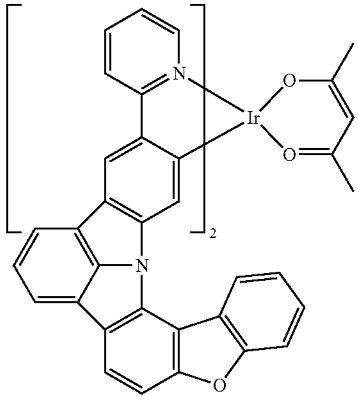
-continued
243
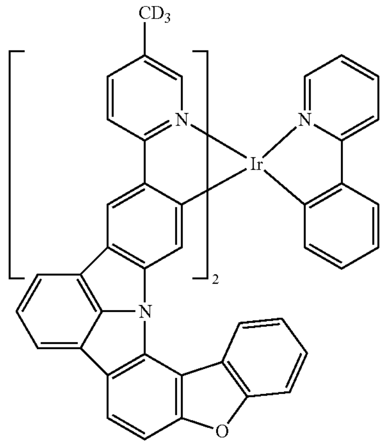
244
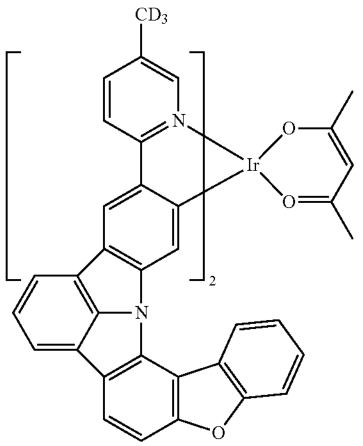
245
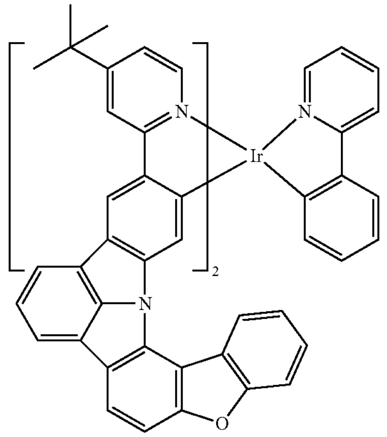

-continued
246
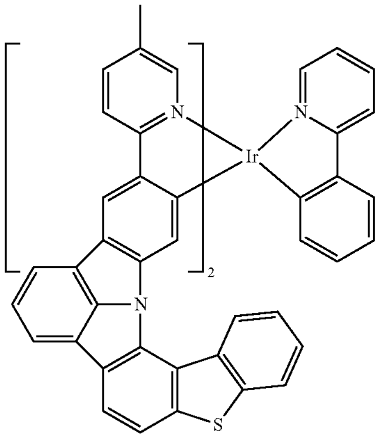
247
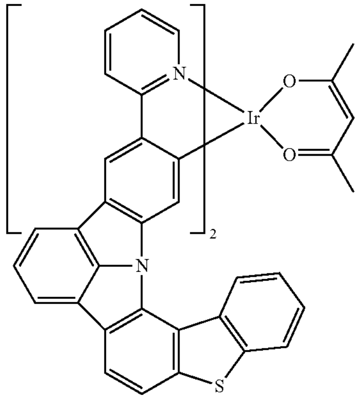
248
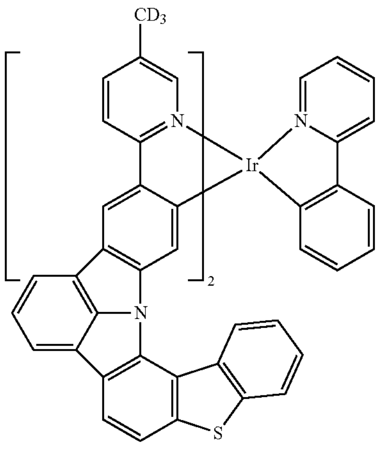
-continued
249
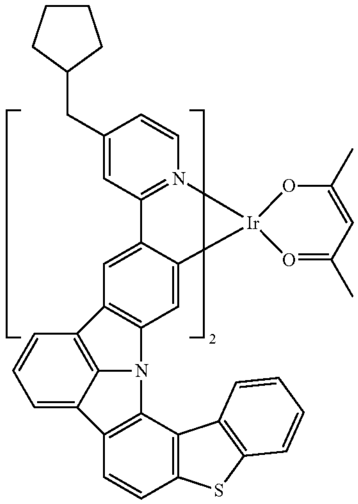
250
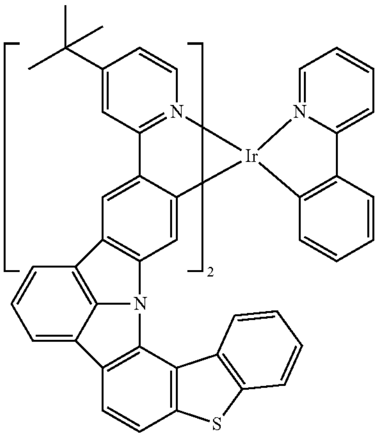
251
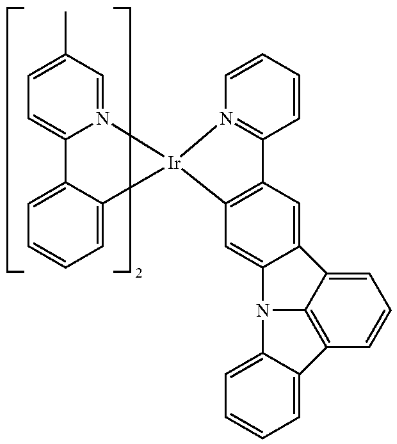

-continued
252
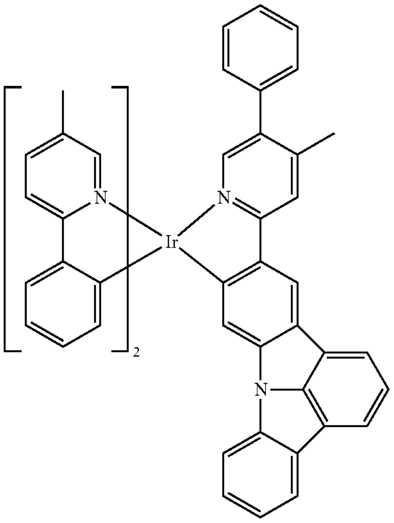
253
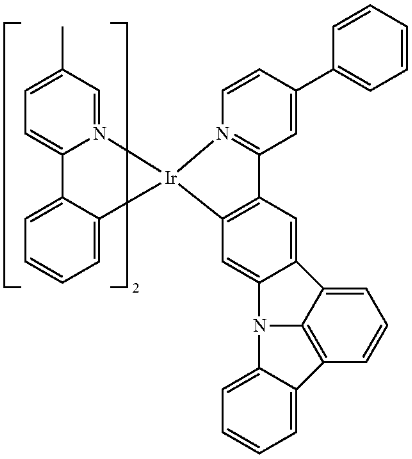
254
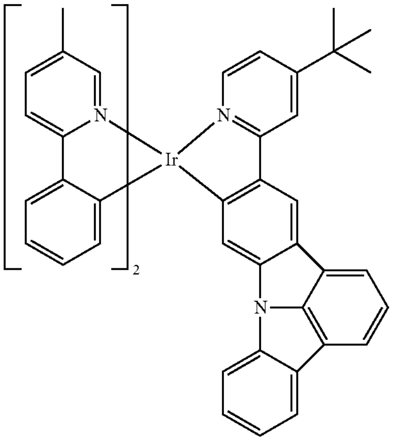
-continued
255
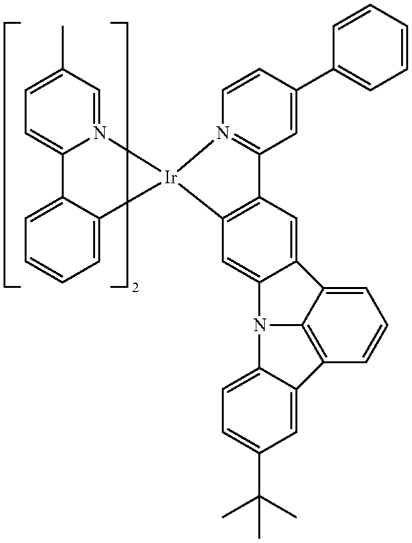
256
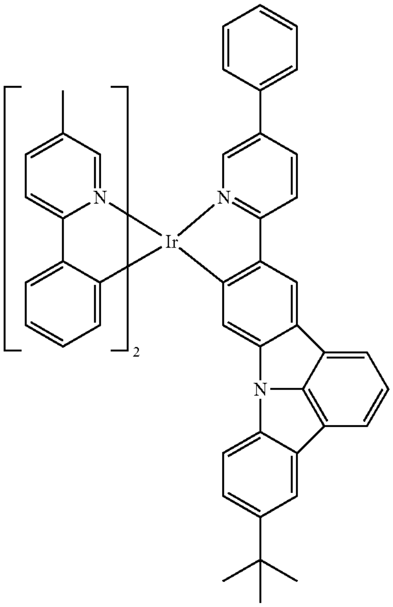

-continued

257

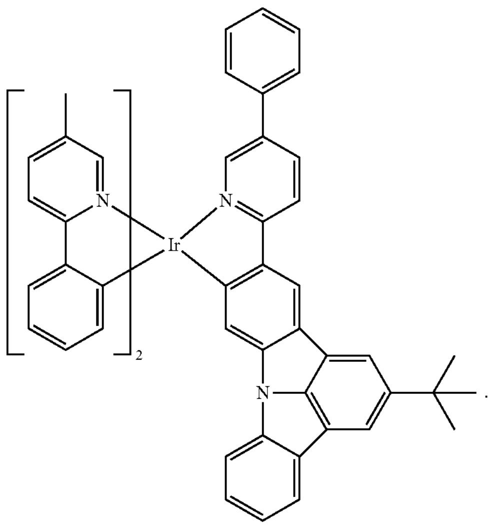

The organic metal compound having anyone of the structures of Formula 4A to Formula 6 includes a hetero aromatic ligand consisting of at least 5 rings, so it has a rigid chemical conformation. The organic metal compound can improve its color purity and luminous lifespan because it can maintain its stable chemical conformation in the emission process. In addition, since the organic metal compound may be a metal complex with bidentate ligands, it is possible to control the emission color purity and emission colors with ease. Accordingly, an organic light emitting diode has excellent luminous efficiency by applying the organic metal compound having the structure of Formulae 1 to 6 into an emissive layer.

The first host 344 may be a p-type host with relatively excellent hole affinity property. The first host 344 may be a (hetero) aryl-amine-based organic compound having the following structure of Formula 7:

[Formula 7]

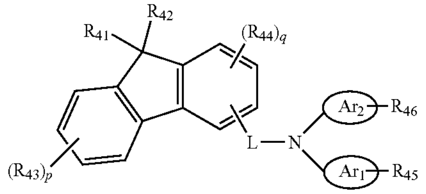

wherein, in Formula 7, each of $R_{41}$ and $R_{42}$ is independently hydrogen, deuterium, unsubstituted or substituted $C_1$-$C_{20}$ alkyl, unsubstituted or substituted $C_6$-$C_{30}$ aryl or unsubstituted or substituted $C_3$-$C_{30}$ hetero aryl, optionally, each substituent on the $C_6$-$C_{30}$ aryl and $C_3$-$C_{30}$ hetero aryl is independently unsubstituted or further substituted with at least one of $C_6$-$C_{30}$ aryl and $C_3$-$C_{30}$ hetero aryl, or $R_{41}$ and $R_{42}$ form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the $C_6$-$C_{30}$ aryl, $C_3$-$C_{30}$ hetero aryl, $C_6$-$C_{30}$ aryl amino and $C_3$-$C_{30}$ hetero aryl amino is independently unsubstituted or further substituted with at least one of $C_6$-$C_{30}$ aryl and $C_3$-$C_{30}$ hetero aryl, wherein each $R_{43}$ is identical to or different from each other when p is an integer of 2 or more and each $R_{44}$ is identical to or different from each other when q is an integer of 2 or more;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3.

In one exemplary aspect, each of the $C_6$-$C_{30}$ aryl and the $C_3$-$C_{30}$ hetero aryl of $R_{41}$ to $R_{46}$, the $C_6$-$C_{30}$ spiro aromatic ring and the $C_3$-$C_{30}$ spiro hetero aromatic ring formed by $R_{41}$ and $R_{42}$, the $C_6$-$C_{30}$ arylene and the $C_3$-$C_{30}$ hetero arylene of L, the $C_6$-$C_{30}$ aromatic ring and the $C_3$-$C_{30}$ hetero aromatic ring of $Ar_1$ and $Ar_2$ may be independently unsubstituted or substituted with at least one of $C_1$-$C_{10}$ alkyl, $C_6$-$C_{20}$ aryl amino, $C_3$-$C_{20}$ hetero aryl amino, $C_6$-$C_{20}$ aryl and $C_3$-$C_{20}$ hetero aryl, or may form a spiro structure with a $C_6$-$C_{20}$ aromatic ring or a $C_3$-$C_{20}$ hetero aromatic ring. Optionally, each of the $C_6$-$C_{20}$ aryl amino, $C_3$-$C_{20}$ hetero aryl amino, $C_6$-$C_{20}$ aryl and $C_3$-$C_{20}$ hetero aryl may be independently unsubstituted or further substituted with other $C_6$-$C_{20}$ aryl and/or other $C_3$-$C_{20}$ hetero aryl.

As an example, each of $R_{41}$ and $R_{42}$ constituting a fluorenyl moiety may include independently, but is not limited to, methyl, phenyl unsubstituted or substituted diphenyl amino (each of two phenyl in the diphenyl amino may be independently unsubstituted or substituted other phenyl) and an unsubstituted or substituted fluorene ring having a spiro structure.

Each of $R_{43}$ and $R_{44}$ linked to a side benzene ring of the fluorenyl moiety may include independently, but is not limited to, hydrogen, deuterium, diphenyl amino unsubstituted or substituted with other aryl, phenyl unsubstituted or substituted with other phenyl, biphenyl, carbazolyl unsubstituted or substituted with phenyl, dibenzofuranyl, dibenzothiophenyl and diphenyl amino (each of two phenyl in the diphenyl amino may be independently unsubstituted or substituted other phenyl). In one exemplary aspect, each of m and n may be independently 0 or 1.

In Formula 7, the nitrogen atom or L as a bridging group (or linker) may be linked to, but is not limited to, 1 to 4-positions, for example, 1-position, 3-position or 4-position of the fluorene ring. Each of $Ar_1$ and $Ar_2$ may be independently the aryl or the hetero aryl as described in Formula 2.

As an example, each of $Ar_1$ and $Ar_2$ may include independently, but is not limited to, a benzene ring, a biphenyl ring, a terphenyl ring, a naphthalene ring, an anthracene ring, a phenanthrene ring, a pyrene ring and a triphenylene ring, each of which may be independently unsubstituted or substituted.

In addition, each of $R_{45}$ and $R_{46}$ may include independently, but is not limited to, hydrogen, phenyl unsubstituted with phenyl or diphenyl amino, dibenzofuranyl, dibenzothiophenyl and carbazolyl unsubstituted or substituted with phenyl. As an example, at least one of $R_{45}$ and $R_{46}$ may be unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino.

In one exemplary aspect, the first host 344 may be selected from, but is not limited to, the following organic compounds of Formula 8:

[Formula 8]

GHH1

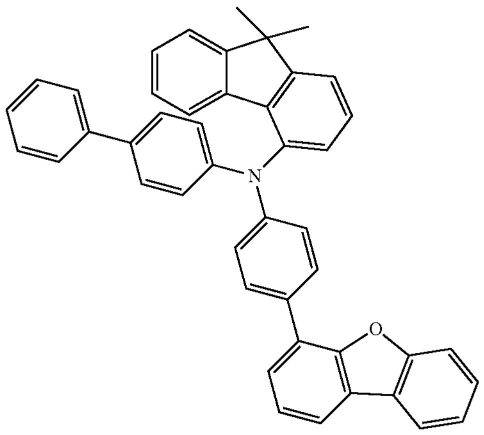

GHH2

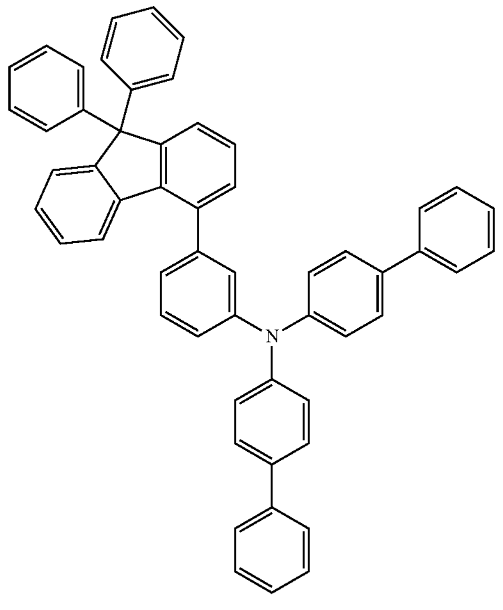

-continued

GHH3

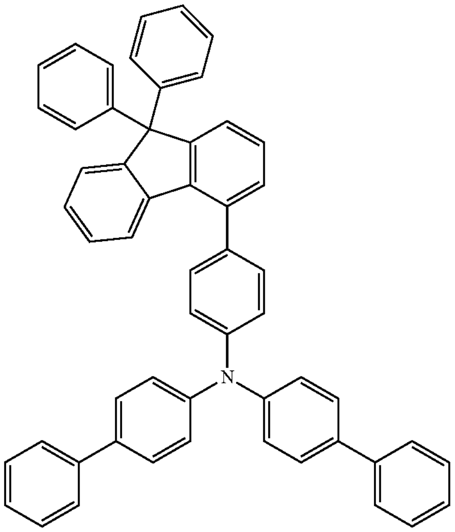

GHH4

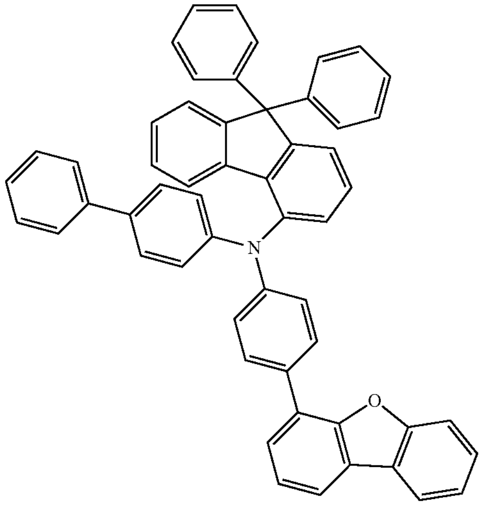

GHH5

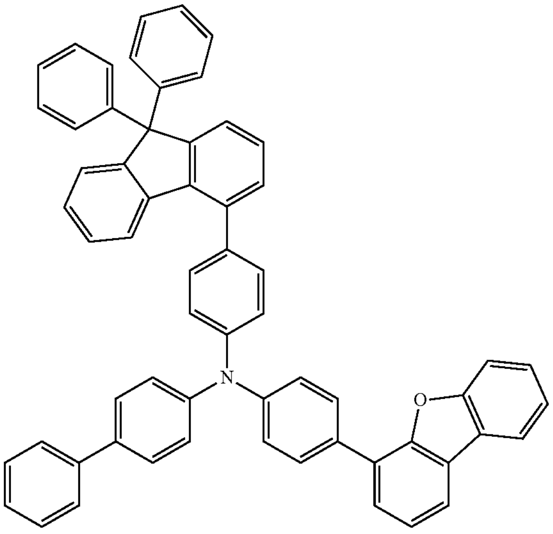

-continued
GHH6
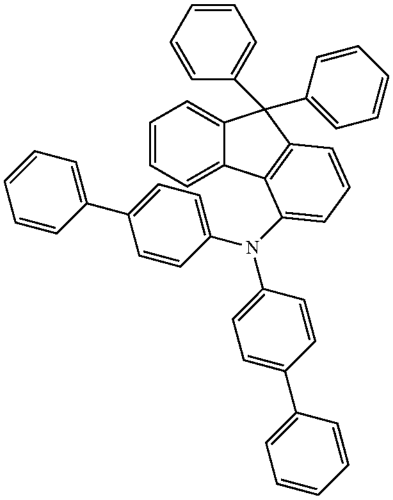
GHH7
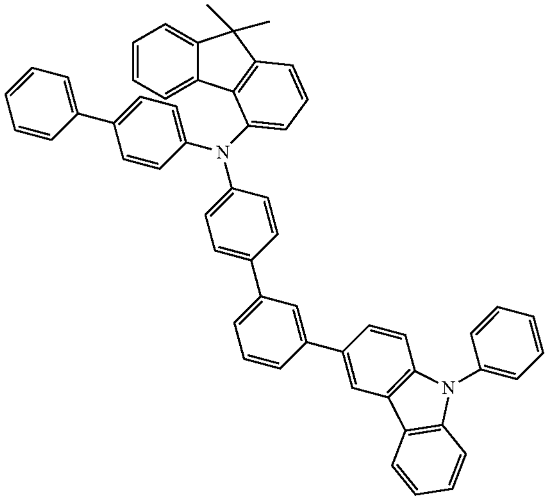
GHH8
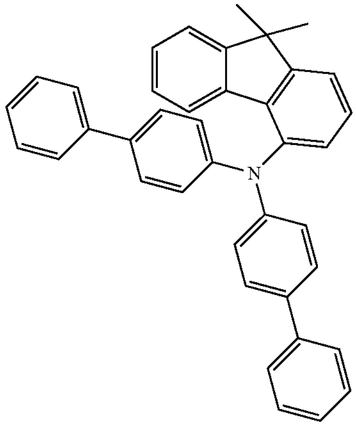
-continued
GHH9
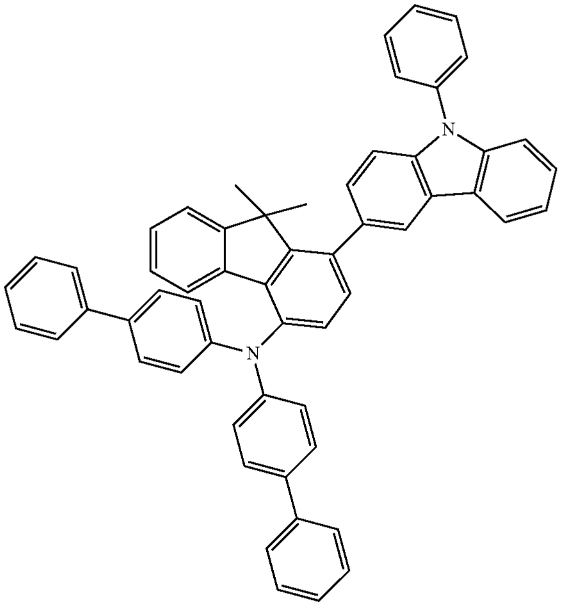
GHH10
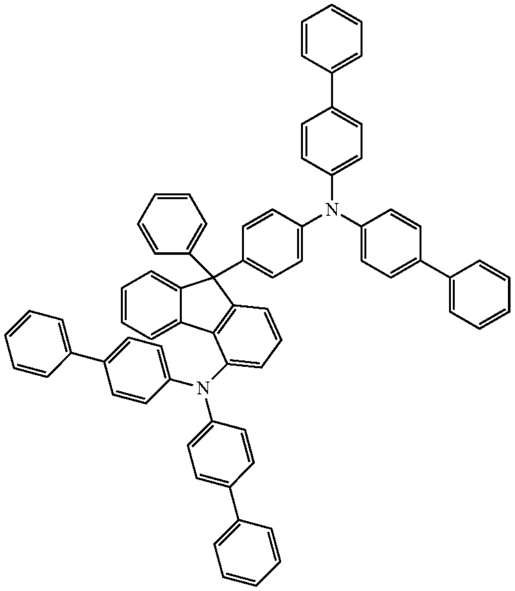

-continued
GHH11
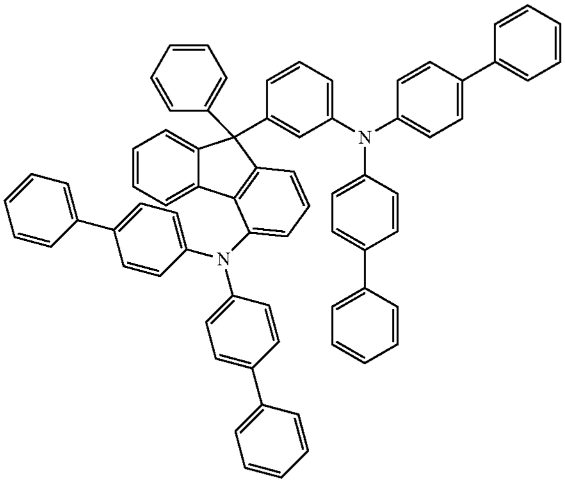
GHH12
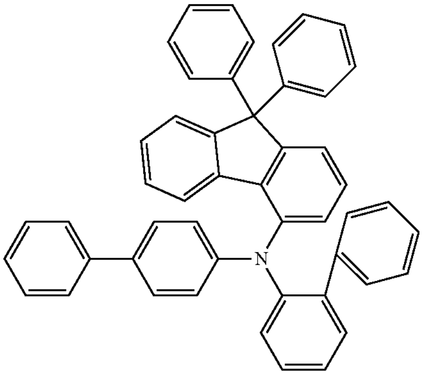
GHH13
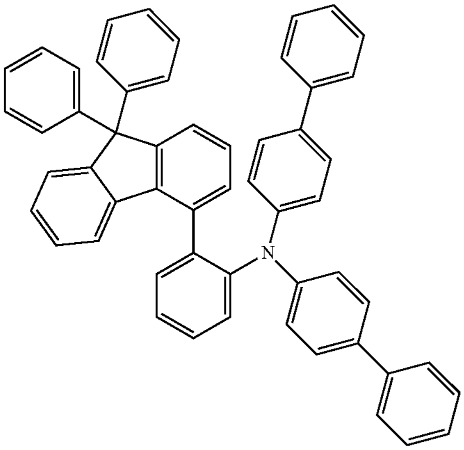
-continued
GHH14
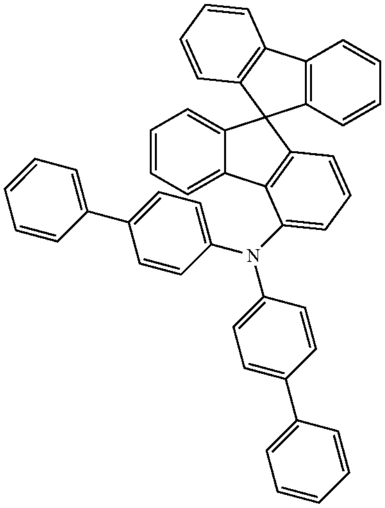
GHH15
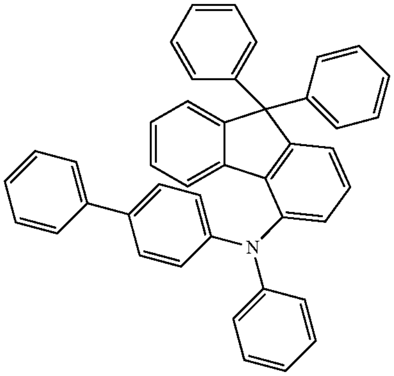
GHH16
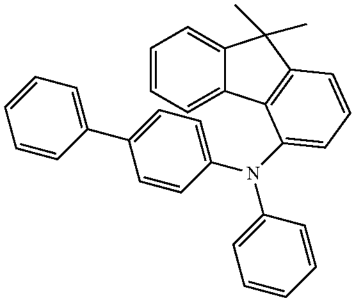

-continued
GHH17
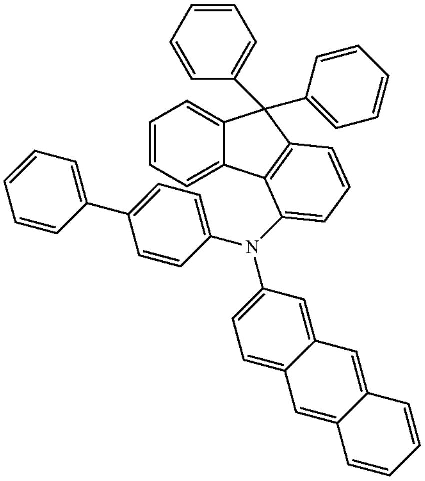
GHH18
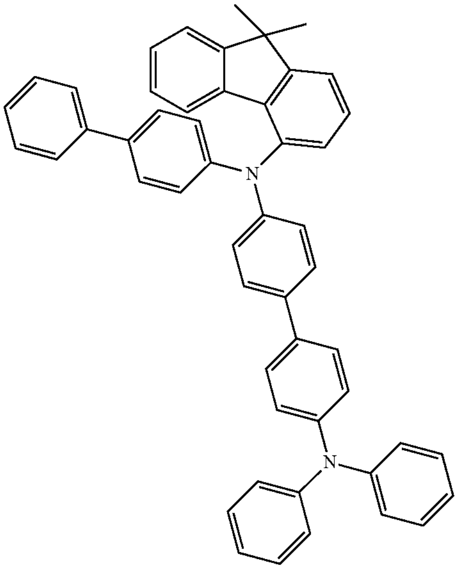
GHH19
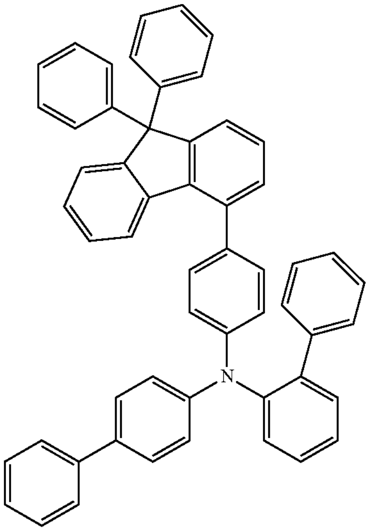
-continued
GHH20
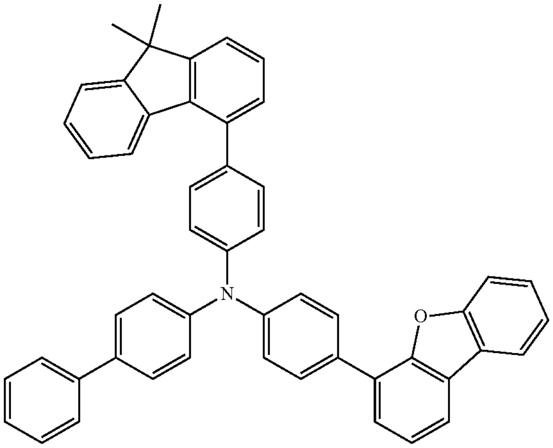
GHH21
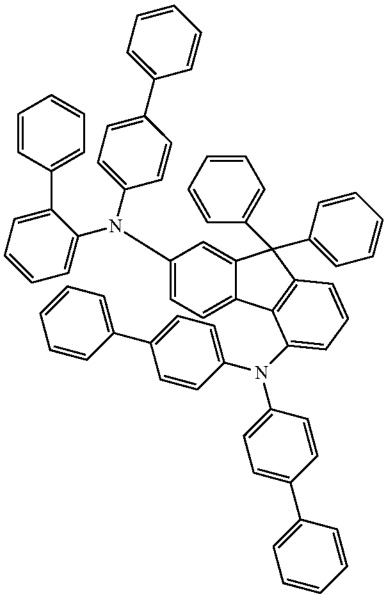
GHH22
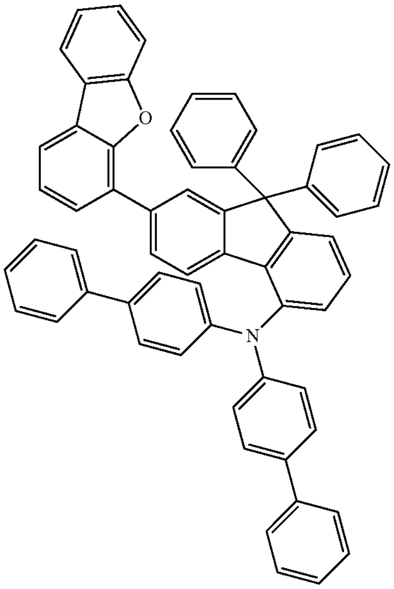

-continued
GHH23
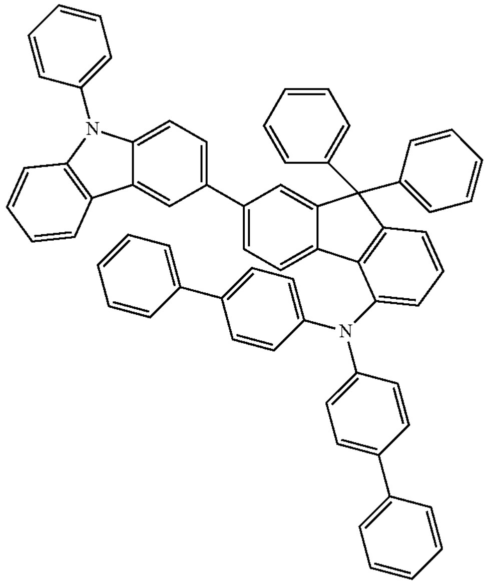
GHH24
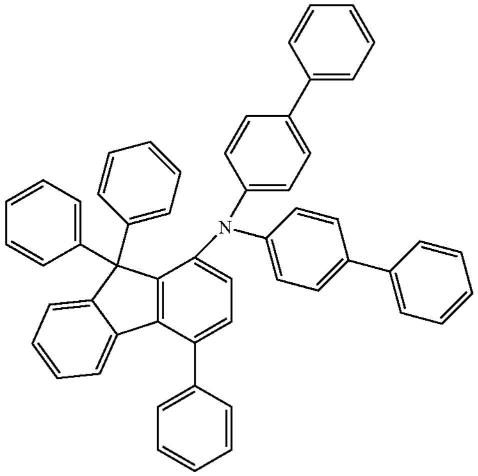
GHH25
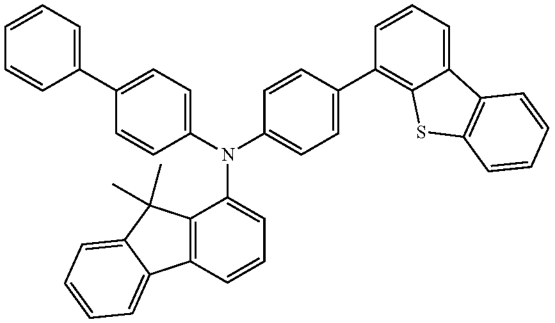
-continued
GHH26
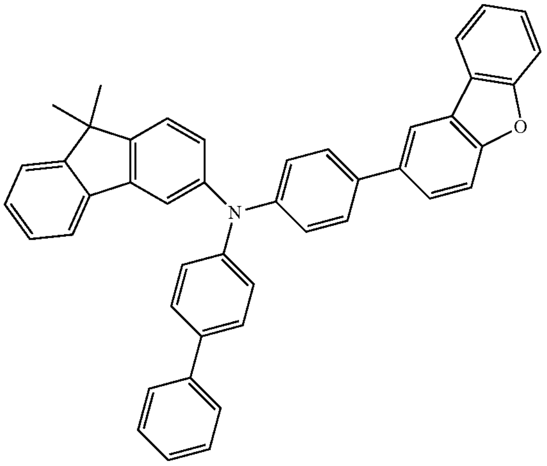
GHH27
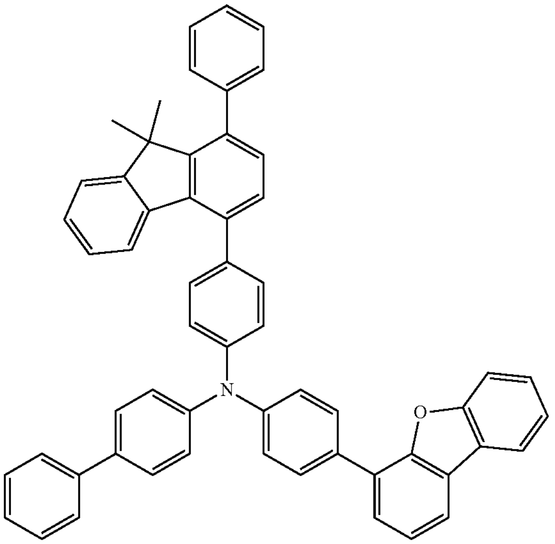
GHH28
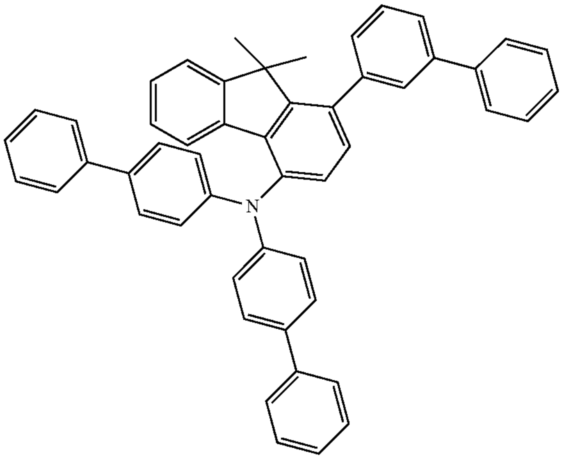

-continued

GHH29

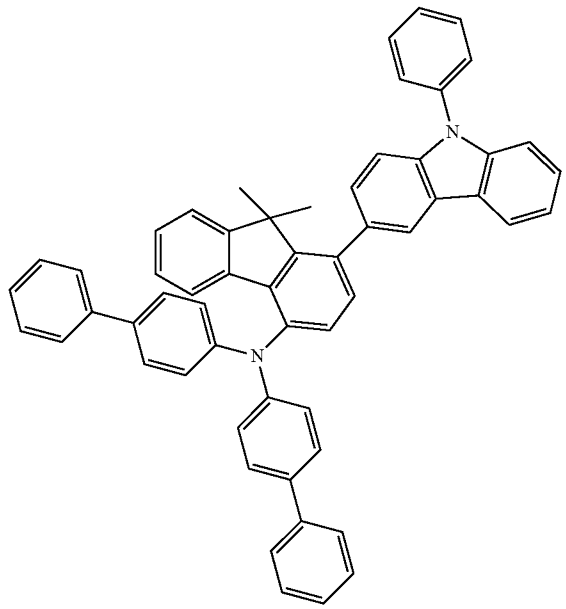

GHH30

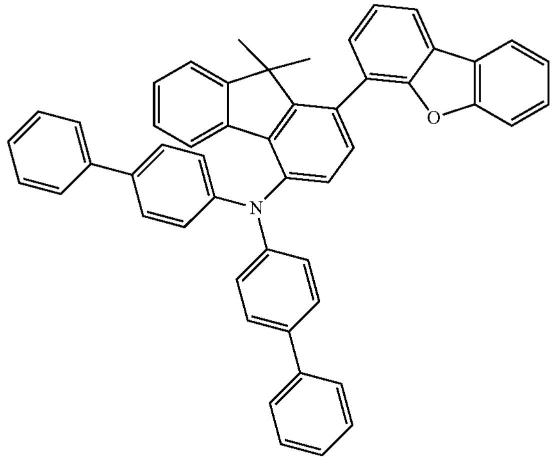

The EML, 340 may further include the second host 346 as well as the first host 344. The second host 346 may be an n-type host with relatively excellent electron affinity property. The second host 346 may include an azine-based organic compound having the following structure of Formula 9.

[Formula 9]

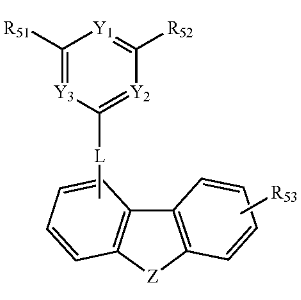

wherein, in Formula 9, each of $R_{51}$ and $R_{52}$ is independently unsubstituted or substituted $C_6$-$C_{30}$ aryl or unsubstituted or substituted $C_3$-$C_{30}$ hetero aryl;

$R_{53}$ is hydrogen or unsubstituted or substituted $C_6$-$C_{30}$ aryl, optionally, the $C_6$-$C_{30}$ aryl forms a spiro structure with an unsubstituted or substituted $C_6$-$C_{30}$ aromatic ring or an unsubstituted or substituted $C_3$-$C_{30}$ hetero aromatic ring;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{54}$ or N, wherein at least one of $Y_1$, $Y_2$ and $Y_3$ is N;

$R_{54}$ is independently hydrogen, unsubstituted or substituted $C_6$-$C_{30}$ aryl or unsubstituted or substituted $C_3$-$C_{30}$ hetero aryl, optionally, each of the $C_6$-$C_{30}$ aryl and the $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring; and Z is O or S.

In one exemplary aspect, each of the aryl and the hetero aryl of $R_{51}$ to $R_{54}$ and/or each of the arylene and the hetero arylene of L may be independently unsubstituted or substituted with at least one of $C_1$-$C_{10}$ alkyl, $C_1$-$C_{10}$ alkyl silyl, $C_6$-$C_{20}$ aryl silyl, $C_6$-$C_{20}$ aryl and $C_3$-$C_{20}$ hetero aryl, or form a spiro structure with a $C_6$-$C_{20}$ aromatic ring or a $C_3$-$C_{20}$ hetero aromatic ring.

As an example, the azine moiety or L in Formula 9 as the second host 346 may be linked to any position, but is not limited to, among 1-4 positions and 6-9 positions, for example, 3-position, 4-position, 8-position or 9-position, of the dibenzofuran or the dibenzothiophene ring. $R_{53}$ in Formula 9 may be linked to any position of the dibenzofuran or the dibenzothiophene ring where the azine moiety or the L is not linked. As an example, $R_{53}$ may be linked to, but is not limited to, 1-4 position, 7-position or 8-position of the dibenzofuran or the dibenzothiophene ring. The aryl and the hetero aryl of $R_{51}$ to $R_{54}$ may include the aryl and hetero aryl as described in Formula 2.

For example, each of $R_{51}$ and $R_{52}$ may include independently, but is not limited to, an aryl group such as phenyl, biphenyl, terphenyl, naphthyl (e.g., 1-naphtyl or 2-naphthyl), fluorenyl (e.g., 9-10-dimethyl-9H-fluorenyl or spirofluorenyl), anthracenyl, pyrenyl and/or triphenylenyl, each of which may be independently unsubstituted or substituted with at least one of $C_6$-$C_{20}$ aryl and $C_3$-$C_{20}$ hetero aryl.

Alternatively, $R_{53}$ may include a phenyl group unsubstituted or substituted with monocyclic or polycyclic aryl such as phenyl, naphthyl, anthracenyl, phenanthrenyl, triphenylenyl and the like, or a polycyclic aryl group such as naphthyl, anthracenyl, phenanthrenyl, fluorenyl and triphenylenyl each of which is independently unsubstituted or substituted with alkyl (such as methyl) and/or aryl (such as phenyl), or optionally has a spiro structure with other aromatic ring or hetero aromatic ring.

The arylene and the hetero arylene may include divalent bridging group corresponding to the aryl and the hetero aryl described in Formula 2. For example, the arylene and the hetero arylene may include, but is not limited to, phenylene, naphthylene and pyridylene each of which may be independently unsubstituted or substituted with at least one aryl such as phenyl, naphthyl, anthracenyl and phenanthrenyl. In one exemplary aspect, the second host 346 may be selected from, but is not limited to, the following organic compounds of Formula 10:
[Formula 10]
GEH1
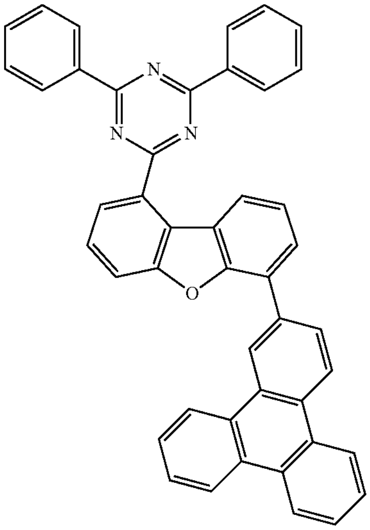
GEH2
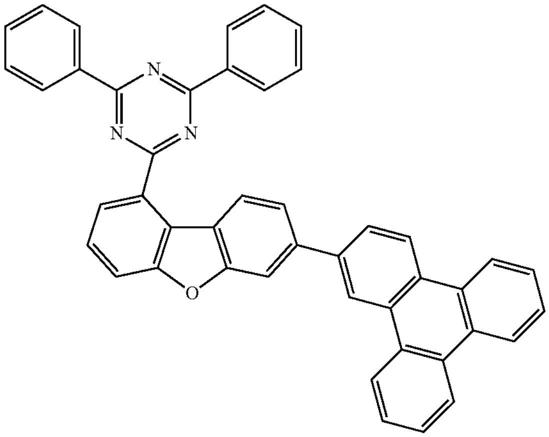
GEH3
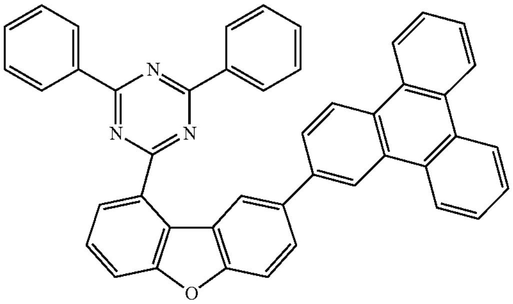
-continued
GEH4
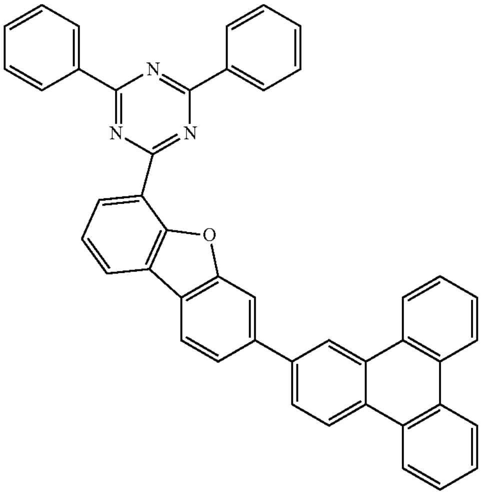
GEH5
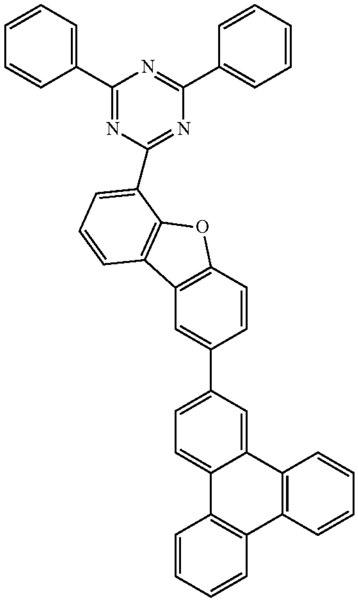
GEH6
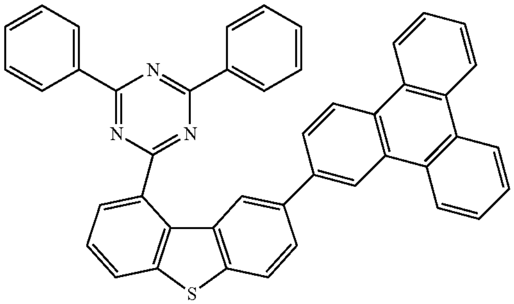

-continued
GEH7
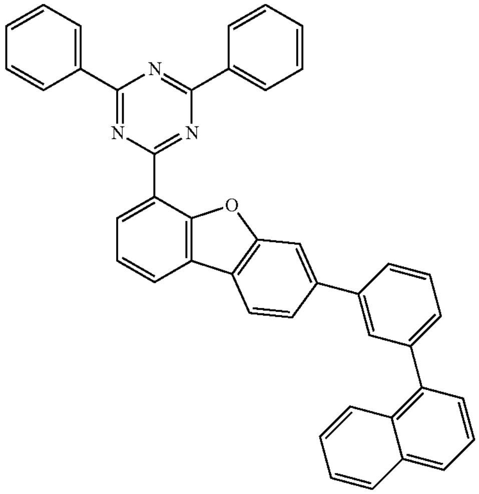
GEH8
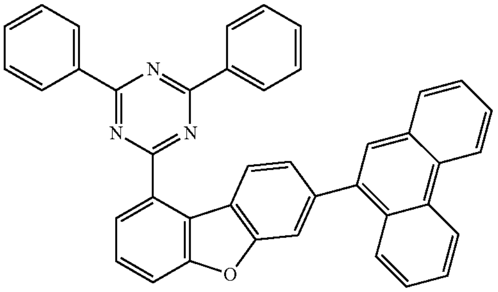
GEH9
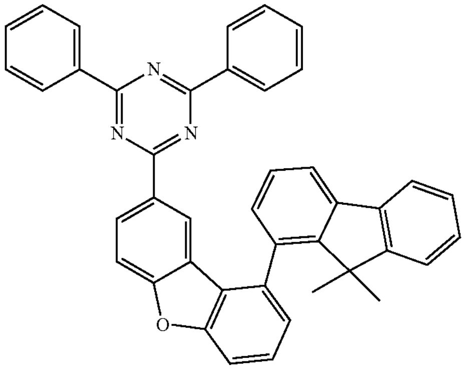
GEH10
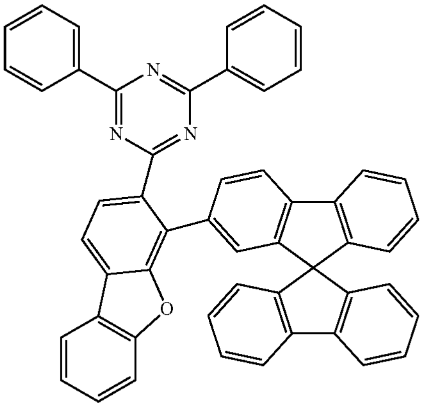
-continued
GEH11
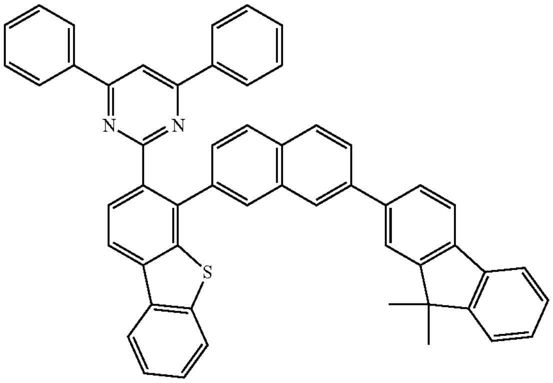
GEH12
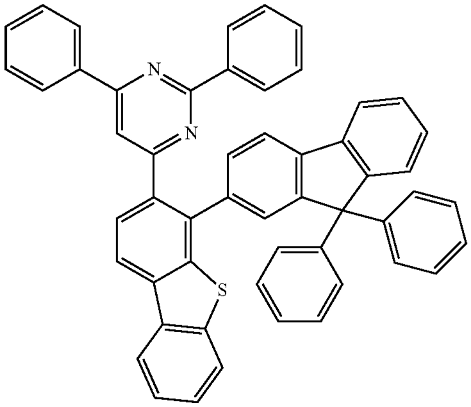
GEH13
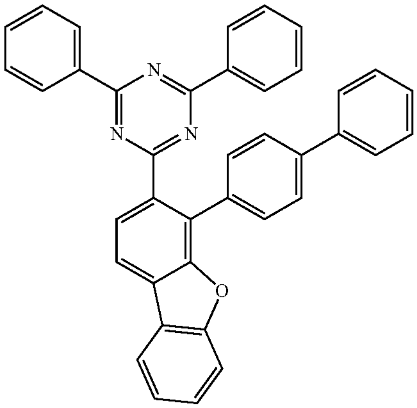
GEH14
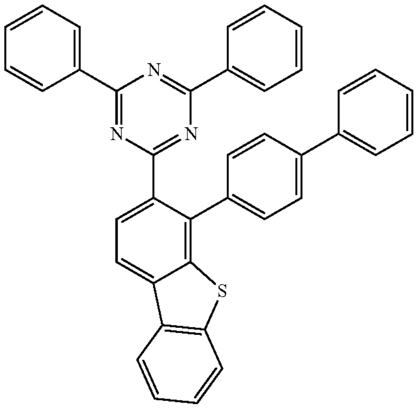

-continued
GEH15
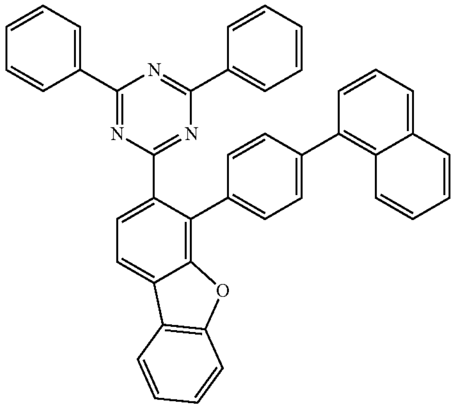
GEH16
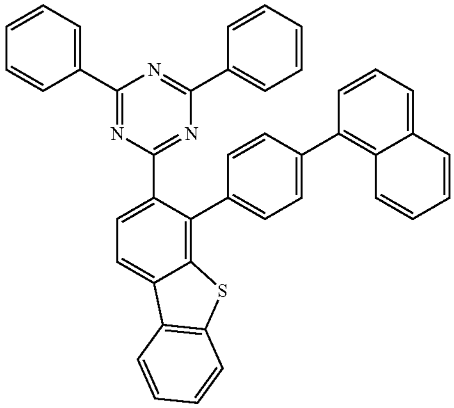
GEH17
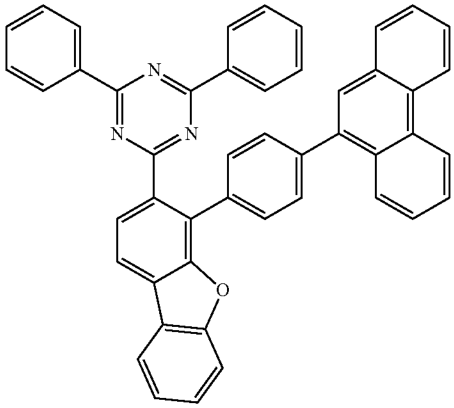
GEH18
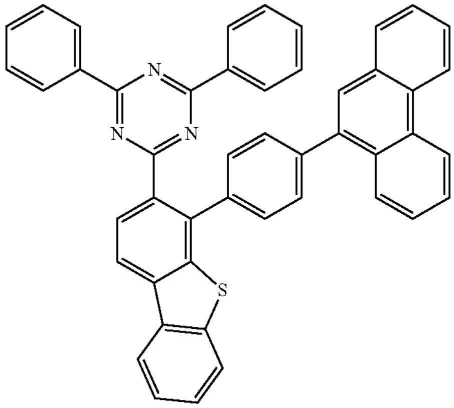
-continued
GEH19
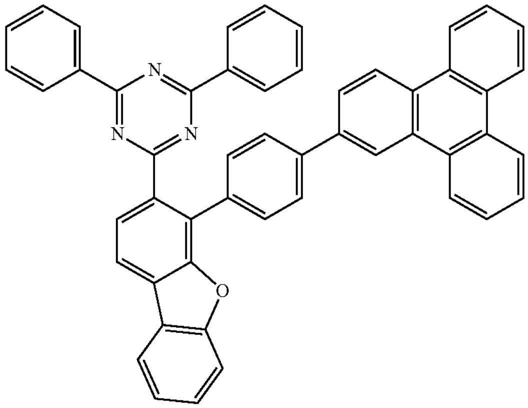
GEH20
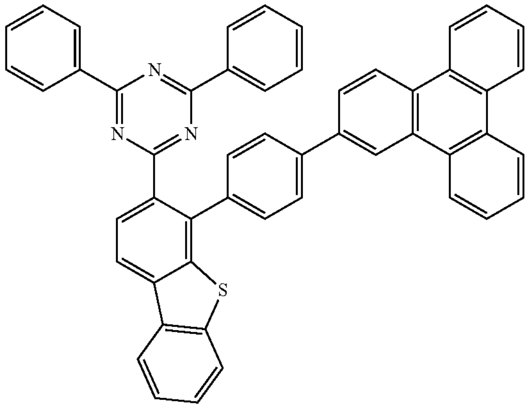
GEH21
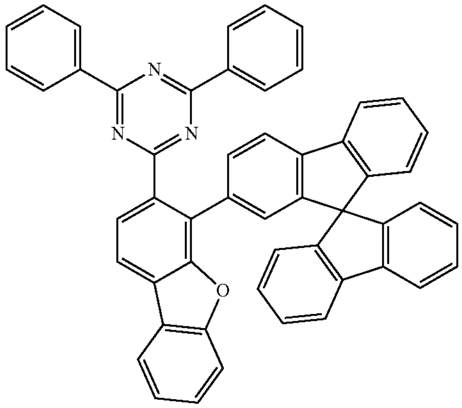

-continued
GEH22
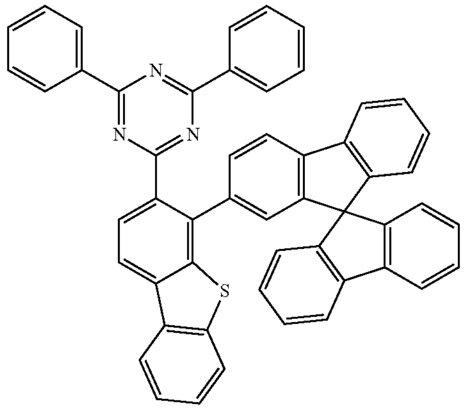
GEH23
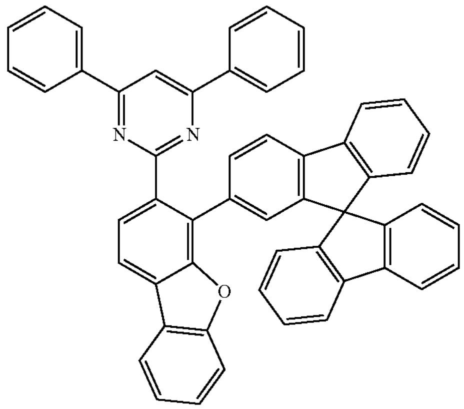
GEH24
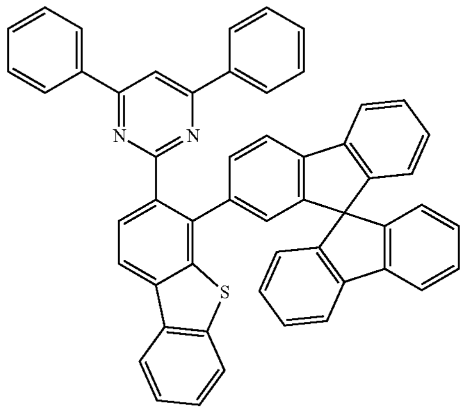
-continued
GEH25
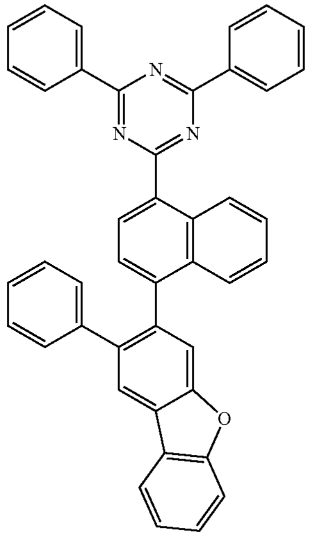
GEH26
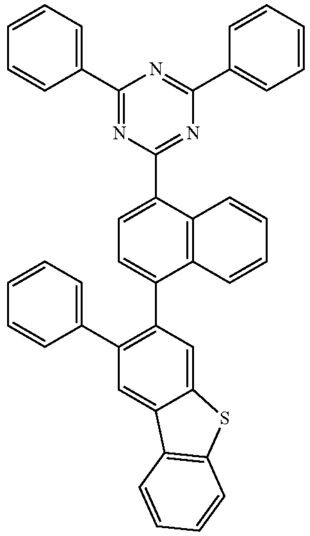
GEH27
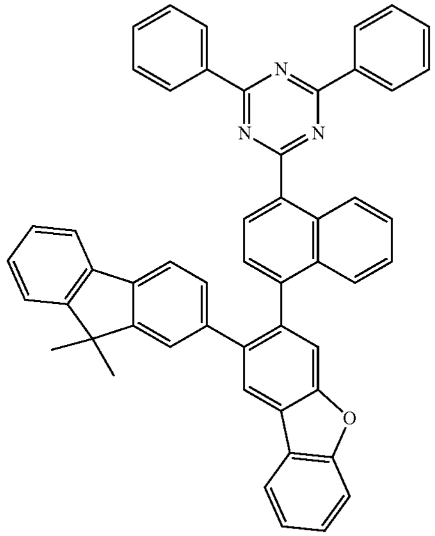

-continued

GEH28

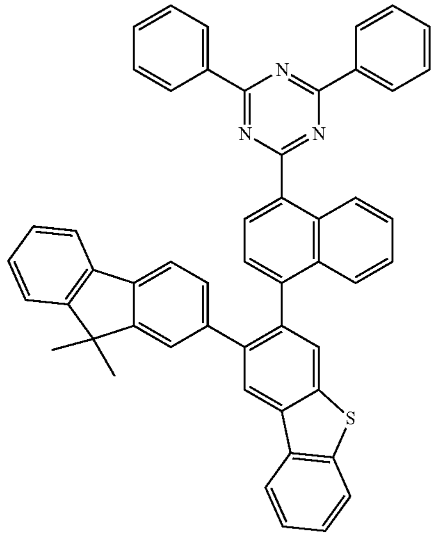

GEH29

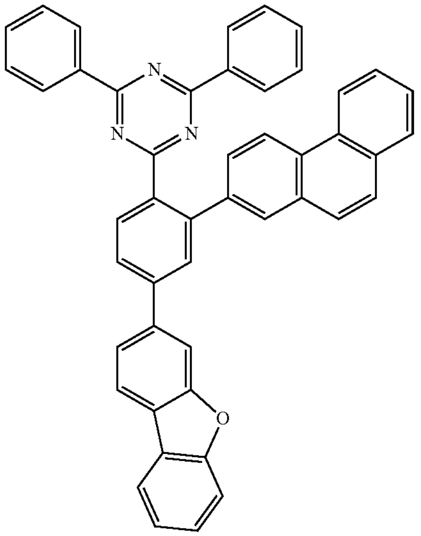

GEH30

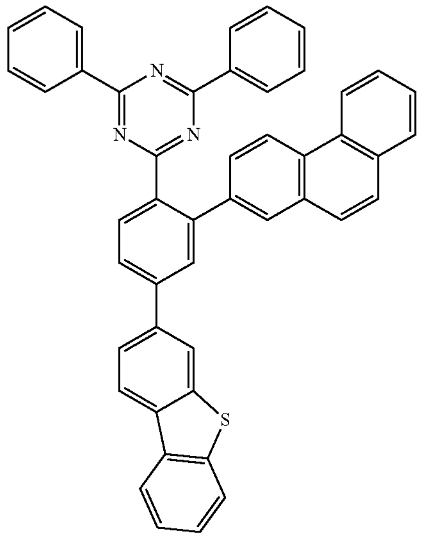

The contents of the host including the first host 344 and the second host 346 in the EML 340 may be, but is not limited to, about 50 to about 90 wt %, for example, about 80 to about 95 wt %. The contents of the dopant 342 in the EML 340 may be, but is not limited to, about 1 to 10 wt %, for example, about 5 to 20 wt %. When the EML 340 includes the first and second hosts 344 and 346, the first host 344 and the second host 346 may be mixed, but is not limited to, with a weight ratio between about 4:1 and about 1:4, for example, about 3:1 and about 1:3. As an example, the EML 340 may have a thickness of, but is not limited to, about 100 to about 500 nm.

The HIL 310 is disposed between the first electrode 210 and the HTL 320 and improves an interface property between the inorganic first electrode 210 and the organic HTL 320. In one exemplary embodiment, the HIL 310 may include, but is not limited to, 4,4',4"-Tris(3-methylphenylamino)triphenylamine (MTDATA), 4,4',4"-Tris(N,N-diphenyl-amino)triphenylamine (NATA), 4,4',4"-Tris(N-(naphthalene-1-yl)-N-phenyl-amino)triphenylamine (1T-NATA), 4,4',4"-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4"-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiphene)polystyrene sulfonate (PEDOT/PSS), 2,3,5,6-tetrafluoro-7,7,8,8-tetracyanoquinodimethane (F4TCNQ), N-(biphenyl-4-yl)-9,9-dimethyl-N-(4-(9-phenyl-9H-carbazol-3-yl)phenyl)-9H-fluoren-2-amine, N,N'-diphenyl-N,N'-di[4-(N,N'-diphenyl-amino)phenyl]benzidine (NPNPB) and combination thereof.

As an example, the HIL 320 may have a thickness of, but is not limited to, about 50 to about 150 nm. The HIL 310 may be omitted in compliance of the OLED D1 property.

The HTL 320 is disposed adjacently to the EML 340 between the first electrode 210 and the EML 340. In one exemplary embodiment, the HTL 320 may include, but is not limited to, N,N'-Diphenyl-N,N'-bis(3-methylphenyl)-1,1'-biphenyl-4,4'-diamine (TPD), NPB (NPD), N,N'-bis[4-[bis(3-methylphenyl)amino]phenyl]-N,N'-diphenyl-[1,1'-biphenyl]-4,4'-diamine (DNTPD), 4,4'-bis(N-carbazolyl)-1,1'-biphenyl (CBP), Poly[N,N'-bis(4-butylphenyl)-N,N'-bis (phenyl)-benzidine] (Poly-TPD), Poly[(9,9-dioctylfluorenyl-2,7-diyl)-co-(4,4'-(N-(4-sec-butylphenyl) diphenylamine))] (TFB), 1,1-bis(4-(N,N'-di(p-tolyl)amino) phenyl)cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine, a spiro-fluorene compound having the following structure of Formula 11 and combination thereof:

[Formula 11]

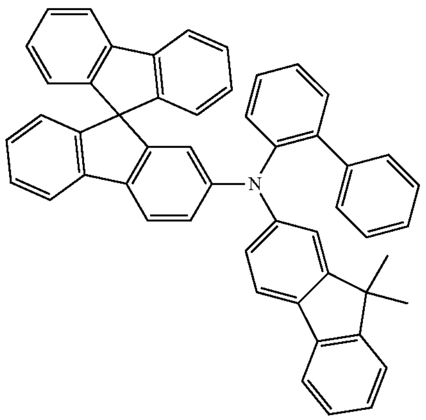

The ETL 360 and the EIL 370 may be laminated sequentially between the EML 340 and the second electrode 220. The ETL 360 includes a material having high electron mobility so as to provide electrons stably with the EML 340 by fast electron transportation.

In one exemplary aspect, the ETL 360 may include, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and the like.

As an example, the ETL 360 may include, but is not limited to, tris-(8-hydroxyquinolinato) aluminum ($Alq_3$), Bis(2-methyl-8-quinolinolato-N1,O8)-(1,1'-biphenyl-4-olato)aluminum (BAlq), lithium quinolate (Liq), 2-biphenyl-4-yl-5-(4-t-butylphenyl)-1,3,4-oxadiazole (PBD), spiro-PBD, 1,3,5-Tris(N-phenylbenzimidazol-2-yl)benzene (TPBi), 4,7-diphenyl-1,10-phenanthroline (Bphen), 2,9-Bis (naphthalene-2-yl)4,7-diphenyl-1,10-phenanthroline (NBphen), 2,9-Dimethyl-4,7-diphenyl-1,10-phenaathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenysilyl-phenylphosphine oxide (TSPO1), 2-[4-(9,10-di-2-naphthalen-2-yl-2-anthracen-2-yl)phenyl]1-phenyl-1H-benzimidazole (ZADN) and combination thereof.

The EIL 370 is disposed between the second electrode 220 and the ETL 360, and can improve physical properties of the second electrode 220 and therefore, can enhance the lifetime of the OLED D1. In one exemplary aspect, the EIL 370 may include, but is not limited to, an alkali metal halide or an alkaline earth metal halide such as LiF, CsF, NaF, $BaF_2$ and the like, and/or an organic metal compound such as Liq, lithium benzoate, sodium stearate, and the like. Alternatively, the EIL 370 may be omitted. Each of the ETL 360 and the EIL 370 may independently have a thickness, but is not limited to, about 100 to about 400 nm. Alternatively, the EIL 370 may be omitted.

In an alternative aspect, the electron transport material and the electron injection material may be admixed to form a single ETL-EIL. The electron transport material and the electron injection material may be admixed with, but is not limited to, about 4:1 to about 1:4 by weight, for example, about 2:1 to about 1:2 by weight.

When holes are transferred to the second electrode 220 via the EML 340 and/or electrons are transferred to the first electrode 210 via the EML 340, the OLED D1 may have short lifetime and reduced luminous efficiency. In order to prevent these phenomena, the OLED D1 in accordance with this aspect of the present disclosure may have at least one exciton blocking layer adjacent to the EML 340.

For example, the OLED D1 may include the EBL 330 between the HTL 320 and the EML 340 so as to control and prevent electron transfers. In one exemplary aspect, the EBL 330 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-bis(carbazol-9-yl) benzene (mCP), 3,3'-bis(N-carbazolyl)-1,1'-biphenyl (mCBP), CuPc, DNTPD, TDAPB, DCDPA, 2,8-bis(9-phenyl-9H-carbazol-3-yl)dibenzo[b,d]thiophene and combination thereof.

In addition, the OLED D1 may further include the HBL 350 as a second exciton blocking layer between the EML 340 and the ETL 360 so that holes cannot be transferred from the EML 340 to the ETL 360. In one exemplary aspect, the HBL 350 may include, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL 360.

For example, the HBL 350 may include a compound having a relatively low HOMO energy level compared to the luminescent materials in EML 340. The HBL 350 may include, but is not limited to, $Alq_3$, BAlq, Liq, PBD, spiro-PBD, BCP, Bis-4,5-(3,5-di-3-pyridylphenyl)-2-methylpyrimidine (B3PYMPM), bis[2-(diphenylphosphino)phenyl] ether oxide (DPEPO), 9-(6-(9H-carbazol-9-yl)pyridine-3-yl)-9H-3,9'-bicarbazole, TSPO1 and combination thereof.

Since the organic metal compound having the structure of Formulae 1 to 6 has a rigid chemical conformation, it can show excellent color purity and luminous lifespan with maintaining its stable chemical conformation in the luminous process. Changing the structure of the bidentate ligands and substituents to the ligand allows the organic metal compound to control its luminescent color.

In addition, the EML 340 may further include the first host 344 with excellent hole transportation property and the second host 346 with excellent electron transportation property. As charges and exciton energies are transferred rapidly from the first host 344 of the (hetero) aryl-amine-based compound with the fluorenyl moiety and the second host 346 of the azine-based compound to the dopant 342, the OLED D1 can decrease its driving voltage and improve its luminous efficiency and luminous lifespan.

In the above exemplary first aspect, the OLED and the organic light emitting display device include a single emitting part emitting green color. Alternatively, the OLED may include multiple emitting parts (see, FIGS. 5 and 6) among which at least one includes the dopant 342, the first host 344, and optionally, the second host 346.

Figure 4:
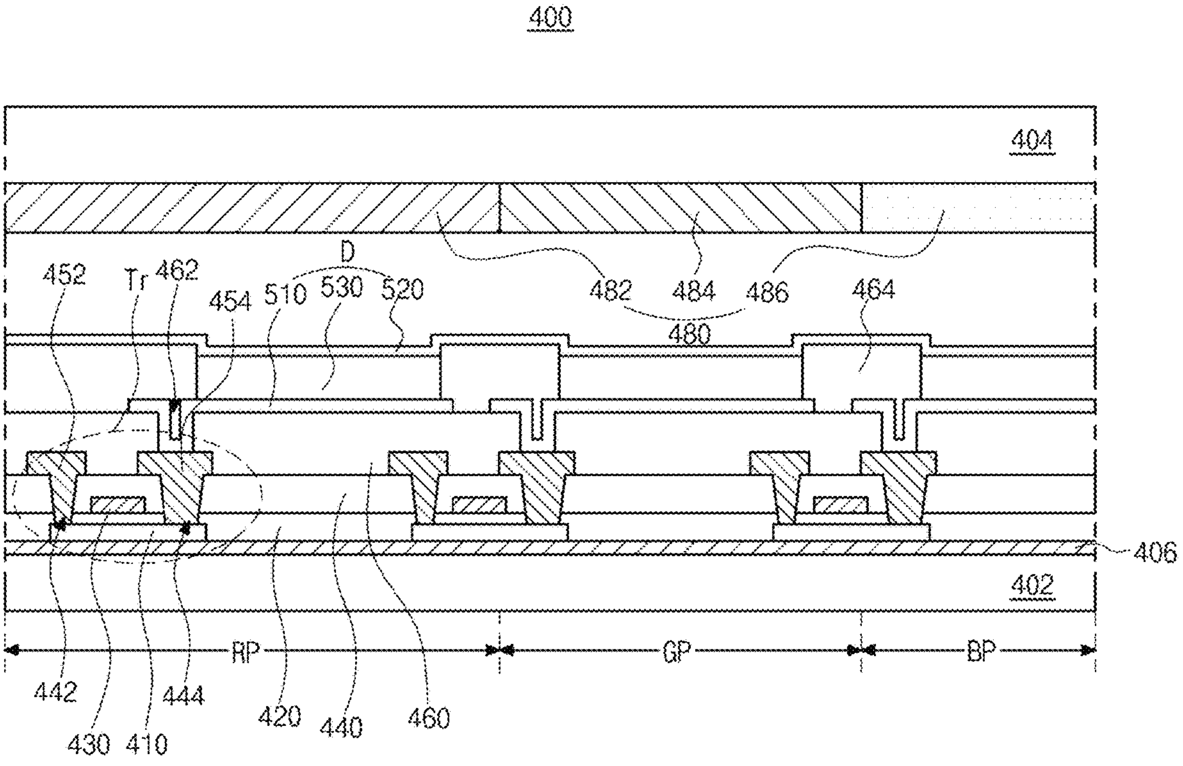
FIG. 4 is a cross-sectional view illustrating an organic light emitting display device in accordance with another exemplary aspect of the present disclosure.

In another exemplary aspect, an organic light emitting display device can implement full-color including white color. FIG. 4 is a schematic cross-sectional view illustrating an organic light emitting display device in accordance with another exemplary aspect of the present disclosure.

As illustrated in FIG. 4, the organic light emitting display device 400 comprises a first substrate 402 that defines each of a red pixel region RP, a green pixel region GP and a blue pixel region BP, a second substrate 404 facing the first substrate 402, a thin film transistor Tr over the first substrate 402, an OLED D disposed between the first and second substrates 402 and 404 and emitting white (W) light and a color filter layer 480 disposed between the OLED D and the second substrate 404.

Each of the first and second substrates 402 and 404 may include, but is not limited to, glass, flexible material and/or polymer plastics. For example, each of the first and second substrates 402 and 404 may be made of PI, PES, PEN, PET, PC and combination thereof. The first substrate 402, over which a thin film transistor Tr and the OLED D are arranged, forms an array substrate.

A buffer layer 406 may be disposed over the first substrate 402, and the thin film transistor Tr is disposed over the buffer layer 406 correspondingly to each of the red pixel region RP, the green pixel region GP and the blue pixel region BP. The buffer layer 406 may be omitted.

A semiconductor layer 410 is disposed over the buffer layer 406. The semiconductor layer 410 may be made of oxide semiconductor material or polycrystalline silicon.

A gate insulating layer 420 including an insulating material, for example, inorganic insulating material such as silicon oxide ($SiO_x$, wherein $0<x\leq2$) or silicon nitride ($SiN_x$, wherein $0<x\leq2$) is disposed on the semiconductor layer 410.

A gate electrode 430 made of a conductive material such as a metal is disposed over the gate insulating layer 420 so as to correspond to a center of the semiconductor layer 410. An interlayer insulting layer 440 including an insulating material, for example, inorganic insulating material such as $SiO_x$ or $SiN_x$, or an organic insulating material such as benzocyclobutene or photo-acryl, is disposed on the gate electrode 430.

The interlayer insulating layer 440 has first and second semiconductor layer contact holes 442 and 444 that expose both sides of the semiconductor layer 410. The first and second semiconductor layer contact holes 442 and 444 are disposed over opposite sides of the gate electrode 430 with spacing apart from the gate electrode 430.

A source electrode 452 and a drain electrode 454, which are made of a conductive material such as a metal, are disposed on the interlayer insulating layer 440. The source electrode 452 and the drain electrode 454 are spaced apart from each other with respect to the gate electrode 430, and contact both sides of the semiconductor layer 410 through the first and second semiconductor layer contact holes 442 and 444, respectively.

The semiconductor layer 410, the gate electrode 430, the source electrode 452 and the drain electrode 454 constitute the thin film transistor Tr, which acts as a driving element.

Although not shown in FIG. 4, the gate line GL and the data line DL, which cross each other to define the pixel region P, and a switching element Ts, which is connected to the gate line GL and the data line DL, is may be further formed in the pixel region P. The switching element Ts is connected to the thin film transistor Tr, which is a driving element. In addition, the power line PL is spaced apart in parallel from the gate line GL or the data line DL, and the thin film transistor Tr may further include the storage capacitor Cst configured to constantly keep a voltage of the gate electrode 430 for one frame.

A passivation layer 460 is disposed on the source and drain electrodes 452 and 454 with covering the thin film transistor Tr over the whole first substrate 402. The passivation layer 460 has a drain contact hole 462 that exposes the drain electrode 454 of the thin film transistor Tr.

The OLED D is located over the passivation layer 460. The OLED D includes a first electrode 510 that is connected to the drain electrode 454 of the thin film transistor Tr, a second electrode 520 facing from the first electrode 510 and an emissive layer 530 disposed between the first and second electrodes 510 and 520.

The first electrode 510 formed for each pixel region RP, GP or BP may be an anode and may include a conductive material having relatively high work function value. For example, the first electrode 510 may include, but is not limited to, ITO, IZO, ITZO, SnO, ZnO, ICO, AZO, and the like. Alternatively, a reflective electrode or a reflective layer may be disposed under the first electrode 510. For example, the reflective electrode or the reflective layer may include, but is not limited to, Ag or APC alloy.

A bank layer 464 is disposed on the passivation layer 460 in order to cover edges of the first electrode 510. The bank layer 464 exposes a center of the first electrode 510 corresponding to each of the red pixel RP, the green pixel GP and the blue pixel BP. The bank layer 464 may be omitted.

Figure 5:
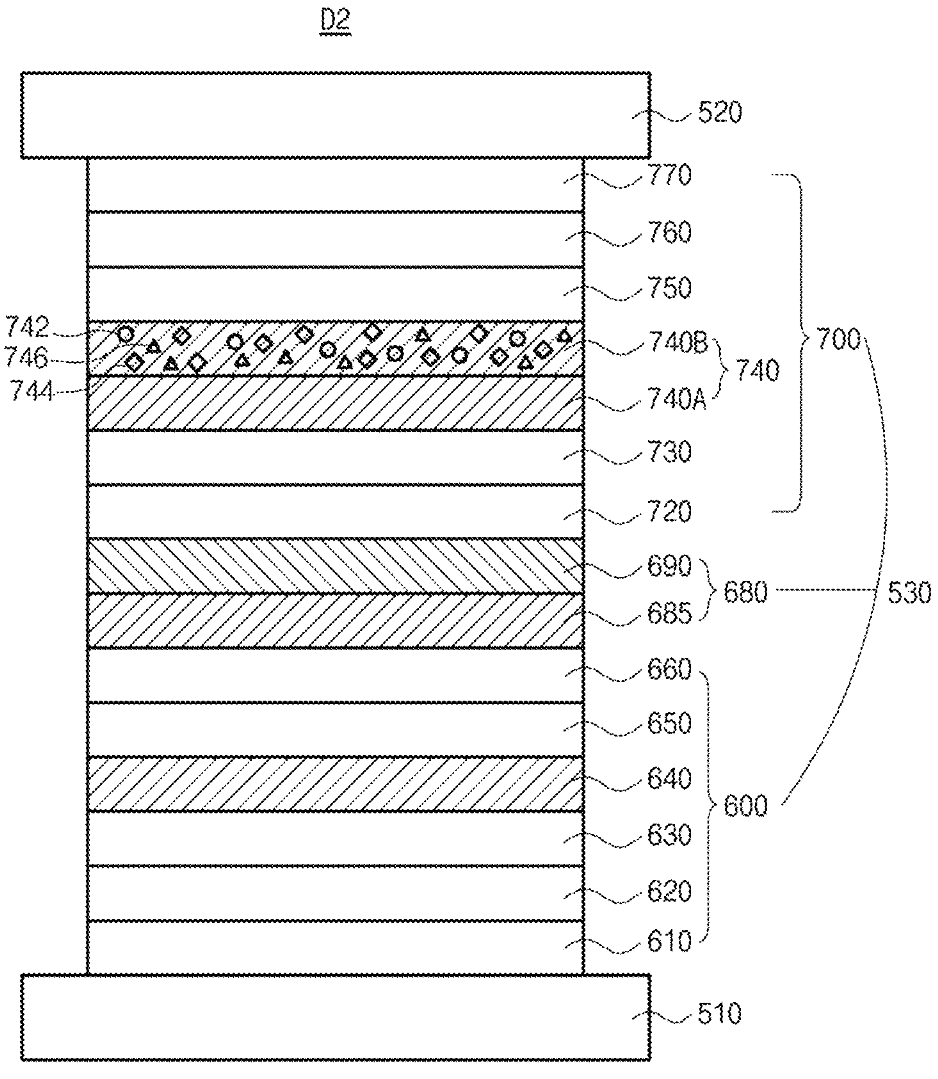
FIG. 5 is a cross-sectional view illustrating an organic light emitting diode having a double-stack structure in accordance with still another exemplary aspect of the present disclosure.
Figure 6:
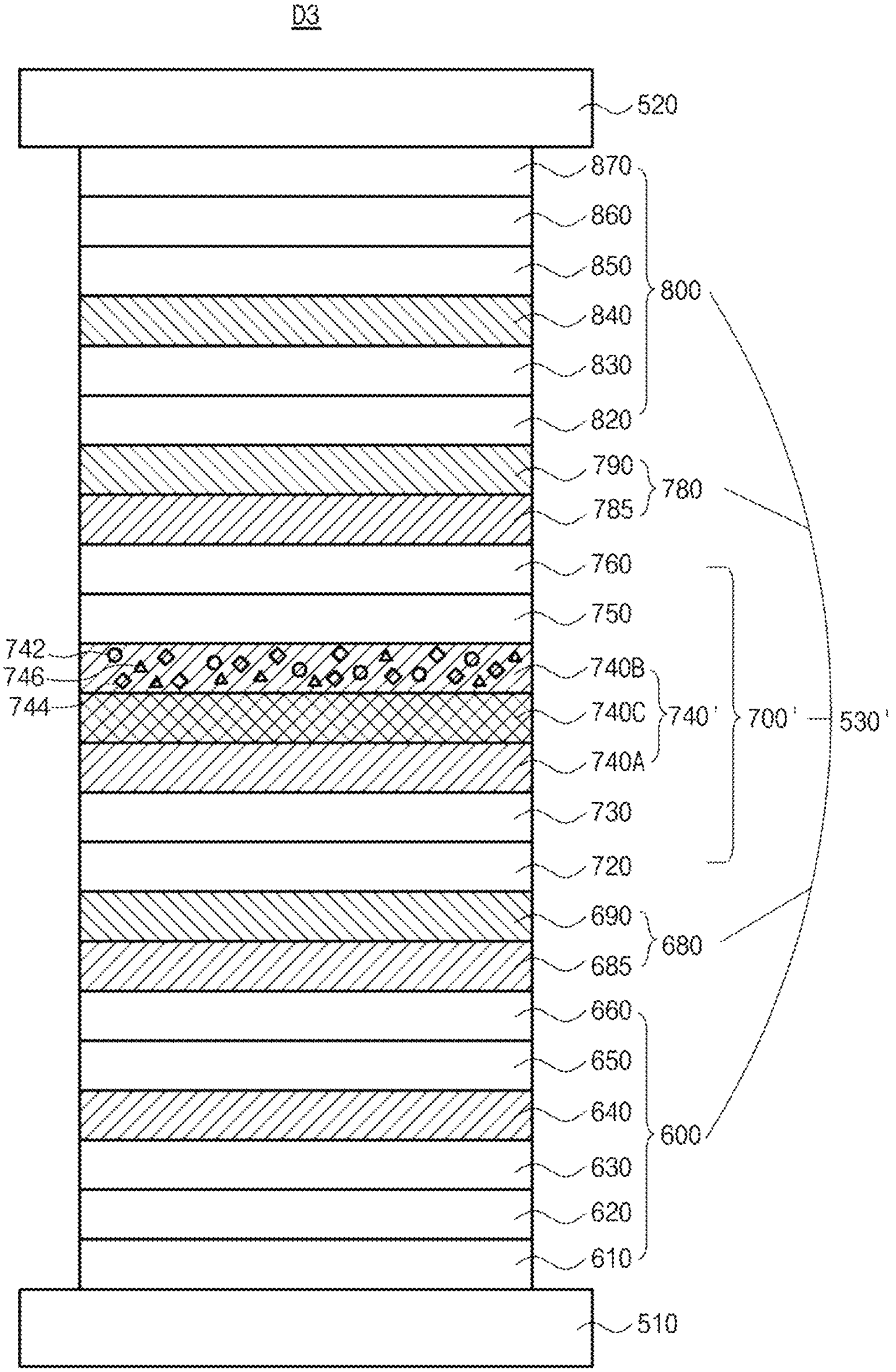
FIG. 6 is a cross-sectional view illustrating an organic light emitting diode having a triple-stack structure in accordance with still further another exemplary aspect of the present disclosure.

An emissive layer 530 that may include emitting parts is disposed on the first electrode 510. As illustrated in FIGS. 5 and 6, the emissive layer 530 may include multiple emitting parts 600, 700, 700', and 800 and at least one charge generation layer 680 and 780. Each of the emitting parts 600, 700, 700' and 800 includes at least one emitting material layer and may further include an HIL, an HTL, an EBL, an HBL, an ETL and/or an EIL.

The second electrode 520 is disposed over the first substrate 402 above which the emissive layer 530 is disposed. The second electrode 520 may be disposed over a whole display area, and may include a conductive material with a relatively low work function value compared to the first electrode 510, and may be a cathode. For example, the second electrode 520 may include, but is not limited to, Al, Mg, Ca, Ag, alloy thereof or combination thereof such as Al—Mg.

Since the light emitted from the emissive layer 530 is incident to the color filter layer 480 through the second electrode 520 in the organic light emitting display device 400 in accordance with the second embodiment of the present disclosure, the second electrode 520 has a thin thickness so that the light can be transmitted.

The color filter layer 480 is disposed over the OLED D and includes a red color filter pattern 482, a green color filter pattern 484 and a blue color filter pattern 486 each of which is disposed correspondingly to the red pixel RP, the green pixel GP and the blue pixel BP, respectively. Although not shown in FIG. 4, the color filter layer 480 may be attached to the OLED D through an adhesive layer. Alternatively, the color filter layer 480 may be disposed directly on the OLED D.

In addition, an encapsulation film may be disposed over the second electrode 520 in order to prevent outer moisture from penetrating into the OLED D. The encapsulation film may have, but is not limited to, a laminated structure of a first inorganic insulating film, an organic insulating film and a second inorganic insulating film (170 in FIG. 2). In addition, a polarizing plate may be attached onto the second substrate 404 to reduce reflection of external light. For example, the polarizing plate may be a circular polarizing plate.

In FIG. 4, the light emitted from the OLED D is transmitted through the second electrode 520 and the color filter layer 480 is disposed over the OLED D. Alternatively, the light emitted from the OLED D is transmitted through the first electrode 510 and the color filter layer 480 may be disposed between the OLED D and the first substrate 402. In addition, a color conversion layer may be formed between the OLED D and the color filter layer 480. The color conversion layer may include a red color conversion layer, a green color conversion layer and a blue color conversion layer each of which is disposed correspondingly to each pixel (RP, GP and BP), respectively, so as to covert the white (W) color light to each of a red, green and blue color lights, respectively. Alternatively, the organic light emitting display device 400 may comprise the color conversion film instead of the color filter layer 480.

As described above, the white (W) color light emitted from the OLED D is transmitted through the red color filter pattern 482, the green color filter pattern 484 and the blue color filter pattern 486 each of which is disposed correspondingly to the red pixel region RP, the green pixel region GP and the blue pixel region BP, respectively, so that red, green and blue color lights are displayed in the red pixel region RP, the green pixel region GP and the blue pixel region BP.

FIG. 5 is a schematic cross-sectional view illustrating an organic light emitting diode having a tandem structure of two emitting parts. As illustrated in FIG. 5, the OLED D2 in accordance with the exemplary embodiment of the present disclosure includes first and second electrodes 510 and 520 and an emissive layer 530 disposed between the first and second electrodes 510 and 520. The emissive layer 530 includes a first emitting part 600 disposed between the first and second electrodes 510 and 520, a second emitting part 700 disposed between the first emitting part 600 and the second electrode 520 and a charge generation layer (CGL) 680 disposed between the first and second emitting parts 600 and 700.

The first electrode 510 may be an anode and may include a conductive material having relatively high work function value such as TCO. For example, the first electrode 510 may include, but is not limited to, ITO, IZO, ITZO, SnO, ZnO, ICO, AZO, and the like. The second electrode 520 may be a cathode and may include a conductive material with a relatively low work function value. For example, the second electrode 520 may include, but is not limited to, Al, Mg, Ca, Ag, alloy thereof or combination thereof such as Al—Mg.

The first emitting part 600 comprise a first EML (EML1) 640. The first emitting part 600 may further include at least one of an HIL 610 disposed between the first electrode 510 and the EML1 640, a first HTL (HTL1) 620 disposed between the HIL 610 and the EML1 640, a first ETL (ETL1) 660 disposed between the EML1 640 and the CGL 680. Alternatively, the first emitting part 600 may further include a first EBL (EBL1) 630 disposed between the HTL1 620 and the EML1 640 and/or a first HBL (HBL1) 650 disposed between the EML1 640 and the ETL1 660.

The second emitting part 700 includes a second EML (EML2) 740. The second emitting part 700 may further include at least one of a second HTL (HTL2) 720 disposed between the CGL 680 and the EML2 740, a second ETL (ETL2) 760 disposed between the second electrode 520 and the EML2 740 and an EIL 770 disposed between the second electrode 520 and the ETL2 760. Alternatively, the second emitting part 700 may further include a second EBL (EBL2) 730 disposed between the HTL2 720 and the EML2 740 and/or a second HBL (HBL2) 750 disposed between the EML2 740 and the ETL2 760.

At least one of the EML1 640 and the EML2 740 may include a dopant 742, a first host 744 and/or a second host 746 to emit green color or yellow green color. The other of the EML1 640 and the EML2 740 may emit a blue color so that the OLED D2 can realize white (W) emission. Hereinafter, the OLED D2 where the EML2 740 emits green or yellow green color will be described in detail.

The HIL 610 is disposed between the first electrode 510 and the HTL1 620 and improves an interface property between the inorganic first electrode 510 and the organic HTL1 620. In one exemplary embodiment, the HIL 610 may include, but is not limited to, MTDATA, NATA, 1T-NATA, 2T-NATA, CuPc, TCTA, NPB (NPD), HAT-CN, TDAPB, PEDOT/PSS, F4TCNQ, N-(biphenyl-4-yl)-9,9-dimethyl-N-(4-(9-phenyl-9H-carbazol-3-yl)phenyl)-9H-fluoren-2-amine, NPNPB and combination thereof. The HIL 610 may be omitted in compliance of the OLED D2 property.

Each of the HTL1 620 and the HTL2 720 may include, but is not limited to, TPD, NPB (NPD), DNTPD, CBP, Poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine, the spiro-fluorene compound of Formula 11 and combination thereof, respectively.

Each of the ETL1 660 and the ETL2 760 facilitates electron transportation in each of the first emitting part 600 and the second emitting part 700, respectively. As an example, each of the ETL1 660 and the ETL2 760 may independently include, but is not limited to, at least one of oxadiazole-based compounds, triazole-based compounds, phenanthroline-based compounds, benzoxazole-based compounds, benzothiazole-based compounds, benzimidazole-based compounds, triazine-based compounds, and the like. For example, each of the ETL1 660 and the ETL2 770 may include, but is not limited to, $Alq_3$, BAlq, Liq, PBD, spiro-PBD, TPBi, Bphen, NBphen, BCP, TAZ, NTAZ, TpPyPB, TmPPPyTz, PFNBr, TPQ, TSPO1, ZADN and combination thereof, respectively.

The EIL 770 is disposed between the second electrode 520 and the ETL2 760, and can improve physical properties of the second electrode 520 and therefore, can enhance the lifetime of the OLED D2. In one exemplary aspect, the EIL 770 may include, but is not limited to, an alkali metal halide or an alkaline earth metal halide such as LiF, CsF, NaF, $BaF_2$ and the like, and/or an organic metal compound such as Liq, lithium benzoate, sodium stearate, and the like.

Each of the EBL1 630 and the EBL2 730 may independently include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phenyl-9H-carbazol-3-yl)dibenzo[b,d]thiophene and combination thereof, respectively.

Each of the HBL1 650 and the HBL2 750 may include, but is not limited to, at least one of oxadiazole-based compounds, triazole-based compounds, phenanthroline-based compounds, benzoxazole-based compounds, benzothiazole-based compounds, benzimidazole-based compounds, and triazine-based compounds each of which can be used in the ETL1 660 and the ETL2 760. For example, each of the HBL1 650 and the HBL2 750 may independently include, but is not limited to, $Alq_3$, BAlq, Liq, PBD, spiro-PBD, BCP, B3PYMPM, DPEPO, 9-(6-(9H-carbazol-9-yl)pyridine-3-yl)-9H-3,9'-bicarbazole, TSPO1 and combination thereof, respectively.

The CGL 680 is disposed between the first emitting part 600 and the second emitting part 700. The CGL 680 includes an N-type CGL (N-CGL) 685 disposed adjacently to the first emitting part 600 and a P-type CGL (P-CGL) 690 disposed adjacently to the second emitting part 700. The N-CGL 685 injects electrons to the EML1 640 of the first emitting part 600 and the P-CGL 690 injects holes to the EML2 740 of the second emitting part 700.

The N-CGL 685 may be an organic layer doped with an alkali metal such as Li, Na, K and Cs and/or an alkaline earth metal such as Mg, Sr, Ba and Ra. The host in the N-CGL 685 may include, but is not limited to, Bphen and MTDATA. The contents of the alkali metal or the alkaline earth metal in the N-CGL 685 may be between about 0.01 wt % and about 30 wt %.

The P-CGL 690 may include, but is not limited to, inorganic material selected from the group consisting of $WO_x$, $MoO_x$, $V_2O_5$ and combination thereof and/or organic material selected from the group consisting of NPD, HAT-CN, F4TCNQ, TPD, N,N,N',N'-tetranaphthalenyl-benzidine (TNB), TCTA, N,N'-dioctyl-3,4,9,10-perylenedicarboximide (PTCDI-C8) and combination thereof.

The EML1 640 may be a blue EML. In this case, the EML1 640 may be a blue EML, a sky-blue EML or a deep-blue EML. The EML1 640 may include a blue host and a blue dopant.

For example, the blue host may include, but is not limited to, mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), Bis(2-methylphenyl)diphenylsilane (UGH-1), 1,4-Bis(triphenylsilyl)benzene (UGH-2), 1,3-Bis(triphenylsilyl)benzene (UGH-3), 9,9-Spiorobifluoren-2-yl-diphenyl-phosphine oxide (SPPO1), 9,9'-(5-(Triphenylsilyl)-1,3-phenylene)bis(9H-carbazole) (SimCP) and combination thereof.

The blue dopant may include at least one of blue phosphorescent material, blue fluorescent material and blue delayed fluorescent material. As an example, the blue dopant may include, but is not limited to, perylene, 4,4'-Bis[4-(di-p-tolylamino)styryl]biphenyl (DPAVBi), 4-(Di-p-tolylamino)-4-4'-[(di-p-tolylamino)styryl]stilbene (DPAVB), 4,4'-Bis[4-(diphenylamino)styryl]biphenyl (BDAVBi), 2,7-Bis(4-diphenylamino)styryl)-9,9-spiorfluorene (spiro-DPVBi), [1,4-bis[2-[4-[N,N-di(p-tolyl)amino]phenyl]vinyl] benzene (DSB), 1-4-di-'4-(N,N-diphenyl)amino]styryl-benzene (DSA), 2,5,8,11-Tetra-tetr-butylperylene (TBPe), Bis (2-hydroxylphenyl)-pyridine)beryllium ($Bepp_2$), 9-(9-Phenylcarbazole-3-yl)-10-(naphthalene-1-yl)anthracene (PCAN), mer-Tris(1-phenyl-3-methylimidazolin-2-ylidene-C,C(2)'iridium(III) (mer-$Ir(pmi)_3$), fac-Tris(1,3-diphenyl-benzimidazolin-2-ylidene-C,C(2)'iridium(III) (fac-Ir $(dpbic)_3$), Bis(3,4,5-trifluoro-2-(2-pyridyl)phenyl-(2-carboxypyridyl)iridium(III) ($Ir(tfpd)_2pic$), tris(2-(4,6-difluorophenyl)pyridine))iridium(III) ($Ir(Fppy)_3$), Bis[2-(4,6-difluorophenyl)pyridinato-$C^2$,N](picolinato)iridium(III) (FIrpic) and combination thereof.

The EML2 740 may comprise a lower EML (first layer) 740A disposed between the EBL2 730 and the HBL2 750 and an upper EML (second layer) 740B disposed between the lower EML 740A and the HBL2 750. One of the lower EML 740A and the upper EML 740B may emit red color and the other of the lower EML 740A and the upper EML 740B may emit green color. Hereinafter, the EML2 740 where the lower EML 740A emits a red color and the upper EML 740B emits a green color will be described in detail.

The lower EML 740A may include a red host and a red dopant. The red host may include, but is not limited to, mCP-CN, CBP, mCBP, mCP, DPEPO, 2,8-bis(diphenylphosphoryl)dibenzothiophene (PPT), 1,3,5-Tri[(3-pyridyl)-phen-3-yl]benzene (TmPyPB), 2,6-Di(9H-carbazol-9-yl)pyridine (PYD-2Cz), 2,8-di(9H-carbazol-9-yl) dibenzothiophene (DCzDBT), 3',5'-Di(carbazol-9-yl)-[1,1'-bipheyl]-3,5-dicarbonitrile (DCzTPA), 4'-(9H-carbazol-9-yl)biphenyl-3,5-dicarbonitrile(4'-(9H-carbazol-9-yl) biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole), 9,9'-Diphenyl-9H, 9'H-3,3'-bicarbazole (BCzPh), 1,3,5-Tris(carbazole-9-yl) benzene (TCP), TCTA, 4,4'-Bis(carbazole-9-yl)-2,2'-dimethylbipheyl (CDBP), 2,7-Bis(carbazole-9-yl)-9,9-dimethylfluorene (DMFL-CBP), 2,2',7,7'-Tetrakis (carbazole-9-yl)-9,9-spiorofluorene (Spiro-CBP), 3,6-Bis (carbazole-9-yl)-9-(2-ethyl-hexyl)-9H-carbazole (TCzl) and combination thereof.

The red dopant may include at least one of red phosphorescent material, red fluorescent material and red delayed fluorescent material. As an example, the red dopant may include, but is not limited to, [Bis(2-(4,6-dimethyl)phenylquinoline)](2,2,6,6-tetramethylheptane-3,5-dionate) iridium(III), Bis[2-(4-n-hexylphenyl)quinoline](acetylacetonate)iridium(III) (Hex-$Ir(phq)_2(acac)$), Tris[2-(4-n-hexylphenyl)quinoline]iridium(III) (Hex-$Ir(phq)_3$), Tris[2-phenyl-4-methylquinoline]iridium(III) ($Ir(Mphq)_3$), Bis(2-phenylquinoline)(2,2,6,6-tetramethylheptene-3,5-dionate) iridium(III) ($Ir(dpm)PQ_2$), Bis(phenylisoquinoline)(2,2,6,6-tetramethylheptene-3,5-dionate)iridium(III) ($Ir(dpm)(piq)_2$), Bis[(4-n-hexylphenyl)isoquinoline](acetylacetonate)iridium(III) (Hex-$Ir(piq)_2(acac)$), Tris[2-(4-n-hexylphenyl)quinoline]iridium(III) (Hex-$Ir(piq)_3$), Tris(2-(3-methylphenyl)-7-methyl-quinolato)iridium ($Ir(dmpq)_3$), Bis [2-(2-methylphenyl)-7-methyl-quinoline](acetylacetonate) iridium(III) ($Ir(dmpq)_2(acac)$), Bis[2-(3,5-dimethylphenyl)-4-methyl-quinoline](acetylacetonate)iridium(III) ($Ir(mphmq)_2(acac)$), Tris(dibenzoylmethane)mono(1,10-phenanthroline)europium(III) ($Eu(dbbm)_3(phen)$) and combination thereof.

The upper EML 740B may include the dopant 742, the first host 744 and/or the second host 746. The dopant 742 is the organic metal compound of green phosphorescent material having the structure of Formulae 1 to 6. The first host 744 is the (hetero) aryl-amine-based organic compound of the p-type host having the structure of Formulae 7 to 8. The second host 746 is the azine-based organic compound of the n-type host having the structure of Formulae 9 to 10.

As an example, the contents of the host including the first and second hosts 744 and 746 in the upper EML 740B may be, but is not limited to, between about 50 and about 99 wt %, for example, about 80 and about 95 wt %, and the contents of the dopant in the upper EML 740B may be, but is not limited to, between about 1 and about 50 wt %, for example, about 5 and about 20 wt %. When the upper EML 740B includes both the first and second hosts 744 and 746, the first host 744 and the second host 746 may be admixed, but is not limited to, with a weight ratio from about 4:1 to about 1:4, for example, about 3:1 to about 1:3.

Alternatively, the EML2 740 may further include a middle emitting material layer (third layer, 740C in FIG. 6) of yellow green EML disposed between the lower EML 740A of the red EML and the upper EML 740B of the green EML.

The OLED D2 in accordance with this aspect has a tandem structure. At least one EML includes the dopant 742 with excellent luminous properties, and the first host 744 and/or the second host 746 with excellent charge and energy transfer properties. By combining the dopant 742, which have rigid chemical conformation and can adjust luminous colors with ease, and the first and/or second hosts 744 and/or 746 with excellent luminous properties, the OLED D2 can reduce its driving voltage and enhance its luminous efficiency and luminous lifespan.

The OLED may have three or more emitting parts to form a tandem structure. FIG. 6 is a schematic cross-sectional view illustrating an organic light emitting diode in accordance with still another exemplary aspect of the present disclosure. As illustrated in FIG. 6, the OLED D3 includes first and second electrodes 510 and 520 facing each other and an emissive layer 530' disposed between the first and second electrodes 510 and 520. The emissive layer 530' includes a first emitting part 600 disposed between the first and second electrodes 510 and 520, a second emitting part 700' disposed between the first emitting part 600 and the second electrode 520, a third emitting part 800 disposed between the second emitting part 700' and the second electrode 520, a first charge generation layer (CGL1) 680 disposed between the first and second emitting parts 600 and 700', and a second charge generation layer (CGL2) 780 disposed between the second and third emitting parts 700' and 800.

The first emitting part 600 includes a first EML (EML1) 640. The first emitting part 600 may further include at least one of an HIL 610 disposed between the first electrode 510 and the EML1 640, a first HTL (HTL1) 620 disposed between the HIL 610 and the EML1 640, a first ETL (ETL1) 660 disposed between the EML1 640 and the CGL 680. Alternatively, the first emitting part 600 may further comprise a first EBL (EBL1) 630 disposed between the HTL1 620 and the EML1 640 and/or a first HBL (HBL1) 650 disposed between the EML1 640 and the ETL1 660.

The second emitting part 700' comprise a second EML (EML2) 740'. The second emitting part 700' may further include at least one of a second HTL (HTL2) 720 disposed between the CGL1 680 and the EML2 740' and a second ETL (ETL2) 760 disposed between the second electrode 520 and the EML2 740'. Alternatively, the second emitting part 700' may further include a second EBL (EBL2) 730 disposed between the HTL2 720 and the EML2 740' and/or a second HBL (HBL2) 750 disposed between the EML2 740' and the ETL2 760.

The third emitting part 800 includes a third EML (EML3) 840. The third emitting part 800 may further comprise at least one of a third HTL (HTL3) 820 disposed between the CGL2 780 and the EML3 840, a third ETL (ETL3) 860 disposed between the second electrode 520 and the EML3 840 and an EIL 870 disposed between the second electrode 520 and the ETL3 860. Alternatively, the third emitting part 800 may further comprise a third EBL (EBL3) 830 disposed between the HTL3 820 and the EML3 840 and/or a third HBL (HBL3) 850 disposed between the EML3 840 and the ETL3 860.

At least one of the EML1 640, the EML2 740' and the EML3 840 may include the dopant 742, the first host 744 and/or the second host 746 to emit green or yellow green color. In addition, another of the EML1 640, the EML2 740' and the EML3 840 emit a blue color so that the OLED D3 can realize white emission. Hereinafter, the OLED where the EML2 740' emits green or yellow green color will be described in detail.

The CGL1 680 is disposed between the first emitting part 600 and the second emitting part 700' and the CGL2 780 is disposed between the second emitting part 700' and the third emitting part 800. The CGL1 680 includes a first N-type CGL (N-CGL1) 685 disposed adjacently to the first emitting part 600 and a first P-type CGL (P-CGL1) 690 disposed adjacently to the second emitting part 700'. The CGL2 780 includes a second N-type CGL (N-CGL2) 785 disposed adjacently to the second emitting part 700' and a second P-type CGL (P-CGL2) 790 disposed adjacently to the third emitting part 800. Each of the N-CGL1 685 and the N-CGL2 785 injects electrons to the EML1 640 of the first emitting part 600 and the EML2 740' of the second emitting part 700', respectively, and each of the P-CGL1 690 and the P-CGL2 790 injects holes to the EML2 740' of the second emitting part 700' and the EML3 840 of the third emitting part 800, respectively.

Each of the EML1 640 and the EML3 840 may be independently a blue EML. In this case, each of the EML1 640 and the EML3 840 may be independently a blue EML, a sky-blue EML or a deep-blue EML. Each of the EML1 640 and the EML3 840 may include independently a blue host and a blue dopant. Each of the blue host and the blue dopant may be identical to each of the blue host and the blue dopant with referring to FIG. 5. For example, the blue dopant may include at least one of the blue phosphorescent materials, the blue fluorescent materials and the blue delayed fluorescent materials. Alternatively, the blue dopant in the EML1 640 may be identical to or different from the blue dopant in the EML3 840 in terms of color and/or luminous efficiency.

The EML2 740' may include a lower EML (first layer) 740A disposed between the EBL2 730 and the HBL2 750, an upper EML (second layer) 740B disposed between the lower EML 740A and the HBL2 750, and optionally, a middle EML (third layer) 740C disposed between the lower EML 740A and the upper EML 740B. One of the lower EML 740A and the upper EML 740B may emit red color and the other of the lower EML 740A and the upper EML 740B may emit green color. Hereinafter, the EML2 740' where the lower EML 740A emits a red color and the upper EML 740B emits a green color will be described in detail.

The lower EML 740A may include the red host and the red dopant. Each of the red host and the red dopant may be identical to each of the red host and the red dopant referring to FIG. 5. For example, the red dopant may include at least one of the red phosphorescent materials, the red fluorescent materials and the red delayed fluorescent materials.

The upper EML 740B may include the dopant 742, the first host 744 and/or the second host 746. The dopant 742 is the organic metal compound of green phosphorescent material having the structure of Formulae 1 to 6. The first host 744 is the (hetero) aryl-amine-based compound of the p-type host having the structure of Formulae 7 to 8. The second host 746 is the azine-based organic compound of the n-type host having the structure of Formulae 9 to 10.

As an example, the contents of the host including the first and second hosts 744 and 746 in the upper EML 740B may be, but is not limited to, between about 50 and about 99 wt %, for example, about 80 and about 95 wt %, and the contents of the dopant in the upper EML 740B may be, but is not limited to, between about 1 and about 50 wt %, for example, about 5 and about 20 wt %. When the upper EML 740B includes both the first and second hosts 744 and 746, the first host 744 and the second host 746 may be admixed, but is not limited to, with a weight ratio from about 4:1 to about 1:4, for example, about 3:1 to about 1:3.

The middle EML 740C may be a yellow green EML and may include a yellow green host and a yellow green dopant. As an example, the yellow green host may be identical to the red host. The yellow green dopant may include at least one of yellow green phosphorescent materials, yellow green fluorescent material and yellow green delayed fluorescent material. The middle EML 740C may be omitted.

In the OLED D3, at least one EML includes the dopant 742, the first host 744 and/or the second host 746 with excellent luminous properties. The dopant 742 can maintain its stable chemical conformation during the luminescent process. The OLED D3 including the dopant 742 as well as the first and second hosts 744 and/or 746 with excellent luminous properties can realize white luminescence with improved luminous efficiency and luminous lifespan.

Synthesis Example 1: Synthesis of Compound 1

(1) Synthesis of Intermediate A-1

[Reaction Formula 1-1]

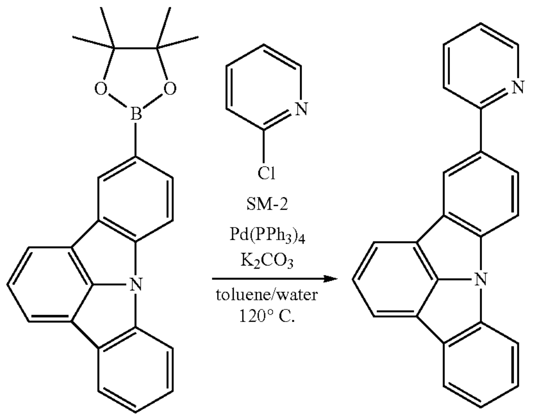

SM-1 A-1

Compound SM-1 (7.34 g, 20 mmol), Compound SM-2 (2.27 g, 20 mmol), Tetrakis(triphenylphosphine)palladium (0) ($Pd(PPh_3)_4$, 1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate A-1 (6.05 g, yield: 95%).

(2) Synthesis of Intermediate I-1

[Reaction Formula 1-2]

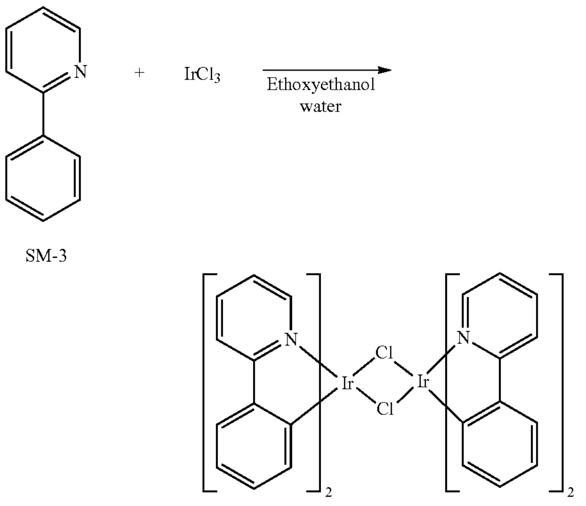

I-1

Compound SM-3 (3.10 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate I-1 of solid (9.56 g, yield: 89%).

(3) Synthesis of Intermediate I-2

[Reaction Formula 1-3]

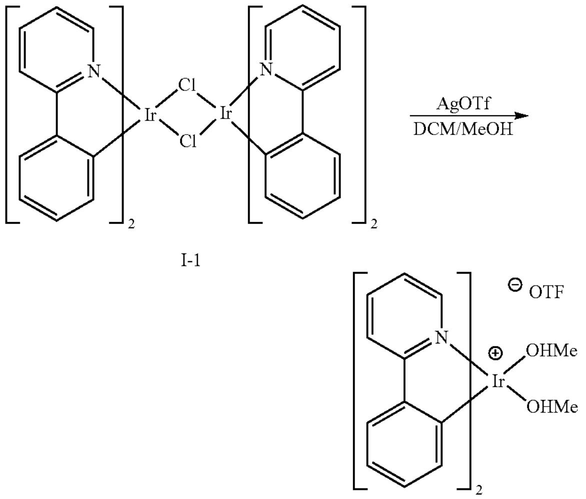

I-2

The Intermediate I-1 (5.16 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate I-2 of solid (6.03 g, yield: 88%).

(4) Synthesis of Compound 1

[Reaction Formula 1-4]

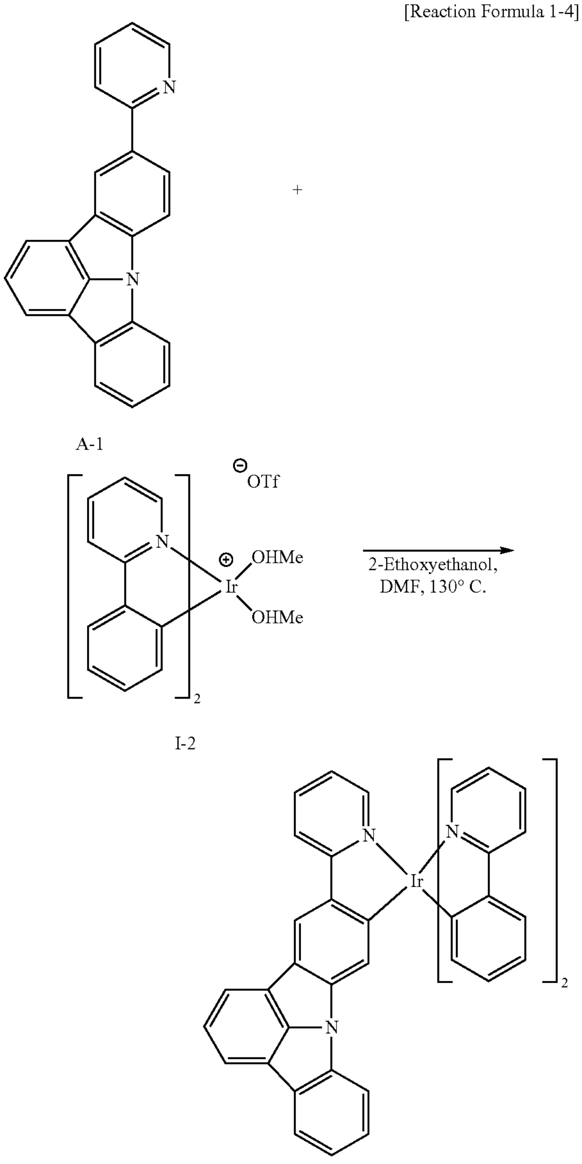

A-1

I-2

1

The Intermediate A-1 (1.11 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 1 (2.01 g, yield: 82%).

Synthesis Example 2: Synthesis of Compound 2

(1) Synthesis of Intermediate B-1

[Reaction Formula 2-1]

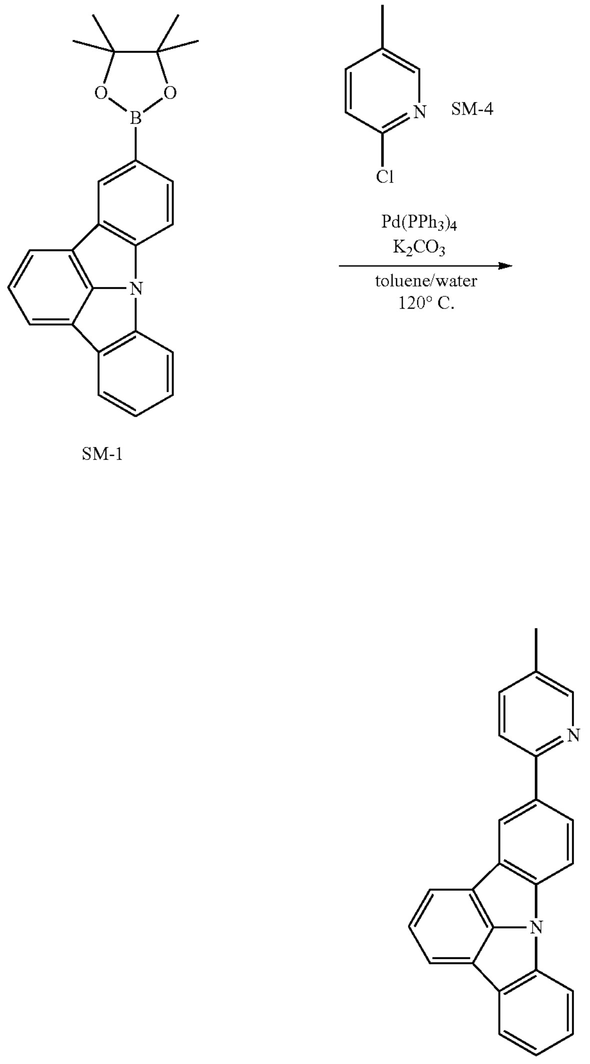

SM-4

SM-1

B-1

Compound SM-1 (7.34 g, 20 mmol), Compound SM-4 (2.54 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate B-1 (6.17 g, yield: 93%).

(2) Synthesis of Compound 2

[Reaction Formula 2-2]

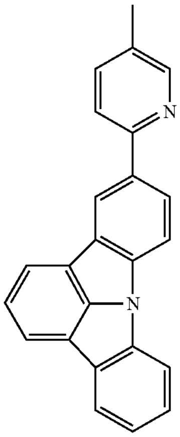

B-1

+

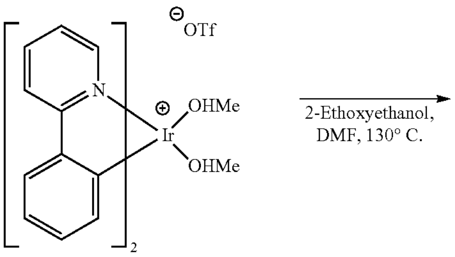

I-2

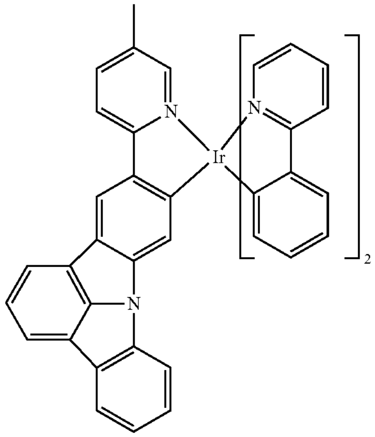

2

The Intermediate B-1 (1.16 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 2 (2.02 g, yield: 81%).

Synthesis Example 3: Synthesis of Compound 16

(1) Synthesis of Intermediate C-1

[Reaction Formula 3-1]

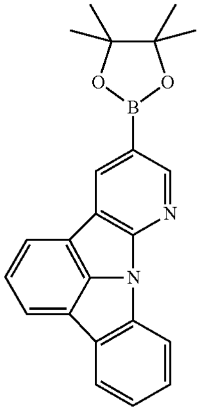

SM-5

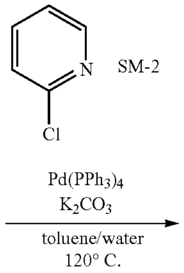

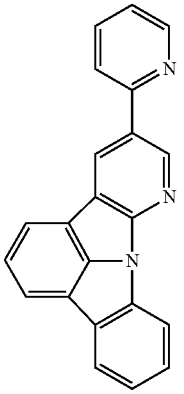

C-1

Compound SM-5 (7.34 g, 20 mmol), Compound SM-2 (2.27 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate C-1 (5.66 g, yield: 93%)

(2) Synthesis of Compound 16

[Reaction Formula 3-2]

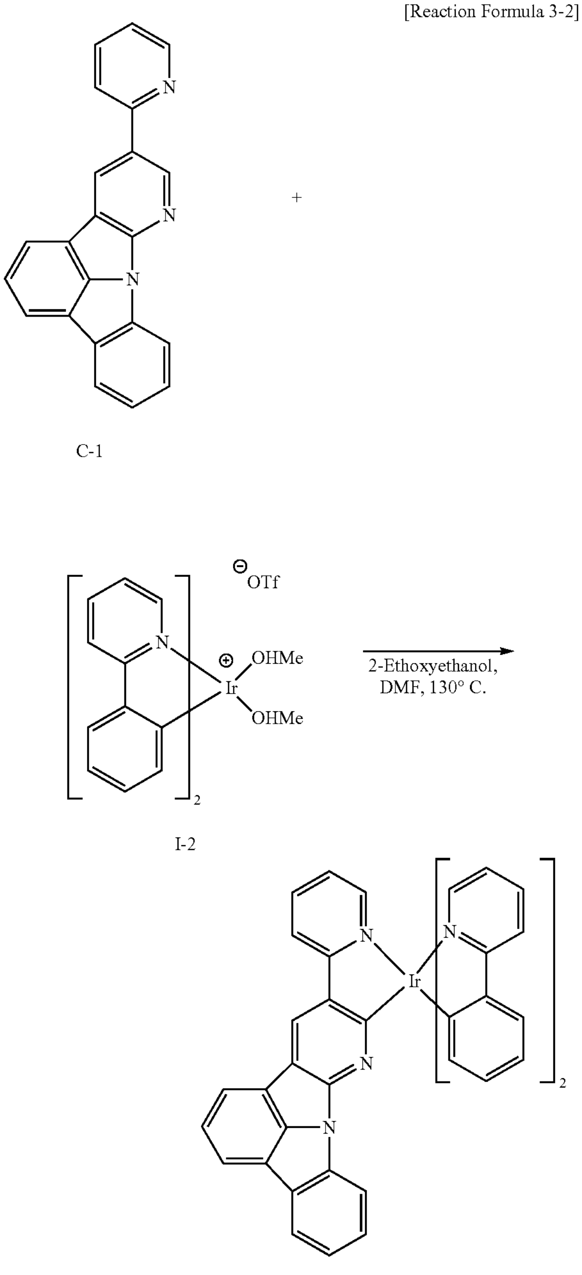

C-1

I-2

16

The Intermediate C-1 (1.12 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 16 (2.02 g, yield: 81%).

Synthesis Example 4: Synthesis of Compound 17

(1) Synthesis of Intermediate D-1

[Reaction Formula 4-1]

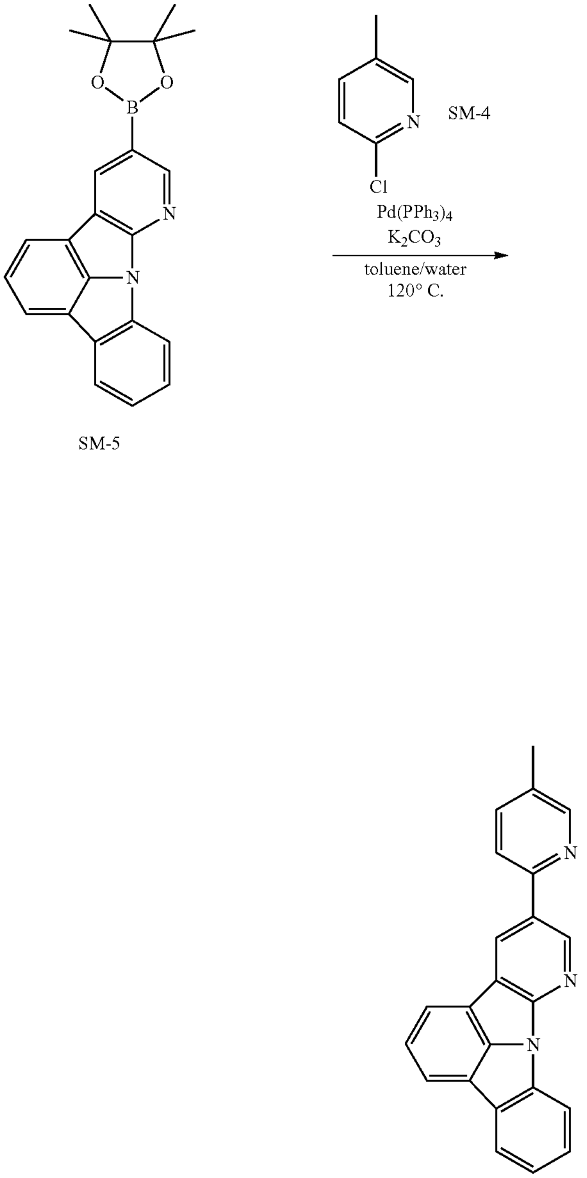

SM-5

SM-4

D-1

Compound SM-5 (7.34 g, 20 mmol), Compound SM-4 (2.54 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate D-1 (5.86 g, yield: 88%).

(2) Synthesis of Compound 17

[Reaction Formula 4-2]

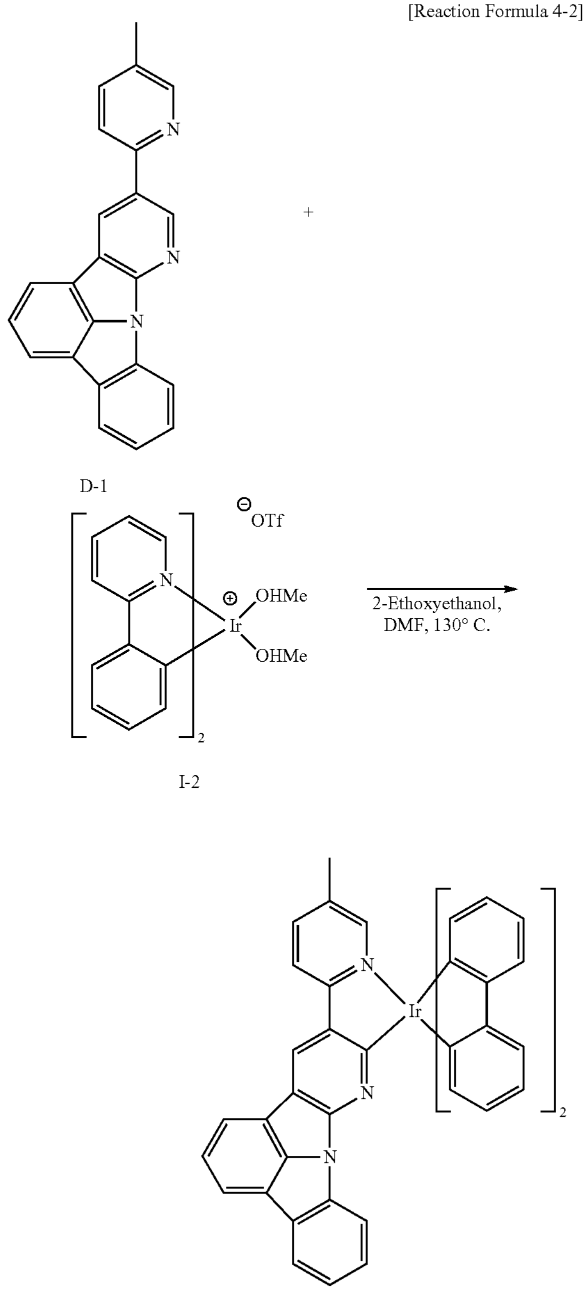

D-1

I-2

17

The Intermediate D-1 (1.17 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 17 (2.25 g, yield: 90%).

Synthesis Example 5: Synthesis of Compound 27

(1) Synthesis of Intermediate E-1

[Reaction Formula 5-1]

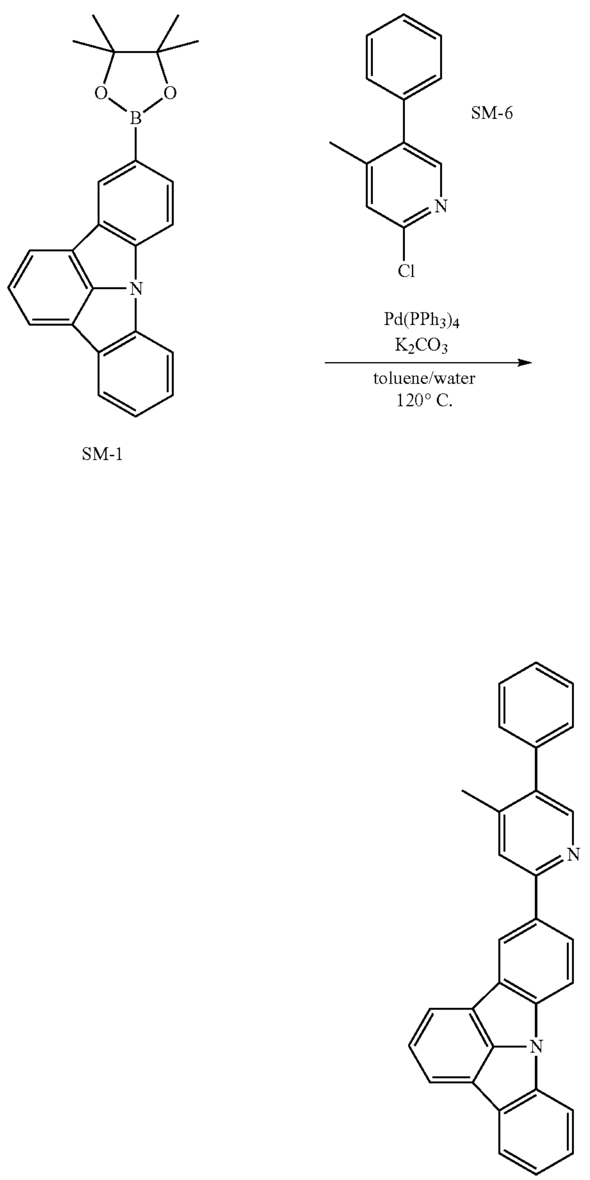

SM-1

SM-6

E-1

Compound SM-1 (7.34 g, 20 mmol), Compound SM-6 (4.08 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate E-1 (7.34 g, yield: 90%)

(2) Synthesis of Compound 27

[Reaction Formula 5-2]

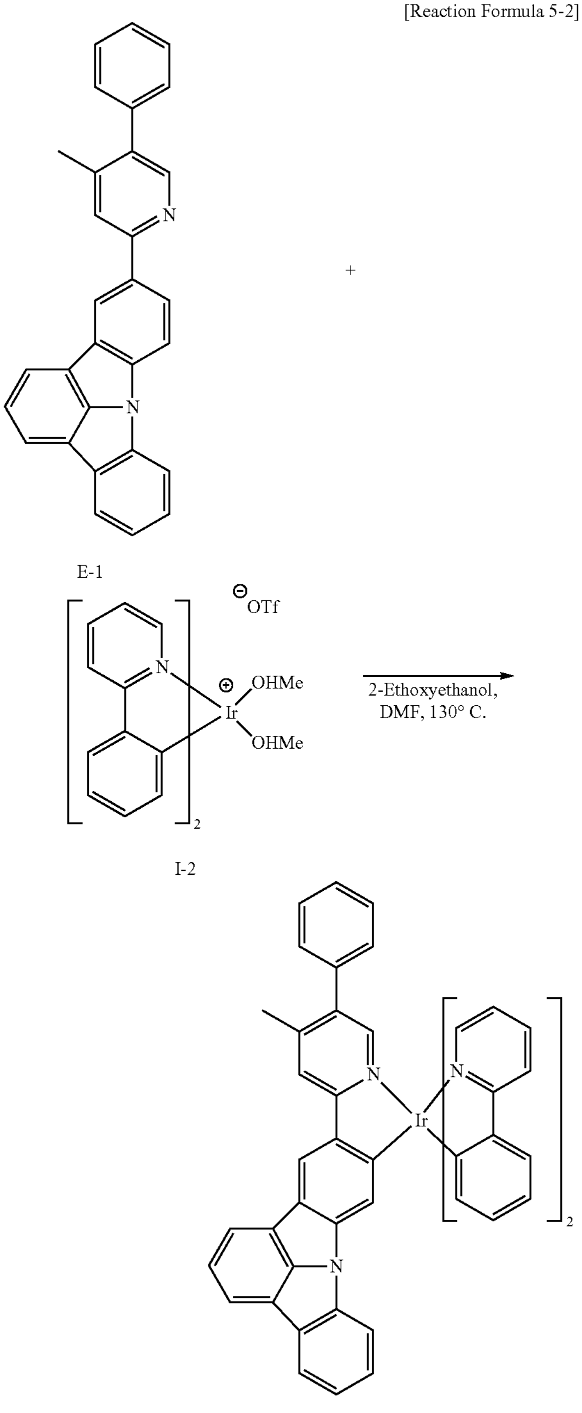

E-1 + I-2 → 27

The Intermediate E-1 (1.43 g, 3.5 mmol), the Intermediate I-2 (2.15 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 27 (2.45 g, yield: 90%).

Synthesis Example 6: Synthesis of Compound 32

(1) Synthesis of Intermediate F-1

[Reaction Formula 6-1]

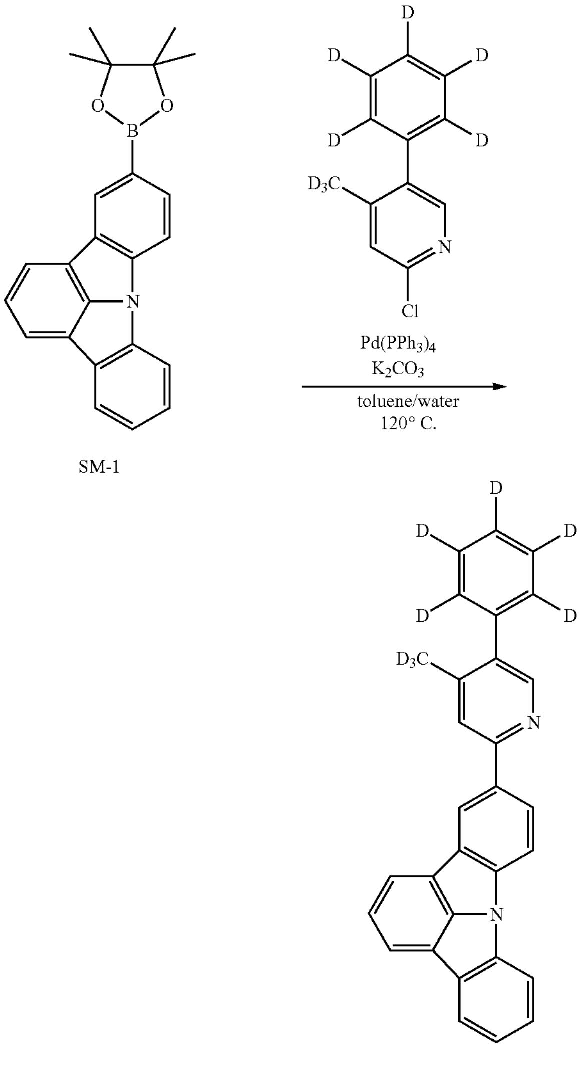

SM-1

F-1

Compound SM-1 (7.34 g, 20 mmol), Compound SM-7 (4.24 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate F-1 (7.67 g, yield: 92%).

(2) Synthesis of Intermediate J-1

[Reaction Formula 6-2]

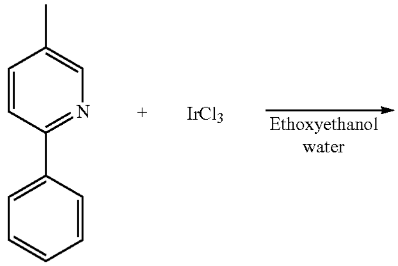

SM-8

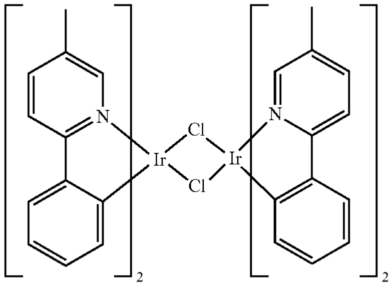

J-1

Compound SM-8 (3.38 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate J-1 of solid (4.07 g, yield: 90%).

(3) Synthesis of Intermediate J-2

[Reaction Formula 6-3]

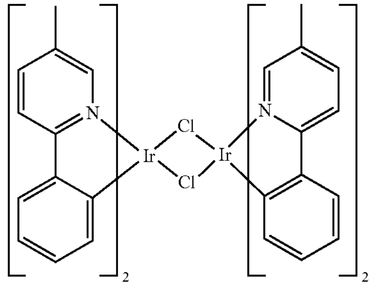

J-1

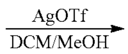

-continued

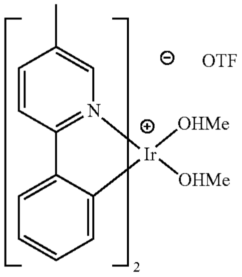

J-2

The Intermediate J-1 (5.16 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate J-2 of solid (6.03 g, yield: 88%).

(4) Synthesis of Compound 32

[Reaction Formula 6-4]

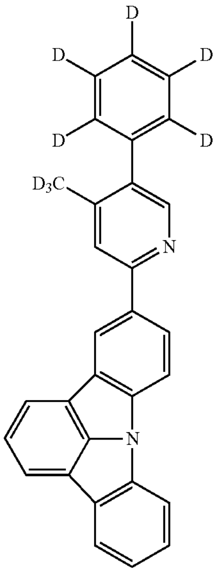

F-1

+

-continued

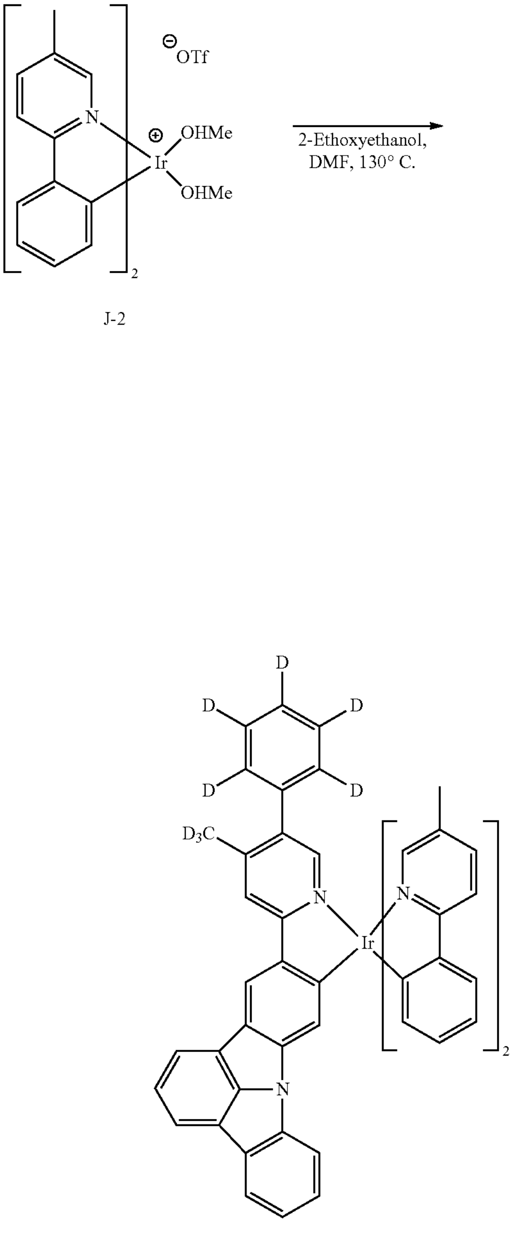

J-2

32

The Intermediate F-1 (1.46 g, 3.5 mmol), the Intermediate J-2 (2.23 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 32 (2.47 g, yield: 87%).

Synthesis Example 7: Synthesis of Compound 34

(1) Synthesis of Intermediate G-1

[Reaction Formula 7-1]

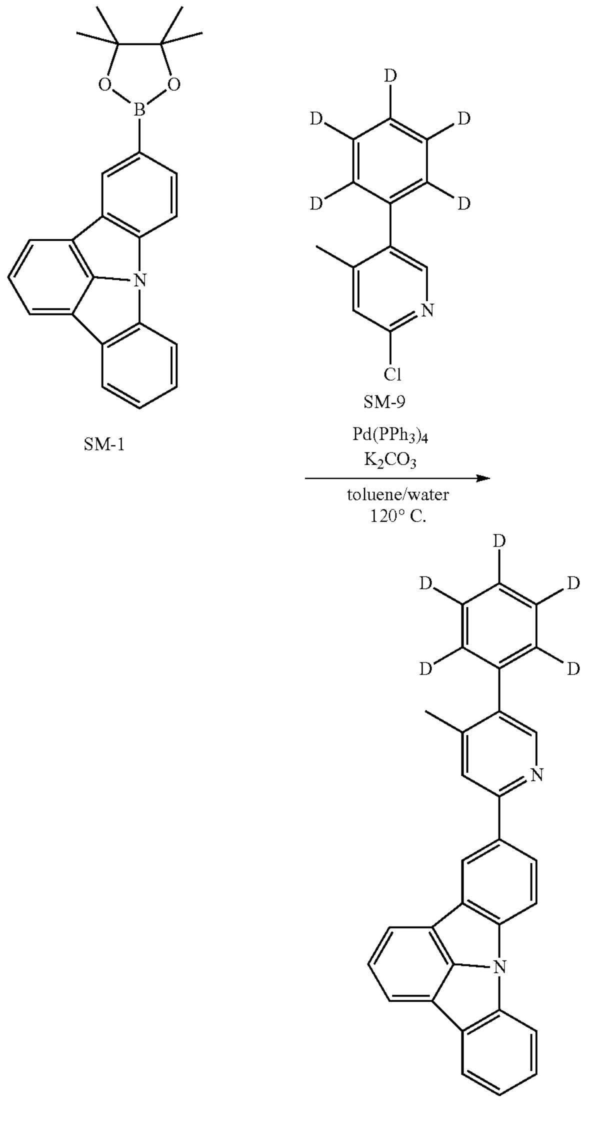

SM-1

SM-9

G-1

Compound SM-1 (7.34 g, 20 mmol), Compound SM-9 (4.24 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate G-1 (7.53 g, yield: 91%).

(2) Synthesis of Compound 34

[Reaction Formula 7-2]

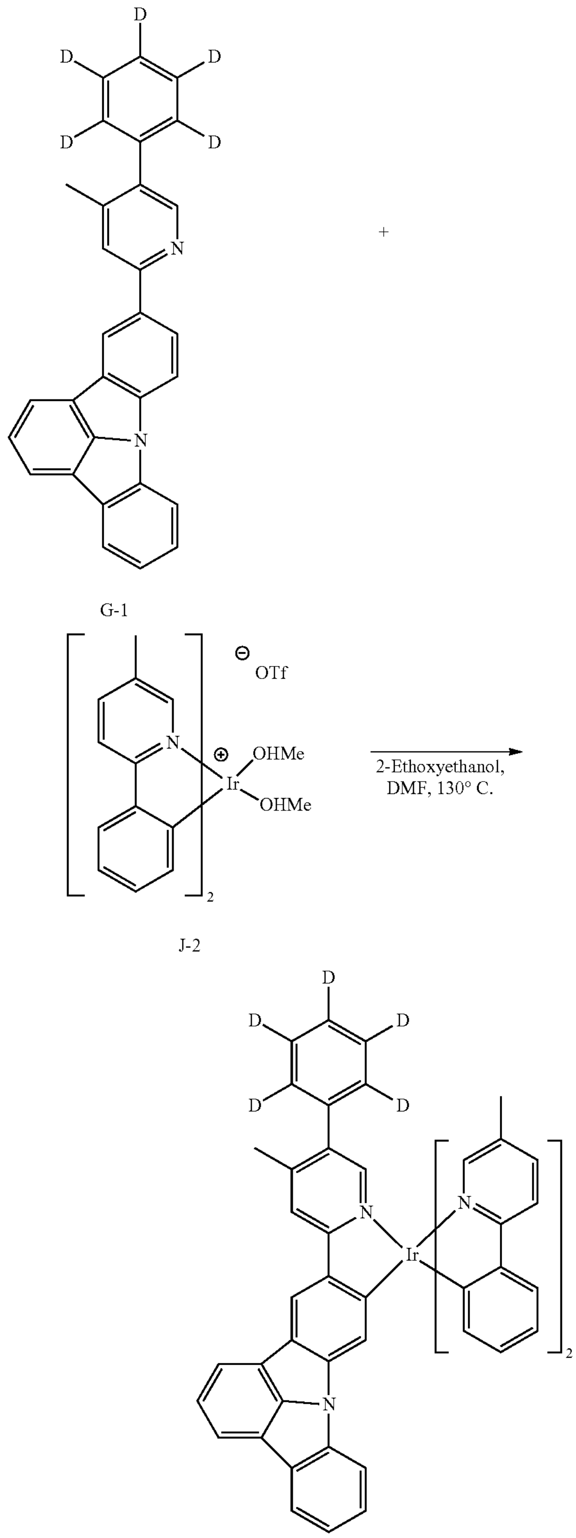

G-1

J-2

34

The Intermediate G-1 (1.45 g, 3.5 mmol), the Intermediate J-2 (2.23 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 34 (2.26 g, yield: 80%).

Synthesis Example 8: Synthesis of Compound 35

(1) Synthesis of Intermediate H-1

[Reaction Formula 8-1]

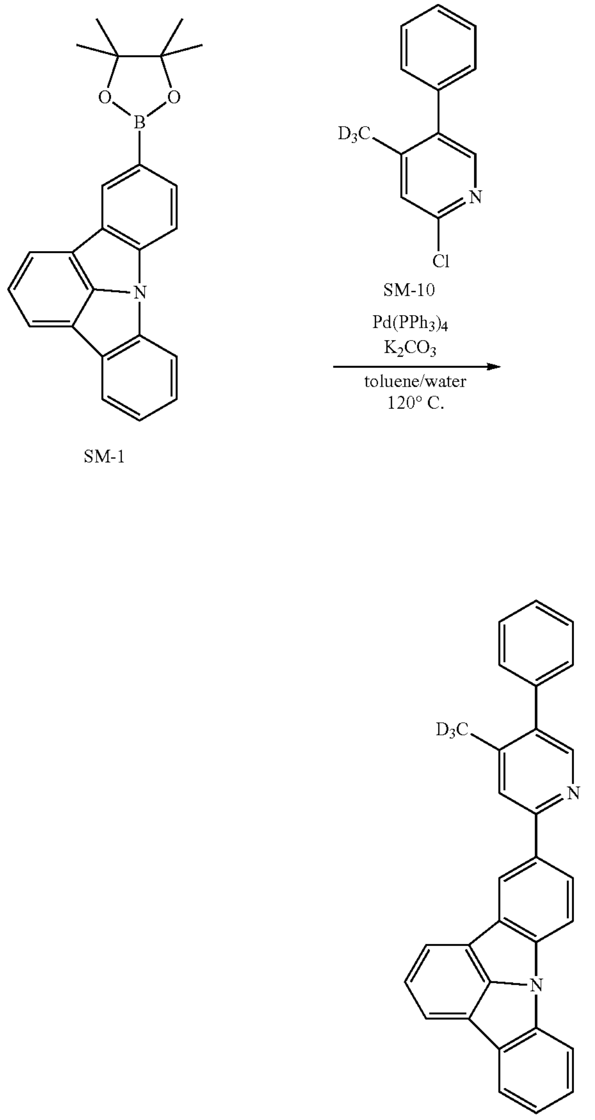

SM-1

SM-10

H-1

Compound SM-1 (7.34 g, 20 mmol), Compound SM-10 (4.14 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. An organic layer was extracted with chloroform and washed with water. Water was removed with anhydrous $MgSO_4$, the organic layer was filtered, the organic solvent was distilled under reduced pressure to be removed, and then a crude product was purified with column chromatography to give the Intermediate H-1 (7.83 g, yield: 95%).

(2) Synthesis of Compound 35

[Reaction Formula 8-2]

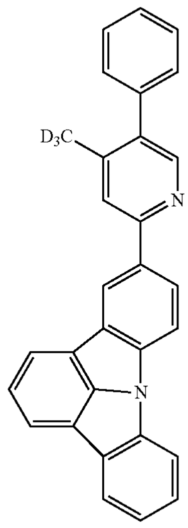

H-1

+

-continued

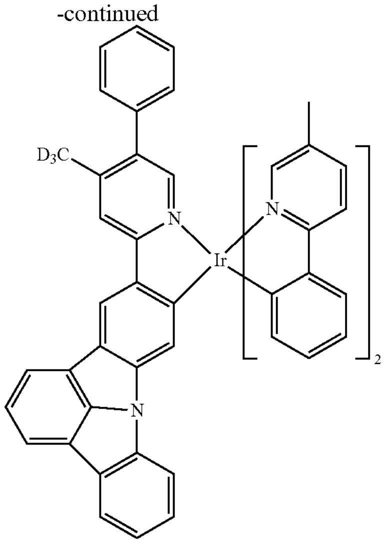

35

The Intermediate H-1 (1.44 g, 3.5 mmol), the Intermediate J-2 (2.23 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 35 (2.28 g, yield: 81%).

Synthesis Example 9: Synthesis of Compound 136

(1) Synthesis of Intermediate A-2

[Reaction Formula 9-1]

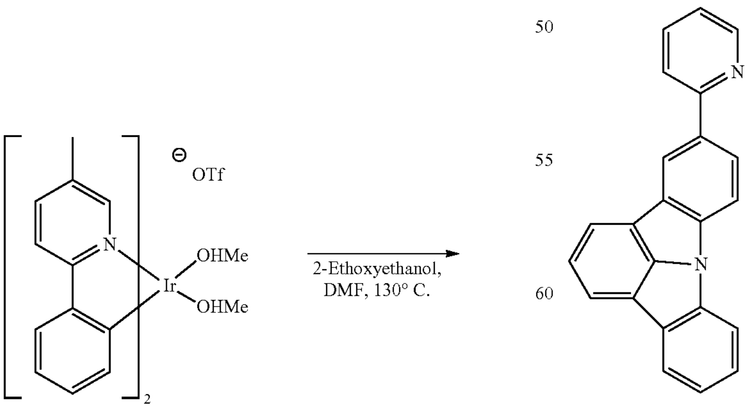

J-2

A-1

+

-continued

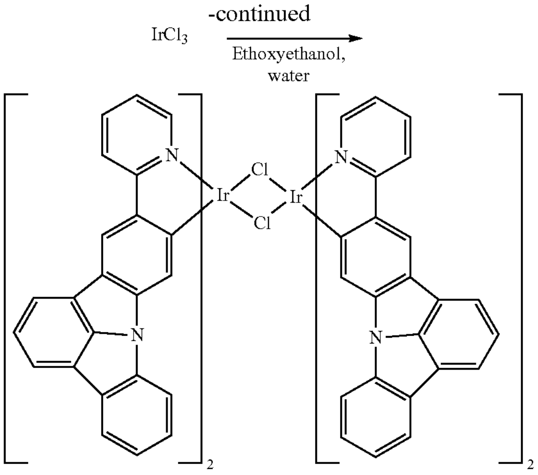

A-2

The Intermediate A-1 (6.36 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate A-2 of solid (5.53 g, yield: 80%).

(2) Synthesis of Intermediate A-3

[Reaction Formula 9-2]

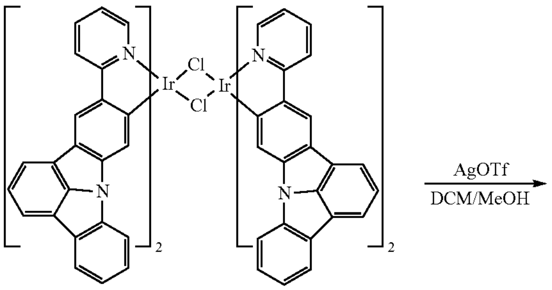

A-2

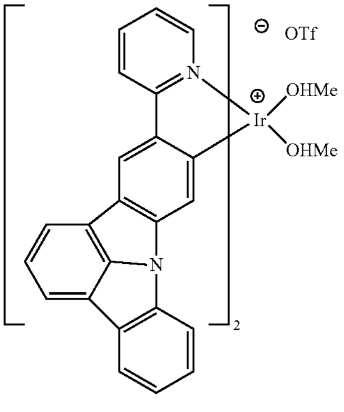

A-3

The Intermediate A-2 (8.29 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate A-3 of solid (7.99 g, yield: 80%).

(3) Synthesis of Compound 136

[Reaction Formula 9-3]

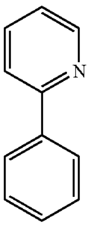

\+

L-1

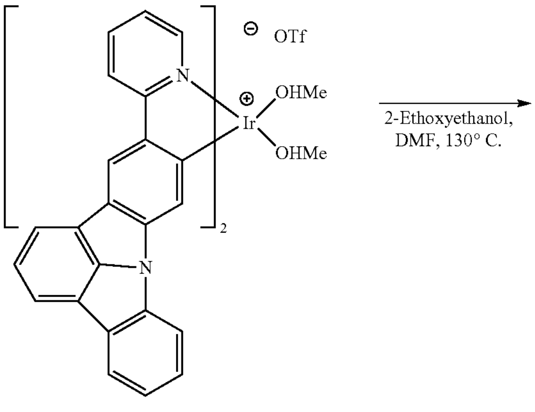

A-3

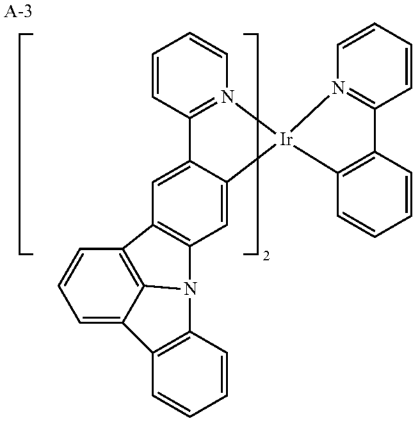

136

Compound L-1 (0.54 g, 3.5 mmol), the Intermediate A-3 (3.12 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 136 (2.46 g, yield: 80%).

Synthesis Example 10: Synthesis of Compound 137

[Reaction Formula 10]

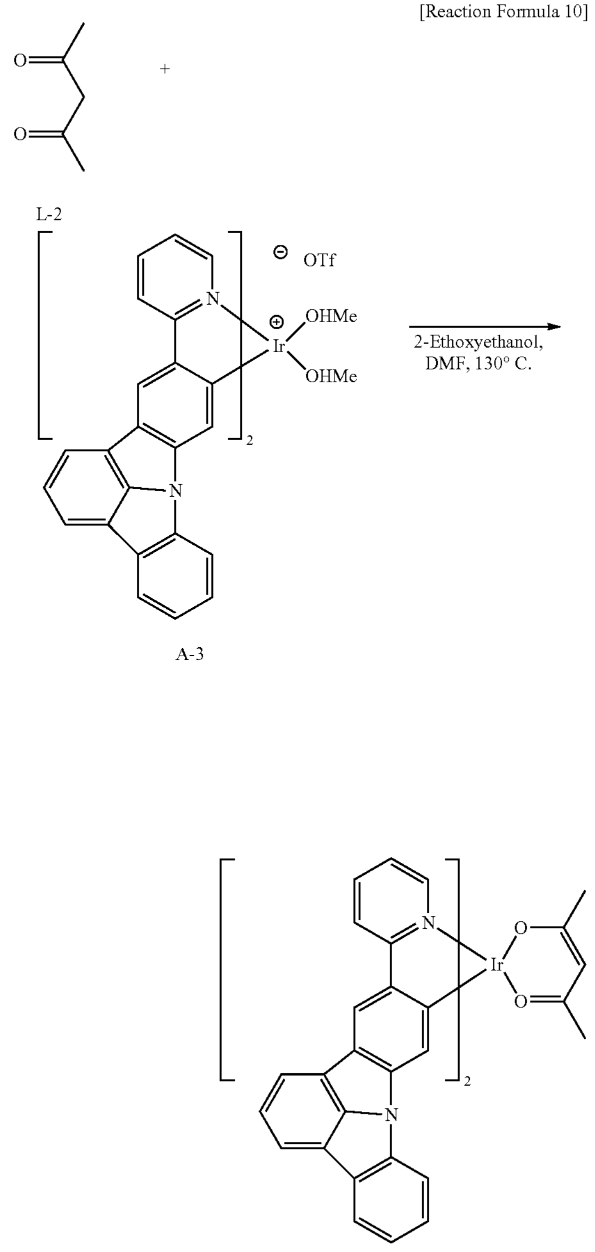

L-2

A-3

137

Compound L-2 (0.35 g, 3.5 mmol), the Intermediate A-3 (3.12 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 137 (2.22 g, yield: 80%).

Synthesis Example 11: Synthesis of Compound 141

(1) Synthesis of Intermediate C-2

[Reaction Formula 11-1]

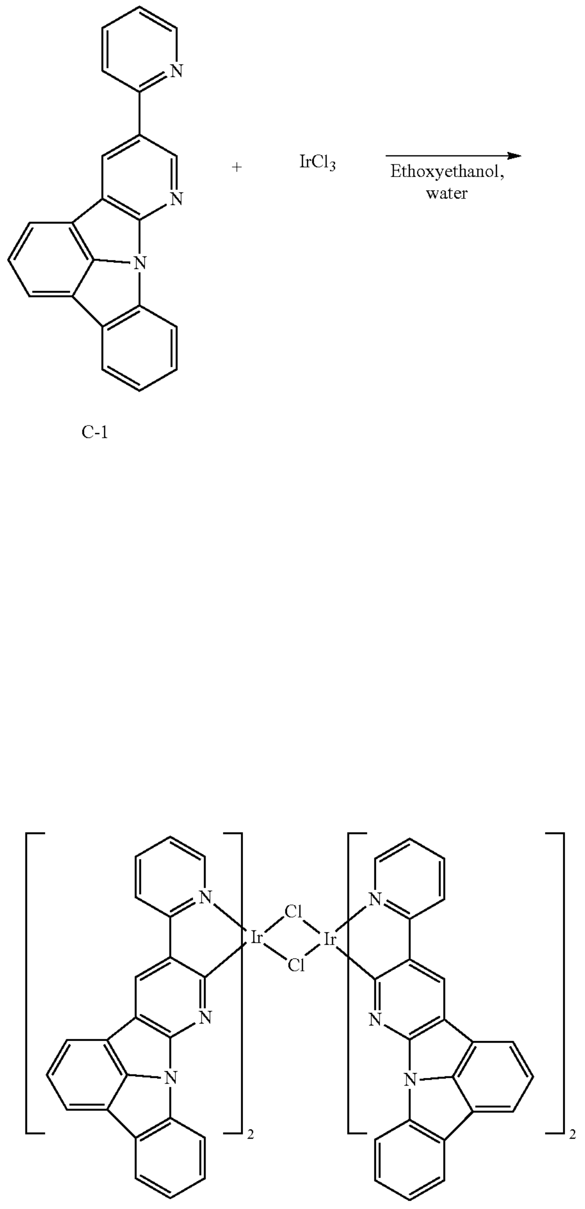

C-1

C-2

The Intermediate C-1 (6.36 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate C-2 of solid (5.32 g, yield: 77%).

(2) Synthesis of Intermediate C-3

[Reaction Formula 11-2]

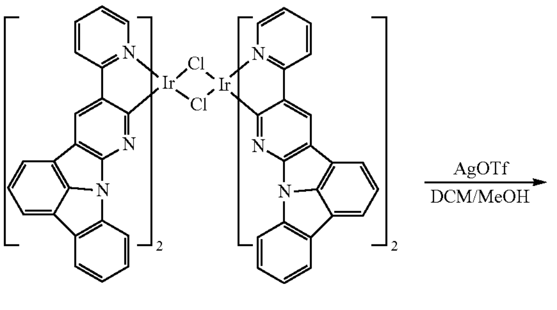

C-2

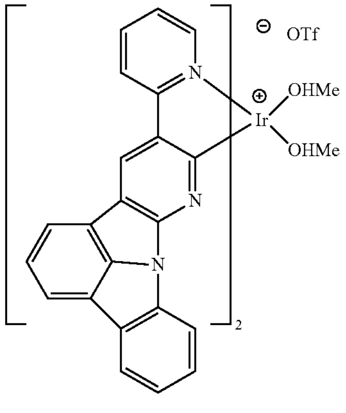

C-3

The Intermediate C-2 (8.29 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate C-3 of solid (7.29 g, yield: 72%).

(3) Synthesis of Compound 141

[Reaction Formula 11-3]

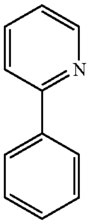

L-1

+

-continued

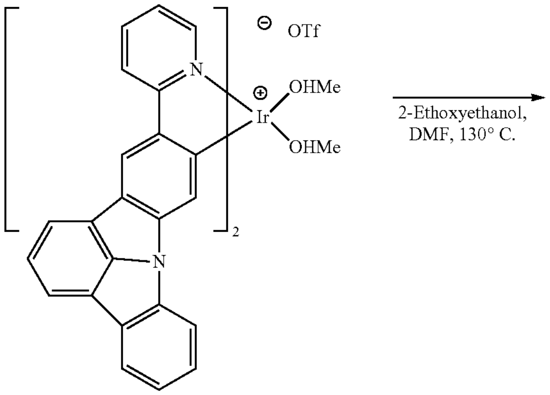

C-2

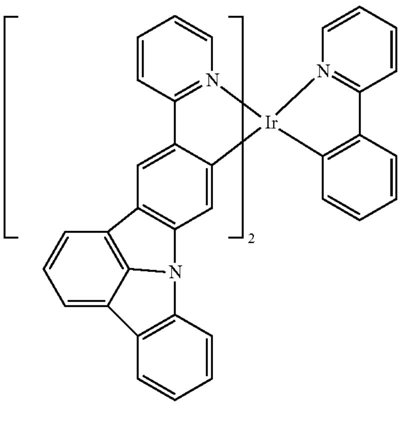

141

Compound L-1 (0.54 g, 3.5 mmol), the Intermediate C-3 (3.13 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 141 (2.45 g, yield: 83%).

Synthesis Example 12: Synthesis of Compound 142

(1) Synthesis of Intermediate D-2

[Reaction Formula 12-1]

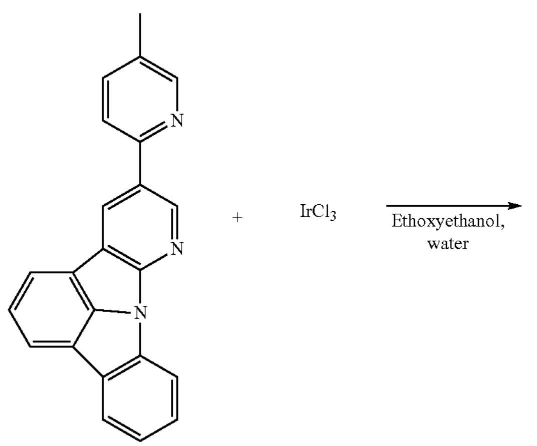

D-1

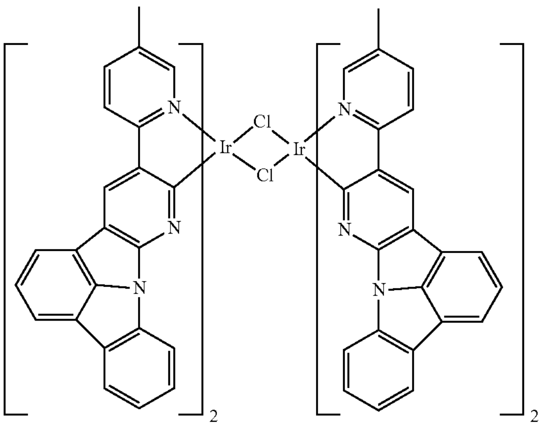

D-2

The Intermediate D-1 (6.64 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate D-2 of solid (5.71 g, yield: 80%).

(2) Synthesis of Intermediate D-3

[Reaction Formula 12-2]

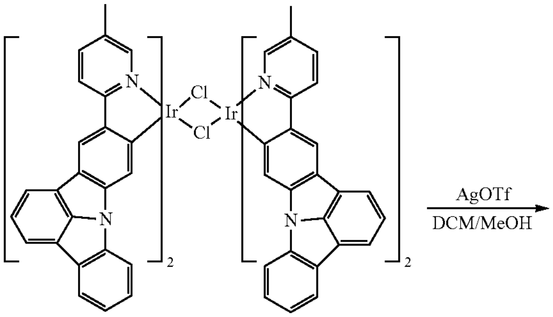

D-2

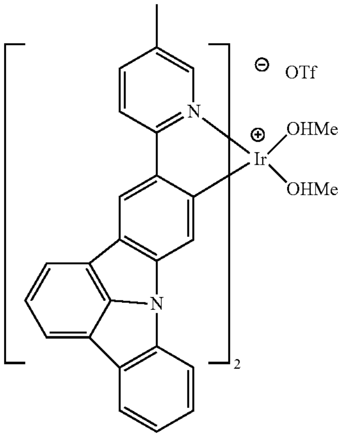

D-3

The Intermediate D-2 (8.58 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate D-3 of solid (7.09 g, yield: 69%).

(3) Synthesis of Compound 142

[Reaction Formula 12-3]

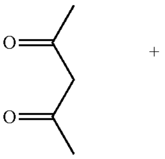

L-2

-continued

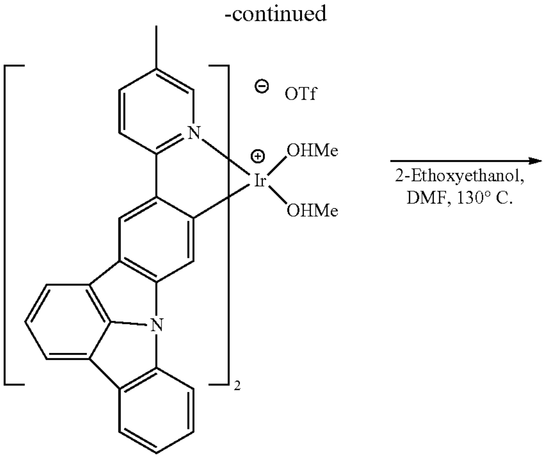

D-3

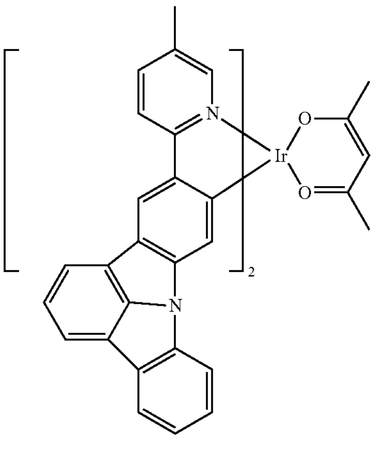

142

Compound L-2 (0.35 g, 3.5 mmol), the Intermediate D-3 (3.21 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 142 (2.12 g, yield: 74%).

Synthesis Example 13: Synthesis of Compound 147

(1) Synthesis of Intermediate E-2

[Reaction Formula 13-1]

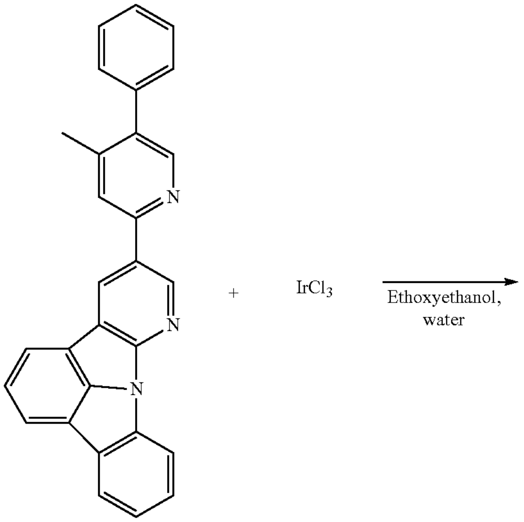

E-1

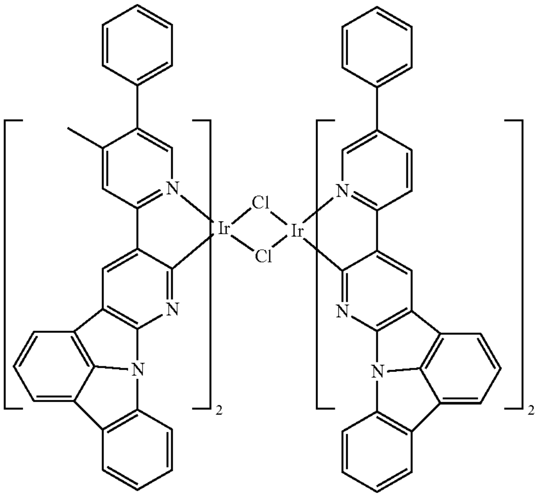

E-2

The Intermediate E-1 (8.16 g, 20 mmol), $IrCl_3$ (2.39 g, 8.0 mmol) and a mixed solvent of ethoxyethanol (90 mL) and water (30 mL) were put into a 250 mL round bottom flask, and then the solution was stirred at 130° C. for 16 hours. After the reaction was complete, the solution was cooled to room temperature, methanol was added into the solution to filter the produced solid under reduced pressure and to give the Intermediate E-2 of solid (7.26 g, yield: 87%).

(2) Synthesis of Intermediate E-3
[Reaction Formula 13-2]
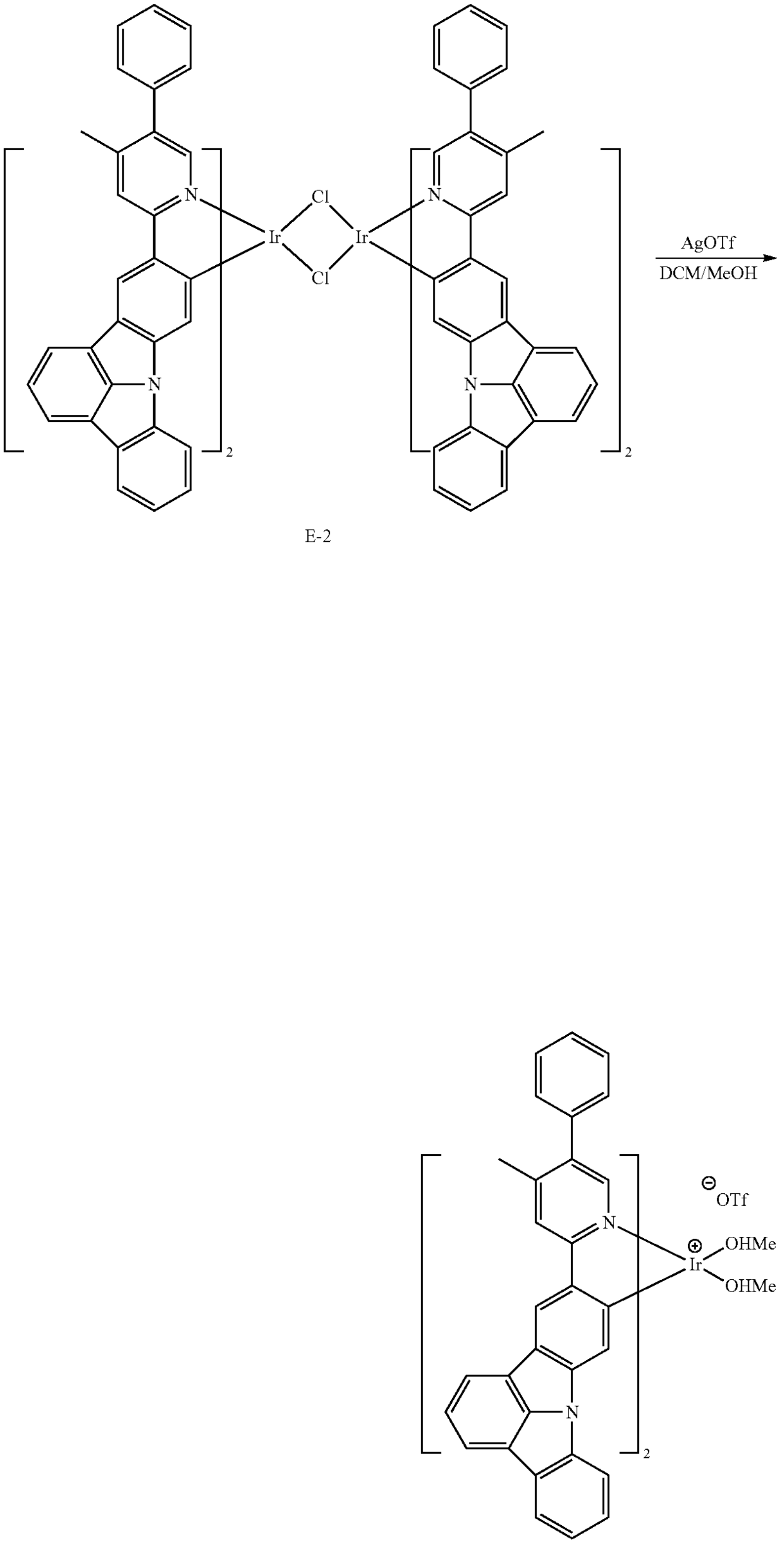
E-2
E-3

The Intermediate E-2 (10.0 g, 4.8 mmol), silver trifluoromethanesulfonate (AgOTf, 3.6 g, 14.3 mmol) and dichloromethane were put into a 1000 mL round bottom flask, and then the solution was stirred at room temperature for 16 hours. After the reaction was complete, the solution was filtered with celite to remove solid. The solvent was removed by distillation under reduced pressure to give the Intermediate E-3 of solid (8.91 g, yield: 76%).

(3) Synthesis of Compound 147

[Reaction Formula 13-3]

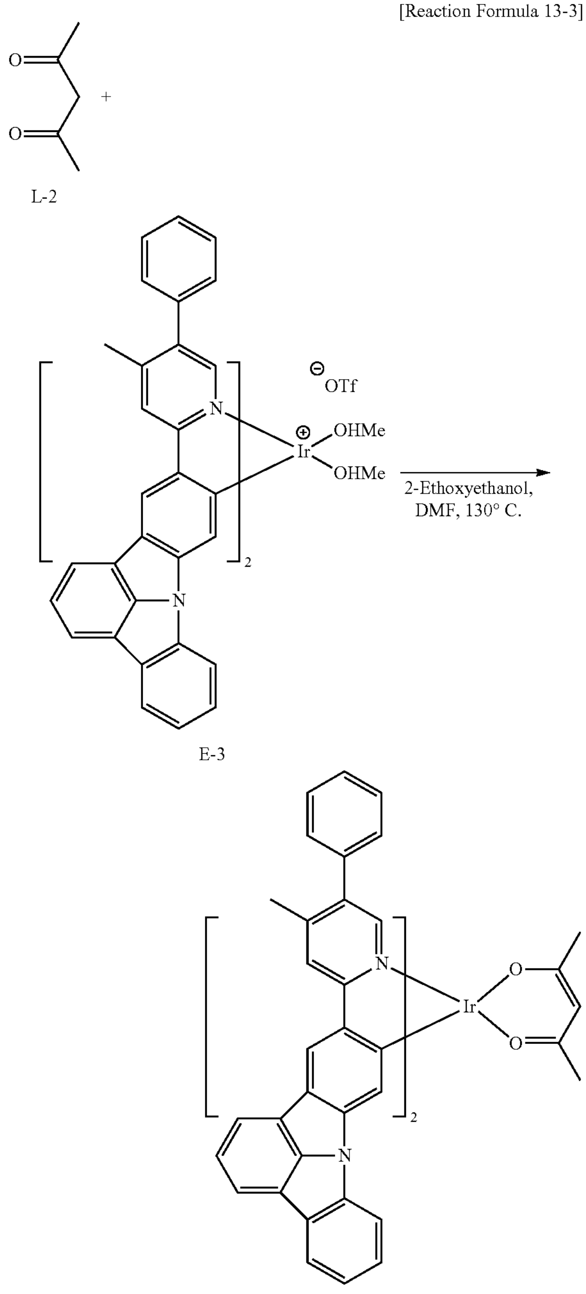

L-2
E-3
147

Compound L-2 (0.35 g, 3.5 mmol), the Intermediate E-3 (3.36 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 147 (2.59 g, yield: 78%).

Synthesis Example 14: Synthesis of Compound 148

[Reaction Formula 14]

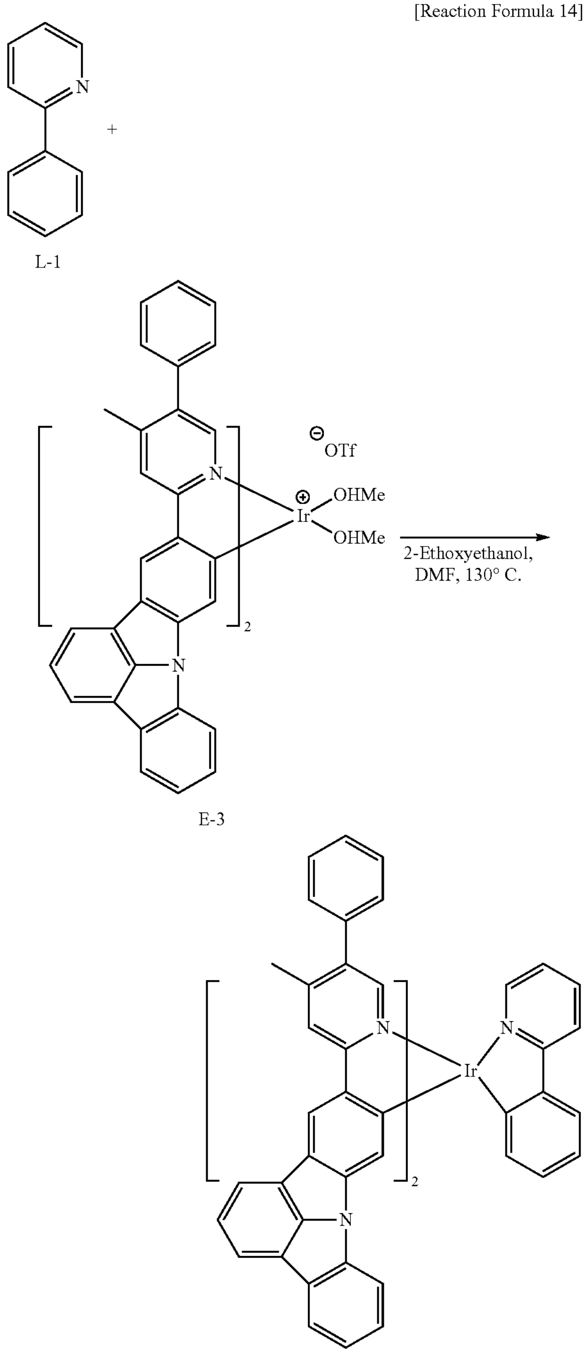

L-1
E-3
148

Compound L-1 (0.54 g, 3.5 mmol), the Intermediate E-3 (3.36 g, 3.0 mmol) and a mixed solvent of 2-ethoxyethanol (40 mL) and DMF (40 mL) were put into a 100 mL round bottom flask under nitrogen atmosphere, and then the solution was stirred at 130° C. for 48 hours. After the reaction was complete, the organic layer extracted with dichloromethane and distilled water and the solvent was removed by distillation under reduced pressure. A crude product was purified with column chromatography (eluent: toluene and hexane) to give the Compound 148 (2.96 g, yield: 85%).

Synthesis Example 15: Synthesis of Compound 251

[Reaction Formula 15]

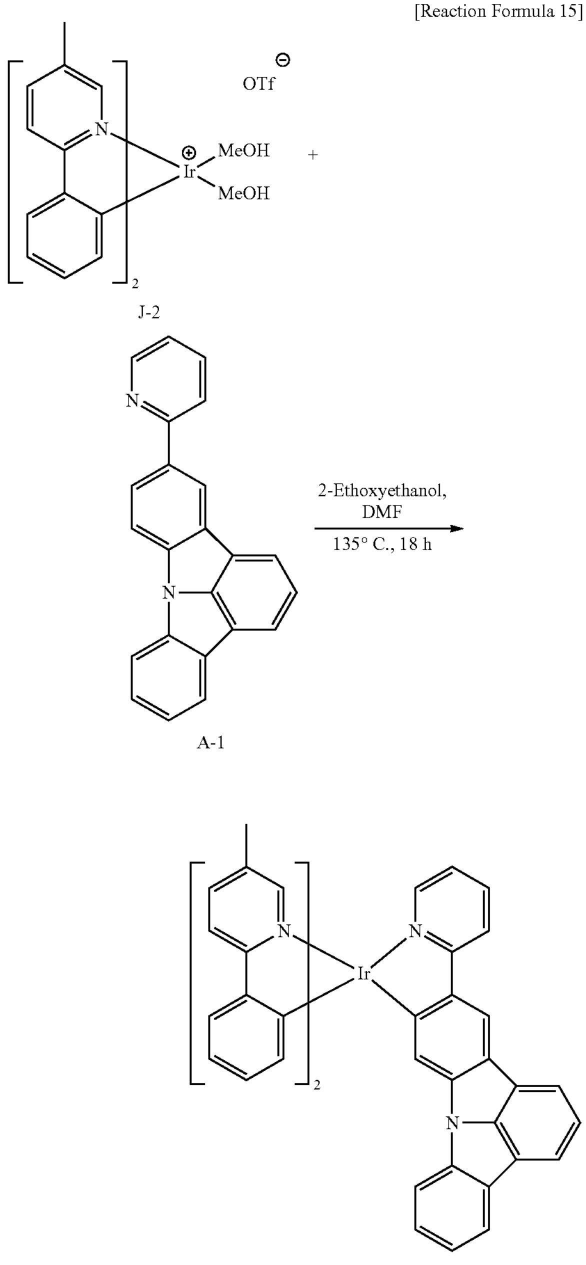

J-2

A-1

251

The Intermediate J-2 (2.23 g, 3.0 mmol), the Intermediate A-1 (1.11 g, 3.5 mmol) and a mixed solvent of 2-ethoxyethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 251 (2.31 g, yield: 91%)

Synthesis Example 16: Synthesis of Compound 252

[Reaction Formula 16]

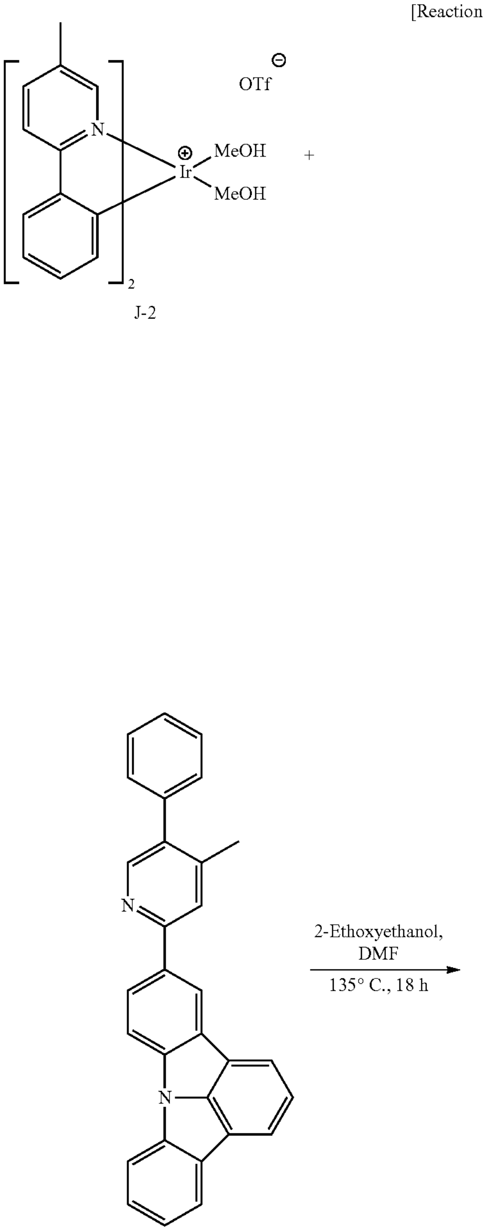

J-2

E-1

-continued

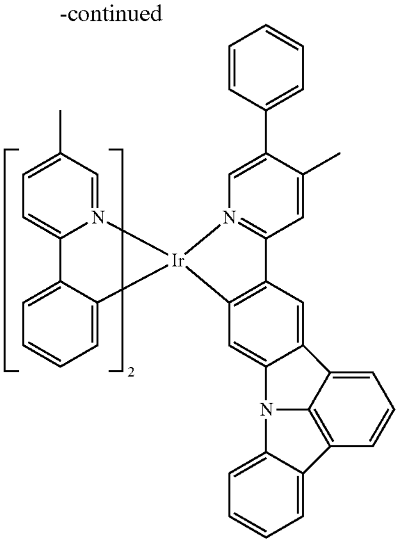

252

The Intermediate J-2 (2.23 g, 3.0 mmol), the Intermediate E-1 (1.43 g, 3.5 mmol) and a mixed solvent of 2-ethoxyethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 252 (2.61 g, yield: 93%).

Synthesis Example 17: Synthesis of Compound 253

(1) Synthesis of Intermediate K-1

[Reaction Formula 17-1]

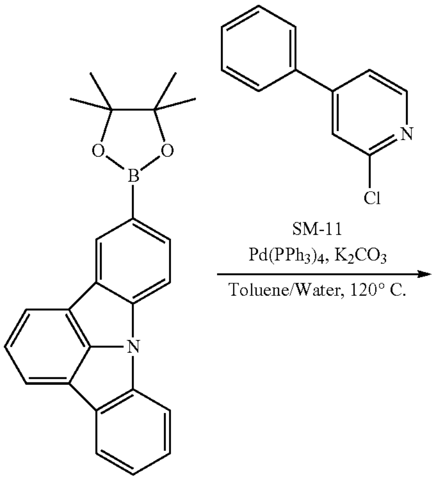

SM-1

-continued

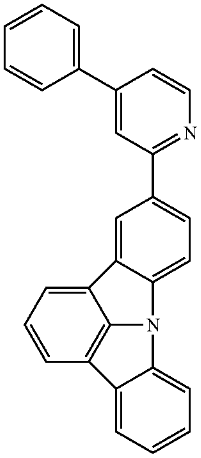

K-1

Compound SM-1 (7.34 g, 20 mmol), Compound SM-11 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. After the reaction was complete, the solution was cooled to a room temperature, and an organic layer was extracted with dichloromethane and washed with excessive water. The moisture was removed with anhydrous magnesium sulfate, the filtrate was concentrated under reduced pressure, and then was purified with column chromatography to give the Intermediate K-1 (7.26 g, yield: 92%).

(2) Synthesis of Compound 253

[Reaction Formula 17-2]

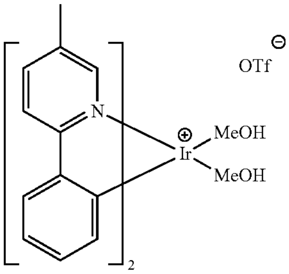

+

J-2

-continued

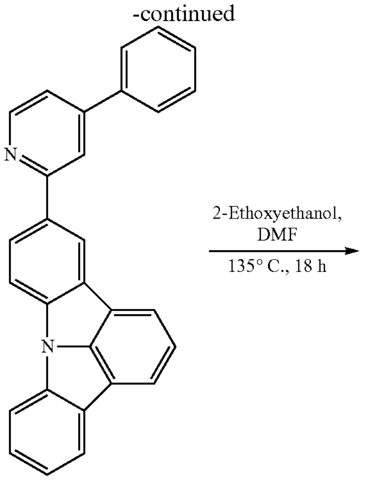

K-1

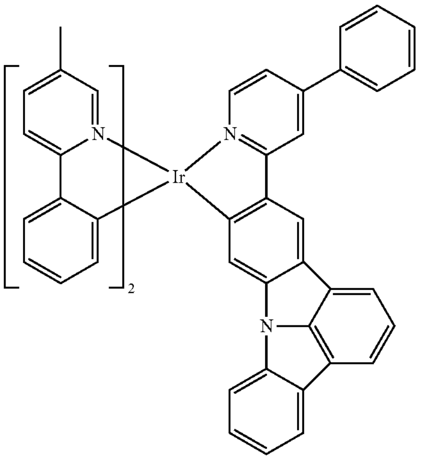

253

The Intermediate J-2 (2.23 g, 3.0 mmol), the Intermediate K-1 (1.38 g, 3.5 mmol) and a mixed solvent of 2-ethoxyethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 253 (2.55 g, yield: 92%).

Synthesis Example 18: Synthesis of Compound 254

(1) Synthesis of Intermediate M-1

[Reaction Formula 18-1]

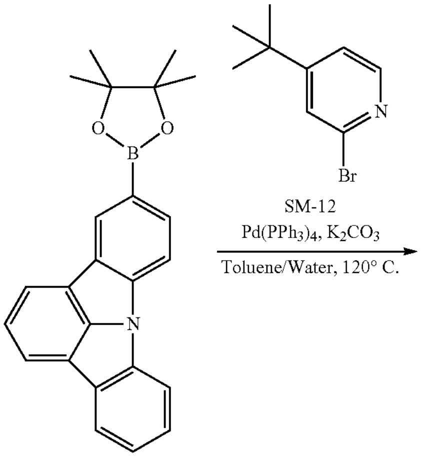

SM-1

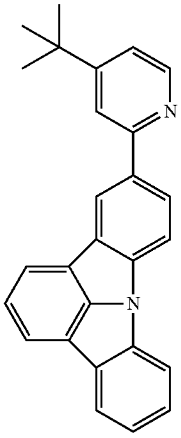

M-1

Compound SM-1 (7.34 g, 20 mmol), Compound SM-12 (4.26 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. After the reaction was complete, the solution was cooled to a room temperature, and an organic layer was extracted with dichloromethane and washed with excessive water. The moisture was removed with anhydrous magnesium sulfate, the filtrate was concentrated under reduced pressure, and then was purified with column chromatography to give the Intermediate M-1 (7.04 g, yield: 94%).

(2) Synthesis of Compound 254

[Reaction Formula 18-2]

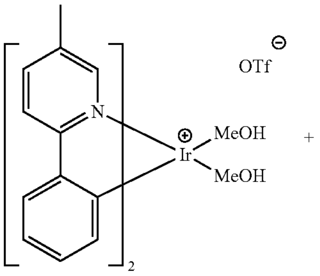

J-2

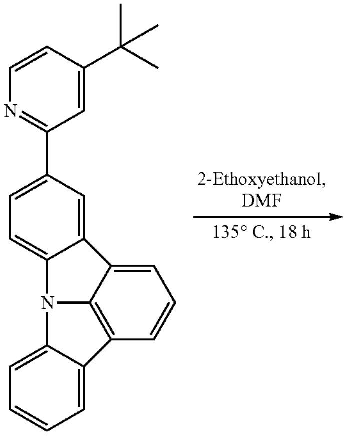

M-1

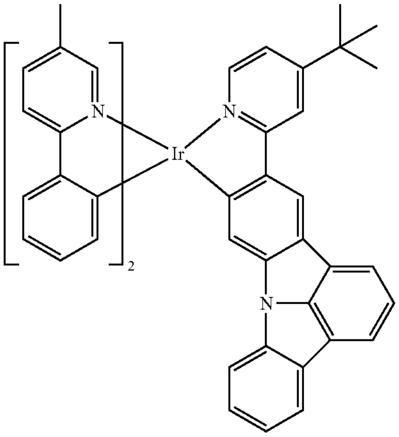

254

The Intermediate J-2 (2.23 g, 3.0 mmol), the Intermediate M-1 (1.43 g, 3.5 mmol) and a mixed solvent of 2-ethoxyethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 254 (2.55 g, yield: 89%).

Synthesis Example 19: Synthesis of Compound 255

(1) Synthesis of Intermediate N-1

[Reaction Formula 19-1]

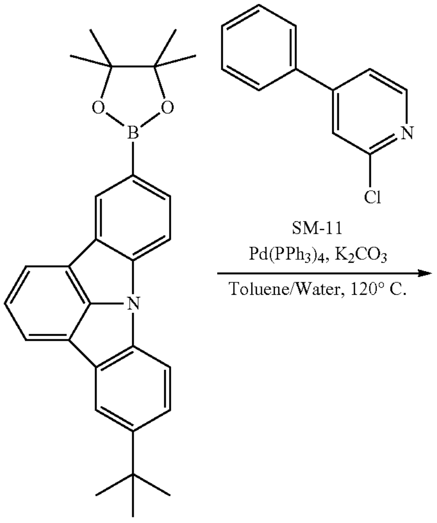

SM-13

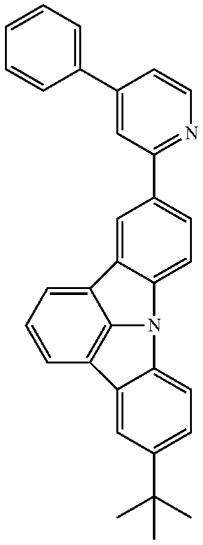

N-1

Compound SM-13 (8.47 g, 20 mmol), Compound SM-11 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. After the reaction was complete, the solution was cooled to a room temperature, and an organic layer was extracted with dichloromethane and washed with excessive water. The moisture was removed with anhydrous magnesium sulfate, the filtrate was concentrated under reduced pressure, and then was purified with column chromatography to give the Intermediate N-1 (8.11 g, yield: 90%).

(2) Synthesis of Compound 255

[Reaction Formula 19-2]

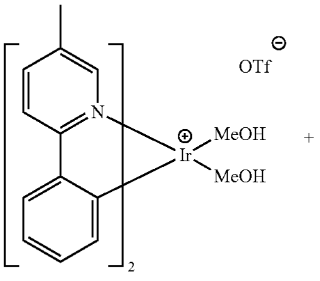

J-2

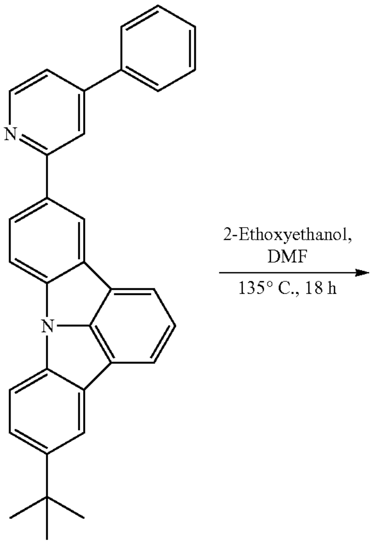

N-1

-continued

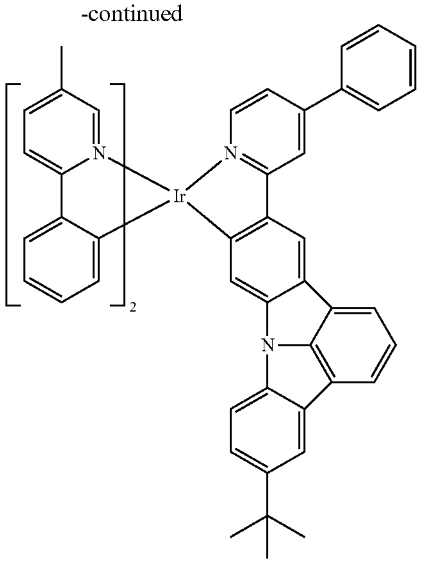

255

The Intermediate J-2 (2.23 g, 3.0 mmol), the Intermediate N-1 (1.58 g, 3.5 mmol) and a mixed solvent of 2-ethoxyethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 255 (2.55 g, yield: 87%).

Synthesis Example 20: Synthesis of Compound 256

(1) Synthesis of Intermediate O-1

[Reaction Formula 20-1]

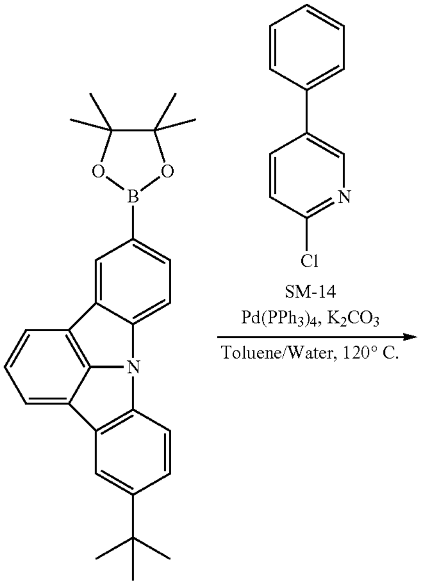

SM-13

-continued

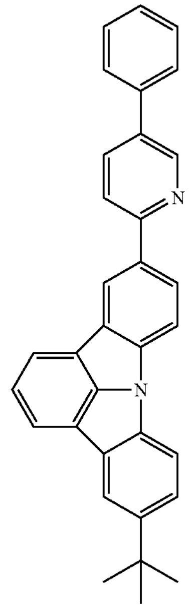

O-1

Compound SM-13 (8.47 g, 20 mmol), Compound SM-14 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. After the reaction was complete, the solution was cooled to a room temperature, and an organic layer was extracted with dichloromethane and washed with excessive water. The moisture was removed with anhydrous magnesium sulfate, the filtrate was concentrated under reduced pressure, and then was purified with column chromatography to give the Intermediate O-1 (8.20 g, yield: 91%).

(2) Synthesis of Compound 256

[Reaction Formula 20-2]

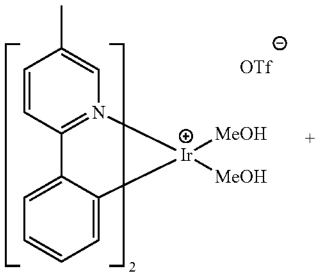

J-2

-continued

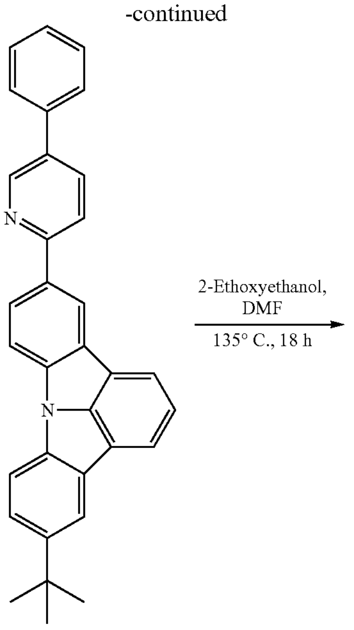

O-1

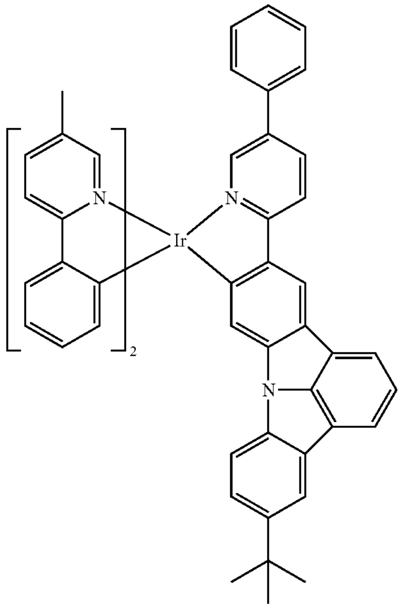

256

The Intermediate J-2 (2.23 g, 3.0 mmol), the Intermediate K-1 (1.38 g, 3.5 mmol) and a mixed solvent of 2-ethoxyethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 256 (2.55 g, yield: 92%).

Synthesis Example 21: Synthesis of Compound 257

(1) Synthesis of Intermediate P-1

[Reaction Formula 21-1]

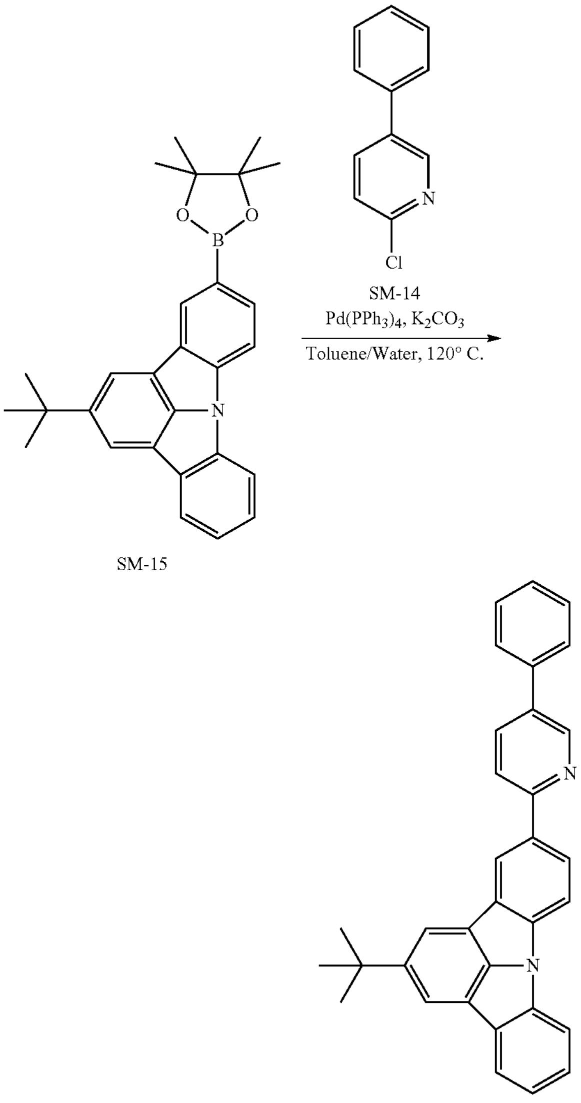

Compound SM-15 (9.47 g, 20 mmol), Compound SM-14 (3.79 g, 20 mmol), $Pd(PPh_3)_4$ (1.2 g, 1 mmol), $K_2CO_3$ (8.3 g, 60 mmol) and a mixed solvent of toluene (200 mL) and water (50 mL) were put into a 500 mL round bottom flask under nitrogen atmosphere, then the solution was heated and refluxed with stirring for 12 hours. After the reaction was complete, the solution was cooled to a room temperature, and an organic layer was extracted with dichloromethane and washed with excessive water. The moisture was removed with anhydrous magnesium sulfate, the filtrate was concentrated under reduced pressure, and then was purified with column chromatography to give the Intermediate P-1 (7.84 g, yield: 87%).

(2) Synthesis of Compound 257

[Reaction Formula 21-2]

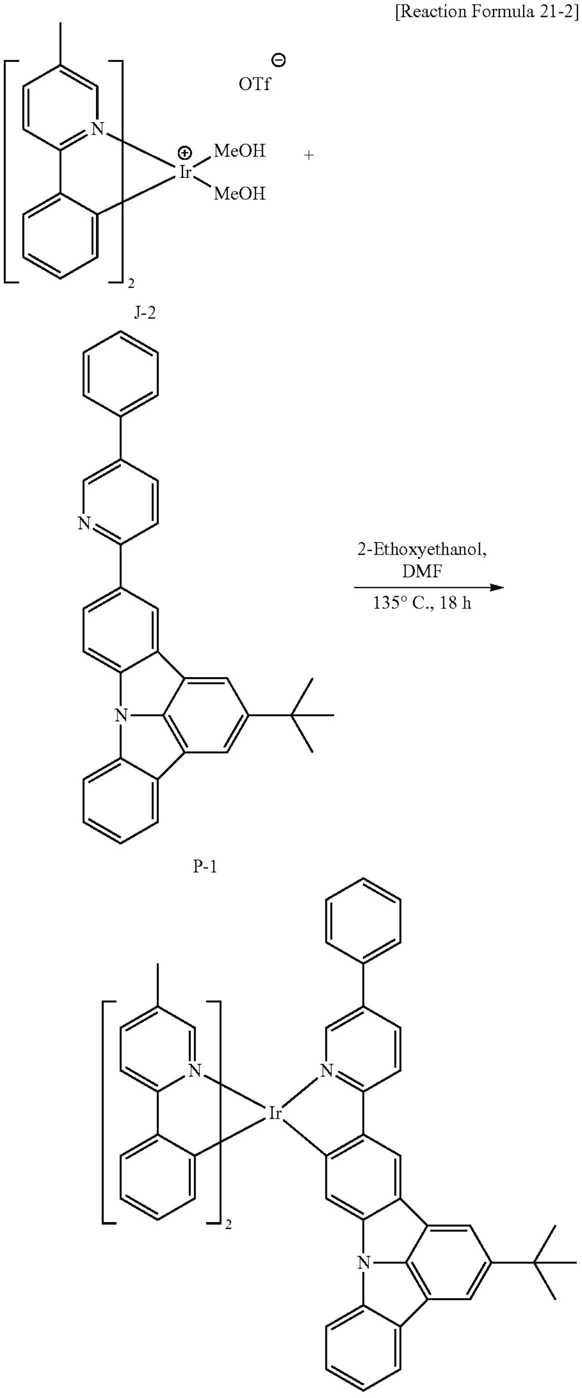

257

The Intermediate J-2 (2.23 g, 3.0 mmol), the Intermediate P-1 (1.58 g, 3.5 mmol) and a mixed solvent of 2-ethoxy-ethanol (40 mL) and DMF (40 mL) were put into a 150 mL round bottom flask under nitrogen atmosphere, and then the solution was stirred at 135° C. for 18 hours. After the reaction was complete, the solution was cooled to a room temperature, the organic layer was extracted with dichloromethane and distilled water and moisture was removed with anhydrous magnesium sulfate. The filtrate was treated under reduced pressure to obtain a crude product, and then the crude product was purified with column chromatography (eluent: ethylene acetate:hexane, 25:75 by volume ratio) to give the Compound 257 (2.67 g, yield: 91%).

Example 1 (Ex. 1): Fabrication of OLED

An organic light emitting diode was fabricated applying GHH1 of Formula 8 as a first host, GEH1 of Formula 10 as a second host and the Compound 251 in Synthesis Example 15 as a dopant into an emitting material layer (EML). A glass substrate onto which ITO (100 nm) was coated as a thin film was washed and ultrasonically cleaned by solvent such as isopropyl alcohol, acetone and dried at 100° C. oven. The substrate was transferred to a vacuum chamber for depositing emissive layer. Subsequently, an emissive layer and a cathode were deposited by evaporation from a heating boat under about 5-7 $10^{-7}$ Torr with setting deposition rate of 1 Å/s as the following order:

A hole injection layer (HIL) (following HI-1 (NPNPB), 100 nm thickness); a hole transport layer (HTL) (following HT-1, 350 nm thickness); an EML (Host (first host: second host=7:3 weight ratio, 90 wt %), Dopant (Compound 251, 10 wt %), 30 nm); an ETL (following ET-1 (ZADN), 350 nm thickness); EIL (Liq, 200 nm thickness); and a cathode (Al, 100 nm thickness).

Examples 2-12 (Ex. 2-12): Fabrication of OLED

An OLED was fabricated using the same procedure and the same material as Example 1, except that GEH2 (Ex. 2), GEH3 (Ex. 3), GEH4 (Ex. 4), GEH5 (Ex. 5), GEH6 (Ex. 6), GEH7 (Ex. 7), GEH8 (Ex. 8), GEH9 (Ex. 9), GEH10 (Ex. 10), GEH11 (Ex. 11) and GEH12 (Ex. 12) of Formula 10, respectively, were used as the second host in the EML instead of GEH1.

Comparative Example 1 (Ref. 1): Fabrication of OLED

An OLED was fabricated using the same procedure and the same material as Example 1, except 4,4'-bis(N-carbazolyl)-1,1'-bipheynl (CBP, 90 wt %) as a sole host was used in the EML instead of GHH1 and GEH1.

The HIL material (HI-1), the HTL material (HT-1), CBP, the ETL material (ET-1) and the EIL material (Liq) are illustrated in the following:

HI-1

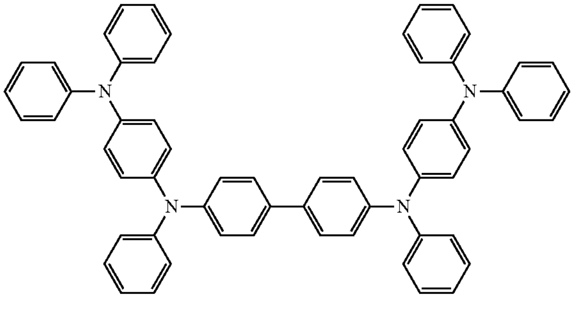

-continued

HT-1

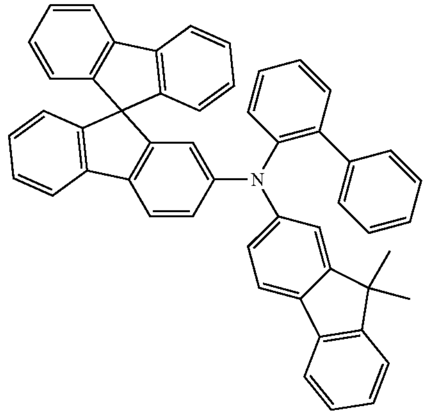

CBP

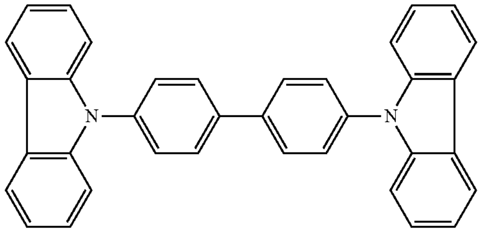

ET-1

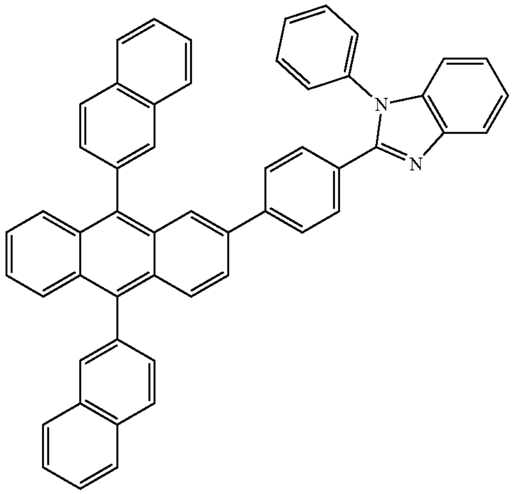

Liq

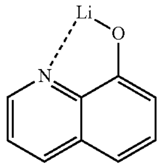

Experimental Example 1: Measurement of Luminous Properties of OLEDs

Each of the OLEDs, having 9 $mm^2$ of emission area, fabricated in Examples 1 to 12 and Comparative Example 1 was connected to an external power source and then luminous properties for all the OLEDs were evaluated using a constant current source (KEITHLEY) and a photometer PR650 at room temperature. In particular, driving voltage (V), External quantum efficiency (EQE, relative value) and time period ($LT_{95}$, relative value) at which the luminance was reduced to 95% from initial luminance was measured at a current density 10 mA/$cm^2$. The measurement results are indicated in the following Table 1.

TABLE 1

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 1 | 251 | GHH1 | GEH1 | 4.08 | 129 | 129 |
| Ex. 2 | 251 | GHH1 | GEH2 | 4.12 | 130 | 128 |
| Ex. 3 | 251 | GHH1 | GEH3 | 4.09 | 127 | 127 |
| Ex. 4 | 251 | GHH1 | GEH4 | 4.03 | 125 | 125 |
| Ex. 5 | 251 | GHH1 | GEH5 | 4.07 | 129 | 122 |
| Ex. 6 | 251 | GHH1 | GEH6 | 4.08 | 127 | 125 |
| Ex. 7 | 251 | GHH1 | GEH7 | 4.16 | 121 | 122 |
| Ex. 8 | 251 | GHH1 | GEH8 | 4.07 | 123 | 123 |
| Ex. 9 | 251 | GHH1 | GEH9 | 4.04 | 122 | 120 |
| Ex. 10 | 251 | GHH1 | GEH10 | 4.01 | 120 | 125 |
| Ex. 11 | 251 | GHH1 | GEH11 | 4.02 | 120 | 118 |
| Ex. 12 | 251 | GHH1 | GEH12 | 4.11 | 118 | 119 |

As indicated in Table 1, in the OLEDs in which the EML includes the host and the dopant of the present disclosure, the driving voltage was reduced and EQE and luminous lifespan ($LT_{95}$) were greatly improved.

Example 13 (Ex. 13): Fabrication of OLED

An OLED was fabricated using the same procedure and the same material as Example 1, except that GHH2 of Formula 8 as the first host was used in the EML instead of GHH1.

Examples 14-24 (Ex. 14-24): Fabrication of OLED

An OLED was fabricated using the same procedure and the same material as Example 13, except that GEH2 (Ex. 14), GEH3 (Ex. 15), GEH4 (Ex. 16), GEH5 (Ex. 17), GEH6 (Ex. 18), GEH7 (Ex. 19), GEH8 (Ex. 20), GEH9 (Ex. 21), GEH10 (Ex. 22), GEH11 (Ex. 23) and GEH12 (Ex. 24) of Formula 10, respectively, were used as the second host in the EML instead of GEH1.

Experimental Example 2: Measurement of Luminous Properties OLED

Optical properties for each of the OLED fabricated in Examples 13 to 24 were measured using the same procedures as Experimental Example 1. The measurement results are indicated in the following Table 2.

TABLE 2

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 13 | 251 | GHH2 | GEH1 | 4.13 | 125 | 128 |
| Ex. 14 | 251 | GHH2 | GEH2 | 4.20 | 128 | 125 |
| Ex. 15 | 251 | GHH2 | GEH3 | 4.10 | 121 | 125 |
| Ex. 16 | 251 | GHH2 | GEH4 | 4.21 | 121 | 124 |
| Ex. 17 | 251 | GHH2 | GEH5 | 4.13 | 122 | 122 |
| Ex. 18 | 251 | GHH2 | GEH6 | 4.17 | 123 | 120 |
| Ex. 19 | 251 | GHH2 | GEH7 | 4.12 | 118 | 120 |
| Ex. 20 | 251 | GHH2 | GEH8 | 4.24 | 118 | 120 |

TABLE 2-continued

Luminous Properties of OLED

| Sample | EML Dopant | EML Host | | Voltage (V) | EQE (%) | $LT_{95}$ (%) |
|---|---|---|---|---|---|---|
| Ex. 21 | 251 | GHH2 | GEH9 | 4.20 | 116 | 119 |
| Ex. 22 | 251 | GHH2 | GEH10 | 4.21 | 114 | 118 |
| Ex. 23 | 251 | GHH2 | GEH11 | 4.26 | 117 | 117 |
| Ex. 24 | 251 | GHH2 | GEH12 | 4.13 | 116 | 116 |

As indicated in Table 2, in the OLEDs in which the EML includes the host and the dopant of the present disclosure, the driving voltage was reduced and EQE and luminous lifespan ($LT_{95}$) were greatly improved.

Example 25 (Ex. 25): Fabrication of OLED

An OLED was fabricated using the same procedure and the same material as Example 1, except that GHH3 of Formula 8 as the first host was used in the EML instead of GHH1.

Examples 26-36 (Ex. 26-36): Fabrication of OLED

An OLED was fabricated using the same procedure and the same material as Example 25, except that GEH2 (Ex. 26), GEH3 (Ex. 27), GEH4 (Ex. 28), GEH5 (Ex. 29), GEH6 (Ex. 30), GEH7 (Ex. 31), GEH8 (Ex. 32), GEH9 (Ex. 33), GEH10 (Ex. 34), GEH11 (Ex. 35) and GEH12 (Ex. 36) of Formula 10, respectively, were used as the second host in the EML instead of GEH1.

Experimental Example 3: Measurement of Luminous Properties OLED

Optical properties for each of the OLED fabricated in Examples 25 to 36 were measured using the same procedures as Experimental Example 1. The measurement results are indicated in the following Table 3.

TABLE 3

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 25 | 251 | GHH3 | GEH1 | 4.17 | 124 | 123 |
| Ex. 26 | 251 | GHH3 | GEH2 | 4.17 | 126 | 123 |
| Ex. 27 | 251 | GHH3 | GEH3 | 4.17 | 122 | 121 |
| Ex. 28 | 251 | GHH3 | GEH4 | 4.21 | 122 | 120 |
| Ex. 29 | 251 | GHH3 | GEH5 | 4.13 | 121 | 120 |
| Ex. 30 | 251 | GHH3 | GEH6 | 4.24 | 123 | 120 |
| Ex. 31 | 251 | GHH3 | GEH7 | 4.26 | 117 | 117 |
| Ex. 32 | 251 | GHH3 | GEH8 | 4.20 | 121 | 117 |
| Ex. 33 | 251 | GHH3 | GEH9 | 4.20 | 118 | 117 |
| Ex. 34 | 251 | GHH3 | GEH10 | 4.19 | 115 | 115 |
| Ex. 35 | 251 | GHH3 | GEH11 | 4.10 | 117 | 116 |
| Ex. 36 | 251 | GHH3 | GEH12 | 4.26 | 118 | 111 |

As indicated in Table 3, in the OLEDs in which the EML includes the host and the dopant of the present disclosure, the driving voltage was reduced and EQE and luminous lifespan ($LT_{95}$) were greatly improved.

Example 37 (Ex. 37): Fabrication of OLED

An OLED was fabricated using the same procedure and the same material as Example 1, except that GHH4 of Formula 8 as the first host was used in the EML instead of Examples 38-48 (Ex. 38-48): Fabrication of OLED An OLED was fabricated using the same procedure and the same material as Example 37, except that GEH2 (Ex. 38), GEH3 (Ex. 39), GEH4 (Ex. 40), GEH5 (Ex. 41), GEH6 (Ex. 42), GEH7 (Ex. 43), GEH8 (Ex. 44), GEH9 (Ex. 45), GEH10 (Ex. 46), GEH11 (Ex. 47) and GEH12 (Ex. 48) of Formula 10, respectively, were used as the second host in the EML instead of GEH1.

Experimental Example 4: Measurement of Luminous Properties OLED

Optical properties for each of the OLED fabricated in Examples 37 to 48 were measured using the same procedures as Experimental Example 1. The measurement results are indicated in the following Table 4.

TABLE 4

Luminous Properties of OLED

| | EML | | | Voltage | EQE | $LT_{95}$ |
|---|---|---|---|---|---|---|
| Sample | Dopant | Host | | (V) | (%) | (%) |
| Ref. 1 | 251 | CBP | | 4.30 | 100 | 100 |
| Ex. 37 | 251 | GHH4 | GEH1 | 4.11 | 129 | 120 |
| Ex. 38 | 251 | GHH4 | GEH2 | 4.05 | 126 | 118 |
| Ex. 39 | 251 | GHH4 | GEH3 | 4.12 | 125 | 118 |
| Ex. 40 | 251 | GHH4 | GEH4 | 4.16 | 120 | 119 |
| Ex. 41 | 251 | GHH4 | GEH5 | 4.09 | 125 | 119 |
| Ex. 42 | 251 | GHH4 | GEH6 | 4.13 | 127 | 114 |
| Ex. 43 | 251 | GHH4 | GEH7 | 4.10 | 118 | 116 |
| Ex. 44 | 251 | GHH4 | GEH8 | 4.14 | 119 | 117 |
| Ex. 45 | 251 | GHH4 | GEH9 | 4.08 | 120 | 111 |
| Ex. 46 | 251 | GHH4 | GEH10 | 4.00 | 120 | 115 |
| Ex. 47 | 251 | GHH4 | GEH11 | 4.03 | 121 | 113 |
| Ex. 48 | 251 | GHH4 | GEH12 | 4.17 | 118 | 110 |

As indicated in Table 4, in the OLEDs in which the EML includes the host and the dopant of the present disclosure, the driving voltage was reduced and EQE and luminous lifespan ($LT_{95}$) were greatly improved.

Example 49 (Ex. 49): Fabrication of OLED

An OLED was fabricated using the same procedure and the same material as Example 1, except that GHH5S of Formula 8 as the first host was used in the EML instead of GHH1.

Examples 50-60 (Ex. 50-60): Fabrication of OLED

An OLED was fabricated using the same procedure and the same material as Example 49, except that GEH2 (Ex. 50), GEH3 (Ex. 51), GEH4 (Ex. 52), GEH5 (Ex. 53), GEH6 (Ex. 54), GEH7 (Ex. 55), GEH8 (Ex. 56), GEH9 (Ex. 57), GEH10 (Ex. 58), GEH12 (Ex. 59) and GEH12 (Ex. 60) of Formula 10, respectively, were used as the second host in the EML instead of GEH1.

Experimental Example 5: Measurement of Luminous Properties OLED

Optical properties for each of the OLED fabricated in Examples 49 to 60 were measured using the same procedures as Experimental Example 1. The measurement results are indicated in the following Table 5.

TABLE 5

Luminous Properties of OLED

| | EML | | | Voltage | EQE | $LT_{95}$ |
|---|---|---|---|---|---|---|
| Sample | Dopant | Host | | (V) | (%) | (%) |
| Ref. 1 | 251 | CBP | | 4.30 | 100 | 100 |
| Ex. 49 | 251 | GHH5 | GEH1 | 4.11 | 126 | 126 |
| Ex. 50 | 251 | GHH5 | GEH2 | 4.17 | 123 | 127 |
| Ex. 51 | 251 | GHH5 | GEH3 | 4.20 | 124 | 127 |
| Ex. 52 | 251 | GHH5 | GEH4 | 4.20 | 121 | 128 |
| Ex. 53 | 251 | GHH5 | GEH5 | 4.16 | 123 | 126 |
| Ex. 54 | 251 | GHH5 | GEH6 | 4.17 | 118 | 124 |
| Ex. 55 | 251 | GHH5 | GEH7 | 4.17 | 116 | 122 |
| Ex. 56 | 251 | GHH5 | GEH8 | 4.19 | 118 | 119 |
| Ex. 57 | 251 | GHH5 | GEH9 | 4.22 | 118 | 119 |
| Ex. 58 | 251 | GHH5 | GEH10 | 4.34 | 116 | 118 |
| Ex. 59 | 251 | GHH5 | GEH11 | 4.10 | 113 | 118 |
| Ex. 60 | 251 | GHH5 | GEH12 | 4.19 | 111 | 117 |

As indicated in Table 5, in the OLEDs in which the EML includes the host and the dopant of the present disclosure, the driving voltage was reduced and EQE and luminous lifespan ($LT_{95}$) were greatly improved.

Example 61 Ex. 61): Fabrication of OLED

An OLED was fabricated using the same procedure and the same material as Example 1, except that GHH6 of Formula 8 as the first host was used in the EML instead of GHH1.

Examples 62-72 (Ex. 62-72): Fabrication of OLED

An OLED was fabricated using the same procedure and the same material as Example 61, except that GEH2 (Ex. 62), GEH3 (Ex. 63), GEH4 (Ex. 64), GEH5 (Ex. 65), GEH6 (Ex. 66), GEH7 (Ex. 67), GEH8 (Ex. 68), GEH9 (Ex. 69), GEH1 (Ex. 70), GEH11 (Ex. 71) and GEH12 (Ex. 72) of Formula 10, respectively, were used as the second host in the EML instead of GEH1.

Experimental Example 6: Measurement of Luminous Properties OLED

Optical properties for each of the OLED fabricated in Examples 61 to 72 were measured using the same procedures as Experimental Example 1. The measurement results are indicated in the following Table 6.

TABLE 6

Luminous Properties of OLED

| | EML | | | Voltage | EQE | $LT_{95}$ |
|---|---|---|---|---|---|---|
| Sample | Dopant | Host | | (V) | (%) | (%) |
| Ref. 1 | 251 | CBP | | 4.30 | 100 | 100 |
| Ex. 61 | 251 | GHH6 | GEH1 | 4.08 | 123 | 127 |
| Ex. 62 | 251 | GHH6 | GEH2 | 4.24 | 122 | 127 |
| Ex. 63 | 251 | GHH6 | GEH3 | 4.19 | 123 | 122 |
| Ex. 64 | 251 | GHH6 | GEH4 | 4.30 | 121 | 122 |
| Ex. 65 | 251 | GHH6 | GEH5 | 4.17 | 125 | 120 |
| Ex. 66 | 251 | GHH6 | GEH6 | 4.18 | 121 | 121 |
| Ex. 67 | 251 | GHH6 | GEH7 | 4.12 | 119 | 118 |
| Ex. 68 | 251 | GHH6 | GEH8 | 4.17 | 119 | 118 |
| Ex. 69 | 251 | GHH6 | GEH9 | 4.28 | 113 | 119 |

TABLE 6-continued

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ex. 70 | 251 | GHH6 | GEH10 | 4.29 | 113 | 118 |
| Ex. 71 | 251 | GHH6 | GEH11 | 4.19 | 116 | 114 |
| Ex. 72 | 251 | GHH6 | GEH12 | 4.25 | 115 | 117 |

As indicated in Table 6, in the OLEDs in which the EML includes the host and the dopant of the present disclosure, the driving voltage was reduced and EQE and luminous lifespan ($LT_{95}$) were greatly improved.

Example 73 Ex. 73): Fabrication of OLED

An OLED was fabricated using the same procedure and the same material as Example 1, except that GHH7 of Formula 8 as the first host was used in the EML instead of GHH1.

Examples 74-84 (Ex. 74-84): Fabrication of OLED

An OLED was fabricated using the same procedure and the same material as Example 73, except that GEH2 (Ex. 74), GEH3 (Ex. 75), GEH4 (Ex. 76), GEH5 (Ex. 77), GEH6 (Ex. 78), GEH7 (Ex. 79), GEH8 (Ex. 80), GEH9 (Ex. 81), GEH10 (Ex. 82), GEH11 (Ex. 83) and GEH12 (Ex. 84) of Formula 10, respectively, were used as the second host in the EML instead of GEH1.

Experimental Example 7: Measurement of Luminous Properties OLED

Optical properties for each of the OLED fabricated in Examples 73 to 84 were measured using the same procedures as Experimental Example 1. The measurement results are indicated in the following Table 7.

TABLE 7

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 1 | 251 | CBP | | 4.30 | 100 | 100 |
| Ex. 73 | 251 | GHH7 | GEH1 | 4.17 | 120 | 115 |
| Ex. 74 | 251 | GHH7 | GEH2 | 4.17 | 119 | 114 |
| Ex. 75 | 251 | GHH7 | GEH3 | 4.09 | 119 | 115 |
| Ex. 76 | 251 | GHH7 | GEH4 | 4.13 | 120 | 112 |
| Ex. 77 | 251 | GHH7 | GEH5 | 4.19 | 122 | 114 |
| Ex. 78 | 251 | GHH7 | GEH6 | 4.17 | 121 | 108 |
| Ex. 79 | 251 | GHH7 | GEH7 | 4.15 | 113 | 110 |
| Ex. 80 | 251 | GHH7 | GEH8 | 4.15 | 116 | 110 |
| Ex. 81 | 251 | GHH7 | GEH9 | 4.12 | 111 | 109 |
| Ex. 82 | 251 | GHH7 | GEH10 | 4.12 | 112 | 109 |
| Ex. 83 | 251 | GHH7 | GEH11 | 4.16 | 113 | 105 |
| Ex. 84 | 251 | GHH7 | GEH12 | 4.20 | 111 | 108 |

As indicated in Table 7, in the OLEDs in which the EML includes the host and the dopant of the present disclosure, the driving voltage was reduced and EQE and luminous lifespan ($LT_{95}$) were greatly improved.

Example 85 (Ex. 85): Fabrication of OLED

An OLED was fabricated using the same procedure and the same material as Example 1, except that GHH8 of Formula 8 as the first host was used in the EML instead of GHH1.

Examples 86-96 (Ex. 86-96): Fabrication of OLED

An OLED was fabricated using the same procedure and the same material as Example 85, except that GEH2 (Ex. 86), GEH3 (Ex. 87), GEH4 (Ex. 88), GEH5 (Ex. 89), GEH6 (Ex. 90), GEH7 (Ex. 91), GEH8 (Ex. 92), GEH9 (Ex. 93), GEH10 (Ex. 94), GEH11 (Ex. 95) and GEH12 (Ex. 96) of Formula 10, respectively, were used as the second host in the EML instead of GEH1.

Experimental Example 8: Measurement of Luminous Properties OLED

Optical properties for each of the OLED fabricated in Examples 85 to 96 were measured using the same procedures as Experimental Example 1. The measurement results are indicated in the following Table 8.

TABLE 8

| Luminous Properties of OLED | | | | | | |
|---|---|---|---|---|---|---|
| | EML | | | Voltage | EQE | $LT_{95}$ |
| Sample | Dopant | Host | | (V) | (%) | (%) |
| Ref. 1 | 251 | CBP | | 4.30 | 100 | 100 |
| Ex. 85 | 251 | GHH8 | GEH1 | 4.23 | 123 | 125 |
| Ex. 86 | 251 | GHH8 | GEH2 | 3.99 | 123 | 121 |
| Ex. 87 | 251 | GHH8 | GEH3 | 4.07 | 121 | 119 |
| Ex. 88 | 251 | GHH8 | GEH4 | 4.16 | 118 | 120 |
| Ex. 89 | 251 | GHH8 | GEH5 | 4.06 | 122 | 120 |
| Ex. 90 | 251 | GHH8 | GEH6 | 4.19 | 121 | 119 |
| Ex. 91 | 251 | GHH8 | GEH7 | 4.21 | 119 | 115 |
| Ex. 92 | 251 | GHH8 | GEH8 | 4.18 | 118 | 116 |
| Ex. 93 | 251 | GHH8 | GEH9 | 4.09 | 114 | 115 |
| Ex. 94 | 251 | GHH8 | GEH10 | 4.09 | 115 | 114 |
| Ex. 95 | 251 | GHH8 | GEH11 | 4.12 | 116 | 114 |
| Ex. 96 | 251 | GHH8 | GEH12 | 4.05 | 116 | 113 |

As indicated in Table 8, in the OLEDs in which the EML includes the host and the dopant of the present disclosure, the driving voltage was reduced and EQE and luminous lifespan ($LT_{95}$) were greatly improved.

Example 97 (Ex. 97): Fabrication of OLED

An OLED was fabricated using the same procedure and the same material as Example 1, except that GHH9 of Formula 8 as the first host was used in the EML instead of GHH1.

Examples 98-108 (Ex. 98-108): Fabrication of OLED

An OLED was fabricated using the same procedure and the same material as Example 97, except that GEH2 (Ex. 98), GEH3 (Ex. 99), GEH4 (Ex. 100), GEH5 (Ex. 101), GEH6 (Ex. 102), GEH7 (Ex. 103), GEH8 (Ex. 104), GEH9 (Ex. 105), GEH10 (Ex. 106), GEH11 (Ex. 107) and GEH12 (Ex. 108) of Formula 10, respectively, were used as the second host in the EML instead of GEH1.

Experimental Example 9: Measurement of Luminous Properties OLED

Optical properties for each of the OLED fabricated in Examples 97 to 108 were measured using the same procedures as Experimental Example 1. The measurement results are indicated in the following Table 9.

TABLE 9

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 97 | 251 | GHH9 | GEH1 | 4.24 | 115 | 123 |
| Ex. 98 | 251 | GHH9 | GEH2 | 4.26 | 115 | 118 |
| Ex. 99 | 251 | GHH9 | GEH3 | 4.09 | 112 | 119 |
| Ex. 100 | 251 | GHH9 | GEH4 | 4.03 | 115 | 115 |
| Ex. 101 | 251 | GHH9 | GEH5 | 4.11 | 114 | 118 |
| Ex. 102 | 251 | GHH9 | GEH6 | 4.11 | 118 | 117 |
| Ex. 103 | 251 | GHH9 | GEH7 | 4.28 | 111 | 113 |
| Ex. 104 | 251 | GHH9 | GEH8 | 4.13 | 113 | 113 |
| Ex. 105 | 251 | GHH9 | GEH9 | 4.13 | 107 | 113 |
| Ex. 106 | 251 | GHH9 | GEH10 | 4.18 | 109 | 113 |
| Ex. 107 | 251 | GHH9 | GEH11 | 4.15 | 111 | 111 |
| Ex. 108 | 251 | GHH9 | GEH12 | 4.16 | 107 | 109 |

As indicated in Table 9, in the OLEDs in which the EML includes the host and the dopant of the present disclosure, the driving voltage was reduced and EQE and luminous lifespan ($LT_{95}$) were greatly improved.

Example 109 (Ex. 109): Fabrication of OLED

An OLED was fabricated using the same procedure and the same material as Example 1, except that GHH10 of Formula 8 as the first host was used in the EML instead of GHH1.

Examples 110-120 (Ex. 110-120): Fabrication of OLED

An OLED was fabricated using the same procedure and the same material as Example 109, except that GEH2 (Ex. 110), GEH3 (Ex. 111), GEH4 (Ex. 112), GEH5 (Ex. 113), GEH6 (Ex. 114), GEH7 (Ex. 115), GEH8 (Ex. 116), GEH9 (Ex. 117), GEH10 (Ex. 118), GEH11 (Ex. 119) and GEH12 (Ex. 120) of Formula 10, respectively, were used as the second host in the EML instead of GEH1.

Experimental Example 10: Measurement of Luminous Properties OLED

Optical properties for each of the OLED fabricated in Examples 109 to 120 were measured using the same procedures as Experimental Example 1. The measurement results are indicated in the following Table 10.

TABLE 10

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 109 | 251 | GHH10 | GEH1 | 4.17 | 122 | 120 |
| Ex. 110 | 251 | GHH10 | GEH2 | 4.31 | 124 | 118 |
| Ex. 111 | 251 | GHH10 | GEH3 | 4.23 | 117 | 119 |
| Ex. 112 | 251 | GHH10 | GEH4 | 4.32 | 118 | 116 |
| Ex. 113 | 251 | GHH10 | GEH5 | 4.30 | 118 | 115 |
| Ex. 114 | 251 | GHH10 | GEH6 | 4.19 | 116 | 114 |
| Ex. 115 | 251 | GHH10 | GEH7 | 4.27 | 116 | 112 |
| Ex. 116 | 251 | GHH10 | GEH8 | 4.12 | 112 | 112 |
| Ex. 117 | 251 | GHH10 | GEH9 | 4.16 | 110 | 109 |
| Ex. 118 | 251 | GHH10 | GEH10 | 4.16 | 110 | 112 |
| Ex. 119 | 251 | GHH10 | GEH11 | 4.21 | 111 | 109 |
| Ex. 120 | 251 | GHH10 | GEH12 | 4.25 | 109 | 108 |

As indicated in Table 10, in the OLEDs in which the EML includes the host and the dopant of the present disclosure, the driving voltage was reduced and EQE and luminous lifespan ($LT_{95}$) were greatly improved.

Example 121 (Ex. 121): Fabrication of OLED

An OLED was fabricated using the same procedure and the same material as Example 1, except that GHH11 of Formula 8 as the first host was used in the EML instead of GHH1.

Examples 122-132 (Ex. 122-132): Fabrication of OLED

An OLED was fabricated using the same procedure and the same material as Example 121, except that GEH2 (Ex. 122), GEH3 (Ex. 123), GEH4 (Ex. 124), GEH5 (Ex. 125), GEH6 (Ex. 126), GEH7 (Ex. 127), GEH8 (Ex. 128), GEH9 (Ex. 129), GEH10 (Ex. 130), GEH11 (Ex. 131) and GEH12 (Ex. 132) of Formula 10, respectively, were used as the second host in the EML instead of GEH1.

Experimental Example 11: Measurement of Luminous Properties OLED

Optical properties for each of the OLED fabricated in Examples 121 to 132 were measured using the same procedures as Experimental Example 1. The measurement results are indicated in the following Table 11.

TABLE 11

Luminous Properties of OLED

| Sample | EML Dopant | EML Host | | Voltage (V) | EQE (%) | $LT_{95}$ (%) |
|---|---|---|---|---|---|---|
| Ref. 1 | 251 | CBP | | 4.30 | 100 | 100 |
| Ex. 121 | 251 | GHH11 | GEH1 | 4.10 | 119 | 117 |
| Ex. 122 | 251 | GHH11 | GEH2 | 4.09 | 121 | 117 |
| Ex. 123 | 251 | GHH11 | GEH3 | 4.09 | 117 | 117 |
| Ex. 124 | 251 | GHH11 | GEH4 | 4.07 | 117 | 115 |
| Ex. 125 | 251 | GHH11 | GEH5 | 4.10 | 121 | 115 |
| Ex. 126 | 251 | GHH11 | GEH6 | 4.10 | 117 | 114 |
| Ex. 127 | 251 | GHH11 | GEH7 | 4.18 | 116 | 109 |
| Ex. 128 | 251 | GHH11 | GEH8 | 4.09 | 117 | 114 |
| Ex. 129 | 251 | GHH11 | GEH9 | 4.10 | 115 | 111 |
| Ex. 130 | 251 | GHH11 | GEH10 | 4.09 | 111 | 112 |
| Ex. 131 | 251 | GHH11 | GEH11 | 4.06 | 113 | 112 |
| Ex. 132 | 251 | GHH11 | GEH12 | 4.21 | 113 | 108 |

As indicated in Table 11, in the OLEDs in which the EML includes the host and the dopant of the present disclosure, the driving voltage was reduced and EQE and luminous lifespan ($LT_{95}$) were greatly improved.

Example 133 (Ex. 133): Fabrication of OLED

An OLED was fabricated using the same procedure and the same material as Example 1, except that GHH12 of Formula 8 as the first host was used in the EML instead of GHH1.

Examples 134-144 (Ex. 134-144): Fabrication of OLED

An OLED was fabricated using the same procedure and the same material as Example 133, except that GEH2 (Ex. 134), GEH3 (Ex. 135), GEH4 (Ex. 136), GEH5 (Ex. 137), GEH6 (Ex. 138), GEH7 (Ex. 139), GEH8 (Ex. 140), GEH9 (Ex. 141), GEH10 (Ex. 142), GEH11 (Ex. 143) and GEH12 (Ex. 144) of Formula 10, respectively, were used as the second host in the EML instead of GEH1.

Experimental Example 12: Measurement of Luminous Properties OLED

Optical properties for each of the OLED fabricated in Examples 133 to 144 were measured using the same procedures as Experimental Example 1. The measurement results are indicated in the following Table 12.

TABLE 12

Luminous Properties of OLED

| | EML | | | Voltage | EQE | $LT_{95}$ |
|---|---|---|---|---|---|---|
| Sample | Dopant | Host | | (V) | (%) | (%) |
| Ref. 1 | 251 | CBP | | 4.28 | 100 | 100 |
| Ex. 133 | 251 | GHH12 | GEH1 | 4.14 | 123 | 125 |
| Ex. 134 | 251 | GHH12 | GEH2 | 4.17 | 122 | 122 |
| Ex. 135 | 251 | GHH12 | GEH3 | 4.09 | 124 | 118 |
| Ex. 136 | 251 | GHH12 | GEH4 | 4.20 | 119 | 122 |
| Ex. 137 | 251 | GHH12 | GEH5 | 4.11 | 119 | 119 |
| Ex. 138 | 251 | GHH12 | GEH6 | 4.28 | 120 | 123 |
| Ex. 139 | 251 | GHH12 | GEH7 | 4.26 | 120 | 117 |
| Ex. 140 | 251 | GHH12 | GEH8 | 4.30 | 118 | 118 |
| Ex. 141 | 251 | GHH12 | GEH9 | 4.15 | 119 | 116 |
| Ex. 142 | 251 | GHH12 | GEH10 | 4.04 | 113 | 119 |
| Ex. 143 | 251 | GHH12 | GEH11 | 4.18 | 114 | 115 |
| Ex. 144 | 251 | GHH12 | GEH12 | 4.19 | 112 | 116 |

As indicated in Table 12, in the OLEDs in which the EML includes the host and the dopant of the present disclosure, the driving voltage was reduced and EQE and luminous lifespan ($LT_{95}$) were greatly improved.

Example 145 (Ex. 145): Fabrication of OLED

An OLED was fabricated using the same procedure and the same material as Example 1, except that Compound 252 synthesized in Synthesis Example 16 as the dopant was used in the EML instead of Compound 251.

Examples 146-150 (Ex. 146-150): Fabrication of OLED

An OLED was fabricated using the same procedure and the same material as Example 145, except that GEH2 (Ex. 146), GEH3 (Ex. 147), GEH4 (Ex. 148), GEH5 (Ex. 149) and GEH6 (Ex. 150) of Formula 10, respectively, were used as the second host in the EML instead of GEH1.

Example 151 (Ex. 151): Fabrication of OLED

An OLED was fabricated using the same procedure and the same material as Example 145, except that GHH2 of Formula 8 as the first host was used in the EML instead of GHH1.

Examples 152-156 (Ex. 152-156): Fabrication of OLED

An OLED was fabricated using the same procedure and the same material as Example 151, except that GEH2 (Ex. 152), GEH3 (Ex. 153), GEH4 (Ex. 154), GEH5 (Ex. 155) and GEH6 (Ex. 156) of Formula 10, respectively, were used as the second host in the EML instead of GEH1.

Comparative Example 2 (Ref 2): Fabrication of OLED

An OLED was fabricated using the same procedure and the same material as Example 145, except CBP (90 wt) as a sole host was used in the EML instead of GHH1 and GEH1.

Experimental Example 13: Measurement of Luminous Properties OLED

Optical properties for each of the OLED fabricated in Examples 145 to 156 and Comparative Example 2 were measured using the same procedures as Experimental Example 1. The measurement results are indicated in the following Table 13.

TABLE 13

Luminous Properties of OLED

| | EML | | | Voltage | EQE | $LT_{95}$ |
|---|---|---|---|---|---|---|
| Sample | Dopant | Host | | (V) | (%) | (%) |
| Ref. 2 | 252 | CBP | | 4.36 | 100 | 100 |
| Ex. 145 | 252 | GHH1 | GEH1 | 4.17 | 130 | 132 |
| Ex. 146 | 252 | GHH1 | GEH2 | 4.13 | 131 | 128 |
| Ex. 147 | 252 | GHH1 | GEH3 | 4.13 | 128 | 128 |
| Ex. 148 | 252 | GHH1 | GEH4 | 4.25 | 126 | 131 |
| Ex. 149 | 252 | GHH1 | GEH5 | 4.08 | 127 | 123 |
| Ex. 150 | 252 | GHH1 | GEH6 | 4.25 | 124 | 125 |
| Ex. 151 | 252 | GHH2 | GEH1 | 4.26 | 125 | 124 |
| Ex. 152 | 252 | GHH2 | GEH2 | 4.42 | 127 | 125 |
| Ex. 153 | 252 | GHH2 | GEH3 | 4.23 | 125 | 121 |
| Ex. 154 | 252 | GHH2 | GEH4 | 4.23 | 119 | 123 |
| Ex. 155 | 252 | GHH2 | GEH5 | 4.25 | 122 | 122 |
| Ex. 156 | 252 | GHH2 | GEH6 | 4.31 | 121 | 121 |

As indicated in Table 13, in the OLEDs in which the EML includes the host and the dopant of the present disclosure, the driving voltage was reduced and EQE and luminous lifespan ($LT_{95}$) were greatly improved.

Example 157 (Ex. 157): Fabrication of OLED

An OLED was fabricated using the same procedure and the same material as Example 145, except that GHH3 of Formula 8 as the first host was used in the EML instead of GHH1.

Examples 158-162 (Ex. 158-162): Fabrication of OLED

An OLED was fabricated using the same procedure and the same material as Example 157, except that GEH2 (Ex. 158), GEH3 (Ex. 159), GEH4 (Ex. 160), GEH5 (Ex. 161) and GEH6 (Ex. 162) of Formula 10, respectively, were used as the second host in the EML instead of GEH1.

Example 163 (Ex. 163): Fabrication of OLED

An OLED was fabricated using the same procedure and the same material as Example 145, except that GHH4 of Formula 8 as the first host was used in the EML instead of GHH1.

Examples 164-168 (Ex. 164-168): Fabrication of OLED

An OLED was fabricated using the same procedure and the same material as Example 163, except that GEH2 (Ex. 164), GEH3 (Ex. 165), GEH4 (Ex. 166), GEH5 (Ex. 167) and GEH6 (Ex. 168) of Formula 10, respectively, were used as the second host in the EML instead of GEH1.

Experimental Example 14: Measurement of Luminous Properties OLED

Optical properties for each of the OLED fabricated in Examples 157 to 168 were measured using the same procedures as Experimental Example 1. The measurement results are indicated in the following Table 14.

TABLE 14

Luminous Properties of PLED

| | EML | | | Voltage | EQE | $LT_{95}$ |
|---|---|---|---|---|---|---|
| Sample | Dopant | Host | | (V) | (%) | (%) |
| Ref. 2 | 252 | CBP | | 4.36 | 100 | 100 |
| Ex. 157 | 252 | GHH3 | GEH1 | 4.37 | 125 | 121 |
| Ex. 158 | 252 | GHH3 | GEH2 | 4.23 | 126 | 125 |
| Ex. 159 | 252 | GHH3 | GEH3 | 4.21 | 120 | 117 |
| Ex. 160 | 252 | GHH3 | GEH4 | 4.18 | 122 | 120 |
| Ex. 161 | 252 | GHH3 | GEH5 | 4.20 | 125 | 119 |
| Ex. 162 | 252 | GHH3 | GEH6 | 4.24 | 122 | 116 |
| Ex. 163 | 252 | GHH4 | GEH1 | 4.18 | 129 | 121 |
| Ex. 164 | 252 | GHH4 | GEH2 | 4.13 | 130 | 122 |
| Ex. 165 | 252 | GHH4 | GEH3 | 4.18 | 125 | 120 |
| Ex. 166 | 252 | GHH4 | GEH4 | 4.11 | 128 | 121 |
| Ex. 167 | 252 | GHH4 | GEH5 | 4.14 | 122 | 116 |
| Ex. 168 | 252 | GHH4 | GEH6 | 4.12 | 123 | 117 |

As indicated in Table 14, in the OLEDs in which the EML includes the host and the dopant of the present disclosure, the driving voltage was reduced and EQE and luminous lifespan ($LT_{95}$) were greatly improved.

Example 169 (Ex. 169): Fabrication of OLED

An OLED was fabricated using the same procedure and the same material as Example 145, except that GHH5 of Formula 8 as the first host was used in the EML instead of GHH1.

Examples 170-174 (Ex. 170-174): Fabrication of OLED

An OLED was fabricated using the same procedure and the same material as Example 169, except that GEH2 (Ex. 170), GEH3 (Ex. 171), GEH4 (Ex. 172), GEH5 (Ex. 173) and GEH6 (Ex. 174) of Formula 10, respectively, were used as the second host in the EML instead of GEH1.

Example 175 (Ex. 175): Fabrication of OLED

An OLED was fabricated using the same procedure and the same material as Example 145, except that GHH6 of Formula 8 as the first host was used in the EML instead of GHH1.

Examples 176-180 (Ex. 176-180): Fabrication of OLED

An OLED was fabricated using the same procedure and the same material as Example 175, except that GEH2 (Ex. 176), GEH3 (Ex. 177), GEH4 (Ex. 178), GEH5 (Ex. 179) and GEH6 (Ex. 180) of Formula 10, respectively, were used as the second host in the EML instead of GEH1.

Experimental Example 15: Measurement of Luminous Properties OLED

Optical properties for each of the OLED fabricated in Examples 169 to 180 were measured using the same procedures as Experimental Example 1. The measurement results are indicated in the following Table 15.

TABLE 15

Luminous Properties of PLED

| | EML | | | Voltage | EQE | $LT_{95}$ |
|---|---|---|---|---|---|---|
| Sample | Dopant | Host | | (V) | (%) | (%) |
| Ref. 2 | 252 | CBP | | 4.36 | 100 | 100 |
| Ex. 169 | 252 | GHH5 | GEH1 | 4.20 | 121 | 131 |
| Ex. 170 | 252 | GHH5 | GEH2 | 4.23 | 126 | 129 |
| Ex. 171 | 252 | GHH5 | GEH3 | 4.28 | 121 | 128 |
| Ex. 172 | 252 | GHH5 | GEH4 | 4.18 | 118 | 125 |
| Ex. 173 | 252 | GHH5 | GEH5 | 4.23 | 120 | 124 |
| Ex. 174 | 252 | GHH5 | GEH6 | 4.28 | 121 | 125 |
| Ex. 175 | 252 | GHH6 | GEH1 | 4.21 | 120 | 127 |
| Ex. 176 | 252 | GHH6 | GEH2 | 4.31 | 124 | 124 |
| Ex. 177 | 252 | GHH6 | GEH3 | 4.27 | 120 | 122 |
| Ex. 178 | 252 | GHH6 | GEH4 | 4.19 | 123 | 124 |
| Ex. 179 | 252 | GHH6 | GEH5 | 4.18 | 120 | 122 |
| Ex. 180 | 252 | GHH6 | GEH6 | 4.23 | 121 | 120 |

As indicated in Table 15, in the OLEDs in which the EML includes the host and the dopant of the present disclosure, the driving voltage was reduced and EQE and luminous lifespan ($LT_{95}$) were greatly improved.

Example 181 (Ex. 181): Fabrication of OLED

An OLED was fabricated using the same procedure and the same material as Example 1, except that Compound 253 synthesized in Synthesis Example 17 as the dopant was used in the EML instead of Compound 251.

Examples 182-186 (Ex. 182-186): Fabrication of OLED

An OLED was fabricated using the same procedure and the same material as Example 181, except that GEH2 (Ex. 182), GEH3 (Ex. 183), GEH4 (Ex. 184), GEH5 (Ex. 185) and GEH6 (Ex. 186) of Formula 10, respectively, were used as the second host in the EML instead of GEH1.

Example 187 (Ex. 187): Fabrication of OLED

An OLED was fabricated using the same procedure and the same material as Example 181, except that GHH2 of Formula 8 as the first host was used in the EML instead of GHH1.

Examples 188-192 (Ex. 188-192): Fabrication of OLED

An OLED was fabricated using the same procedure and the same material as Example 187, except that GEH2 (Ex. 188), GEH3 (Ex. 189), GEH4 (Ex. 190), GEH5 (Ex. 191) and GEH6 (Ex. 192) of Formula 10, respectively, were used as the second host in the EML instead of GEH1.

Comparative Example 3 (Ref. 3): Fabrication of OLED

An OLED was fabricated using the same procedure and the same material as Example 181, except CBP (90 wt %) as a sole host was used in the EML instead of GHH1 and GEH1.

Experimental Example 16: Measurement of Luminous Properties OLED

Optical properties for each of the OLED fabricated in Examples 181 to 192 and Comparative Example 3 were measured using the same procedures as Experimental Example 1. The measurement results are indicated in the following Table 16.

TABLE 16

Luminous Properties of PLED

| Sample | EML Dopant | EML Host | | Voltage (V) | EQE (%) | $LT_{95}$ (%) |
|---|---|---|---|---|---|---|
| Ref. 3 | 253 | CBP | | 4.34 | 100 | 100 |
| Ex. 181 | 253 | GHH1 | GEH1 | 4.21 | 129 | 129 |
| Ex. 182 | 253 | GHH1 | GEH2 | 4.00 | 133 | 127 |
| Ex. 183 | 253 | GHH1 | GEH3 | 4.11 | 128 | 127 |
| Ex. 184 | 253 | GHH1 | GEH4 | 4.20 | 131 | 128 |
| Ex. 185 | 253 | GHH1 | GEH5 | 4.18 | 126 | 125 |
| Ex. 186 | 253 | GHH1 | GEH6 | 4.07 | 124 | 122 |
| Ex. 187 | 253 | GHH2 | GEH1 | 4.22 | 122 | 126 |
| Ex. 188 | 253 | GHH2 | GEH2 | 4.20 | 125 | 126 |
| Ex. 189 | 253 | GHH2 | GEH3 | 4.34 | 122 | 125 |
| Ex. 190 | 253 | GHH2 | GEH4 | 4.13 | 121 | 122 |
| Ex. 191 | 253 | GHH2 | GEH5 | 4.28 | 122 | 123 |
| Ex. 192 | 253 | GHH2 | GEH6 | 4.21 | 123 | 122 |

As indicated in Table 16, in the OLEDs in which the EML includes the host and the dopant of the present disclosure, the driving voltage was reduced and EQE and luminous lifespan ($LT_{95}$) were greatly improved.

Example 193 (Ex. 193): Fabrication of OLED

An OLED was fabricated using the same procedure and the same material as Example 181, except that GHH3 of Formula 8 as the first host was used in the EML instead of GHH1.

Examples 194-198 (Ex. 194-198): Fabrication of OLED

An OLED was fabricated using the same procedure and the same material as Example 193, except that GEH2 (Ex. 194), GEH3 (Ex. 195), GEH4 (Ex. 196), GEH5 (Ex. 197) and GEH6 (Ex. 198) of Formula 10, respectively, were used as the second host in the EML instead of GEH1.

Example 199 (Ex. 199): Fabrication of OLED

An OLED was fabricated using the same procedure and the same material as Example 181, except that GHH4 of Formula 8 as the first host was used in the EML instead of GHH1.

Examples 200-204 (Ex. 200-204): Fabrication of OLED

An OLED was fabricated using the same procedure and the same material as Example 199, except that GEH2 (Ex. 200), GEH3 (Ex. 201), GEH4 (Ex. 202), GEH5 (Ex. 203) and GEH6 (Ex. 204) of Formula 10, respectively, were used as the second host in the EML instead of GEH1.

Experimental Example 17: Measurement of Luminous Properties OLED

Optical properties for each of the OLED fabricated in Examples 193 to 204 were measured using the same procedures as Experimental Example 1. The measurement results are indicated in the following Table 17.

TABLE 17

Luminous Properties of PLED

| Sample | EML Dopant | EML Host | | Voltage (V) | EQE (%) | $LT_{95}$ (%) |
|---|---|---|---|---|---|---|
| Ref 3 | 253 | CBP | | 4.34 | 100 | 100 |
| Ex. 193 | 253 | GHH3 | GEH1 | 4.27 | 127 | 123 |
| Ex. 194 | 253 | GHH3 | GEH2 | 4.22 | 126 | 123 |
| Ex. 195 | 253 | GHH3 | GEH3 | 4.22 | 124 | 124 |
| Ex. 196 | 253 | GHH3 | GEH4 | 4.21 | 120 | 121 |
| Ex. 197 | 253 | GHH3 | GEH5 | 4.26 | 122 | 120 |
| Ex. 198 | 253 | GHH3 | GEH6 | 4.14 | 121 | 123 |
| Ex. 199 | 253 | GHH4 | GEH1 | 4.28 | 127 | 121 |
| Ex. 200 | 253 | GHH4 | GEH2 | 4.15 | 129 | 122 |
| Ex. 201 | 253 | GHH4 | GEH3 | 4.17 | 129 | 117 |
| Ex. 202 | 253 | GHH4 | GEH4 | 4.11 | 125 | 118 |
| Ex. 203 | 253 | GHH4 | GEH5 | 4.30 | 127 | 119 |
| Ex. 204 | 253 | GHH4 | GEH6 | 4.20 | 124 | 118 |

As indicated in Table 17, in the OLEDs in which the EML includes the host and the dopant of the present disclosure, the driving voltage was reduced and EQE and luminous lifespan ($LT_{95}$) were greatly improved.

Example 205 (Ex. 205): Fabrication of OLED

An OLED was fabricated using the same procedure and the same material as Example 181, except that GHH5S of Formula 8 as the first host was used in the EML instead of GHH1.

Examples 206-210 (Ex. 206-210): Fabrication of OLED

An OLED was fabricated using the same procedure and the same material as Example 205, except that GEH2 (Ex. 206), GEH3 (Ex. 207), GEH4 (Ex. 208), GEH5 (Ex. 209) and GEH6 (Ex. 210) of Formula 10, respectively, were used as the second host in the EML instead of GEH1.

Example 211 Ex. 211): Fabrication of OLED

An OLED was fabricated using the same procedure and the same material as Example 181, except that GHH6 of Formula 8 as the first host was used in the EML instead of GHH1.

Examples 212-216 (Ex. 212-216): Fabrication of OLED

An OLED was fabricated using the same procedure and the same material as Example 211, except that GEH2 (Ex. 212), GEH3 (Ex. 213), GEH4 (Ex. 214), GEH5 (Ex. 215) and GEH6 (Ex. 216) of Formula 10, respectively, were used as the second host in the EML instead of GEH1.

Experimental Example 18: Measurement of Luminous Properties OLED

Optical properties for each of the OLED fabricated in Examples 205 to 216 were measured using the same procedures as Experimental Example 1. The measurement results are indicated in the following Table 18.

TABLE 18

Luminous Properties of PLED

| Sample | EML Dopant | EML Host | | Voltage (V) | EQE (%) | $LT_{95}$ (%) |
|---|---|---|---|---|---|---|
| Ref 3 | 253 | CBP | | 4.34 | 100 | 100 |
| Ex. 205 | 253 | GHH5 | GEH1 | 4.25 | 122 | 127 |
| Ex. 206 | 253 | GHH5 | GEH2 | 4.20 | 123 | 131 |
| Ex. 207 | 253 | GHH5 | GEH3 | 4.23 | 122 | 126 |
| Ex. 208 | 253 | GHH5 | GEH4 | 4.16 | 120 | 123 |
| Ex. 209 | 253 | GHH5 | GEH5 | 4.21 | 123 | 122 |
| Ex. 210 | 253 | GHH5 | GEH6 | 4.21 | 122 | 128 |
| Ex. 211 | 253 | GHH6 | GEH1 | 4.33 | 124 | 125 |
| Ex. 212 | 253 | GHH6 | GEH2 | 4.22 | 123 | 125 |
| Ex. 213 | 253 | GHH6 | GEH3 | 4.19 | 120 | 124 |
| Ex. 214 | 253 | GHH6 | GEH4 | 4.25 | 116 | 125 |
| Ex. 215 | 253 | GHH6 | GEH5 | 4.24 | 120 | 126 |
| Ex. 216 | 253 | GHH6 | GEH6 | 4.18 | 121 | 120 |

As indicated in Table 18, in the OLEDs in which the EML includes the host and the dopant of the present disclosure, the driving voltage was reduced and EQE and luminous lifespan ($LT_{95}$) were greatly improved.

Example 217 (Ex. 217): Fabrication of OLED

An OLED was fabricated using the same procedure and the same material as Example 1, except that Compound 254 synthesized in Synthesis Example 18 as the dopant was used in the EML instead of Compound 251.

Examples 218-222 (Ex. 218-222): Fabrication of OLED

An OLED was fabricated using the same procedure and the same material as Example 217, except that GEH2 (Ex. 218), GEH3 (Ex. 219), GEH4 (Ex. 220), GEH5 (Ex. 221) and GEH6 (Ex. 222) of Formula 10, respectively, were used as the second host in the EML instead of GEH1.

Example 223 (Ex. 223): Fabrication of OLED

An OLED was fabricated using the same procedure and the same material as Example 217, except that GHH2 of Formula 8 as the first host was used in the EML instead of GHH1.

Examples 224-228 (Ex. 224-228): Fabrication of OLED

An OLED was fabricated using the same procedure and the same material as Example 223, except that GEH2 (Ex. 224), GEH3 (Ex. 225), GEH4 (Ex. 226), GEH5 (Ex. 227) and GEH6 (Ex. 228) of Formula 10, respectively, were used as the second host in the EML instead of GEH1.

Comparative Example 4 (Ref. 4): Fabrication of OLED

An OLED was fabricated using the same procedure and the same material as Example 217, except CBP (90 wt %) as a sole host was used in the EML instead of GHH1 and GEH1.

Experimental Example 19: Measurement of Luminous Properties OLED

Optical properties for each of the OLED fabricated in Examples 217 to 228 and Comparative Example 4 were measured using the same procedures as Experimental Example 1. The measurement results are indicated in the following Table 19.

TABLE 19

Luminous Properties of PLED

| Sample | EML Dopant | EML Host | | Voltage (V) | EQE (%) | $LT_{95}$ (%) |
|---|---|---|---|---|---|---|
| Ref 4 | 254 | CBP | | 4.32 | 100 | 100 |
| Ex. 217 | 254 | GHH1 | GEH1 | 4.11 | 131 | 127 |
| Ex. 218 | 254 | GHH1 | GEH2 | 4.06 | 130 | 131 |
| Ex. 219 | 254 | GHH1 | GEH3 | 4.13 | 129 | 126 |
| Ex. 220 | 254 | GHH1 | GEH4 | 4.03 | 127 | 126 |
| Ex. 221 | 254 | GHH1 | GEH5 | 4.07 | 131 | 127 |
| Ex. 222 | 254 | GHH1 | GEH6 | 4.06 | 127 | 124 |
| Ex. 223 | 254 | GHH2 | GEH1 | 4.32 | 126 | 130 |
| Ex. 224 | 254 | GHH2 | GEH2 | 4.28 | 128 | 121 |
| Ex. 225 | 254 | GHH2 | GEH3 | 4.23 | 123 | 122 |
| Ex. 226 | 254 | GHH2 | GEH4 | 4.26 | 122 | 126 |
| Ex. 227 | 254 | GHH2 | GEH5 | 4.15 | 119 | 120 |
| Ex. 228 | 254 | GHH2 | GEH6 | 4.22 | 122 | 121 |

As indicated in Table 19, in the OLEDs in which the EML includes the host and the dopant of the present disclosure, the driving voltage was reduced and EQE and luminous lifespan ($LT_{95}$) were greatly improved.

Example 229 (Ex. 229): Fabrication of OLED

An OLED was fabricated using the same procedure and the same material as Example 217, except that GHH3 of Formula 8 as the first host was used in the EML instead of GHH1.

Examples 230-234 (Ex. 230-234): Fabrication of OLED

An OLED was fabricated using the same procedure and the same material as Example 229, except that GEH2 (Ex. 230), GEH3 (Ex. 231), GEH4 (Ex. 232), GEH5 (Ex. 233) and GEH6 (Ex. 234) of Formula 10, respectively, were used as the second host in the EML instead of GEH1.

Example 235 Ex. 235): Fabrication of OLED

An OLED was fabricated using the same procedure and the same material as Example 217, except that GHH4 of Formula 8 as the first host was used in the EML instead of GHH1.

Examples 236-240 (Ex. 236-240): Fabrication of OLED

An OLED was fabricated using the same procedure and the same material as Example 235, except that GEH2 (Ex. 236), GEH3 (Ex. 237), GEH4 (Ex. 238), GEH5 (Ex. 239) and GEH6 (Ex. 240) of Formula 10, respectively, were used as the second host in the EML instead of GEH1.

Experimental Example 20: Measurement of Luminous Properties OLED

Optical properties for each of the OLED fabricated in Examples 229 to 240 were measured using the same procedures as Experimental Example 1. The measurement results are indicated in the following Table 20.

TABLE 20

Luminous Properties of PLED

| Sample | EML Dopant | EML Host | | Voltage (V) | EQE (%) | $LT_{95}$ (%) |
|---|---|---|---|---|---|---|
| Ref 4 | 254 | CBP | | 4.32 | 100 | 100 |
| Ex. 229 | 254 | GHH3 | GEH1 | 4.15 | 126 | 124 |
| Ex. 230 | 254 | GHH3 | GEH2 | 4.34 | 124 | 124 |
| Ex. 231 | 254 | GHH3 | GEH3 | 4.18 | 123 | 120 |
| Ex. 232 | 254 | GHH3 | GEH4 | 4.24 | 123 | 121 |
| Ex. 233 | 254 | GHH3 | GEH5 | 4.18 | 118 | 119 |
| Ex. 234 | 254 | GHH3 | GEH6 | 4.15 | 125 | 119 |
| Ex. 235 | 254 | GHH4 | GEH1 | 4.15 | 125 | 122 |
| Ex. 236 | 254 | GHH4 | GEH2 | 4.04 | 128 | 120 |
| Ex. 237 | 254 | GHH4 | GEH3 | 4.15 | 126 | 118 |
| Ex. 238 | 254 | GHH4 | GEH4 | 4.10 | 125 | 120 |
| Ex. 239 | 254 | GHH4 | GEH5 | 4.02 | 128 | 118 |
| Ex. 240 | 254 | GHH4 | GEH6 | 4.18 | 125 | 116 |

As indicated in Table 20, in the OLEDs in which the EML includes the host and the dopant of the present disclosure, the driving voltage was reduced and EQE and luminous lifespan ($LT_{95}$) were greatly improved.

Example 241 (Ex. 241): Fabrication of OLED

An OLED was fabricated using the same procedure and the same material as Example 217, except that GHH5 of Formula 8 as the first host was used in the EML instead of GHH1.

Examples 242-246 (Ex. 242-246): Fabrication of OLED

An OLED was fabricated using the same procedure and the same material as Example 241, except that GEH2 (Ex. 242), GEH3 (Ex. 243), GEH4 (Ex. 244), GEH5 (Ex. 245) and GEH6 (Ex. 246) of Formula 10, respectively, were used as the second host in the EML instead of GEH1.

Example 247 (Ex. 247): Fabrication of OLED

An OLED was fabricated using the same procedure and the same material as Example 217, except that GHH6 of Formula 8 as the first host was used in the EML instead of GHH1.

Examples 248-252 (Ex. 248-252): Fabrication of OLED

An OLED was fabricated using the same procedure and the same material as Example 247, except that GEH2 (Ex. 248), GEH3 (Ex. 249), GEH4 (Ex. 250), GEH5 (Ex. 251) and GEH6 (Ex. 252) of Formula 10, respectively, were used as the second host in the EML instead of GEH1.

Experimental Example 21: Measurement of Luminous Properties OLED

Optical properties for each of the OLED fabricated in Examples 241 to 252 were measured using the same procedures as Experimental Example 1. The measurement results are indicated in the following Table 21.

TABLE 21

Luminous Properties of PLED

| Sample | EML Dopant | EML Host | | Voltage (V) | EQE (%) | $LT_{95}$ (%) |
|---|---|---|---|---|---|---|
| Ref 4 | 254 | CBP | | 4.32 | 100 | 100 |
| Ex. 241 | 254 | GHH5 | GEH1 | 4.27 | 120 | 128 |
| Ex. 242 | 254 | GHH5 | GEH2 | 4.17 | 122 | 125 |
| Ex. 243 | 254 | GHH5 | GEH3 | 4.10 | 121 | 124 |
| Ex. 244 | 254 | GHH5 | GEH4 | 4.28 | 122 | 129 |
| Ex. 245 | 254 | GHH5 | GEH5 | 4.28 | 121 | 124 |
| Ex. 246 | 254 | GHH5 | GEH6 | 4.18 | 117 | 119 |
| Ex. 247 | 254 | GHH6 | GEH1 | 4.15 | 125 | 128 |
| Ex. 248 | 254 | GHH6 | GEH2 | 4.23 | 125 | 127 |
| Ex. 249 | 254 | GHH6 | GEH3 | 4.18 | 126 | 124 |
| Ex. 250 | 254 | GHH6 | GEH4 | 4.17 | 119 | 122 |
| Ex. 251 | 254 | GHH6 | GEH5 | 4.20 | 118 | 123 |
| Ex. 252 | 254 | GHH6 | GEH6 | 4.25 | 119 | 121 |

As indicated in Table 21, in the OLEDs in which the EML includes the host and the dopant of the present disclosure, the driving voltage was reduced and EQE and luminous lifespan ($LT_{95}$) were greatly improved.

Example 253 (Ex. 253): Fabrication of OLED

An OLED was fabricated using the same procedure and the same material as Example 1, except that Compound 255 synthesized in Synthesis Example 19 as the dopant was used in the EML instead of Compound 251.

Examples 254-258 (Ex. 254-258): Fabrication of OLED

An OLED was fabricated using the same procedure and the same material as Example 253, except that GEH2 (Ex. 254), GEH3 (Ex. 255), GEH4 (Ex. 256), GEH5 (Ex. 257) and GEH6 (Ex. 258) of Formula 10, respectively, were used as the second host in the EML instead of GEH1.

Example 259 (Ex. 259): Fabrication of OLED

An OLED was fabricated using the same procedure and the same material as Example 253, except that GHH2 of Formula 8 as the first host was used in the EML instead of GHH1.

Examples 260-264 (Ex. 260-264): Fabrication of OLED

An OLED was fabricated using the same procedure and the same material as Example 259, except that GEH2 (Ex.

260), GEH3 (Ex. 261), GEH4 (Ex. 262), GEH5 (Ex. 263) and GEH6 (Ex. 264) of Formula 10, respectively, were used as the second host in the EML instead of GEH1.

Comparative Example 5 (Ref 5): Fabrication of OLED

An OLED was fabricated using the same procedure and the same material as Example 253, except CBP (90 wt %) as a sole host was used in the EML instead of GHH1 and GEH1.

Experimental Example 22: Measurement of Luminous Properties OLED

Optical properties for each of the OLED fabricated in Examples 253 to 264 and Comparative Example 5 were measured using the same procedures as Experimental Example 1. The measurement results are indicated in the following Table 22.

TABLE 22

Luminous Properties of PLED

| Sample | EML Dopant | EML Host | | Voltage (V) | EQE (%) | $LT_{95}$ (%) |
|---|---|---|---|---|---|---|
| Ref 5 | 255 | CBP | | 4.36 | 100 | 100 |
| Ex. 253 | 255 | GHH1 | GEH1 | 4.21 | 131 | 131 |
| Ex. 254 | 255 | GHH1 | GEH2 | 4.12 | 131 | 129 |
| Ex. 255 | 255 | GHH1 | GEH3 | 4.20 | 129 | 127 |
| Ex. 256 | 255 | GHH1 | GEH4 | 4.15 | 126 | 123 |
| Ex. 257 | 255 | GHH1 | GEH5 | 4.06 | 129 | 122 |
| Ex. 258 | 255 | GHH1 | GEH6 | 4.15 | 127 | 125 |
| Ex. 259 | 255 | GHH2 | GEH1 | 4.41 | 122 | 123 |
| Ex. 260 | 255 | GHH2 | GEH2 | 4.31 | 128 | 125 |
| Ex. 261 | 255 | GHH2 | GEH3 | 4.34 | 122 | 121 |
| Ex. 262 | 255 | GHH2 | GEH4 | 4.25 | 123 | 126 |
| Ex. 263 | 255 | GHH2 | GEH5 | 4.20 | 120 | 121 |
| Ex. 264 | 255 | GHH2 | GEH6 | 4.15 | 123 | 122 |

As indicated in Table 22, in the OLEDs in which the EML includes the host and the dopant of the present disclosure, the driving voltage was reduced and EQE and luminous lifespan ($LT_{95}$) were greatly improved.

Example 265 (Ex. 265): Fabrication of OLED

An OLED was fabricated using the same procedure and the same material as Example 253, except that GHH3 of Formula 8 as the first host was used in the EML instead of GHH1.

Examples 266-270 (Ex. 266-270): Fabrication of OLED

An OLED was fabricated using the same procedure and the same material as Example 265, except that GEH2 (Ex. 266), GEH3 (Ex. 267), GEH4 (Ex. 268), GEH5 (Ex. 269) and GEH6 (Ex. 270) of Formula 10, respectively, were used as the second host in the EML instead of GEH1.

Example 271 (Ex. 271): Fabrication of OLED

An OLED was fabricated using the same procedure and the same material as Example 253, except that GHH4 of Formula 8 as the first host was used in the EML instead of GHH1.

Examples 272-276 (Ex. 272-276): Fabrication of OLED

An OLED was fabricated using the same procedure and the same material as Example 271, except that GEH2 (Ex. 272), GEH3 (Ex. 273), GEH4 (Ex. 274), GEH5 (Ex. 275) and GEH6 (Ex. 276) of Formula 10, respectively, were used as the second host in the EML instead of GEH1.

Experimental Example 23: Measurement of Luminous Properties OLED

Optical properties for each of the OLED fabricated in Examples 265 to 275 were measured using the same procedures as Experimental Example 1. The measurement results are indicated in the following Table 23.

TABLE 23

Luminous Properties of PLED

| Sample | EML Dopant | EML Host | | Voltage (V) | EQE (%) | $LT_{95}$ (%) |
|---|---|---|---|---|---|---|
| Ref 5 | 255 | CBP | | 4.36 | 100 | 100 |
| Ex. 265 | 255 | GHH3 | GEH1 | 4.26 | 128 | 123 |
| Ex. 266 | 255 | GHH3 | GEH2 | 4.28 | 129 | 122 |
| Ex. 267 | 255 | GHH3 | GEH3 | 4.31 | 121 | 124 |
| Ex. 268 | 255 | GHH3 | GEH4 | 4.28 | 122 | 121 |
| Ex. 269 | 255 | GHH3 | GEH5 | 4.39 | 124 | 121 |
| Ex. 270 | 255 | GHH3 | GEH6 | 4.28 | 124 | 118 |
| Ex. 271 | 255 | GHH4 | GEH1 | 4.24 | 126 | 122 |
| Ex. 272 | 255 | GHH4 | GEH2 | 4.15 | 132 | 122 |
| Ex. 273 | 255 | GHH4 | GEH3 | 4.11 | 128 | 119 |
| Ex. 274 | 255 | GHH4 | GEH4 | 4.08 | 125 | 120 |
| Ex. 275 | 255 | GHH4 | GEH5 | 4.20 | 124 | 119 |
| Ex. 276 | 255 | GHH4 | GEH6 | 4.19 | 125 | 119 |

As indicated in Table 23, in the OLEDs in which the EML includes the host and the dopant of the present disclosure, the driving voltage was reduced and EQE and luminous lifespan ($LT_{95}$) were greatly improved.

Example 277 (Ex. 277): Fabrication of OLED

An OLED was fabricated using the same procedure and the same material as Example 253, except that GHH5 of Formula 8 as the first host was used in the EML instead of GHH1.

Examples 278-282 (Ex. 278-282): Fabrication of OLED

An OLED was fabricated using the same procedure and the same material as Example 277, except that GEH2 (Ex. 278), GEH3 (Ex. 279), GEH4 (Ex. 280), GEH5 (Ex. 281) and GEH6 (Ex. 282) of Formula 10, respectively, were used as the second host in the EML instead of GEH1.

Example 283 (Ex. 283): Fabrication of OLED

An OLED was fabricated using the same procedure and the same material as Example 253, except that GHH6 of Formula 8 as the first host was used in the EML instead of GHH1.

Examples 284-288 (Ex. 284-288): Fabrication of OLED

An OLED was fabricated using the same procedure and the same material as Example 283, except that GEH2 (Ex.

284), GEH3 (Ex. 285), GEH4 (Ex. 286), GEH5 (Ex. 287) and GEH6 (Ex. 288) of Formula 10, respectively, were used as the second host in the EML instead of GEH1.

Experimental Example 24: Measurement of Luminous Properties OLED

Optical properties for each of the OLED fabricated in Examples 277 to 288 were measured using the same procedures as Experimental Example 1. The measurement results are indicated in the following Table 24.

TABLE 24

Luminous Properties of PLED

| Sample | EML Dopant | EML Host | | Voltage (V) | EQE (%) | $LT_{95}$ (%) |
|---|---|---|---|---|---|---|
| Ref 5 | 255 | CBP | | 4.36 | 100 | 100 |
| Ex. 277 | 255 | GHH5 | GEH1 | 4.20 | 123 | 129 |
| Ex. 278 | 255 | GHH5 | GEH2 | 4.35 | 125 | 131 |
| Ex. 279 | 255 | GHH5 | GEH3 | 4.22 | 121 | 127 |
| Ex. 280 | 255 | GHH5 | GEH4 | 4.24 | 121 | 124 |
| Ex. 281 | 255 | GHH5 | GEH5 | 4.25 | 120 | 126 |
| Ex. 282 | 255 | GHH5 | GEH6 | 4.25 | 118 | 124 |
| Ex. 283 | 255 | GHH6 | GEH1 | 4.23 | 125 | 127 |
| Ex. 284 | 255 | GHH6 | GEH2 | 4.32 | 126 | 125 |
| Ex. 285 | 255 | GHH6 | GEH3 | 4.25 | 120 | 128 |
| Ex. 286 | 255 | GHH6 | GEH4 | 4.21 | 119 | 125 |
| Ex. 287 | 255 | GHH6 | GEH5 | 4.24 | 121 | 119 |
| Ex. 288 | 255 | GHH6 | GEH6 | 4.25 | 118 | 120 |

As indicated in Table 24, in the OLEDs in which the EML includes the host and the dopant of the present disclosure, the driving voltage was reduced and EQE and luminous lifespan ($LT_{95}$) were greatly improved.

Examples 289-298 (Ex. 289-298): Fabrication of OLED

An OLED was fabricated using the same procedure and the same material as Example 1, except that each of Compounds 256, 257, 1, 2 and 27 as the dopant, GHH1 of Formula 8 as the first host, and GEH1 or GEH2 of Formula 10 as the second host, as indicated in the following Table 25, were used in the EML.

Comparative Examples 6-10 (Ref. 6-10): Fabrication of OLED

An OLED was fabricated using the same procedure and the same material as each of Examples 289-298 except that CBP as a sole host, as indicated in the following Table 25, was used in the EML.

Experimental Example 25: Measurement of Luminous Properties OLED

Optical properties for each of the OLED fabricated in Examples 289 to 298 and Comparative Examples 6 to 10 were measured using the same procedures as Experimental Example 1. The measurement results are indicated in the following Table 25.

TABLE 25

Luminous Properties of PLED

| Sample | EML Dopant | EML Host | | Voltage (V) | EQE (%) | $LT_{95}$ (%) |
|---|---|---|---|---|---|---|
| Ref 6 | 256 | CBP | | 4.32 | 100 | 100 |
| Ex. 289 | 256 | GHH1 | GEH1 | 4.23 | 130 | 129 |
| Ex. 290 | 256 | GHH1 | GEH2 | 4.19 | 135 | 124 |
| Ref. 7 | 257 | CBP | | 4.39 | 100 | 100 |
| Ex. 291 | 257 | GHH1 | GEH1 | 4.06 | 134 | 129 |
| Ex. 292 | 257 | GHH1 | GEH2 | 4.26 | 133 | 127 |
| Ref. 8 | 1 | CBP | | 4.24 | 100 | 100 |
| Ex. 293 | 1 | GHH1 | GEH1 | 3.98 | 133 | 130 |
| Ex. 294 | 1 | GHH1 | GEH2 | 4.07 | 132 | 125 |
| Ref. 9 | 2 | CBP | | 4.26 | 100 | 100 |
| Ex. 295 | 2 | GHH1 | GEH1 | 4.10 | 132 | 130 |
| Ex. 296 | 2 | GHH1 | GEH2 | 4.12 | 133 | 130 |
| Ref. 10 | 27 | CBP | | 4.32 | 100 | 100 |
| Ex. 297 | 27 | GHH1 | GEH1 | 4.12 | 127 | 131 |
| Ex. 298 | 27 | GHH1 | GEH2 | 4.13 | 132 | 125 |

As indicated in Table 25, in the OLEDs in which the EML includes the host and the dopant of the present disclosure, the driving voltage was reduced and EQE and luminous lifespan ($LT_{95}$) were greatly improved.

Examples 299-308 (Ex. 299-308): Fabrication of OLED

An OLED was fabricated using the same procedure and the same material as Example 1, except that each of Compounds 16, 17, 32, 34 and 35 as the dopant, GHH1 of Formula 8 as the first host, and GEH1 or GEH2 of Formula 10 as the second host, as indicated in the following Table 26, were used in the EML.

Comparative Examples 11-15 (Ref 11-15): Fabrication of OLED

An OLED was fabricated using the same procedure and the same material as each of Examples 299-308 except that CBP as a sole host, as indicated in the following Table 26, was used in the EML.

Experimental Example 26: Measurement of Luminous Properties OLED

Optical properties for each of the OLED fabricated in Examples 299 to 308 and Comparative Examples 11 to 15 were measured using the same procedures as Experimental Example 1. The measurement results are indicated in the following Table 26.

TABLE 26

Luminous Properties of OLED

| Sample | EML Dopant | EML Host | | Voltage (V) | EQE (%) | $LT_{95}$ (%) |
|---|---|---|---|---|---|---|
| Ref 11 | 16 | CBP | | 4.26 | 100 | 100 |
| Ex. 299 | 16 | GHH1 | GEH1 | 4.10 | 129 | 129 |
| Ex. 300 | 16 | GHH1 | GEH2 | 4.07 | 132 | 127 |
| Ref. 12 | 17 | CBP | | 4.26 | 100 | 100 |
| Ex. 301 | 17 | GHH1 | GEH1 | 4.11 | 133 | 130 |
| Ex. 302 | 17 | GHH1 | GEH2 | 4.02 | 131 | 129 |
| Ref. 13 | 32 | CBP | | 4.43 | 100 | 100 |
| Ex. 303 | 32 | GHH1 | GEH1 | 4.14 | 131 | 127 |
| Ex. 304 | 32 | GHH1 | GEH2 | 4.25 | 132 | 128 |

TABLE 26-continued

Luminous Properties of OLED

| | EML | | | Voltage | EQE | $LT_{95}$ |
|---|---|---|---|---|---|---|
| Sample | Dopant | Host | | (V) | (%) | (%) |
| Ref. 14 | 34 | CBP | | 4.36 | 100 | 100 |
| Ex. 305 | 34 | GHH1 | GEH1 | 4.12 | 133 | 127 |
| Ex. 306 | 34 | GHH1 | GEH2 | 4.13 | 129 | 130 |
| Ref. 15 | 35 | CBP | | 4.36 | 100 | 100 |
| Ex. 307 | 35 | GHH1 | GEH1 | 4.19 | 129 | 130 |
| Ex. 308 | 35 | GHH1 | GEH2 | 4.19 | 133 | 131 |

As indicated in Table 26, in the OLEDs in which the EML includes the host and the dopant of the present disclosure, the driving voltage was reduced and EQE and luminous lifespan ($LT_{95}$) were greatly improved.

Examples 309-318 (Ex. 309-318): Fabrication of OLED

An OLED was fabricated using the same procedure and the same material as Example 1, except that each of Compounds 136, 137, 142, 148 and 147 as the dopant, GHH1 of Formula 8 as the first host, and GEH1 or GEH2 of Formula 10 as the second host, as indicated in the following Table 27, were used in the EML.

Comparative Examples 16-20 (Ref 16-20): Fabrication of OLED

An OLED was fabricated using the same procedure and the same material as each of Examples 309-318 except that CBP as a sole host, as indicated in the following Table 27, was used in the EML.

Experimental Example 27: Measurement of Luminous Properties OLED

Optical properties for each of the OLED fabricated in Examples 309 to 318 and Comparative Examples 16 to 20 were measured using the same procedures as Experimental Example 1. The measurement results are indicated in the following Table 27.

TABLE 27

Luminous Properties of PLED

| | EML | | | Voltage | EQE | $LT_{95}$ |
|---|---|---|---|---|---|---|
| Sample | Dopant | Host | | (V) | (%) | (%) |
| Ref 16 | 136 | CBP | | 4.22 | 100 | 100 |
| Ex. 309 | 136 | GHH1 | GEH1 | 4.14 | 130 | 128 |
| Ex. 310 | 136 | GHH1 | GEH2 | 3.94 | 128 | 128 |
| Ref. 17 | 137 | CBP | | 4.26 | 100 | 100 |
| Ex. 311 | 137 | GHH1 | GEH1 | 4.08 | 130 | 130 |
| Ex. 312 | 137 | GHH1 | GEH2 | 3.93 | 131 | 128 |
| Ref. 18 | 142 | CBP | | 4.32 | 100 | 100 |
| Ex. 313 | 142 | GHH1 | GEH1 | 4.19 | 129 | 128 |
| Ex. 314 | 142 | GHH1 | GEH2 | 4.11 | 127 | 128 |
| Ref. 19 | 148 | CBP | | 4.34 | 100 | 100 |
| Ex. 315 | 148 | GHH1 | GEH1 | 4.28 | 129 | 130 |
| Ex. 316 | 148 | GHH1 | GEH2 | 4.15 | 132 | 127 |
| Ref. 20 | 147 | CBP | | 4.30 | 100 | 100 |
| Ex. 317 | 147 | GHH1 | GEH1 | 4.16 | 132 | 127 |
| Ex. 318 | 147 | GHH1 | GEH2 | 4.13 | 131 | 130 |

As indicated in Table 27, in the OLEDs in which the EML includes the host and the dopant of the present disclosure, the driving voltage was reduced and EQE and luminous lifespan ($LT_{95}$) were greatly improved.

Examples 319-328 (Ex. 319-328): Fabrication of OLED

An OLED was fabricated using the same procedure and the same material as Example 1, except that each of Compounds 251-255 (10 wt %) as the dopant, and GHH1 or GHH2 (90 wt %) of Formula 8 as the sole host, as indicated in the following Table 28, were used in the EML.

Comparative Examples 21-25 (Ref. 21-25): Fabrication of OLED

An OLED was fabricated using the same procedure and the same material as each of Examples 319-328 except that CBP as the sole host, as indicated in the following Table 28, was used in the EML.

Experimental Example 28: Measurement of Luminous Properties OLED

Optical properties for each of the OLED fabricated in Examples 319 to 328 and Comparative Examples 21 to 25 were measured using the same procedures as Experimental Example 1. The measurement results are indicated in the following Table 28.

TABLE 28

Luminous Properties of PLED

| | EML | | Voltage | EQE | $LT_{95}$ |
|---|---|---|---|---|---|
| Sample | Dopant | Host | (V) | (%) | (%) |
| Ref 21 | 251 | CBP | 4.30 | 100 | 100 |
| Ex. 319 | 251 | GHH1 | 4.06 | 115 | 116 |
| Ex. 320 | 251 | GHH2 | 4.27 | 110 | 115 |
| Ref. 22 | 252 | CBP | 4.36 | 100 | 100 |
| Ex. 321 | 252 | GHH1 | 4.30 | 115 | 116 |
| Ex. 322 | 252 | GHH2 | 4.49 | 113 | 114 |
| Ref. 23 | 253 | CBP | 4.34 | 100 | 100 |
| Ex. 323 | 253 | GHH1 | 4.14 | 111 | 116 |
| Ex. 324 | 253 | GHH2 | 4.32 | 113 | 113 |
| Ref. 24 | 254 | CBP | 4.32 | 100 | 100 |
| Ex. 325 | 254 | GHH1 | 4.18 | 114 | 117 |
| Ex. 326 | 254 | GHH2 | 4.24 | 112 | 113 |
| Ref. 25 | 255 | CBP | 4.36 | 100 | 100 |
| Ex. 327 | 255 | GHH1 | 4.28 | 117 | 116 |
| Ex. 328 | 255 | GHH2 | 4.33 | 113 | 112 |

As indicated in Table 28, in the OLEDs in which the EML includes the host and the dopant of the present disclosure, the driving voltage was reduced and EQE and luminous lifespan ($LT_{95}$) were greatly improved.

Examples 329-338 (Ex. 329-338): Fabrication of OLED

An OLED was fabricated using the same procedure and the same material as Example 1, except that each of Compounds 256, 257, 1, 2 and 27 (10 wt) as the dopant, and GHH1 or GHH2 (90 wt %) of Formula 8 as the sole host, as indicated in the following Table 29, were used in the EML.

Comparative Examples 26-30 (Ref. 26-30): Fabrication of OLED

An OLED was fabricated using the same procedure and the same material as each of Examples 329-338 except that CBP as the sole host, as indicated in the following Table 29, was used in the EML.

Experimental Example 29: Measurement of Luminous Properties OLED

Optical properties for each of the OLED fabricated in Examples 329 to 338 and Comparative Examples 26 to 30 were measured using the same procedures as Experimental Example 1. The measurement results are indicated in the following Table 29.

TABLE 29

Luminous Properties of OLED

| | EML | | Voltage | EQE | $LT_{95}$ |
|---|---|---|---|---|---|
| Sample | Dopant | Host | (V) | (%) | (%) |
| Ref. 26 | 256 | CBP | 4.32 | 100 | 100 |
| Ex. 329 | 256 | GHH1 | 4.22 | 114 | 119 |
| Ex. 330 | 256 | GHH2 | 4.25 | 108 | 111 |
| Ref. 27 | 257 | CBP | 4.39 | 100 | 100 |
| Ex. 331 | 257 | GHH1 | 4.23 | 117 | 116 |
| Ex. 332 | 257 | GHH2 | 4.41 | 109 | 114 |
| Ref. 28 | 1 | CBP | 4.24 | 100 | 100 |
| Ex. 333 | 1 | GHH1 | 4.16 | 113 | 116 |
| Ex. 334 | 1 | GHH2 | 4.27 | 108 | 114 |
| Ref. 29 | 2 | CBP | 4.26 | 100 | 100 |
| Ex. 335 | 2 | GHH1 | 4.21 | 117 | 116 |
| Ex. 336 | 2 | GHH2 | 4.19 | 112 | 113 |
| Ref. 30 | 27 | CBP | 4.32 | 100 | 100 |
| Ex. 337 | 27 | GHH1 | 4.15 | 111 | 116 |
| Ex. 338 | 27 | GHH2 | 4.28 | 109 | 115 |

As indicated in Table 29, in the OLEDs in which the EML includes the host and the dopant of the present disclosure, the driving voltage was reduced and EQE and luminous lifespan ($LT_{95}$) were greatly improved.

Examples 339-348 (Ex. 339-348): Fabrication of OLED

An OLED was fabricated using the same procedure and the same material as Example 1, except that each of Compounds 16, 17, 32, 34 and 35 (10 wt %) as the dopant, and GHH1 or GHH2 (90 wt %) of Formula 8 as the sole host, as indicated in the following Table 30, were used in the EML.

Comparative Examples 31-35 (Ref. 31-35): Fabrication of OLED

An OLED was fabricated using the same procedure and the same material as each of Examples 339-348 except that CBP as the sole host, as indicated in the following Table 30, was used in the EML.

Experimental Example 30: Measurement of Luminous Properties OLED

Optical properties for each of the OLED fabricated in Examples 339 to 348 and Comparative Examples 31 to 35 were measured using the same procedures as Experimental Example 1. The measurement results are indicated in the following Table 30.

TABLE 30

Luminous Properties of OLED

| | EML | | Voltage | EQE | $LT_{95}$ |
|---|---|---|---|---|---|
| Sample | Dopant | Host | (V) | (%) | (%) |
| Ref. 31 | 16 | CBP | 4.26 | 100 | 100 |
| Ex. 339 | 16 | GHH1 | 4.07 | 114 | 116 |
| Ex. 340 | 16 | GHH2 | 4.18 | 110 | 116 |
| Ref. 32 | 17 | CBP | 4.26 | 100 | 100 |
| Ex. 341 | 17 | GHH1 | 4.26 | 115 | 114 |
| Ex. 342 | 17 | GHH2 | 4.29 | 109 | 112 |
| Ref. 33 | 32 | CBP | 4.43 | 100 | 100 |
| Ex. 343 | 32 | GHH1 | 4.31 | 114 | 115 |
| Ex. 344 | 32 | GHH2 | 4.44 | 108 | 113 |
| Ref. 34 | 34 | CBP | 4.36 | 100 | 100 |
| Ex. 345 | 34 | GHH1 | 4.20 | 114 | 113 |
| Ex. 346 | 34 | GHH2 | 4.38 | 110 | 116 |
| Ref. 35 | 35 | CBP | 4.36 | 100 | 100 |
| Ex. 347 | 35 | GHH1 | 4.34 | 115 | 115 |
| Ex. 348 | 35 | GHH2 | 4.41 | 109 | 113 |

As indicated in Table 30, in the OLEDs in which the EML includes the host and the dopant of the present disclosure, the driving voltage was reduced and EQE and luminous lifespan ($LT_{95}$) were greatly improved.

Examples 349-358 (Ex. 349-358): Fabrication of OLED

An OLED was fabricated using the same procedure and the same material as Example 1, except that each of Compounds 136, 137, 142, 148 and 147 (10 wt %) as the dopant, and GHH1 or GHH2 (90 wt %) of Formula 8 as the sole host, as indicated in the following Table 31, were used in the EML.

Comparative Examples 36-40 (Ref. 36-40): Fabrication of OLED

An OLED was fabricated using the same procedure and the same material as each of Examples 349-358 except that CBP as a sole host, as indicated in the following Table 31, was used in the EML.

Experimental Example 31: Measurement of Luminous Properties OLED

Optical properties for each of the OLED fabricated in Examples 349 to 358 and Comparative Examples 36 to 40 were measured using the same procedures as Experimental Example 1. The measurement results are indicated in the following Table 31.

TABLE 31

Luminous Properties of OLED

| | EML | | Voltage | EQE | $LT_{95}$ |
|---|---|---|---|---|---|
| Sample | Dopant | Host | (V) | (%) | (%) |
| Ref. 36 | 136 | CBP | 4.22 | 100 | 100 |
| Ex. 349 | 136 | GHH1 | 4.06 | 117 | 116 |
| Ex. 350 | 136 | GHH2 | 4.39 | 109 | 113 |
| Ref. 37 | 137 | CBP | 4.26 | 100 | 100 |
| Ex. 351 | 137 | GHH1 | 4.14 | 117 | 116 |
| Ex. 352 | 137 | GHH2 | 4.32 | 112 | 113 |

TABLE 31-continued

| Luminous Properties of OLED | | | | | |
|---|---|---|---|---|---|
| | EML | | Voltage | EQE | $LT_{95}$ |
| Sample | Dopant | Host | (V) | (%) | (%) |
| Ref. 38 | 142 | CBP | 4.32 | 100 | 100 |
| Ex. 353 | 142 | GHH1 | 4.24 | 116 | 116 |
| Ex. 354 | 142 | GHH2 | 4.36 | 112 | 111 |
| Ref. 39 | 148 | CBP | 4.34 | 100 | 100 |
| Ex. 355 | 148 | GHH1 | 4.15 | 112 | 115 |
| Ex. 356 | 148 | GHH2 | 4.33 | 111 | 114 |
| Ref. 40 | 147 | CBP | 4.30 | 100 | 100 |
| Ex. 357 | 147 | GHH1 | 4.16 | 113 | 117 |
| Ex. 358 | 147 | GHH2 | 4.19 | 113 | 114 |

As indicated in Table 31, in the OLEDs in which the EML includes the host and the dopant of the present disclosure, the driving voltage was reduced and EQE and luminous lifespan ($LT_{95}$) were greatly improved.

Summing the results in Tables 1-31, it is possible to implement an OLED with lowering its driving voltages and improving its luminous efficiency and luminous lifespan by introducing the host and the dopant in accordance with the present disclosure.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. An organic light emitting diode including:

a first electrode;

a second electrode facing the first electrode; and an emissive layer disposed between the first and second electrodes and including at least one emitting material layer, wherein the at least one emitting material layer includes a host and a dopant, wherein the dopant includes an organic metal compound having the following structure of Formula 1:

$Ir(L_A)_m(L_B)_n$ [Formula 1]

wherein, in Formula 1, $L_A$ has the following structure of Formula 2;

$L_B$ is an auxiliary ligand having the following structure of Formula 3;

m is an integer of 1 to 3;

n is an integer of 0 to 2; and m+n is 3;

[Formula 2]

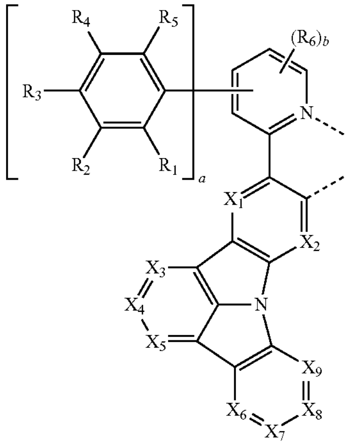

wherein, in Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently is $CR_9$ or N and at least one of $X_6$ to $X_9$ is $CR_9$;

each of $R_1$ to $R_9$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and wherein each $R_6$ is identical to or different from each other when b is an integer of 2 or more;

optionally, two adjacent groups among $R_1$ to $R_5$, and/or two adjacent $R_6$ when b is an integer of 2 or more, and/or $X_3$ and $X_4$ or $X_4$ and $X_5$, and/or $X_6$ and $X_7$, $X_7$ and $X_8$, or $X_8$ and $X_9$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is an integer of 0 to 2; and b is an integer of 0 to 4,

[Formula 3]

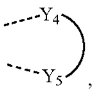

and wherein the host includes a first host having the following structure of Formula 7 and a second host having the following structure of Formula 9:

[Formula 7]

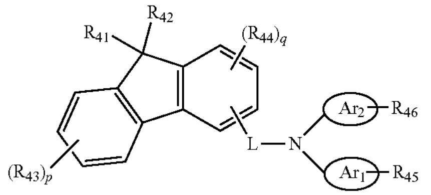

wherein, in Formula 7, each of $R_{41}$ and $R_{42}$ is independently hydrogen, deuterium, unsubstituted or substituted $C_1$-$C_{20}$ alkyl, unsubstituted or substituted $C_6$-$C_{30}$ aryl or unsubstituted or substituted $C_3$-$C_{30}$ hetero aryl, optionally, each substituent on the $C_6$-$C_{30}$ aryl and $C_3$-$C_{30}$ hetero aryl is independently unsubstituted or further substituted with at least one of $C_6$-$C_{30}$ aryl and $C_3$-$C_{30}$ hetero aryl, or $R_{41}$ and $R_{42}$ form an unsubstituted or substituted $C_6$-$C_{30}$ spiro aromatic ring or an unsubstituted or substituted $C_3$-$C_{30}$ spiro hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the $C_6$-$C_{30}$ aryl, $C_3$-$C_{30}$ hetero aryl, $C_6$-$C_{30}$ aryl amino and $C_3$-$C_{30}$ hetero aryl amino is independently unsubstituted or further substituted with at least one of $C_6$-$C_{30}$ aryl and $C_3$-$C_{30}$ hetero aryl, wherein each $R_{43}$ is identical to or different from each other when p is an integer of 2 or more and each $R_{44}$ is identical to or different from each other when q is an integer of 2 or more;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3,

[Formula 9]

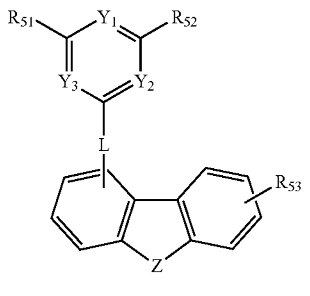

wherein, in Formula 9, each of $R_{51}$ and $R_{52}$ is independently unsubstituted or substituted $C_6$-$C_{30}$ aryl or unsubstituted or substituted $C_3$-$C_{30}$ hetero aryl;

$R_{53}$ is hydrogen or unsubstituted or substituted $C_6$-$C_{30}$ aryl, optionally, the $C_6$-$C_{30}$ aryl forms a spiro structure with an unsubstituted or substituted $C_6$-$C_{30}$ aromatic ring or an unsubstituted or substituted $C_3$-$C_{30}$ hetero aromatic ring;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{54}$ or N, wherein at least one of $Y_1$, $Y_2$ and $Y_3$ is N;

$R_{54}$ is independently hydrogen, unsubstituted or substituted $C_6$-$C_{30}$ aryl or unsubstituted or substituted $C_3$-$C_{30}$ hetero aryl, optionally, each of the $C_6$-$C_{30}$ aryl and the $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring; and Z is O or S.

2. The organic light emitting diode of claim 1, wherein $L_A$ has the following structure of Formula 4A or Formula 4B:

[Formula 4A]

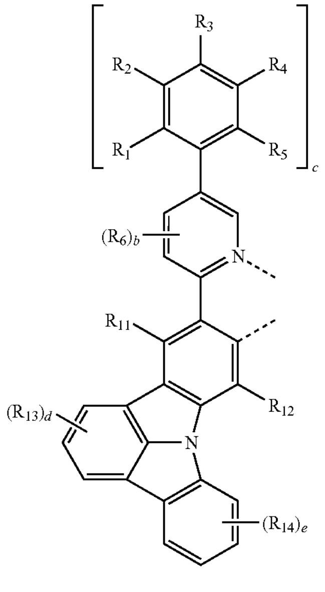

-continued

[Formula 4B]

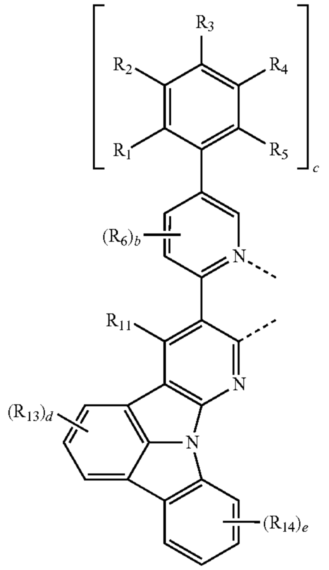

wherein, in Formulae 4A and 4B, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d an integer of 2 or more, and/or two adjacent $R_{14}$ when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is an integer of 0 or 1;

d is an integer of 0 to 3; and e is an integer of 0 to 4.

3. The organic light emitting diode of claim 1, wherein $L_A$ has the following structure of Formula 4C or Formula 4D:

[Formula 4C]

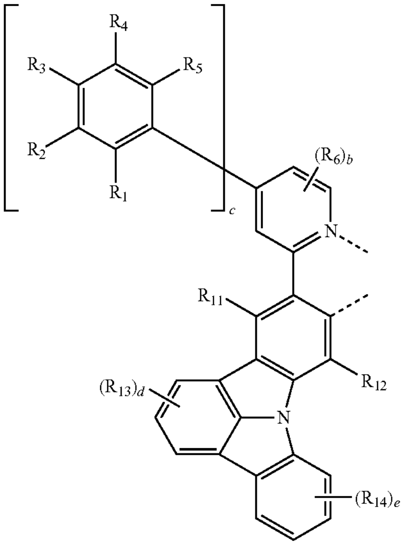

[Formula 4D]

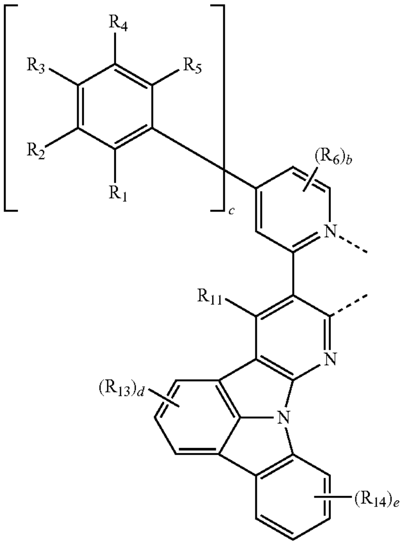

wherein, in Formulae 4C and 4D, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is an integer of 2 or more, and/or two adjacent $R_{14}$ when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is an integer of 0 or 1;

d is an integer of 0 to 3; and e is an integer of 0 to 4.

4. The organic light emitting diode of claim 1, wherein $L_B$ has the following structure of Formula 5A or Formula 5B:

[Formula 5A]

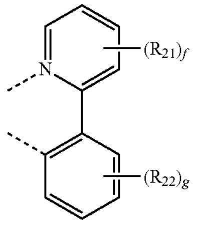

[Formula 5B]

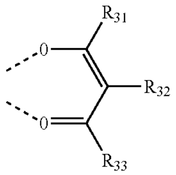

wherein, in Formulae 5A and 5B, each of $R_{21}$, $R_{22}$ and $R_{31}$ to $R_{33}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{21}$ when f is an integer of 2 or more, and/or two adjacent $R_{22}$ when g is an integer of 2 or more, and/or $R_{31}$ and $R_{32}$ or $R_{32}$ and $R_{33}$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring; and each of f and g is an integer of 0 to 4.

5. The organic light emitting diode of claim 1, wherein $X_1$ is $CR_7$, $X_2$ is $CR_7$ or N, each of $X_3$ to $X_5$ is independently $CR_8$ and each of $X_6$ to $X_9$ is independently $CR_9$, each of $R_7$ to $R_9$ is the same as defined in Formula 2.

6. The organic light emitting diode of claim 1, wherein the organic metal compound is selected form the following compounds:

1

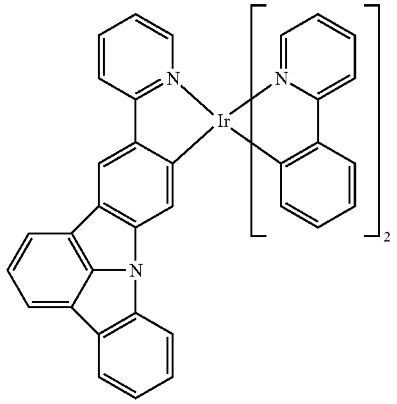

2

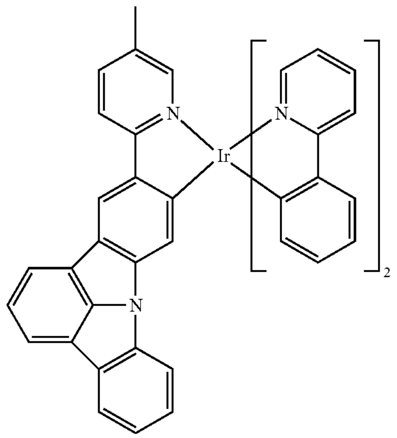

3

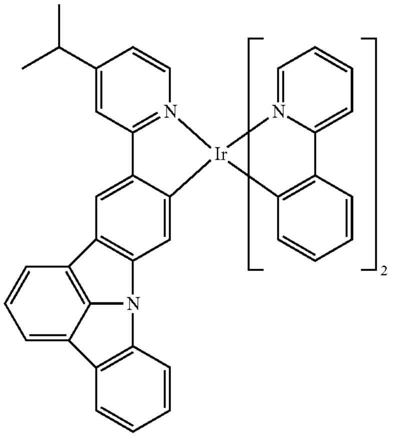

-continued
4
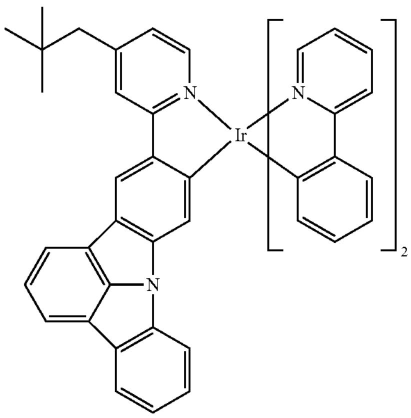
5
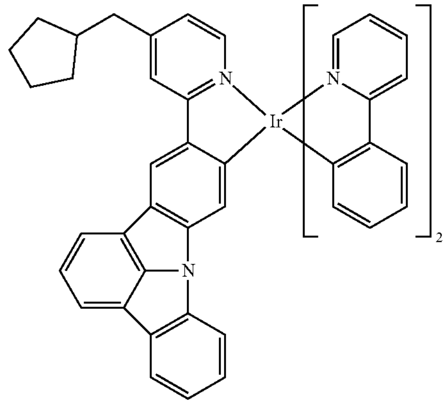
6
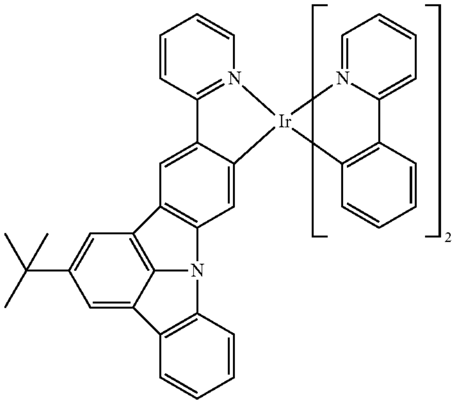
7
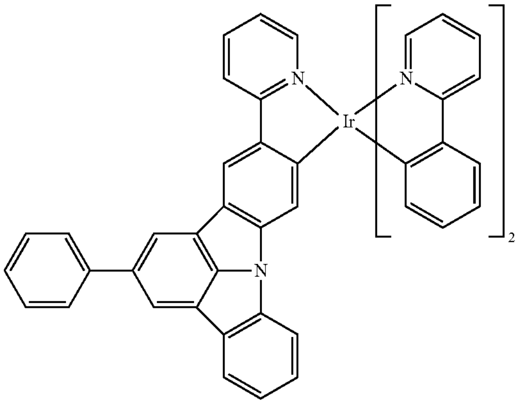
-continued
8
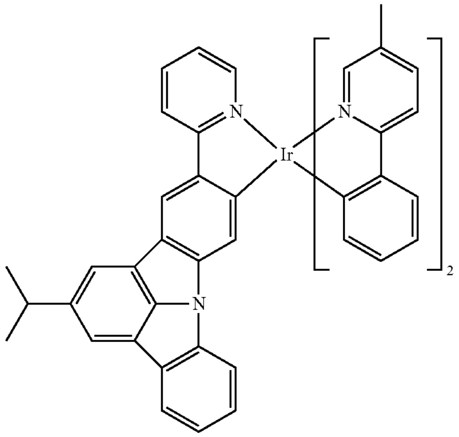
9
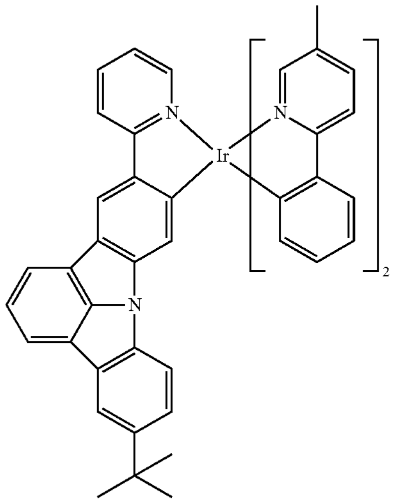
10
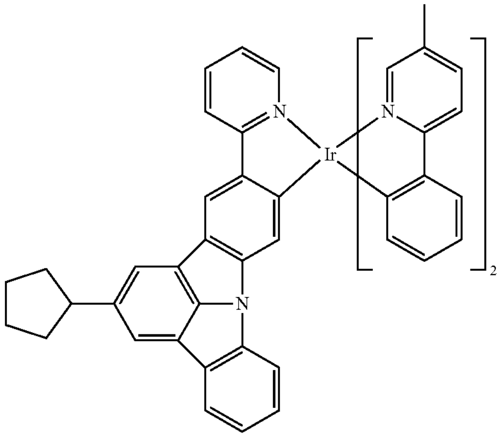

-continued
11
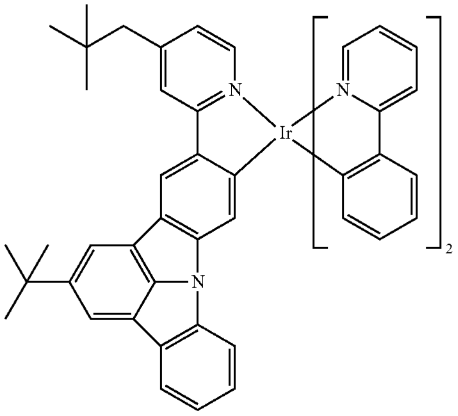
12
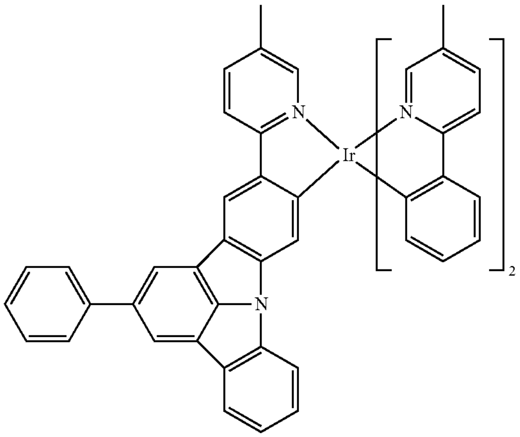
13
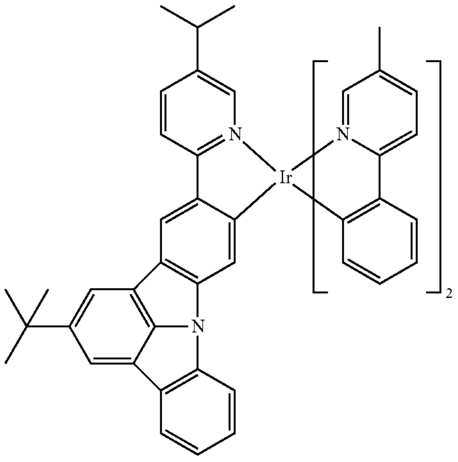
-continued
14
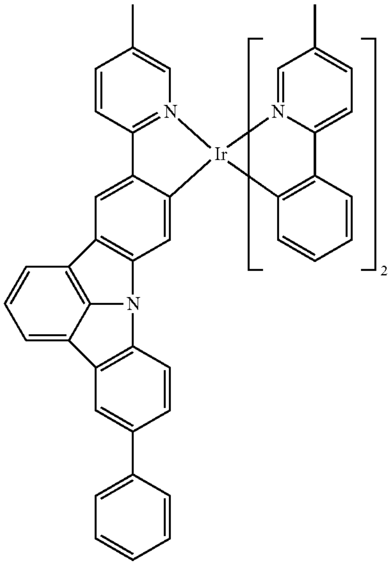
15
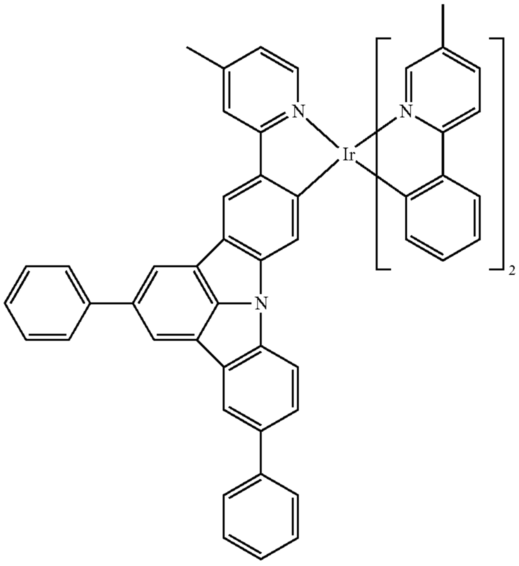
16
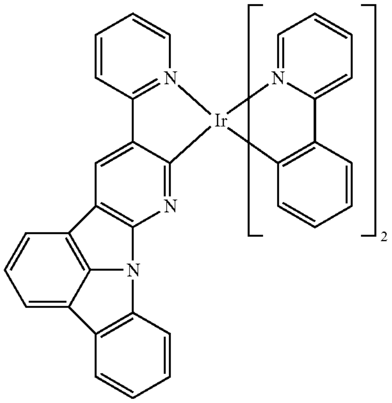

-continued
17
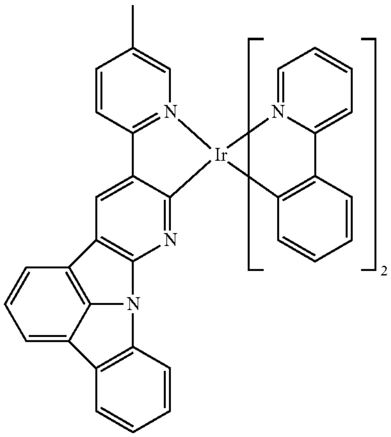
18
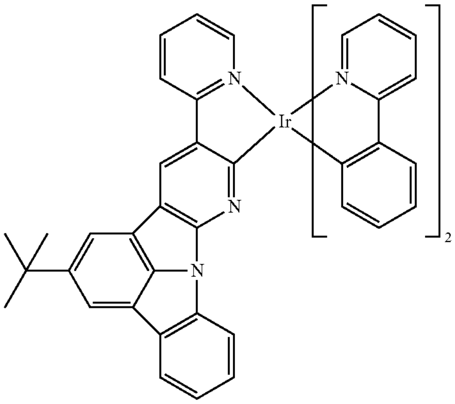
19
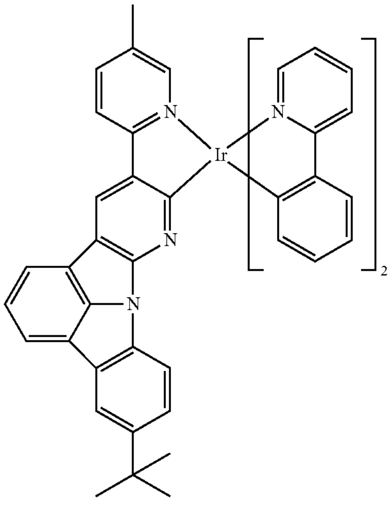
-continued
20
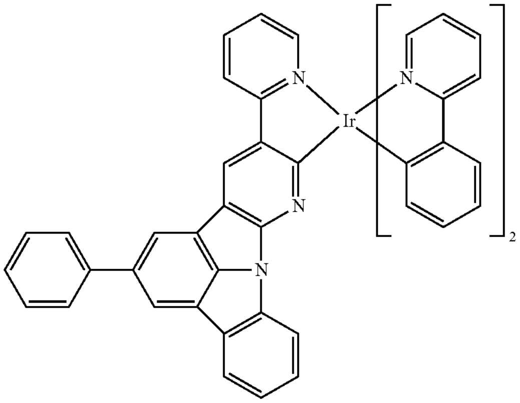
21
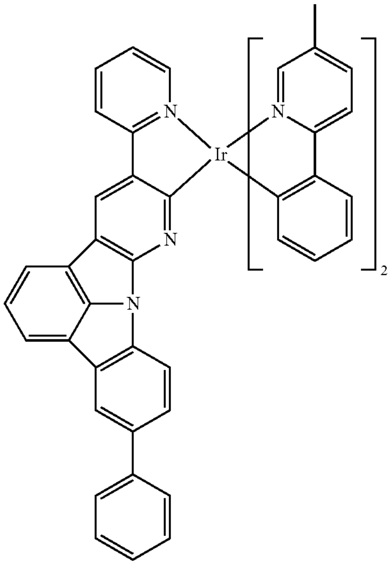
22
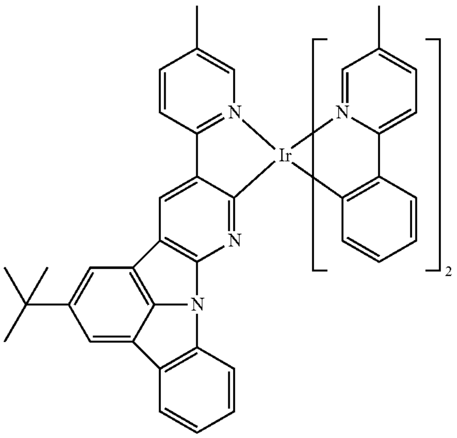

-continued
23
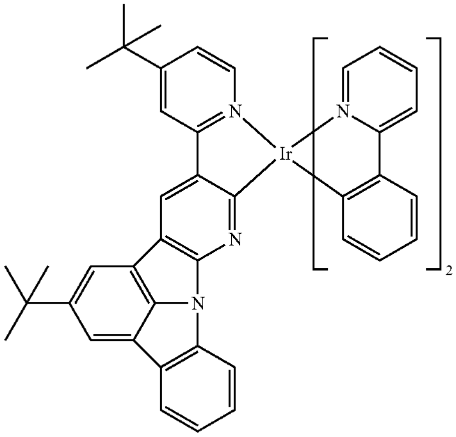
24
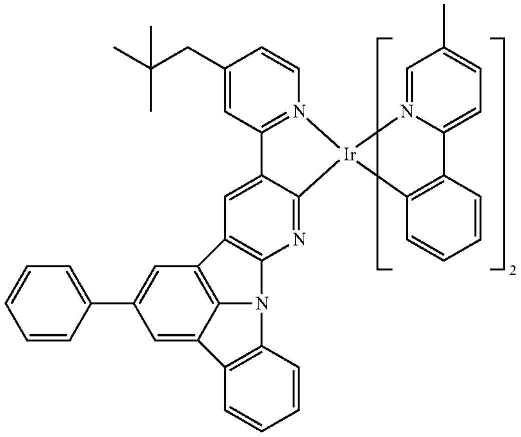
25
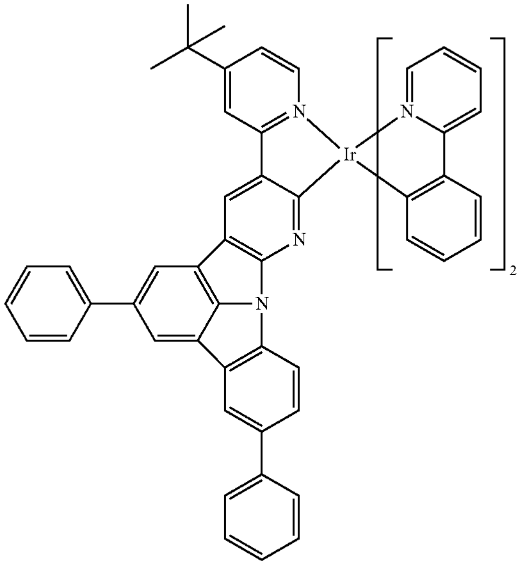
-continued
26
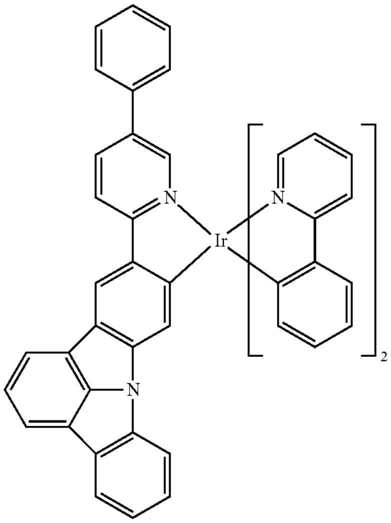
27
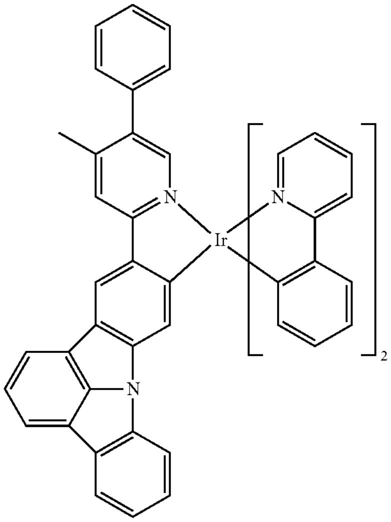
28
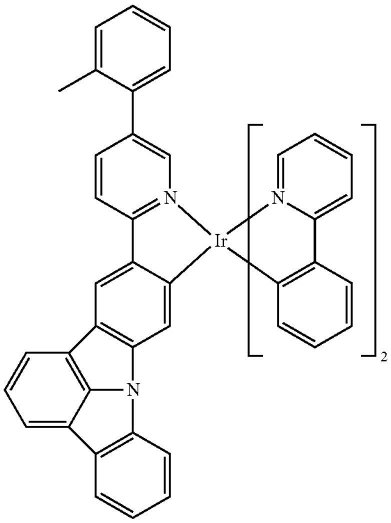

29
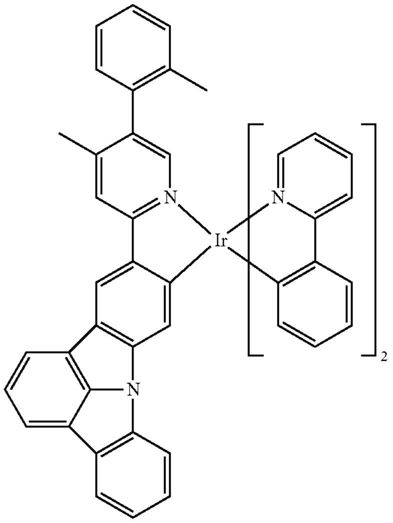
30
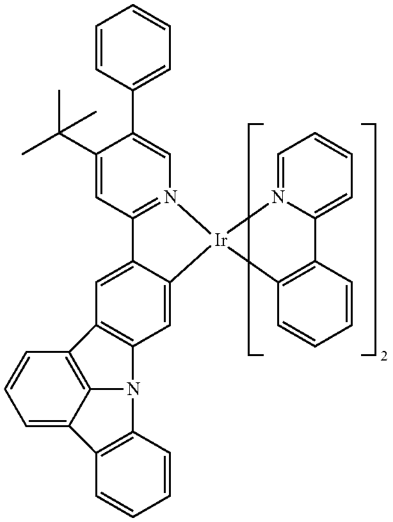
31
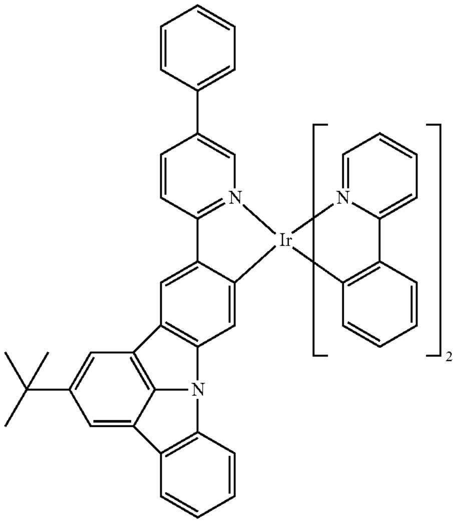
32
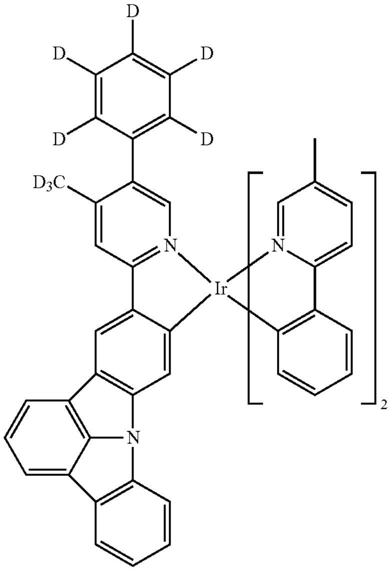
33
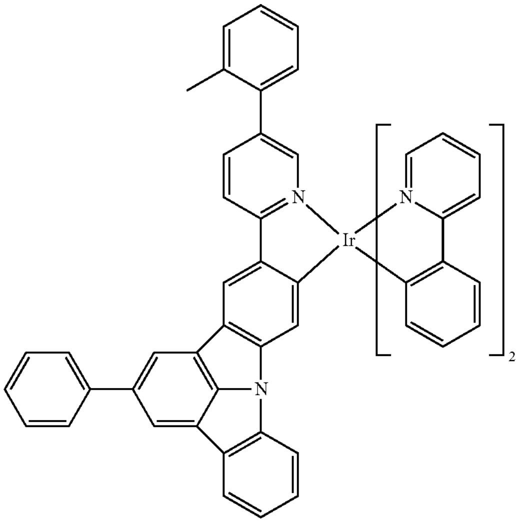
34
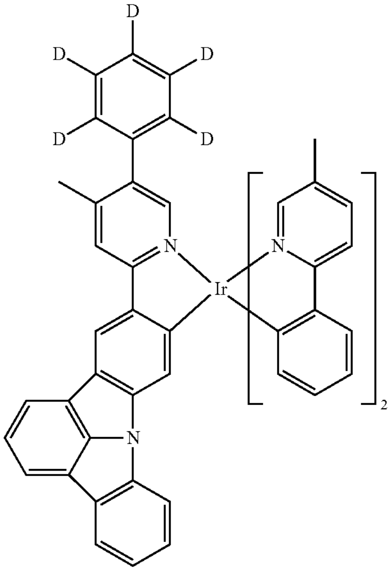

-continued
35
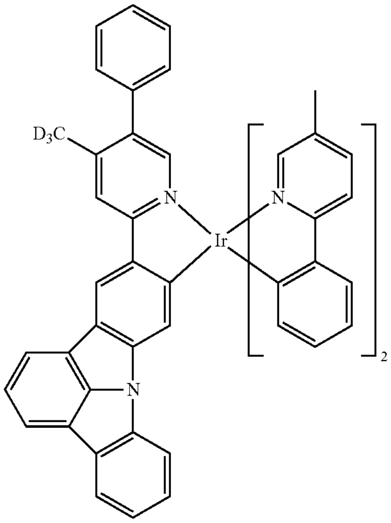
36
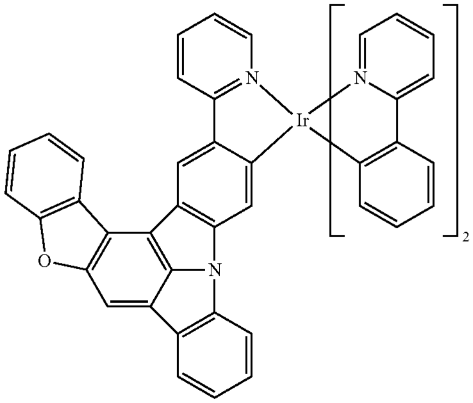
37
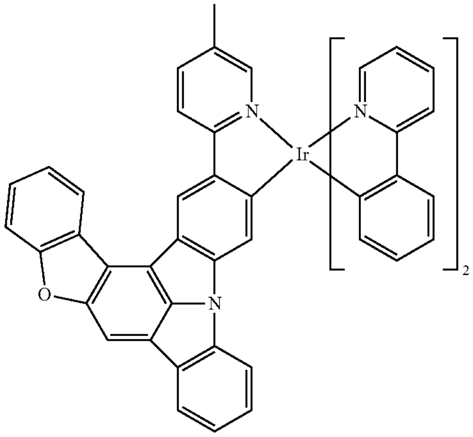
-continued
38
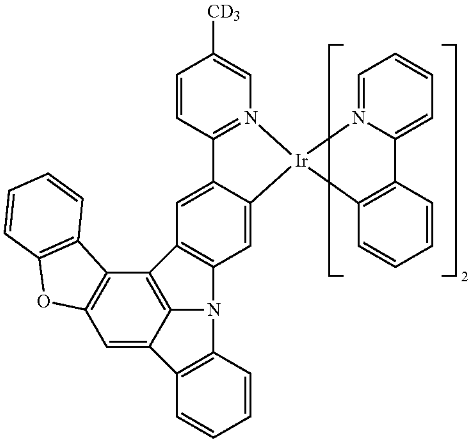
39
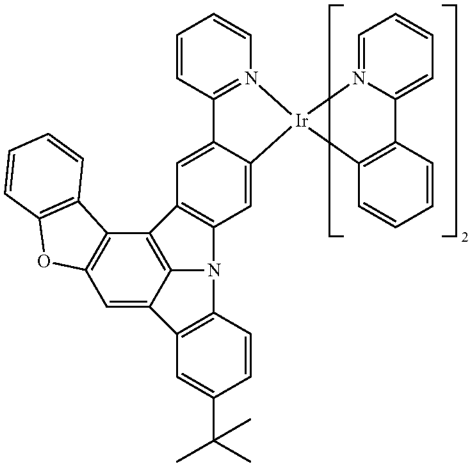
40
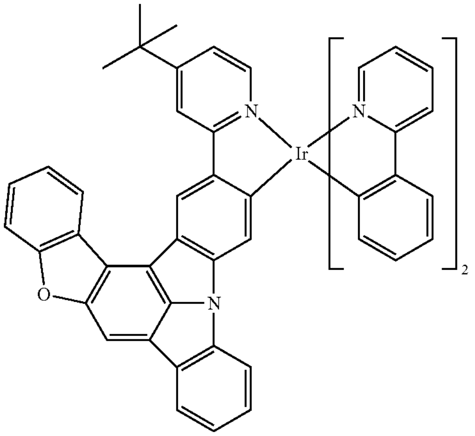

-continued
41
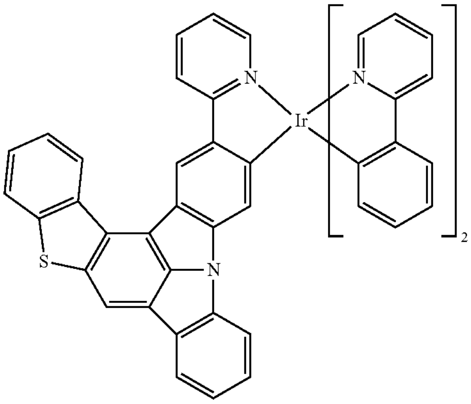
42
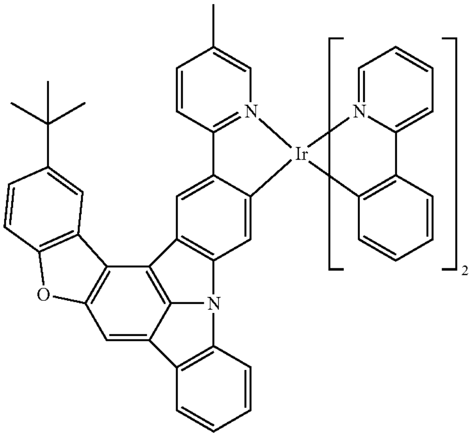
43
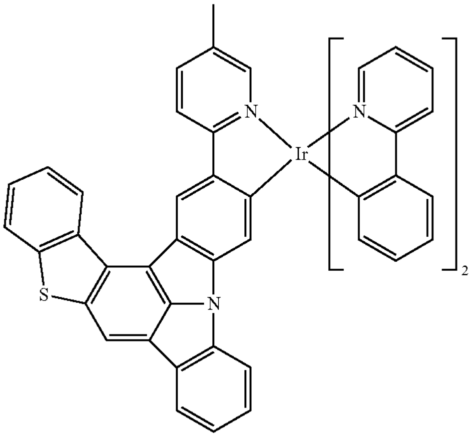
-continued
44
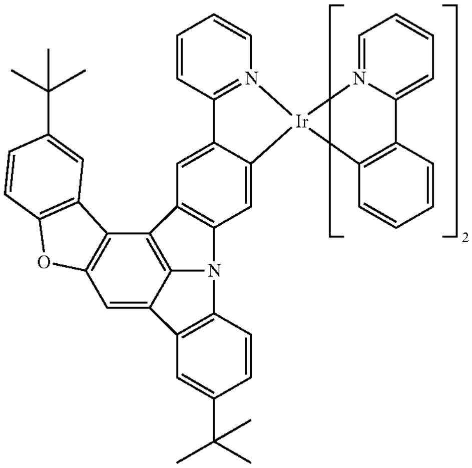
45
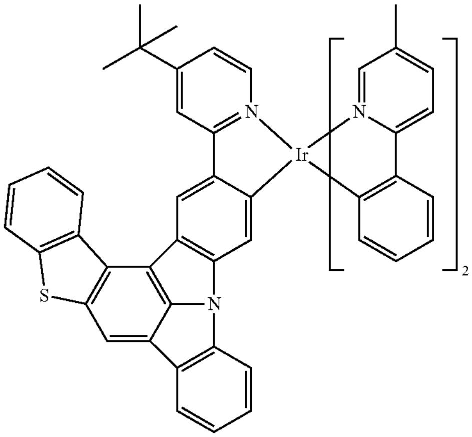
46
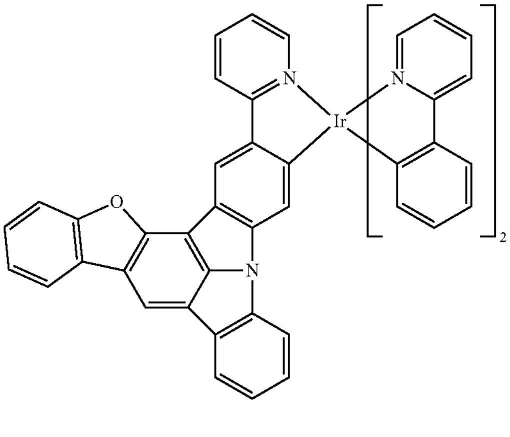

-continued
47
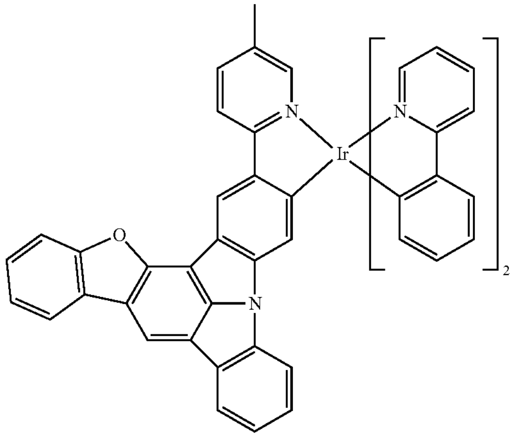
48
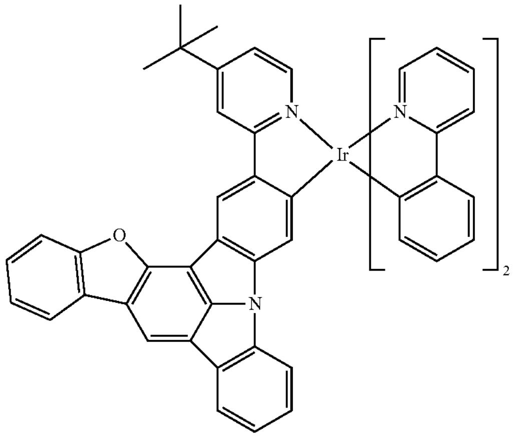
49
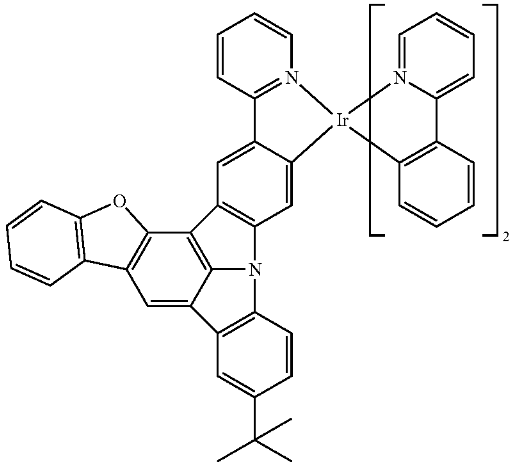
-continued
50
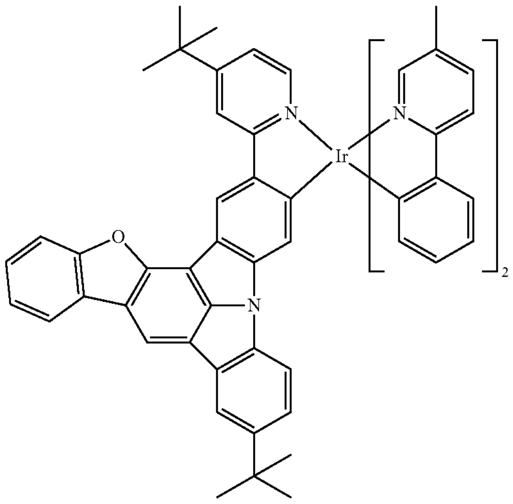
51
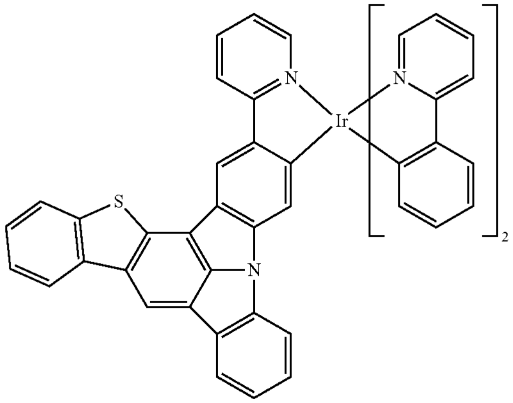
52
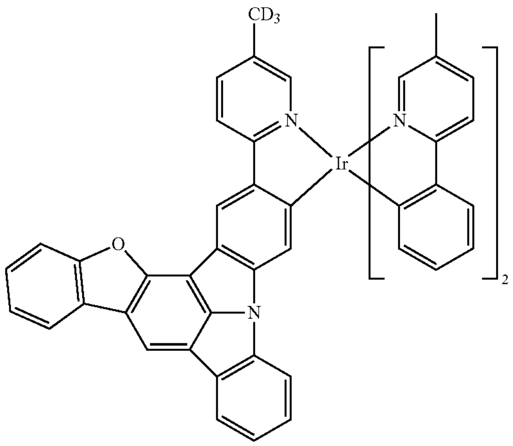

-continued
53
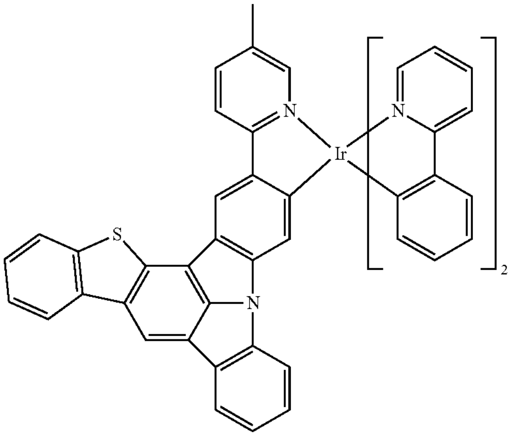
54
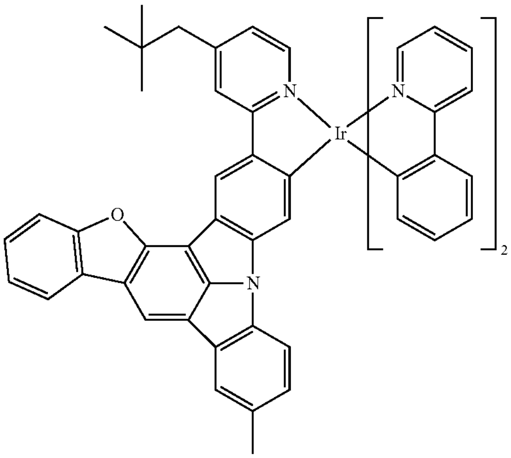
55
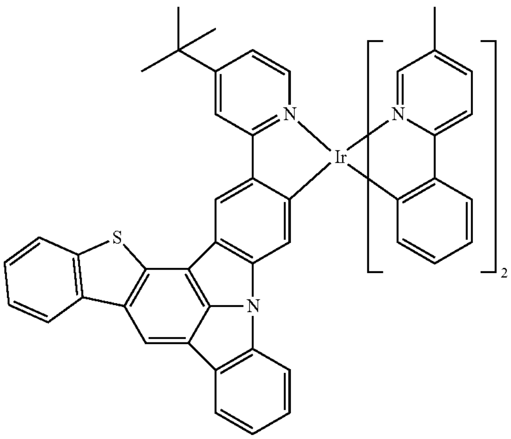
-continued
56
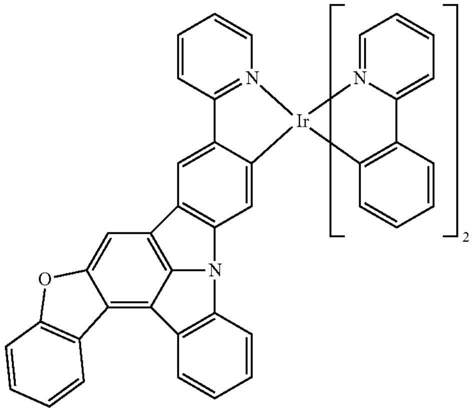
57
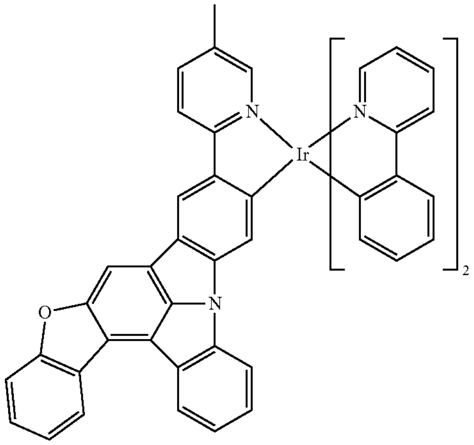
58
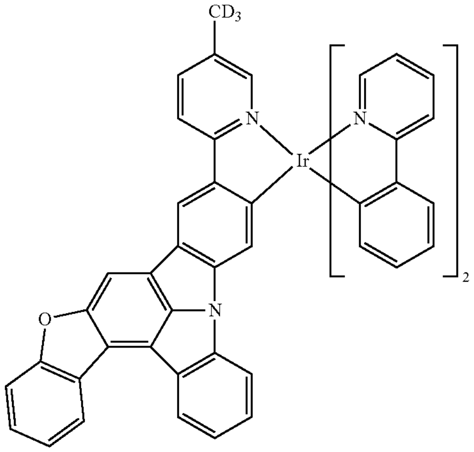

-continued
59
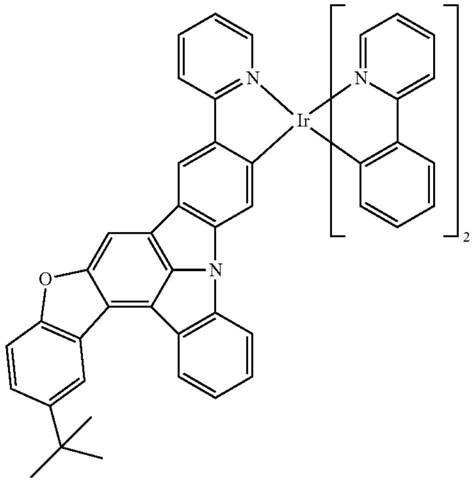
60
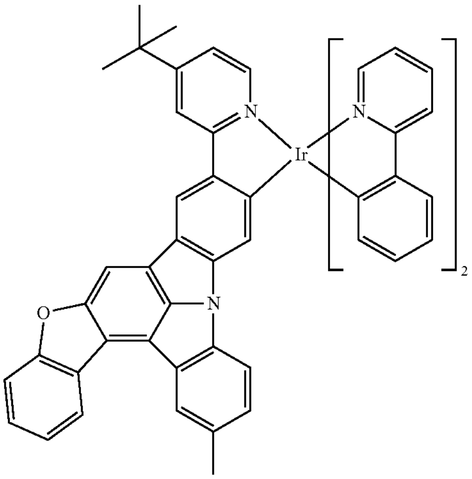
61
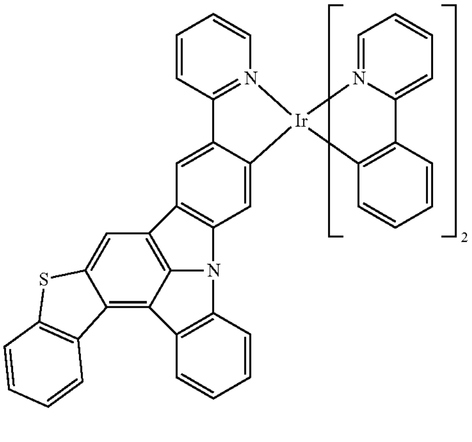
-continued
62
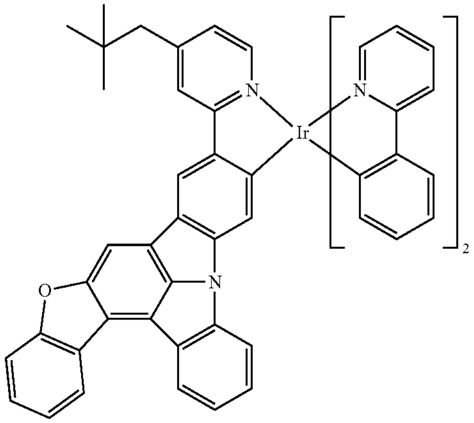
63
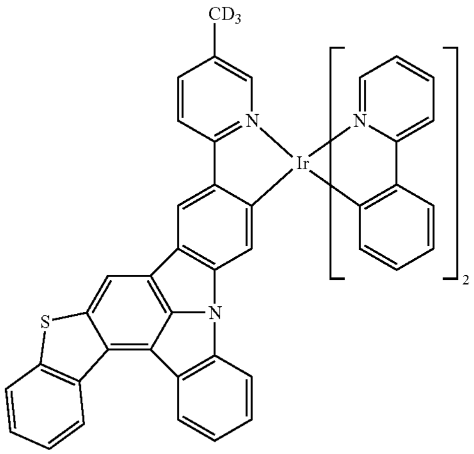
64
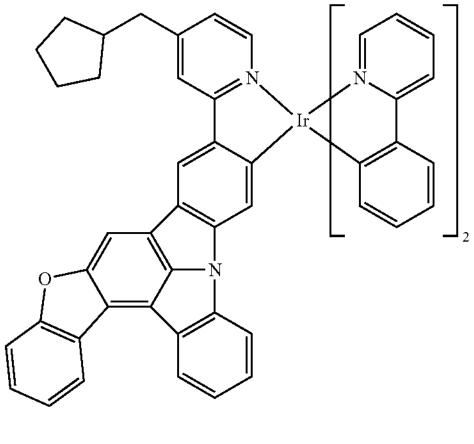

-continued
65
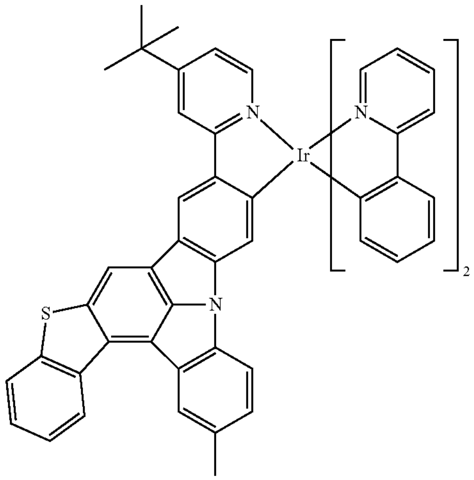
66
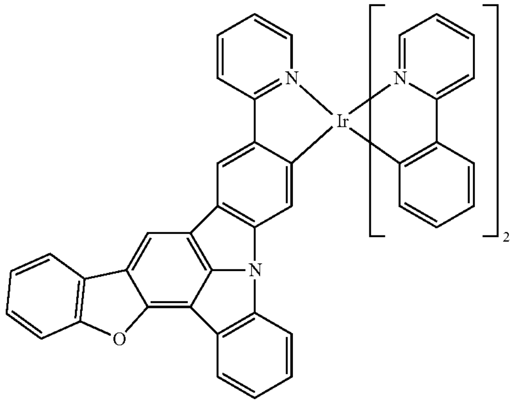
67
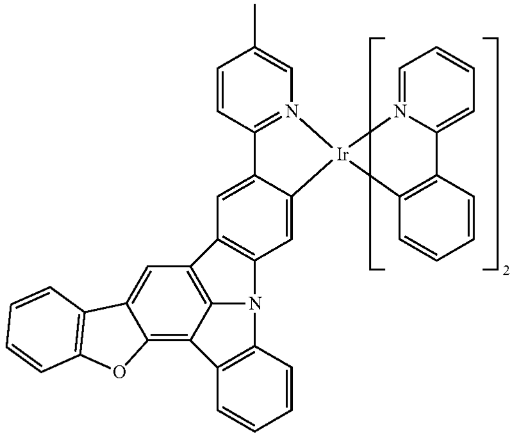
-continued
68
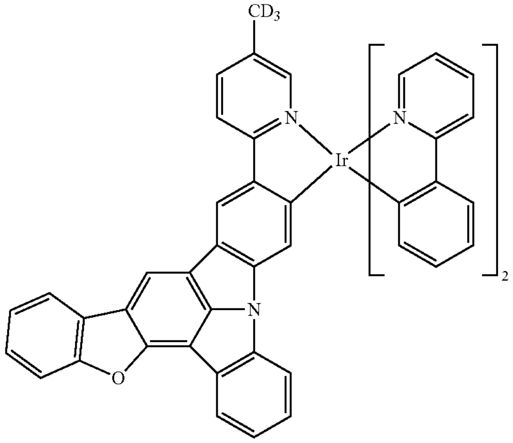
69
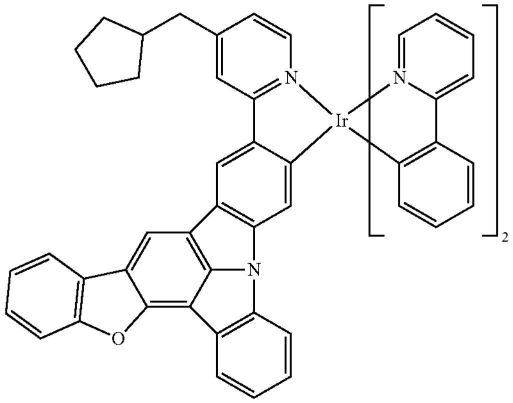
70
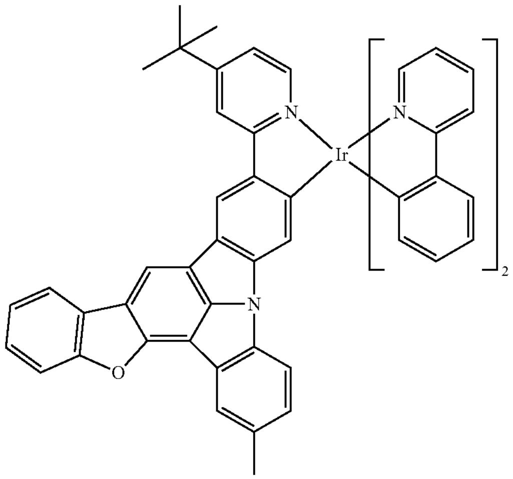

-continued
71
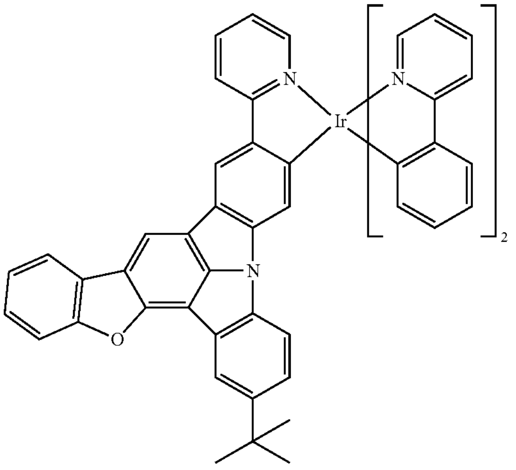
72
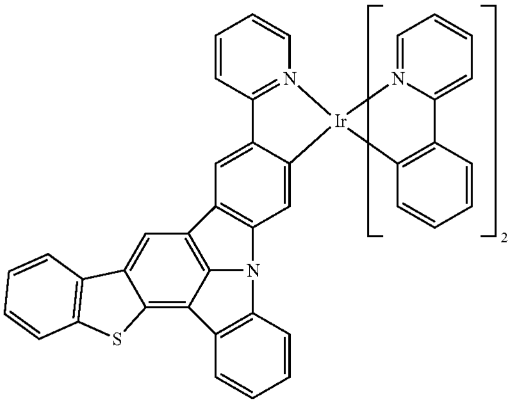
73
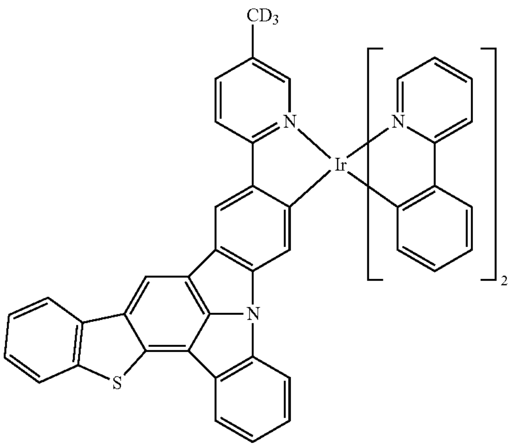
-continued
74
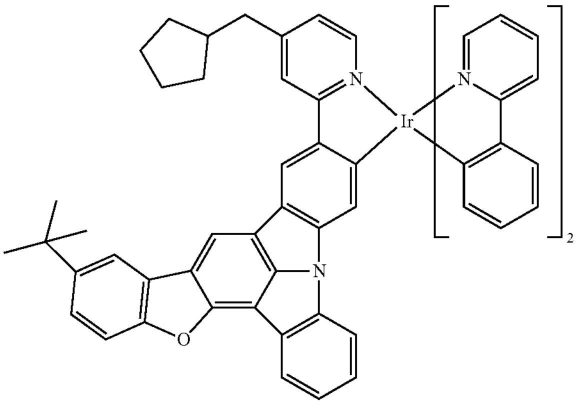
75
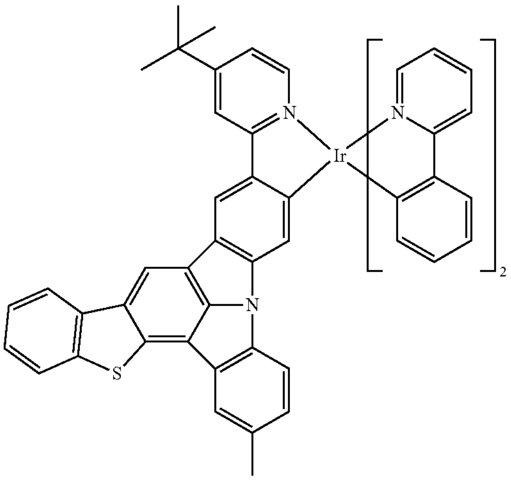
76
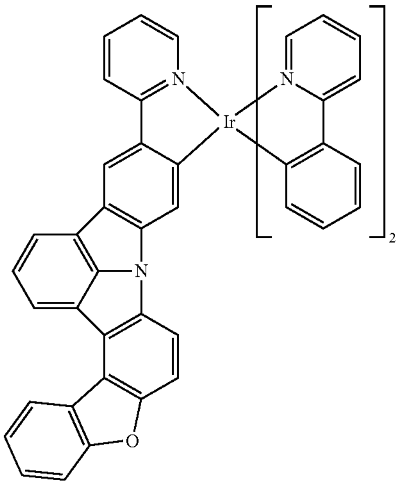

-continued
77
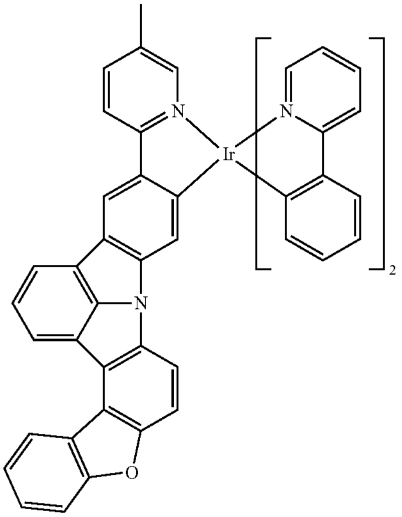
78
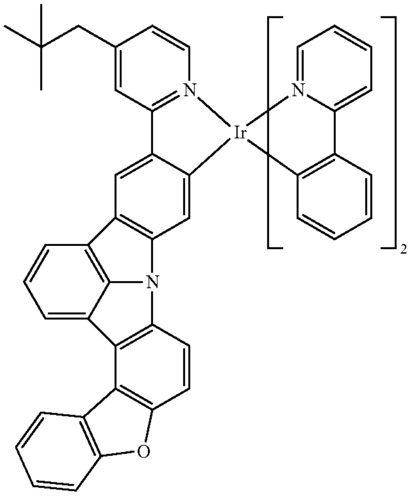
79
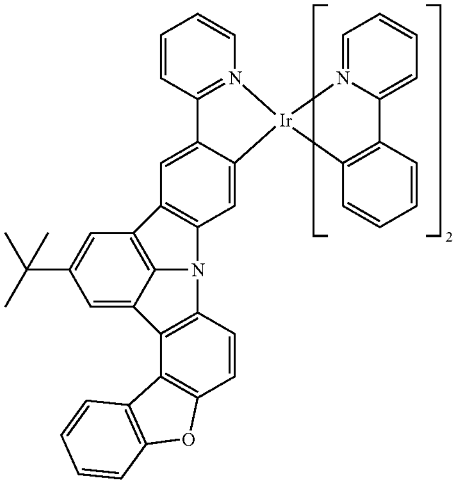
-continued
80
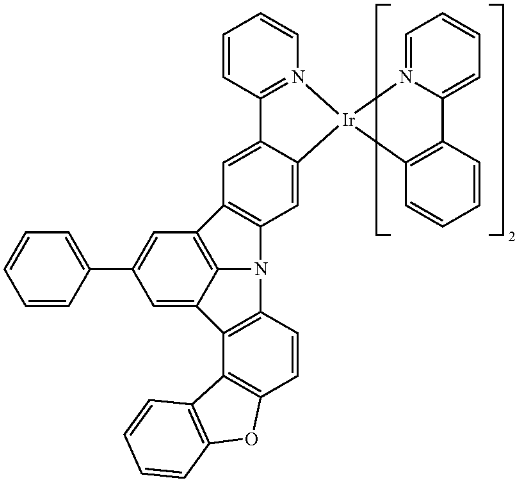
81
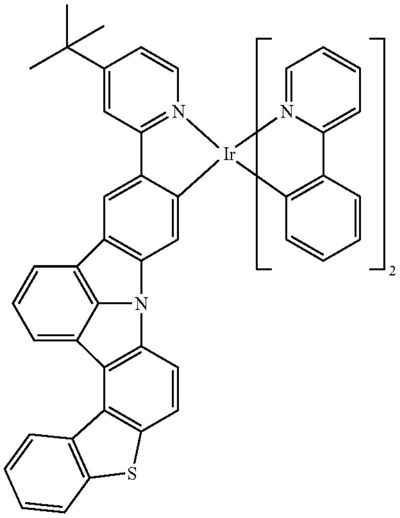
82
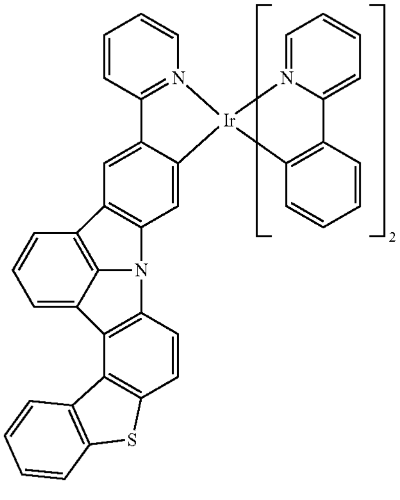

-continued
83
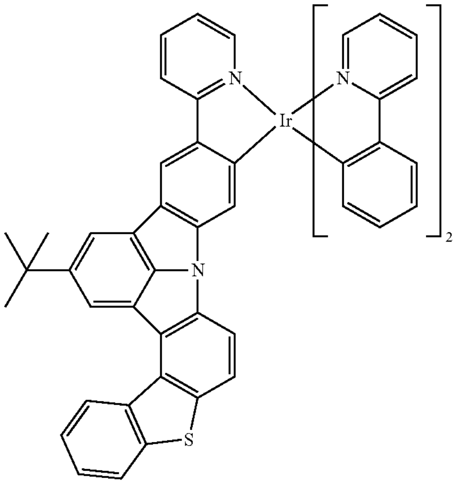
84
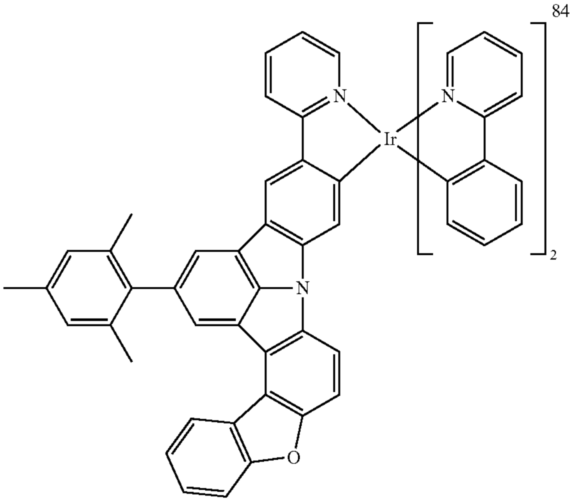
85
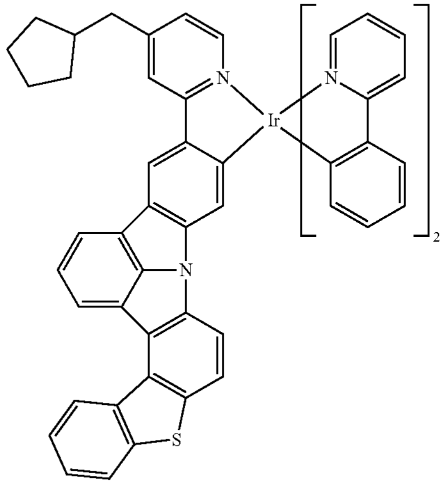
-continued
86
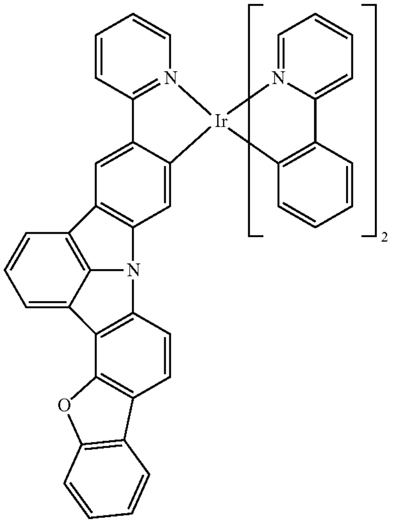
87
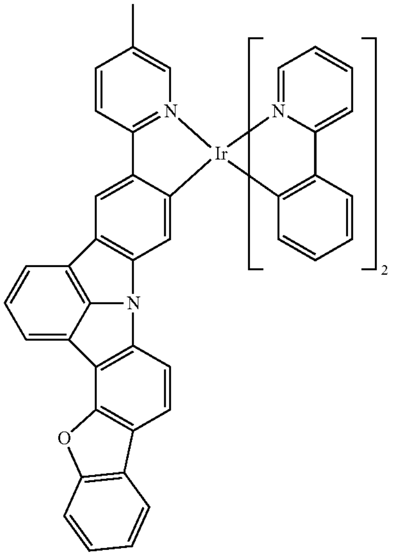
88
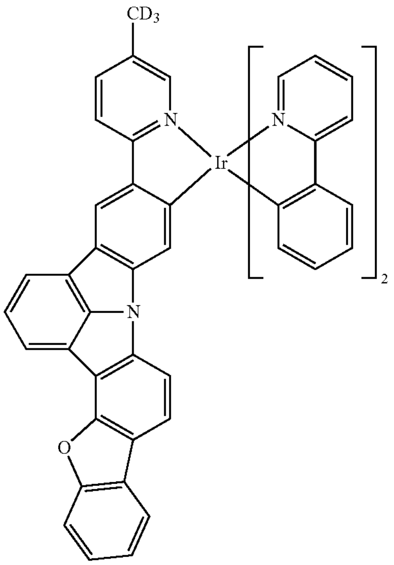

-continued
89
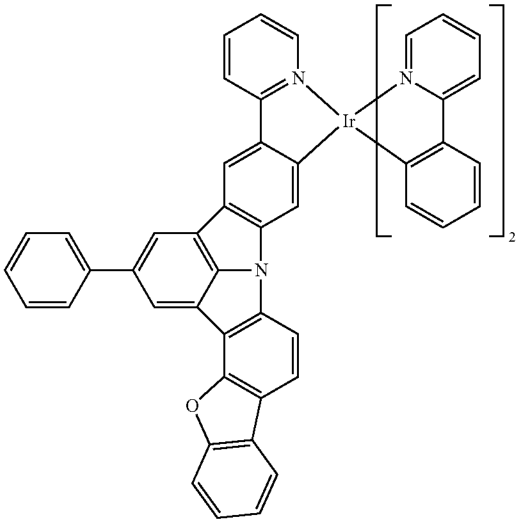
90
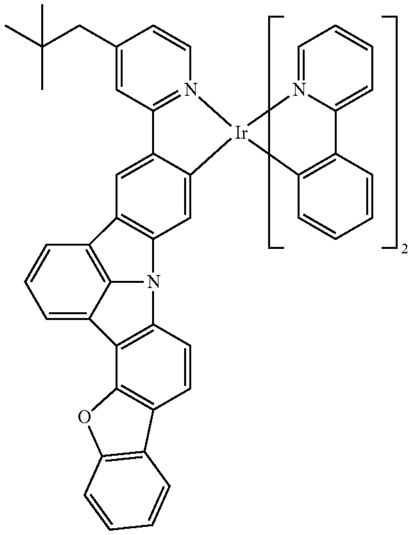
91
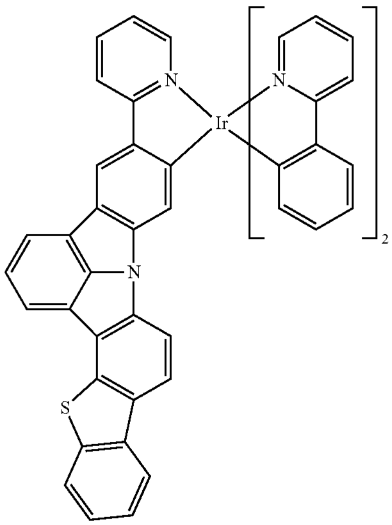
-continued
92
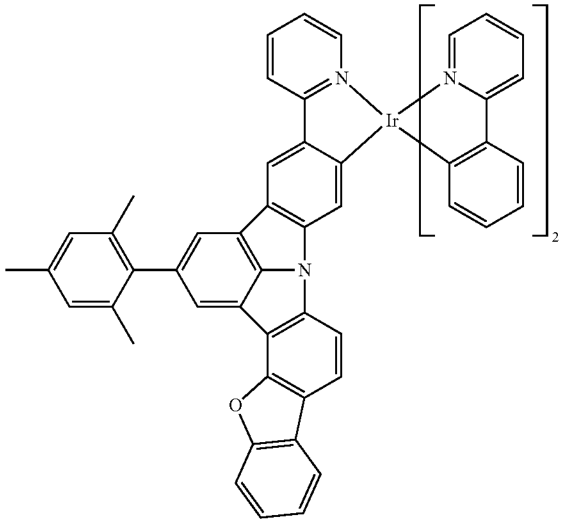
93
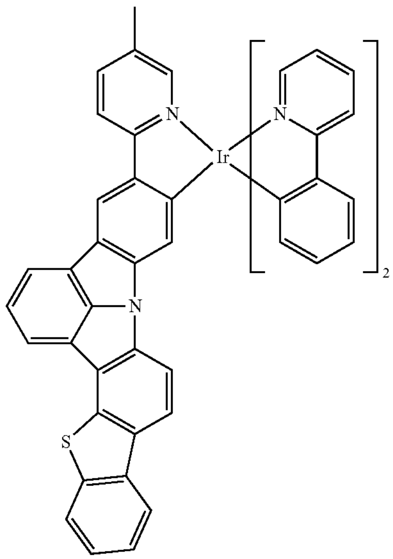
94
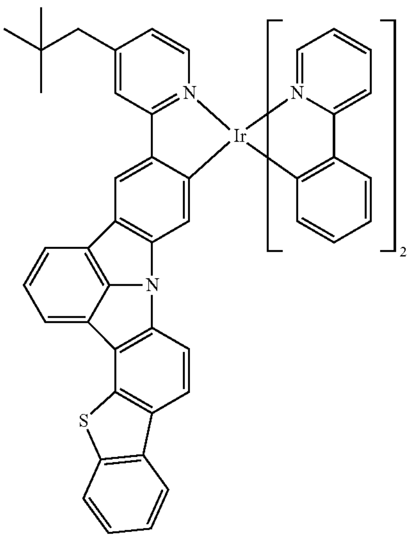

-continued
95
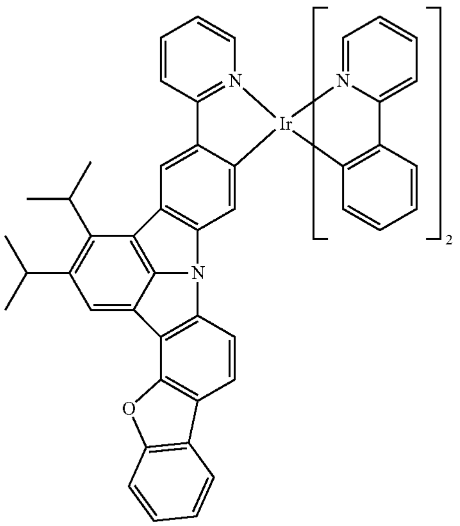
96
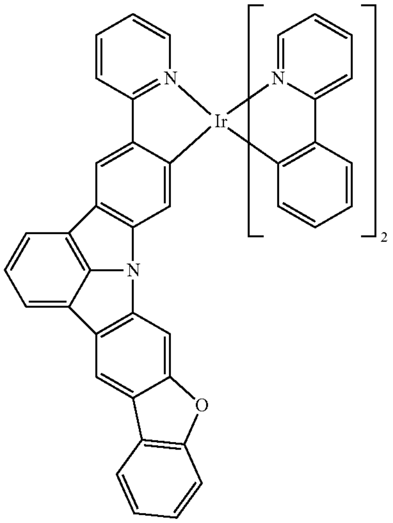
97
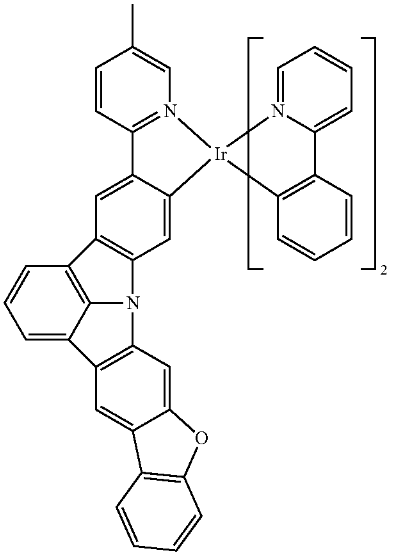
-continued
98
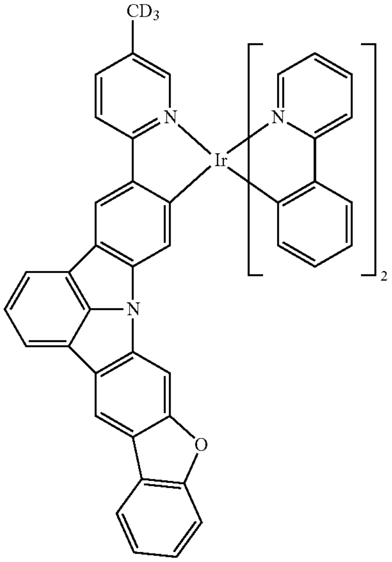
99
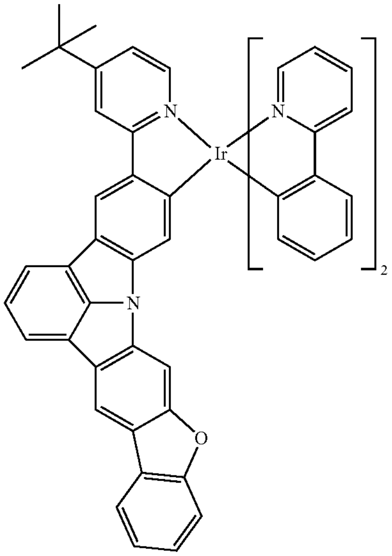

-continued
100
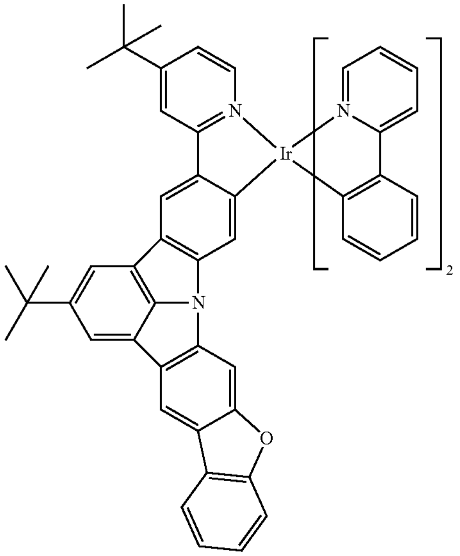
102
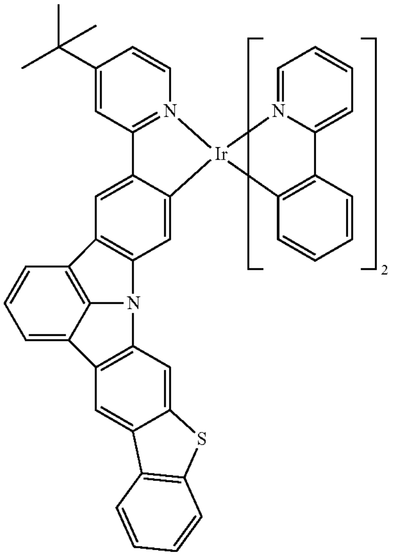
101
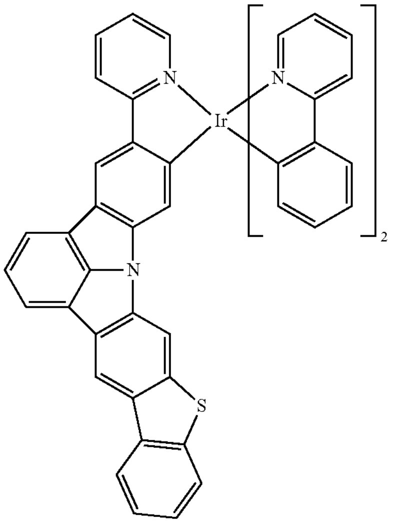
103
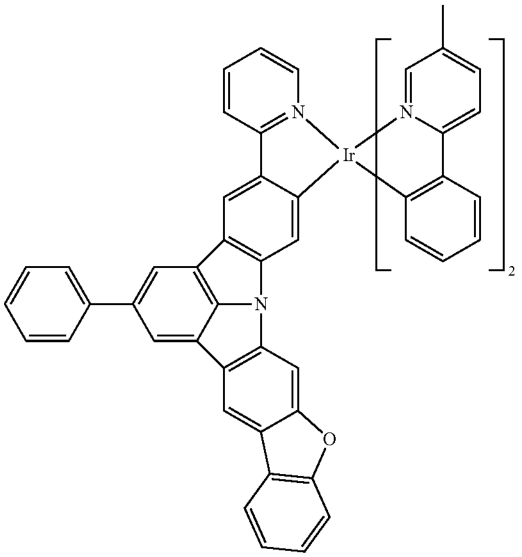

-continued
104
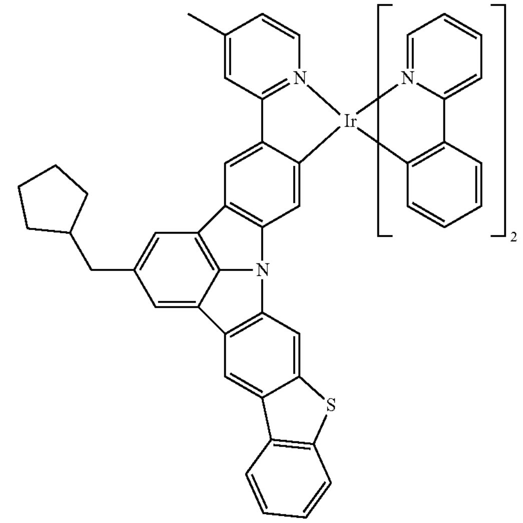
105
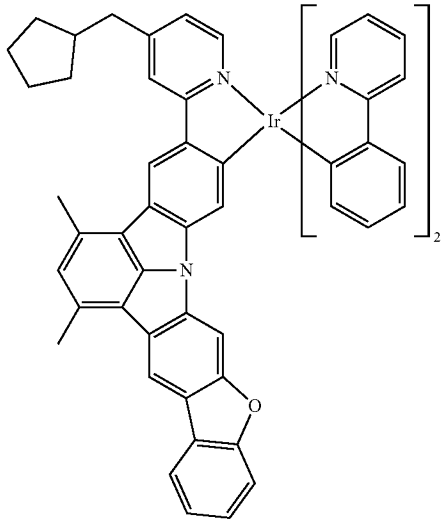
106
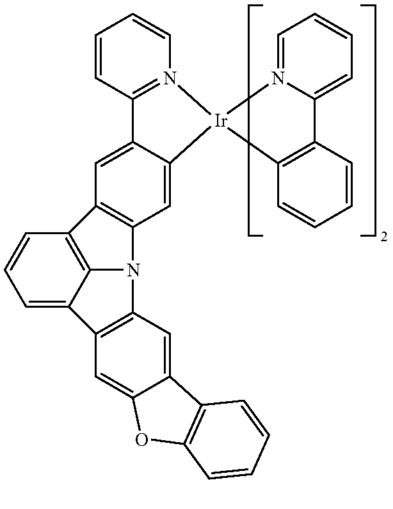
-continued
107
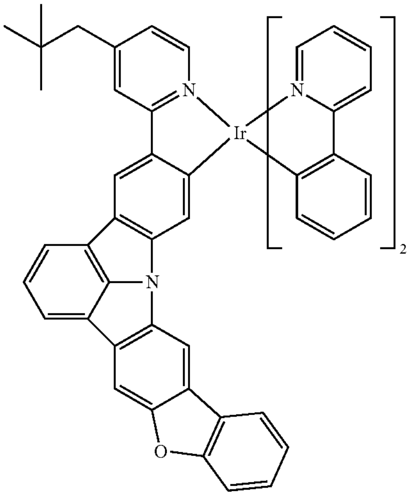
108
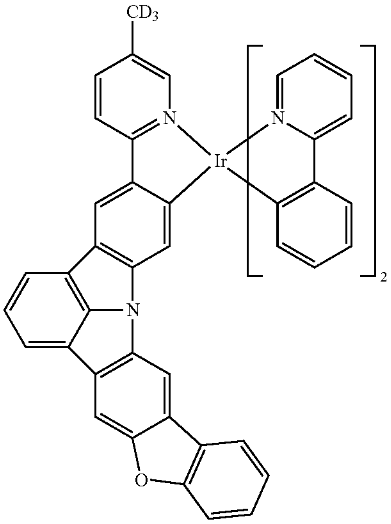
109
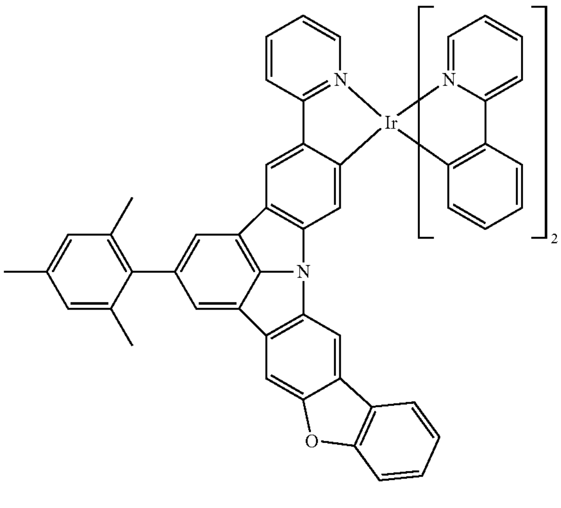

-continued
110
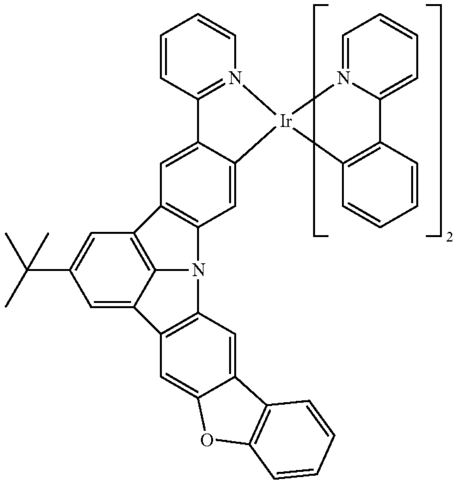
111
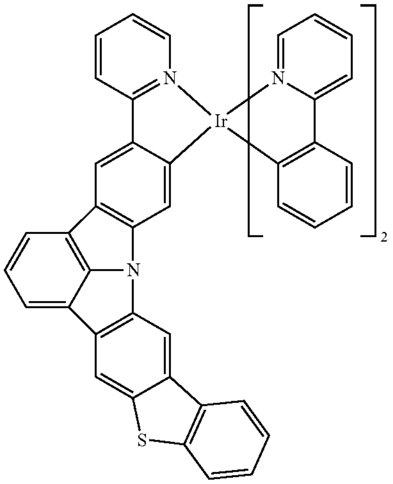
112
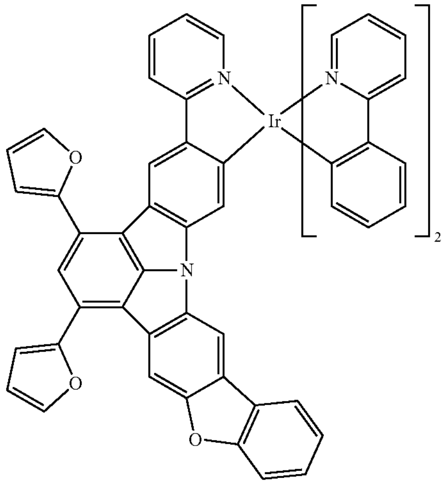
-continued
113
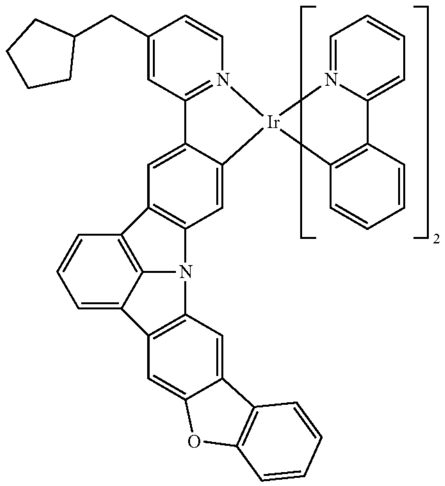
114
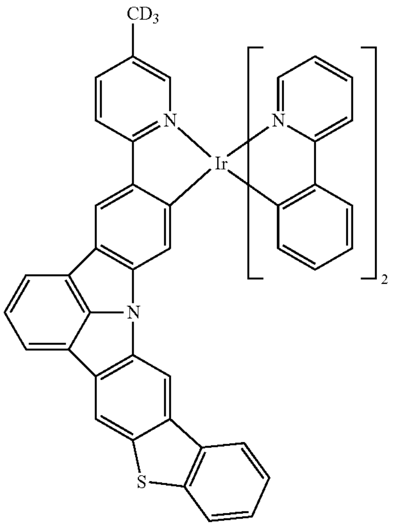
115
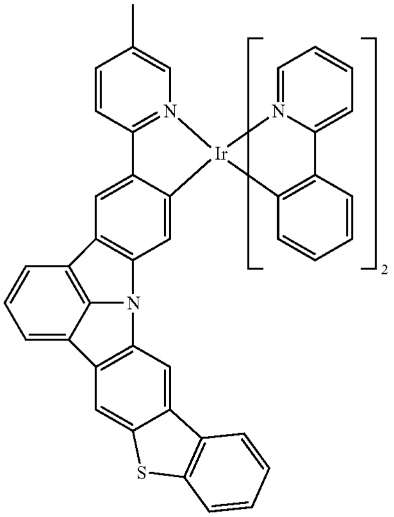

-continued
116
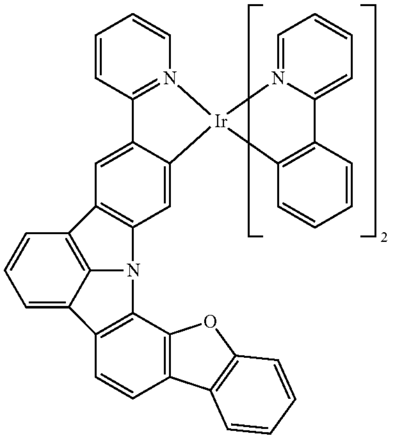
117
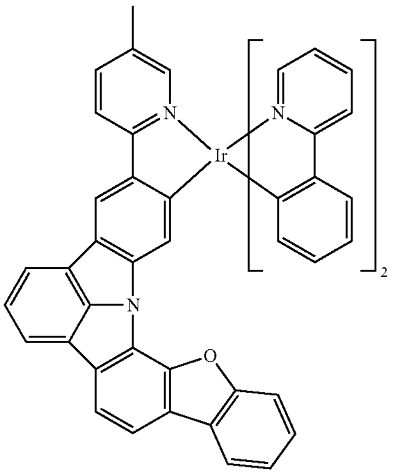
118
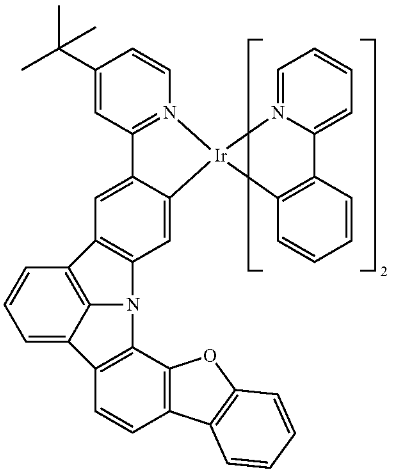
-continued
119
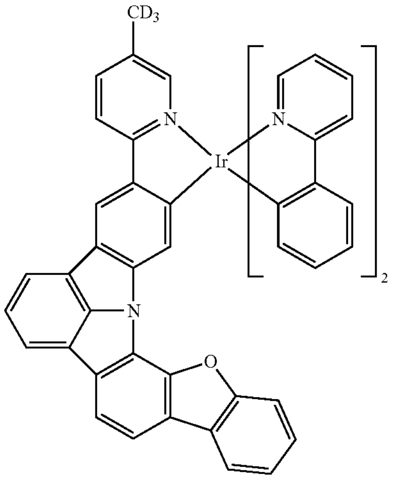
120
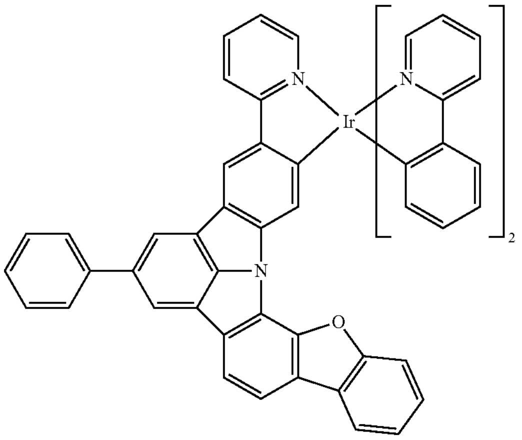
121
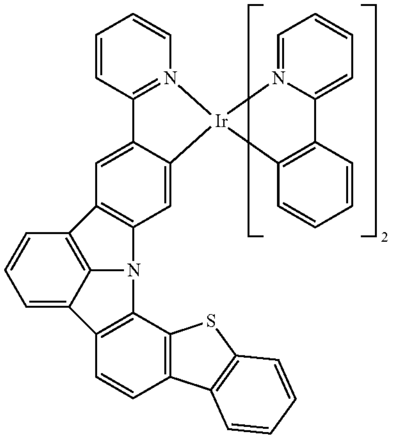

-continued
122
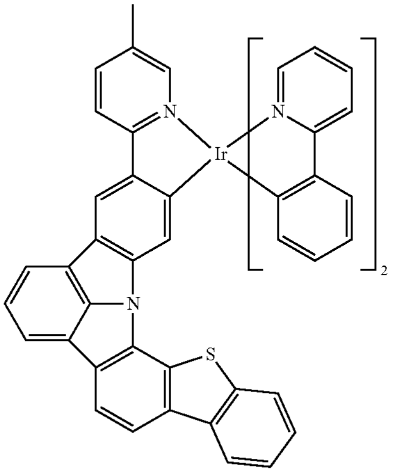
123
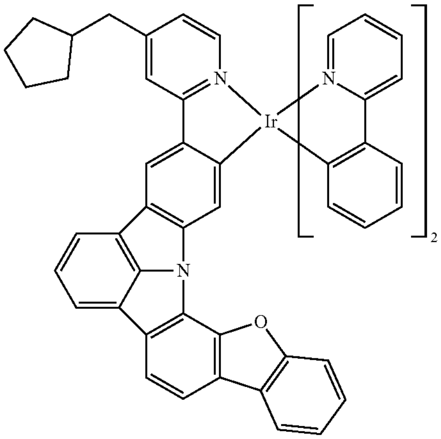
124
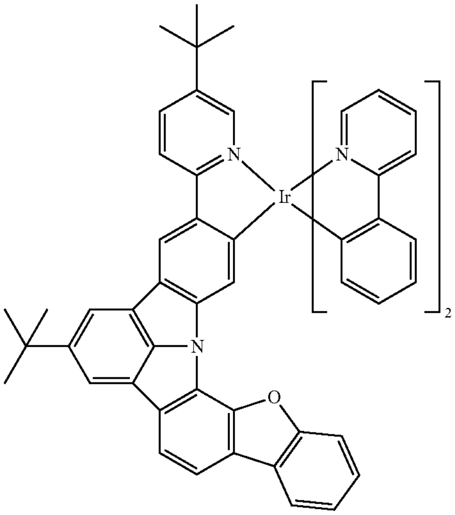
-continued
125
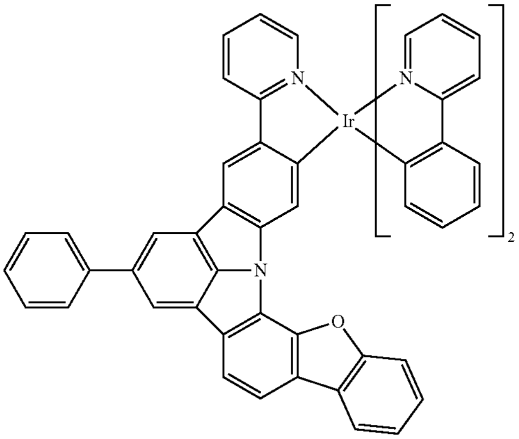
126
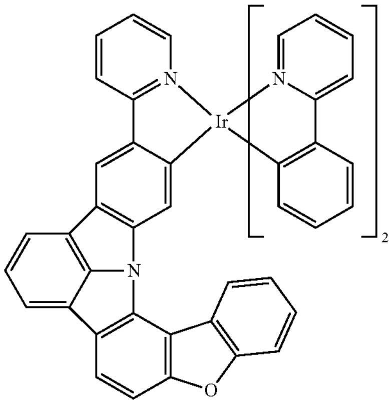
127
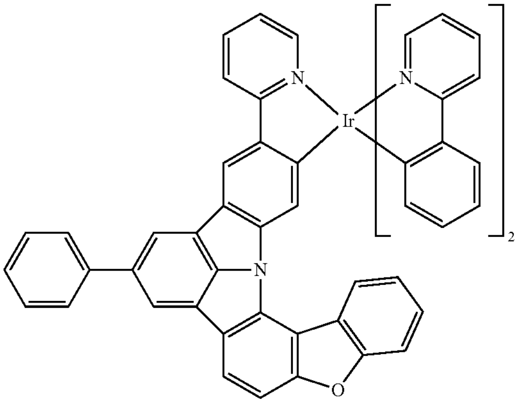

-continued
128
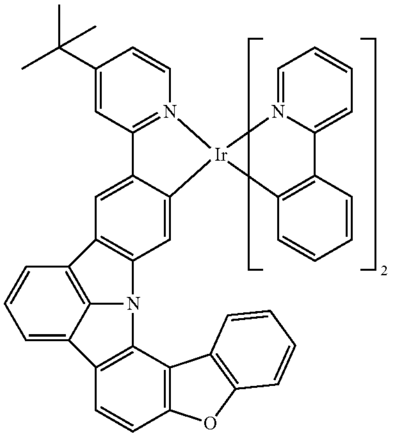
129
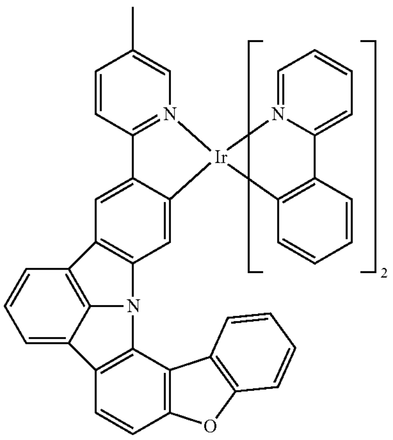
130
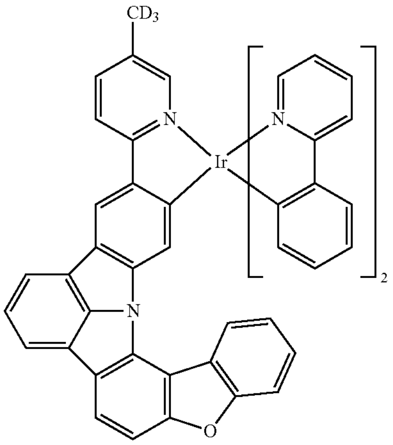
-continued
131
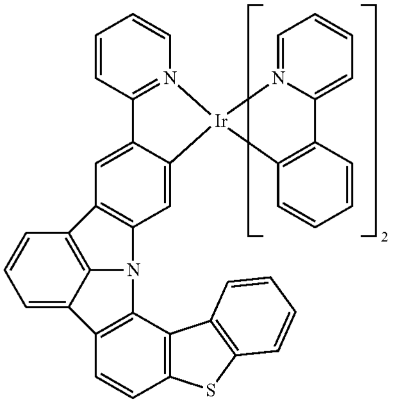
132
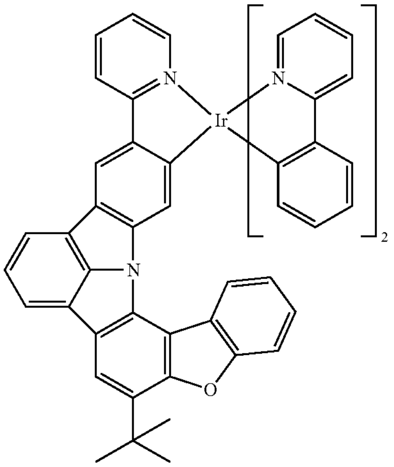
133
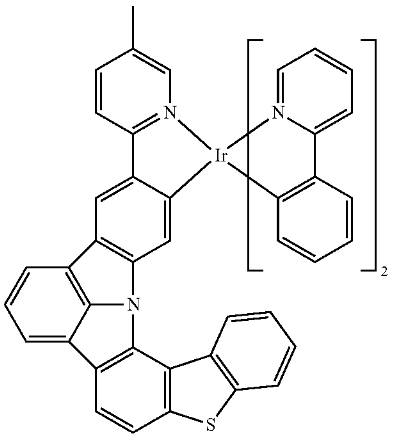

-continued
134
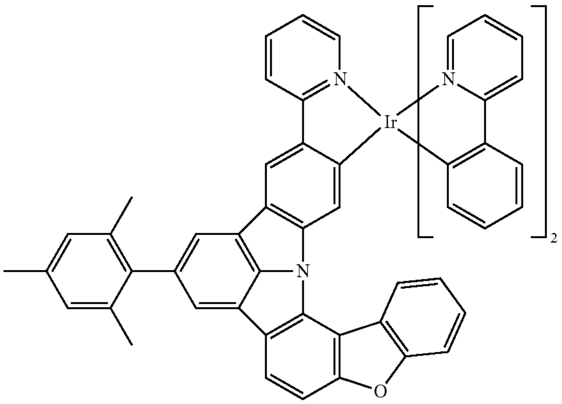
135
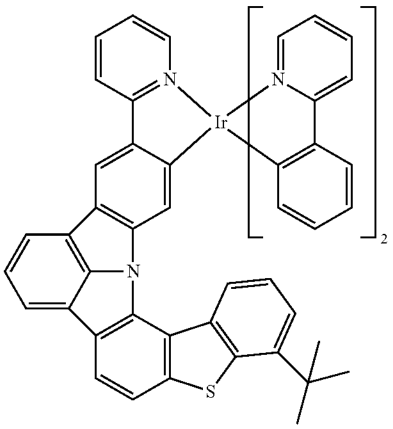
136
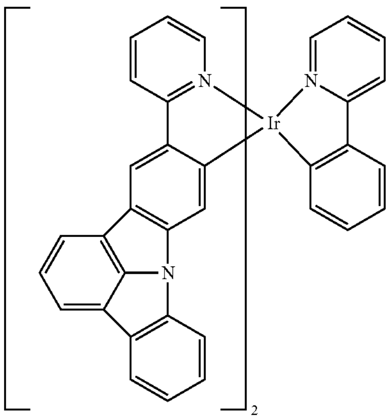
-continued
137
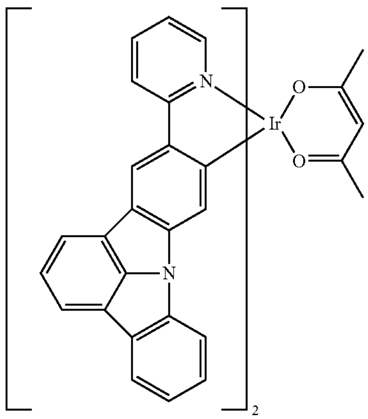
138
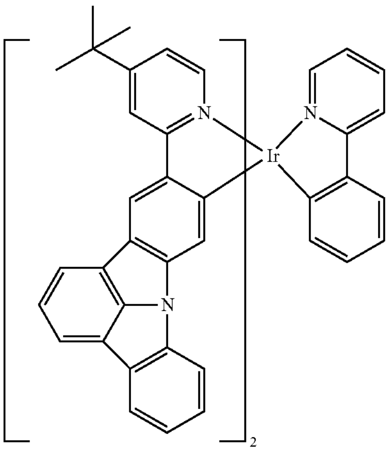
139
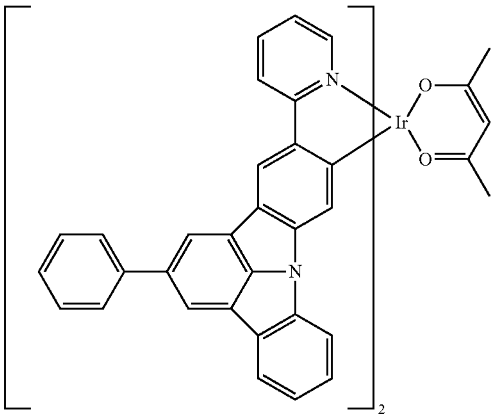

-continued
-continued
140
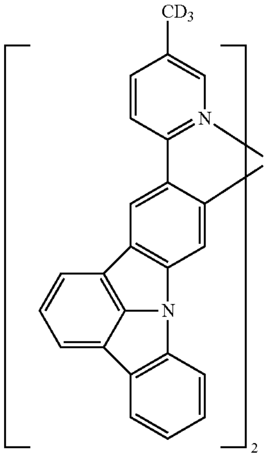
143
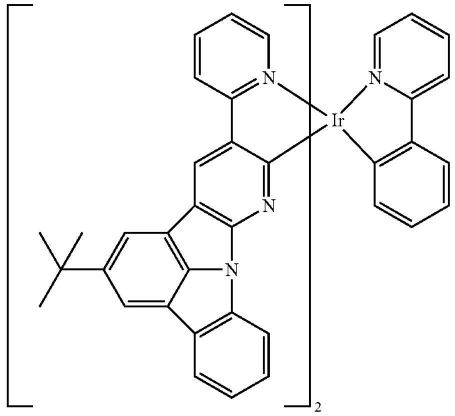
141
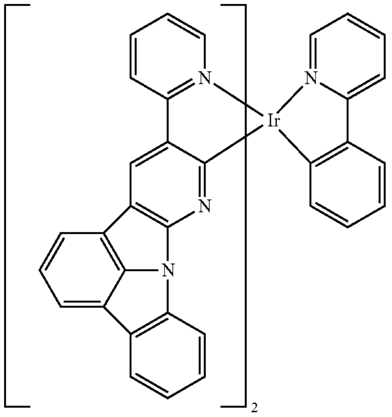
144
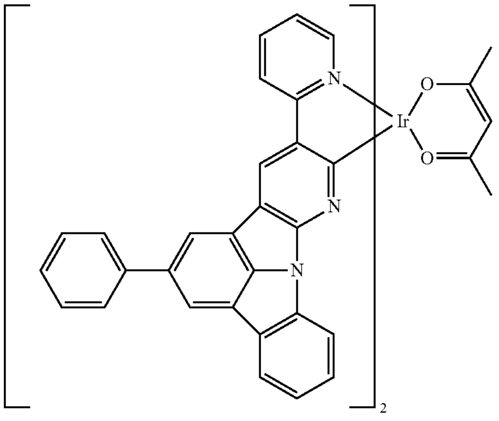
142
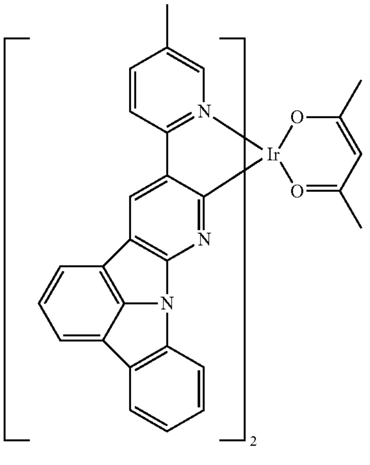
145
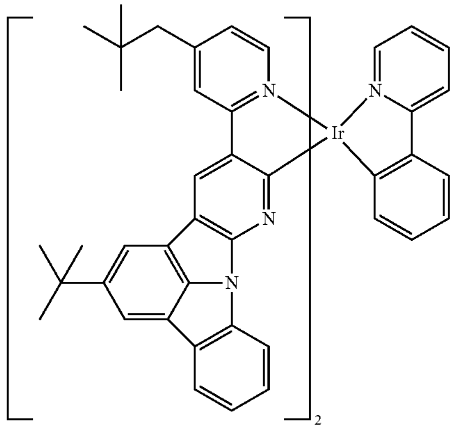

-continued
146
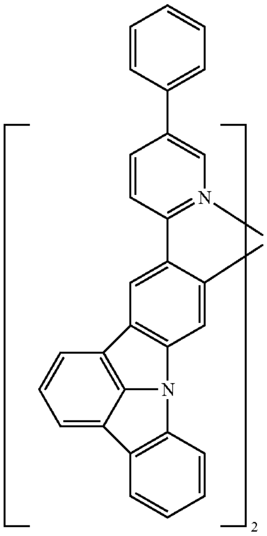
147
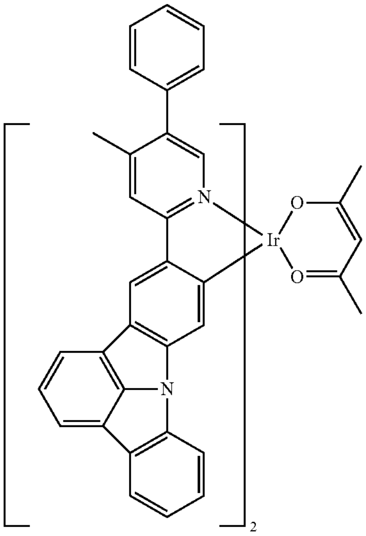
148
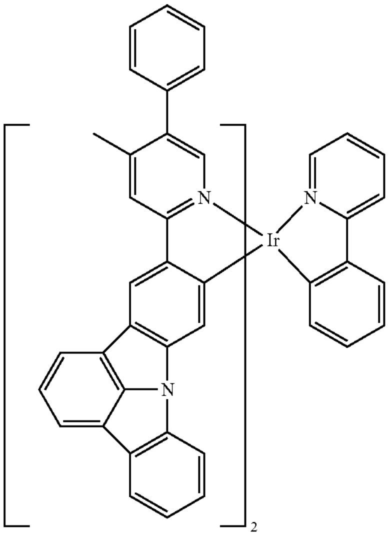
-continued
149
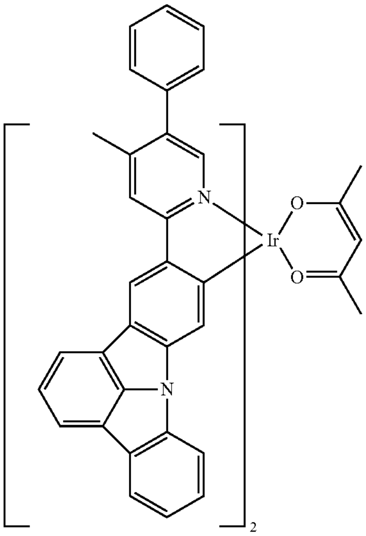
150
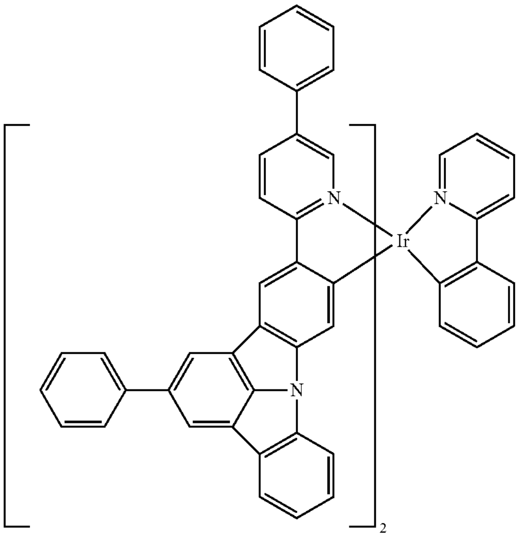
151
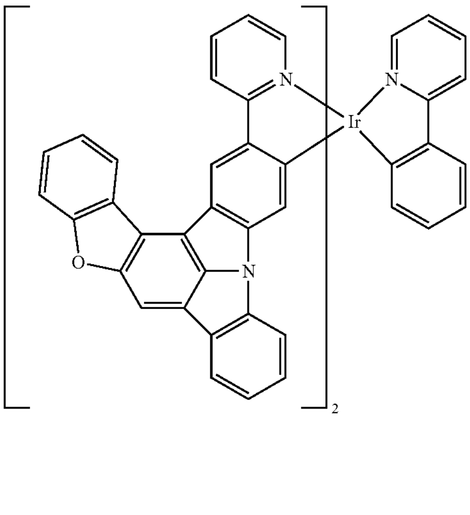

-continued
152
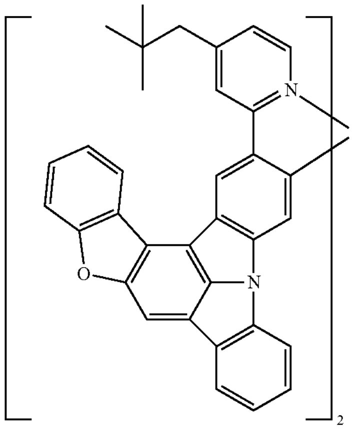
153
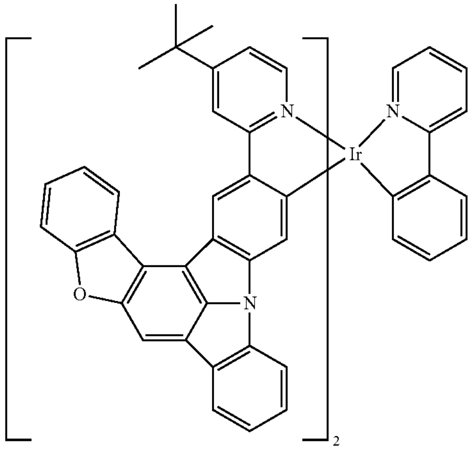
154
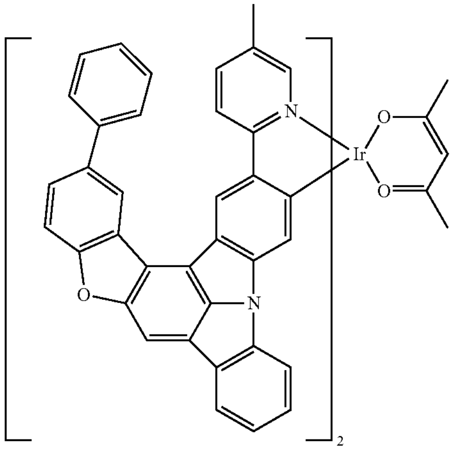
-continued
155
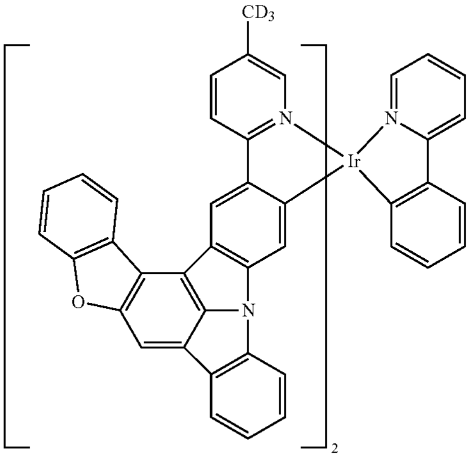
156
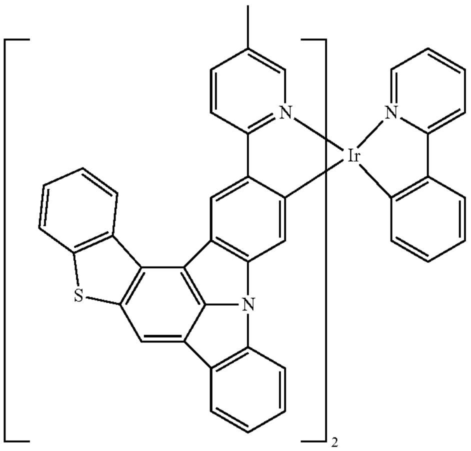
157
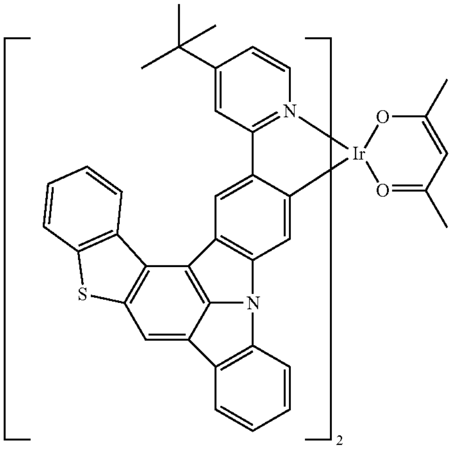

-continued
158
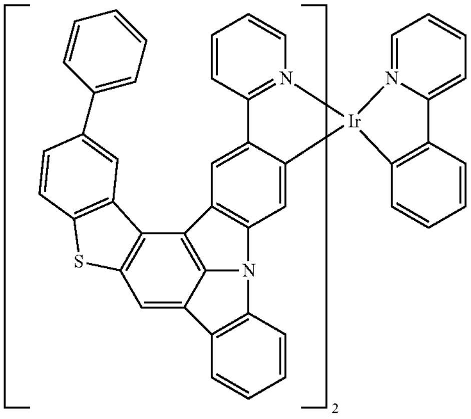
159
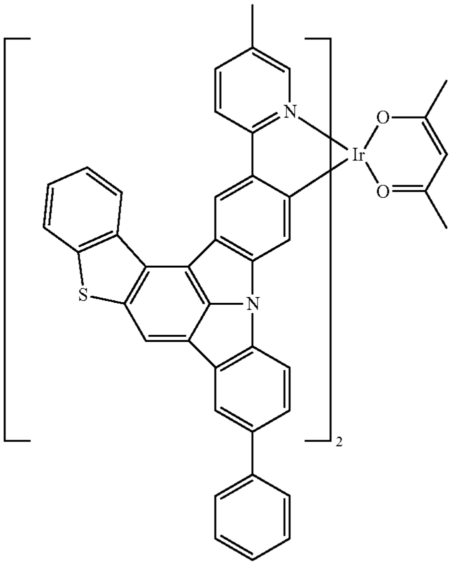
160
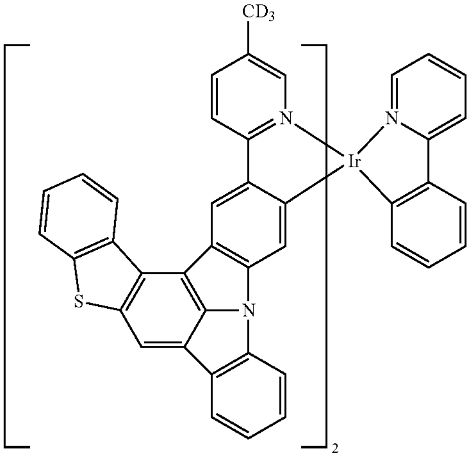
-continued
161
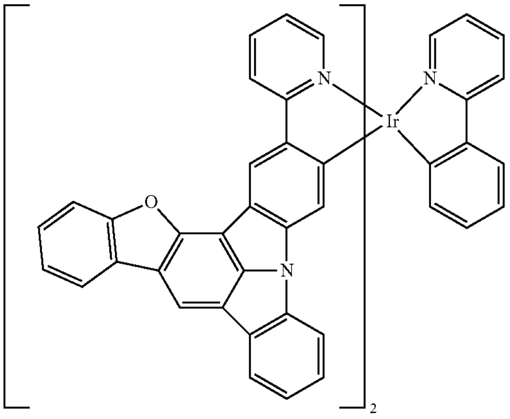
162
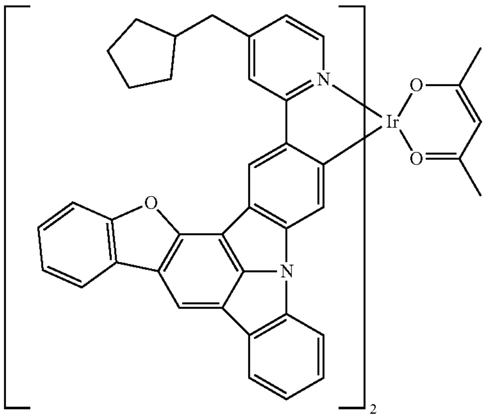
163
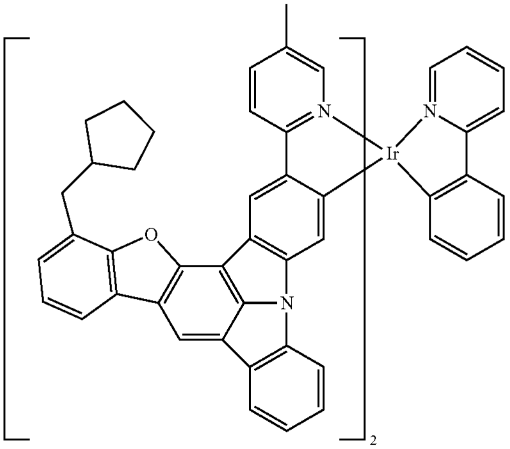

-continued
164
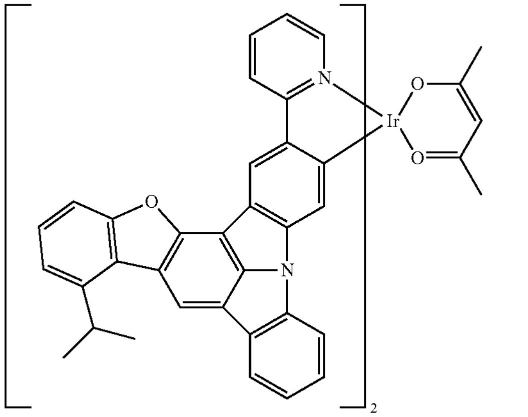
165
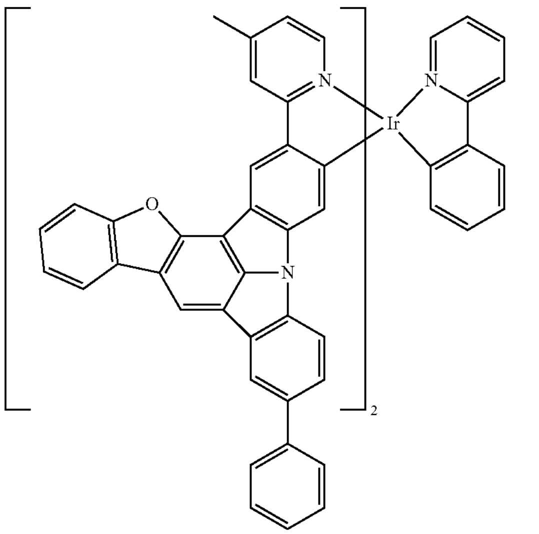
166
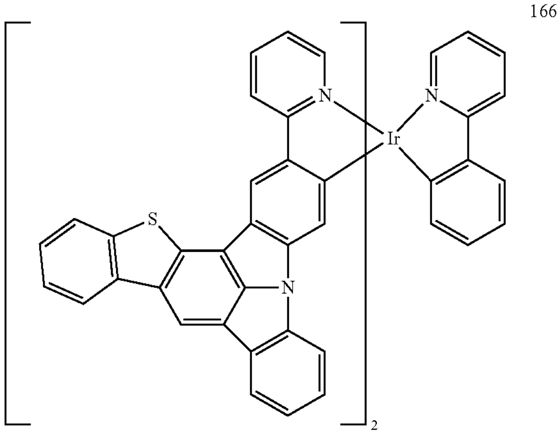
-continued
167
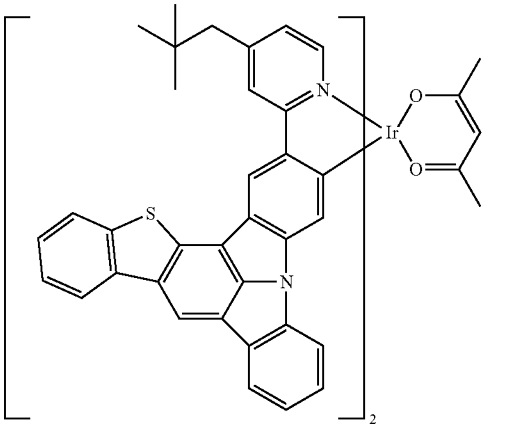
168
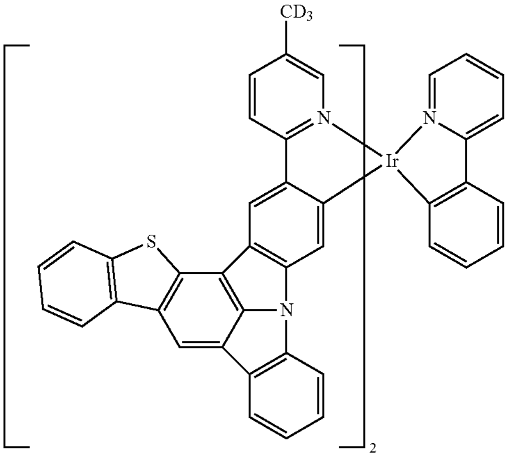
169
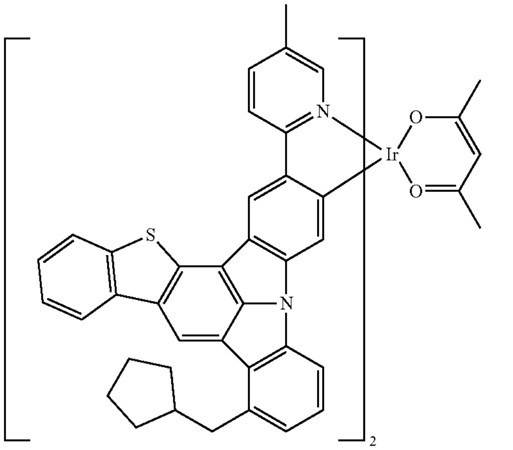

-continued
170
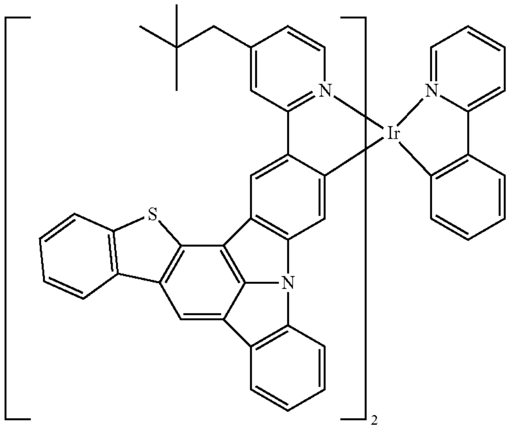
171
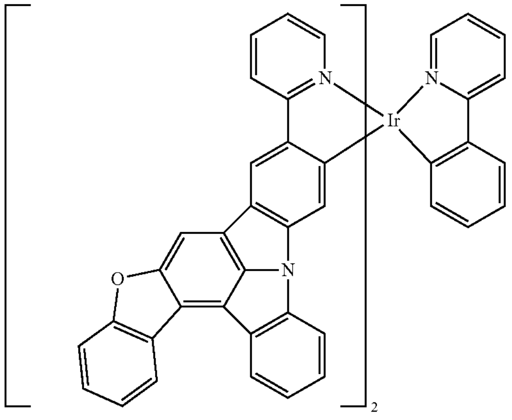
172
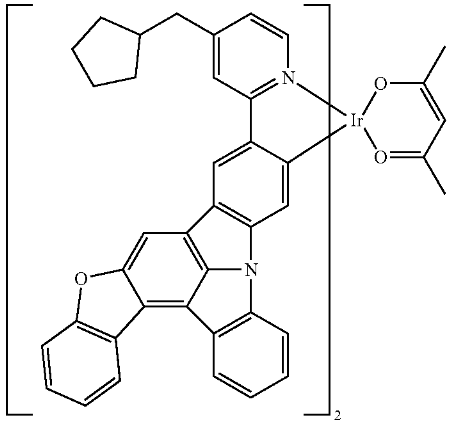
-continued
173
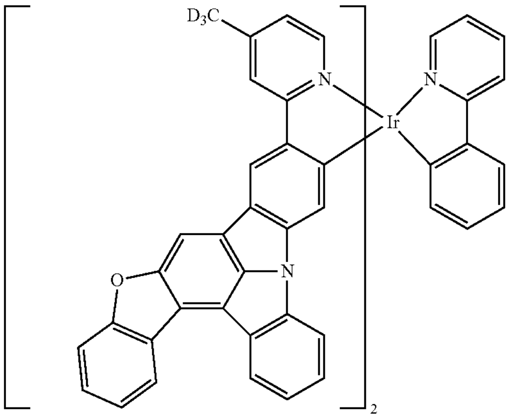
174
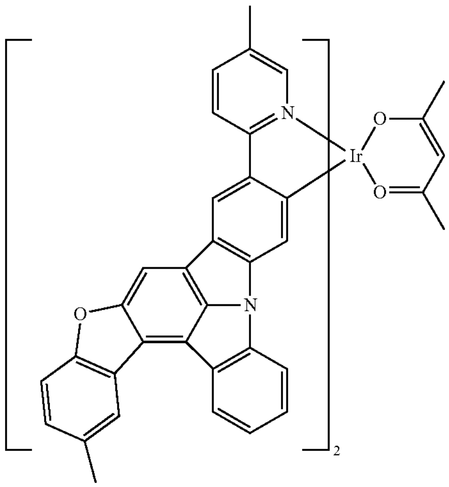
175
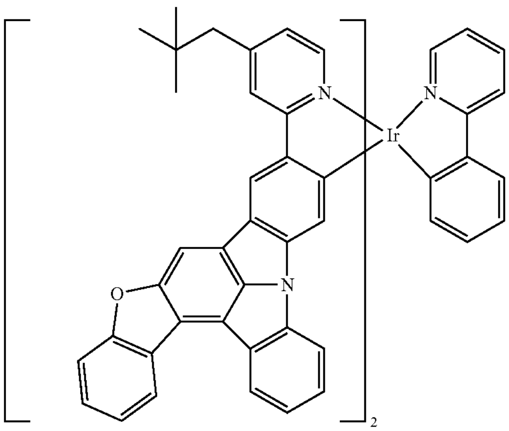

-continued
176
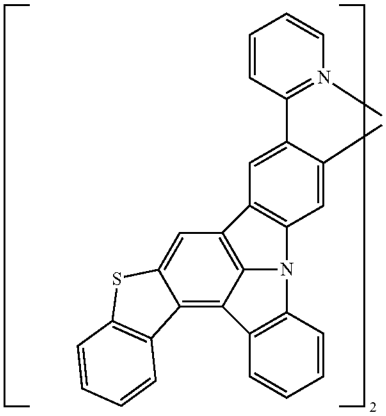
177
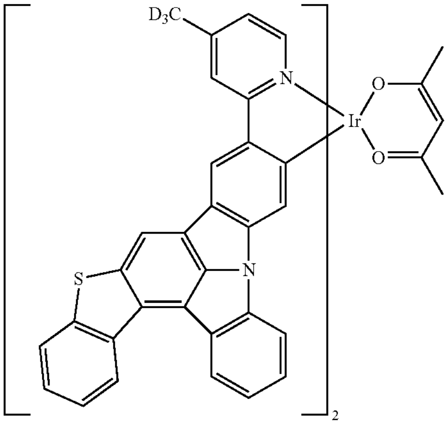
178
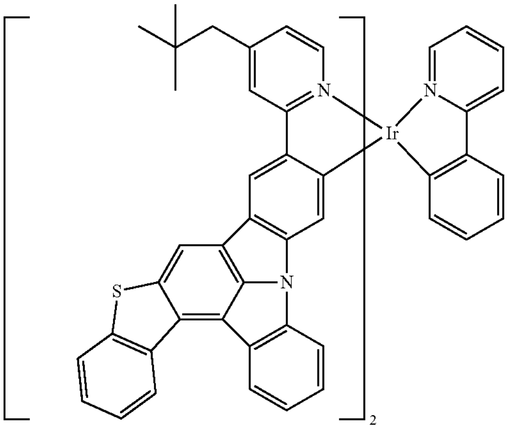
-continued
179
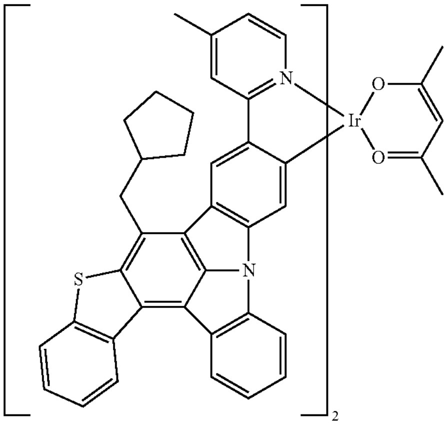
180
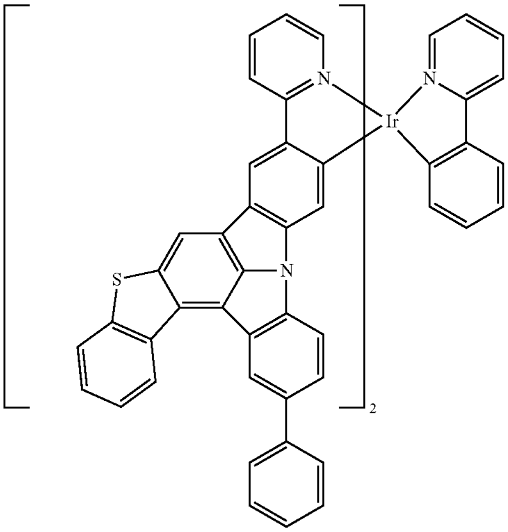
181
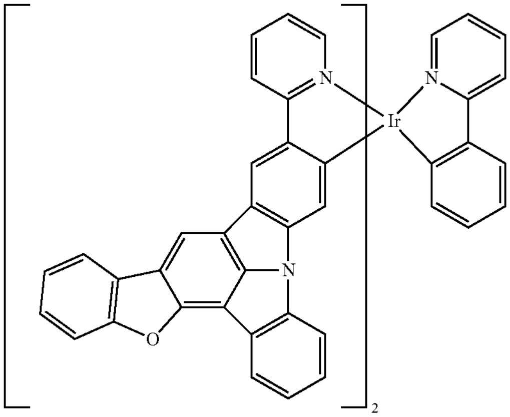

-continued
182
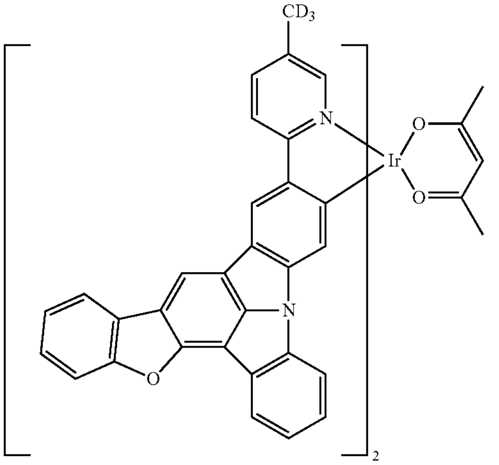
183
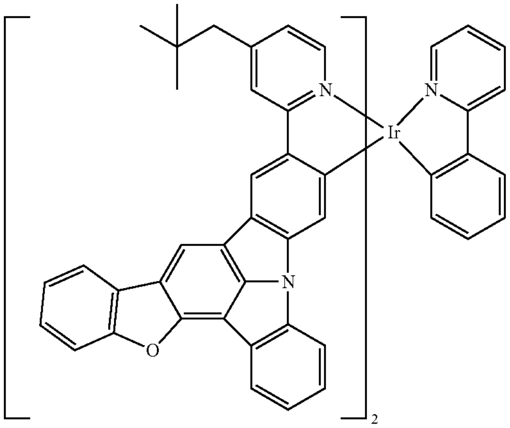
184
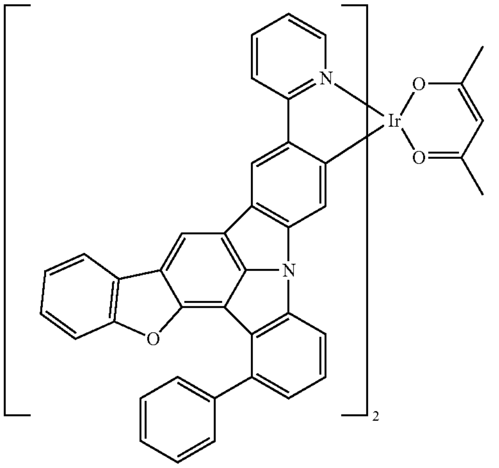
-continued
185
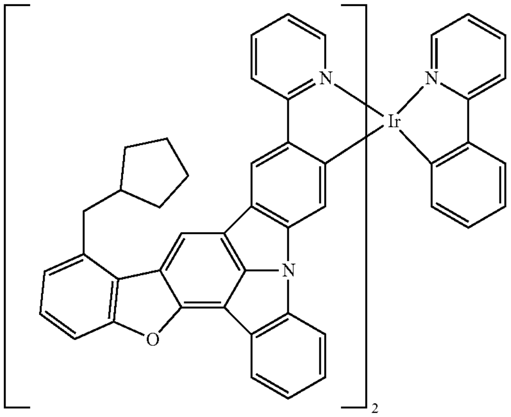
186
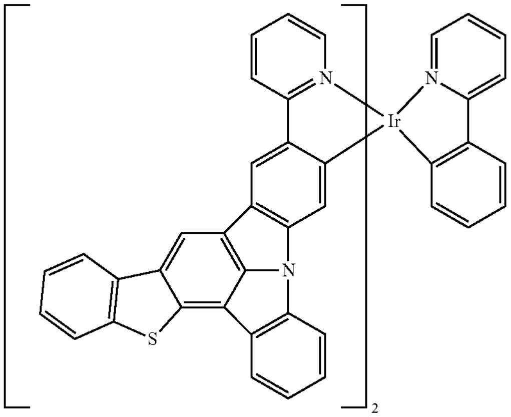
187
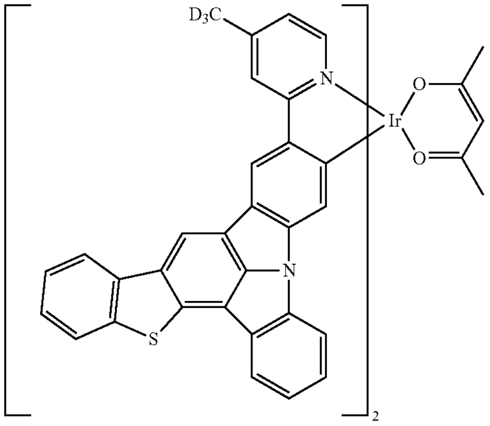

-continued
188
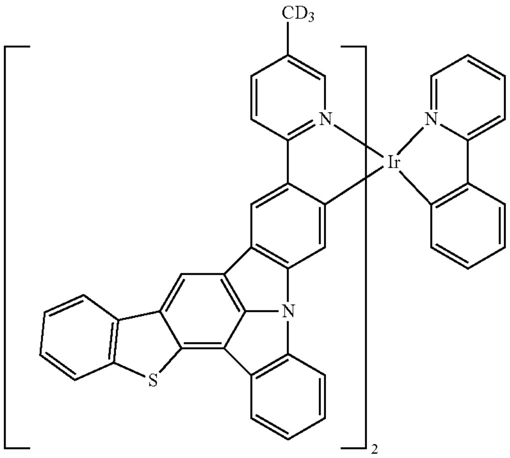
189
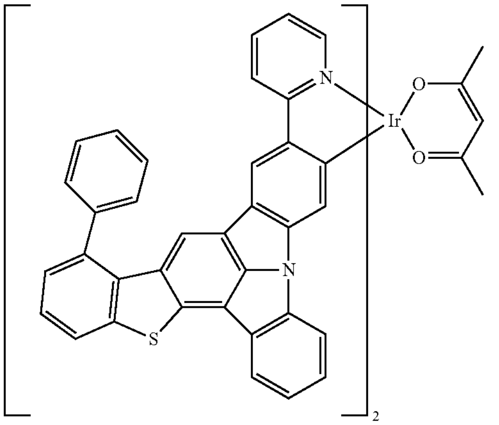
190
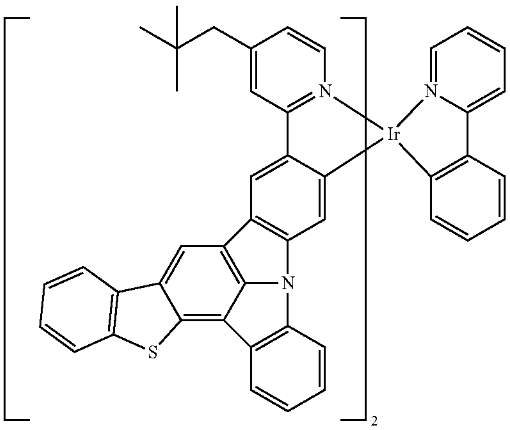
-continued
191
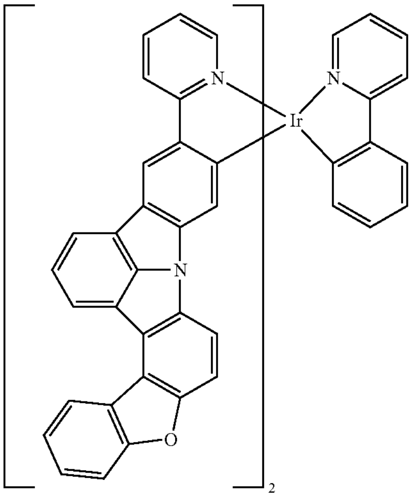
192
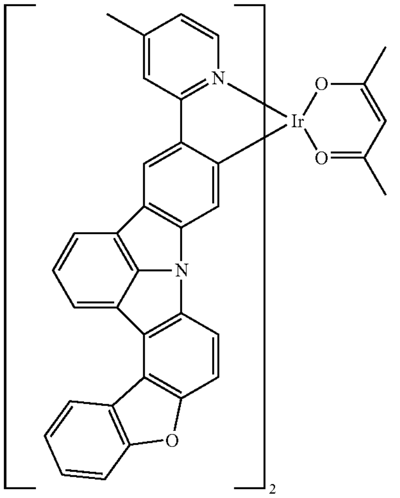
193
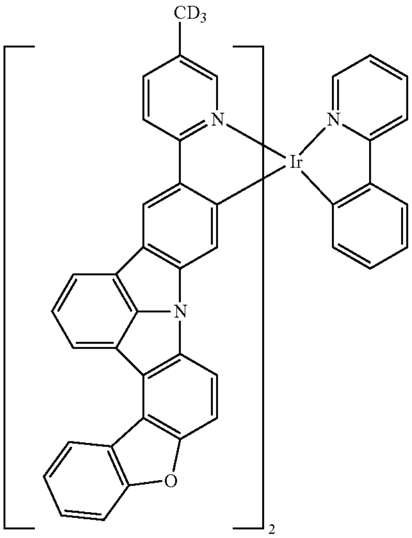

-continued
194
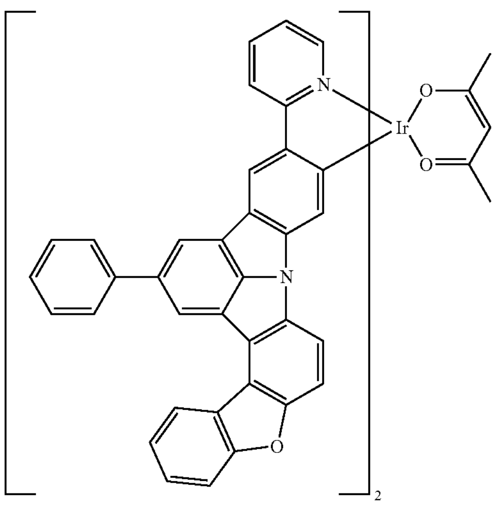
195
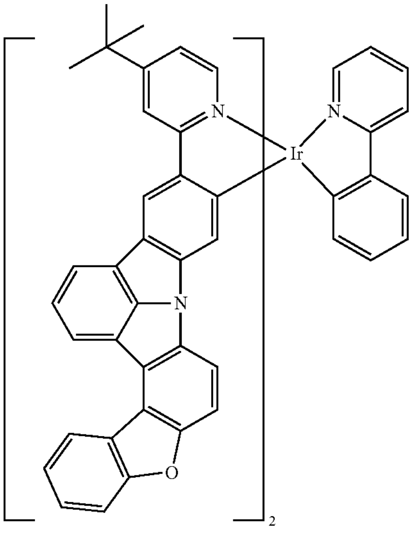
196
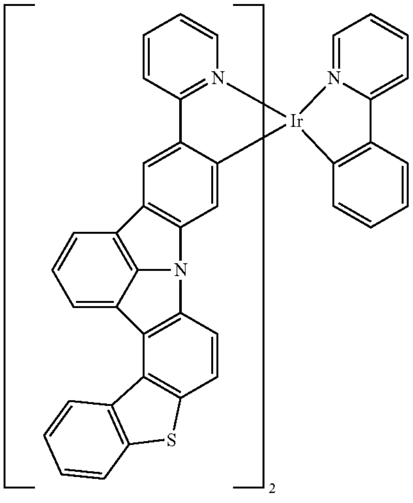
-continued
197
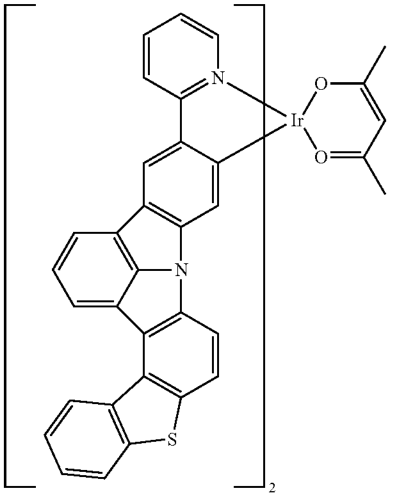
198
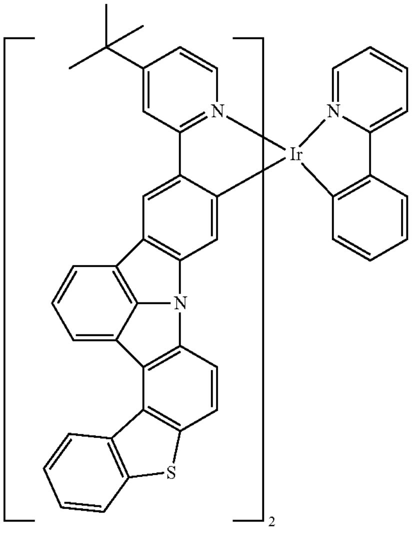
199
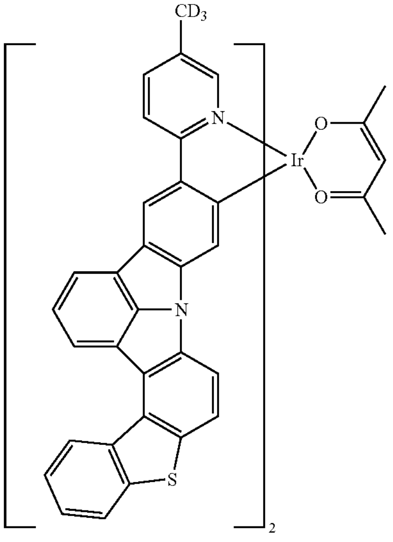

-continued
200
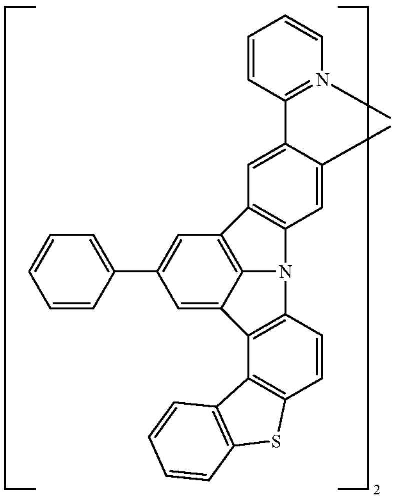
201
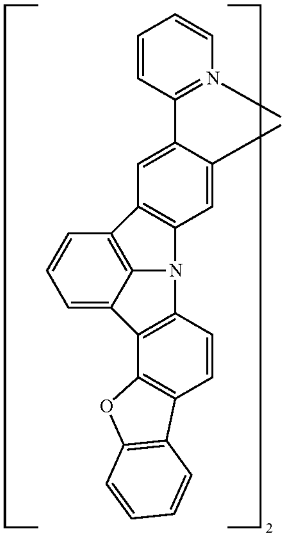
202
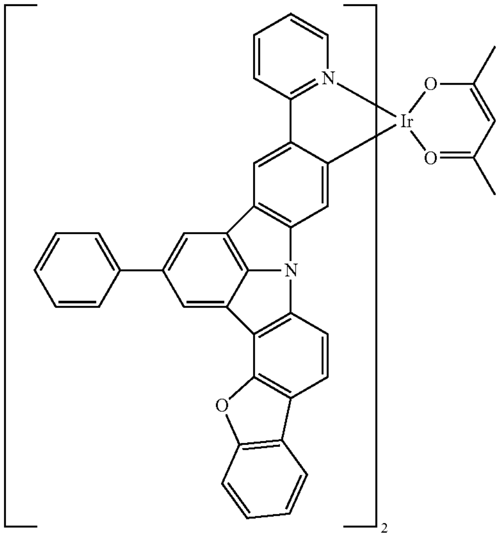
-continued
203
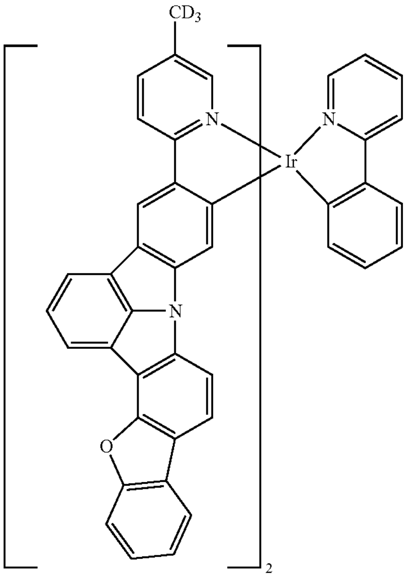
204
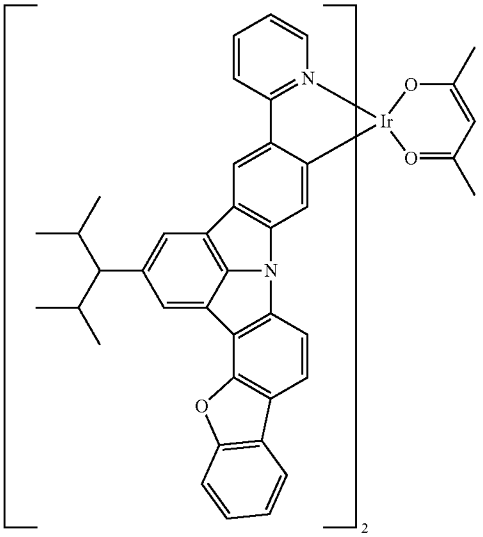
205
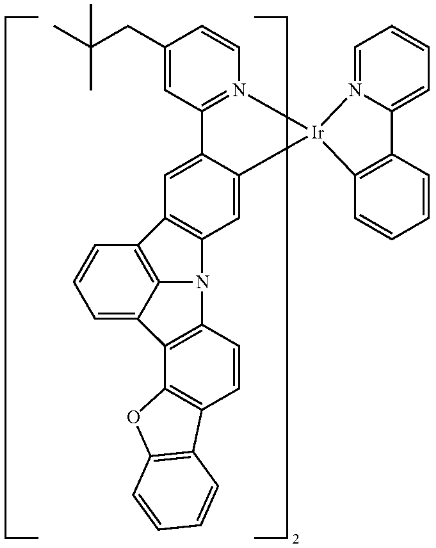

206
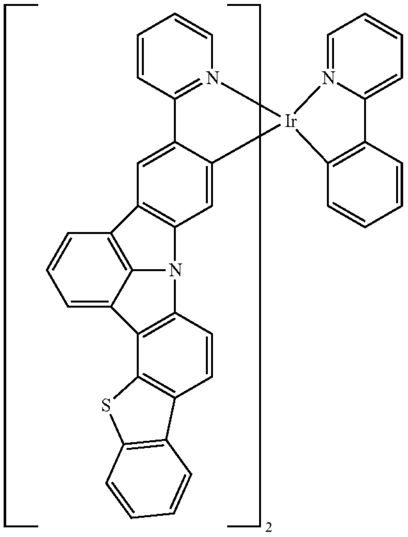
207
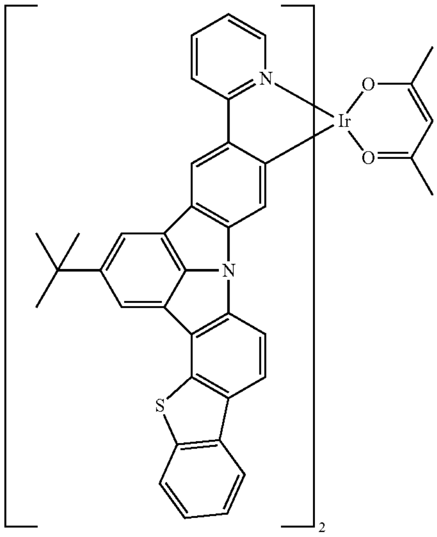
208
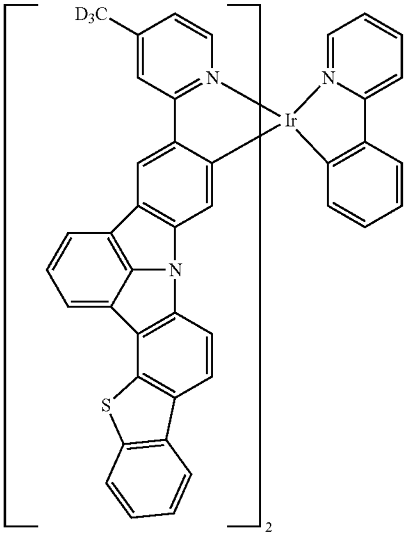
209
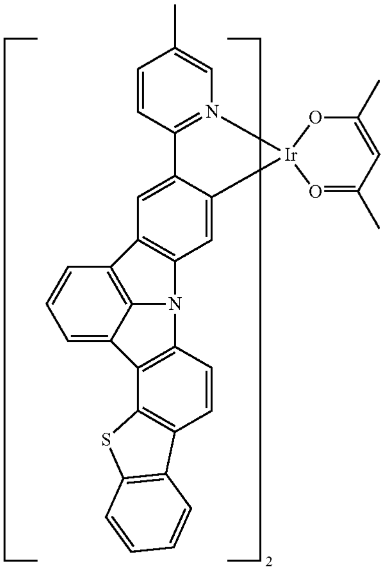
210
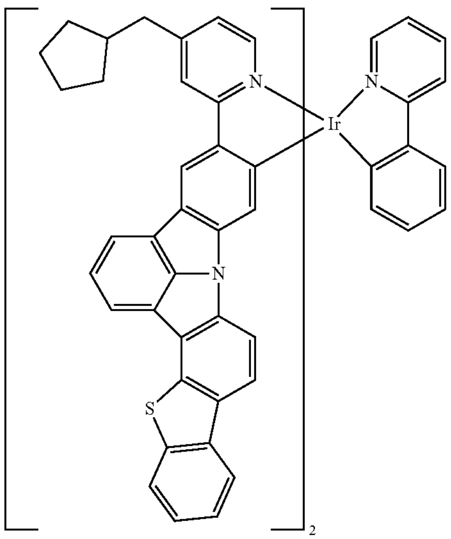
211
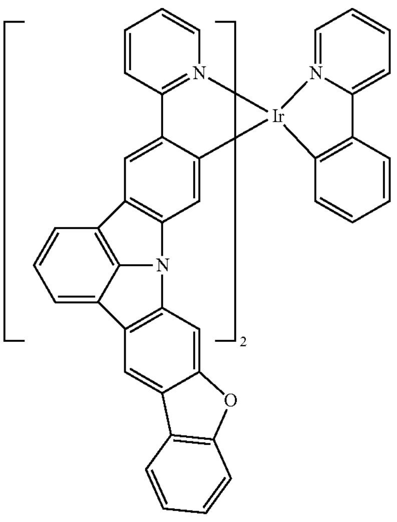

-continued
212
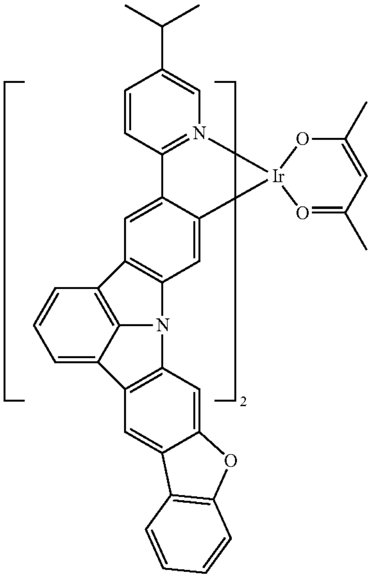
213
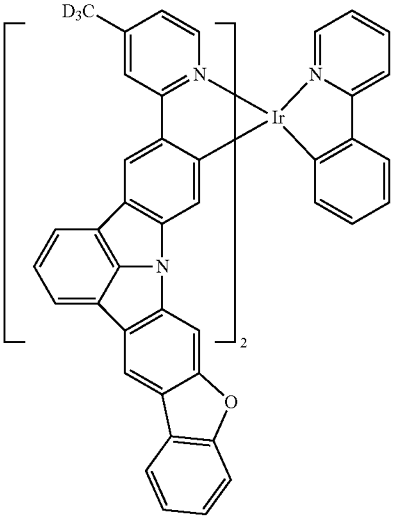
-continued
214
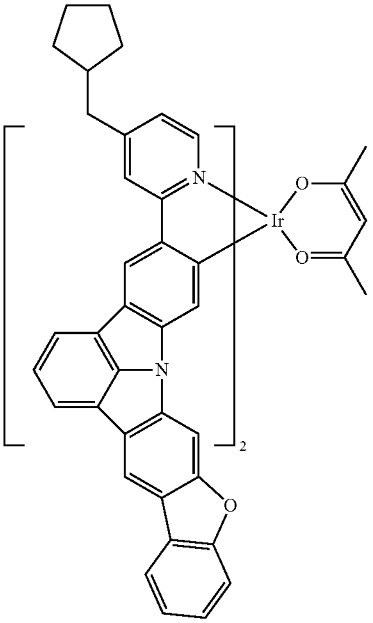
215
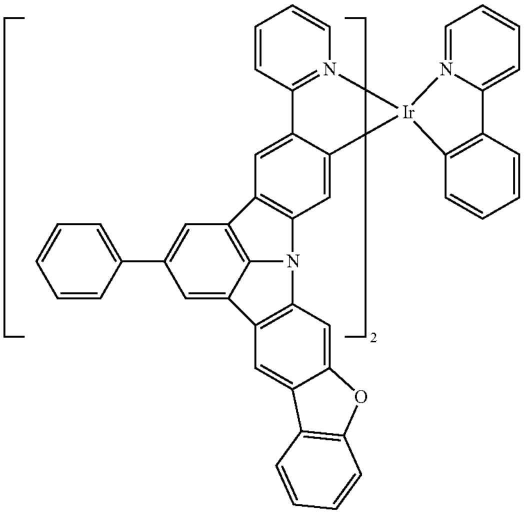
216
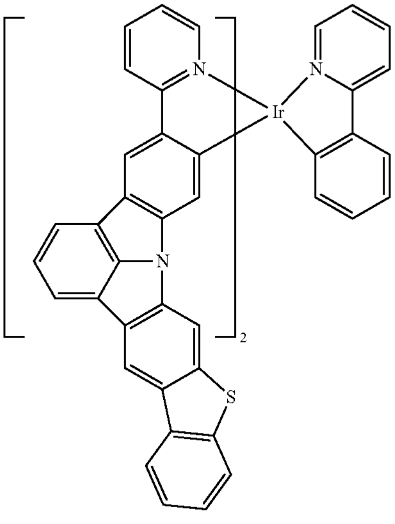

-continued
217
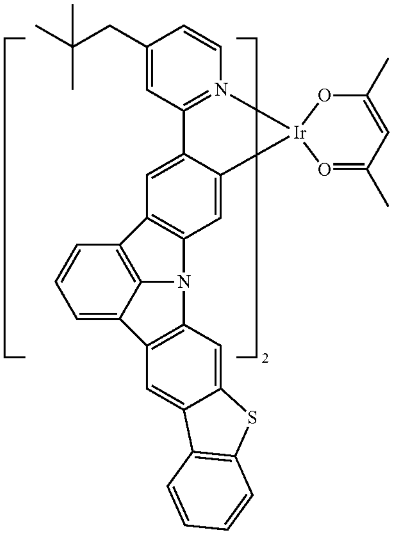
218
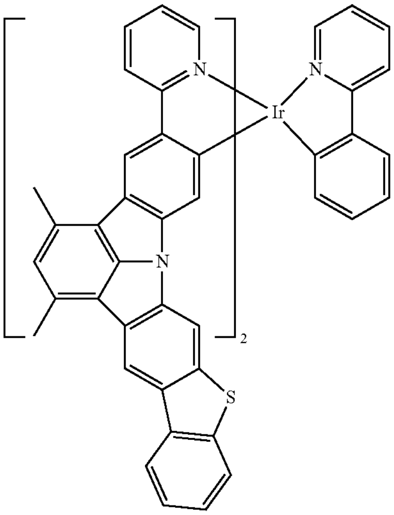
219
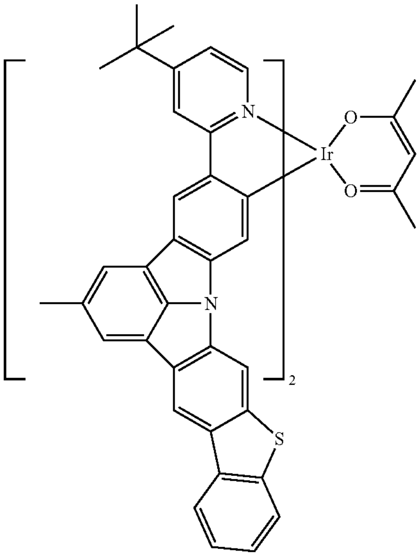
-continued
220
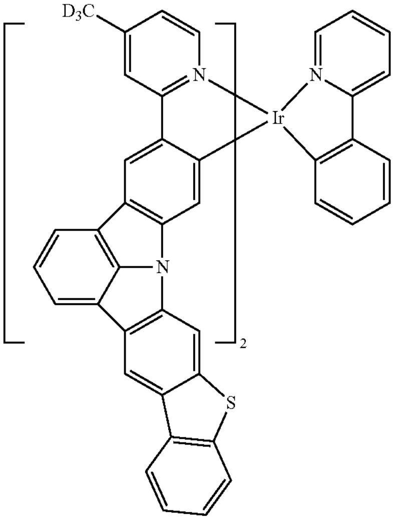
221
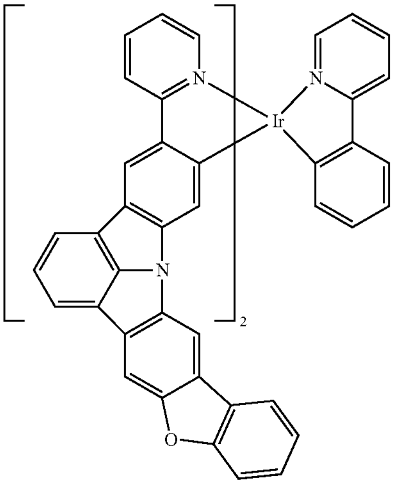
222
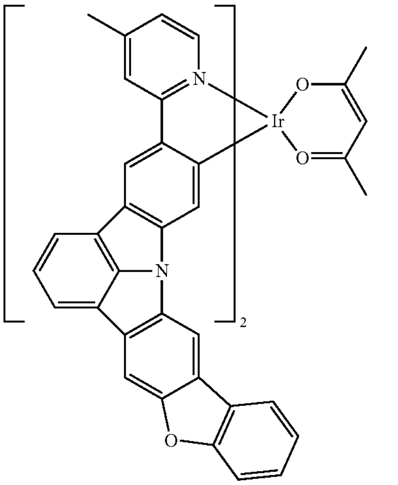

-continued
223
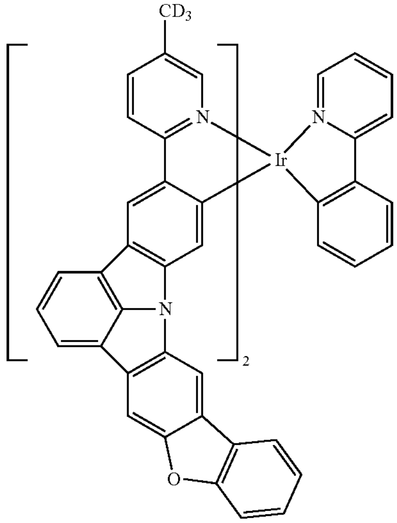
224
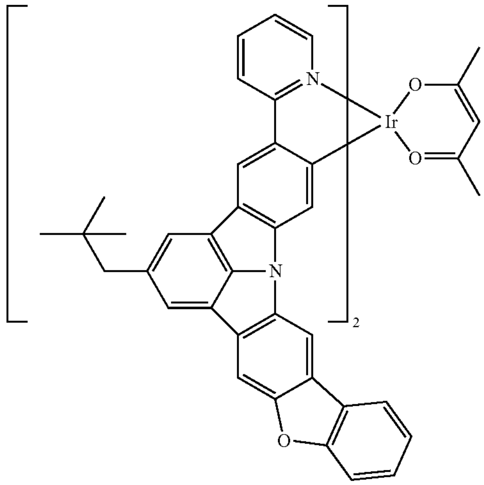
225
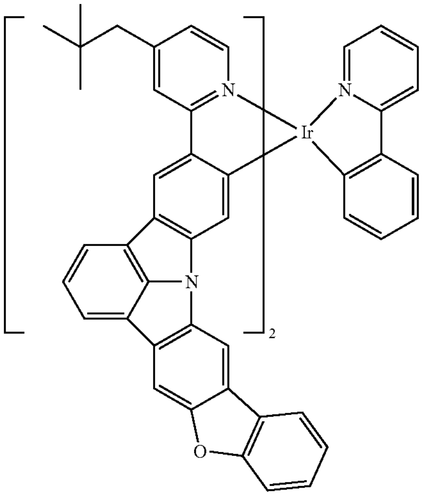
-continued
226
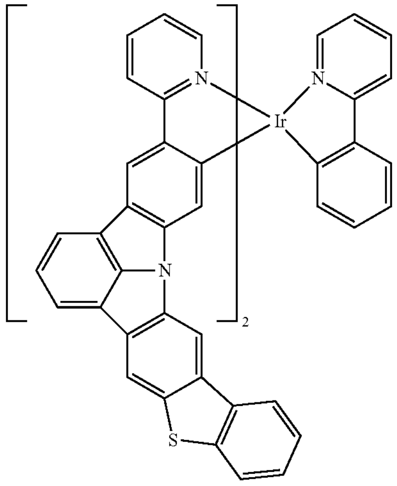
227
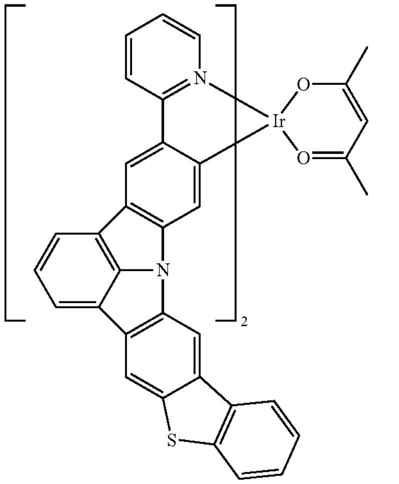
228
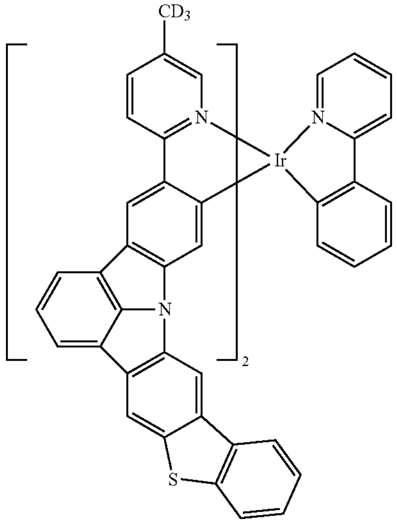

-continued
229
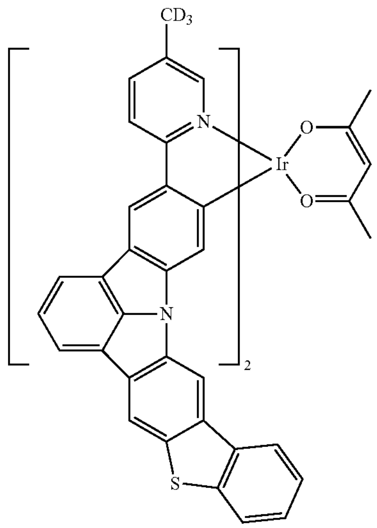
230
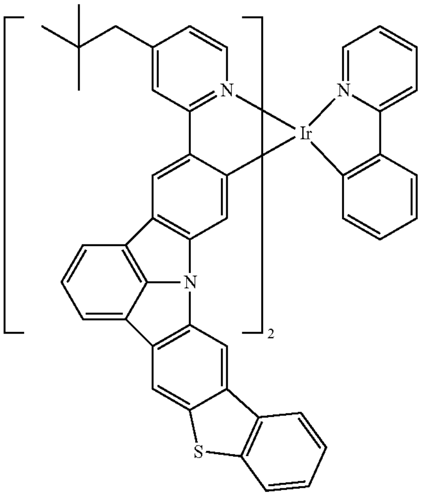
231
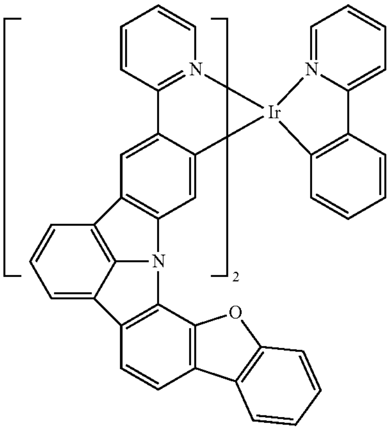
-continued
232
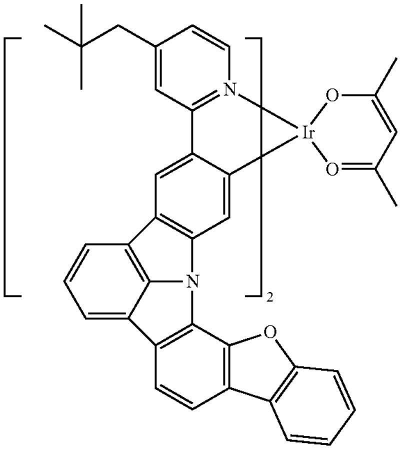
233
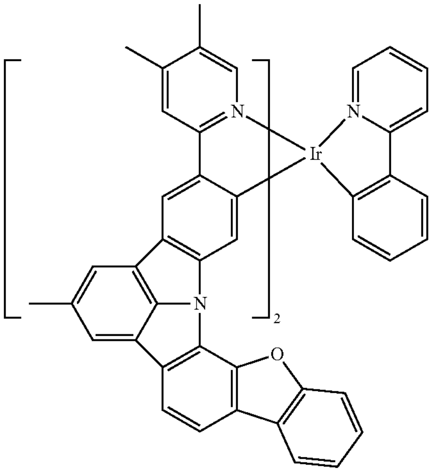
234
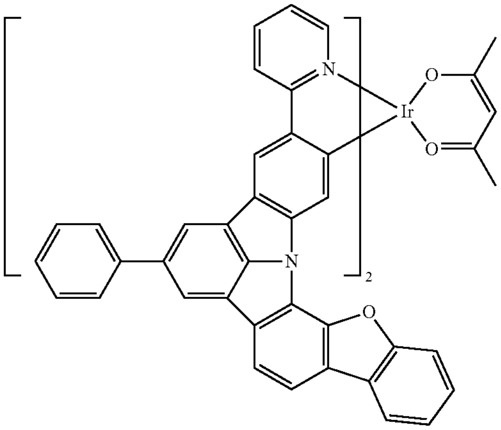

235
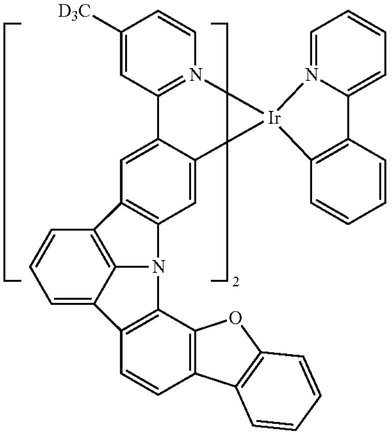
236
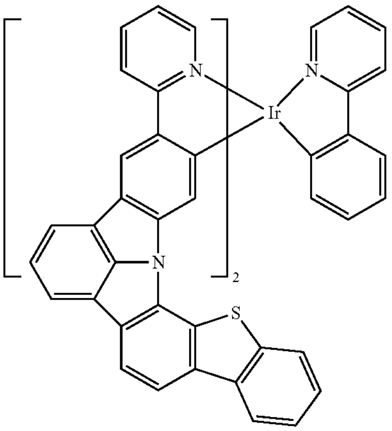
237
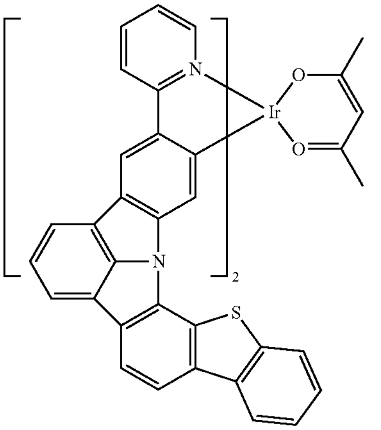
238
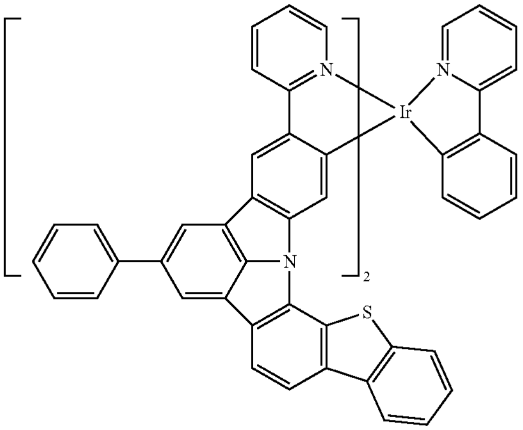
239
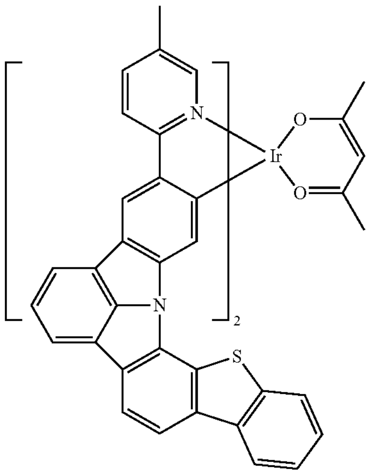
240
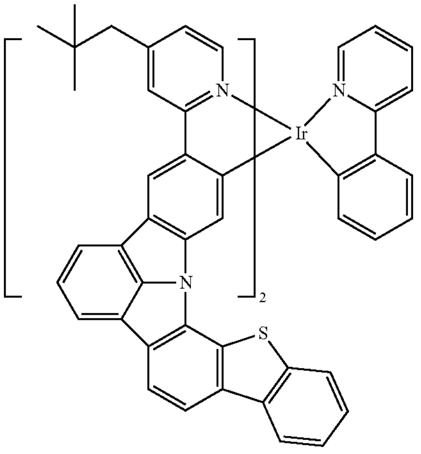

-continued
241
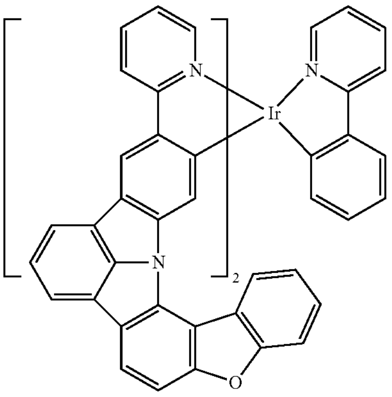
242
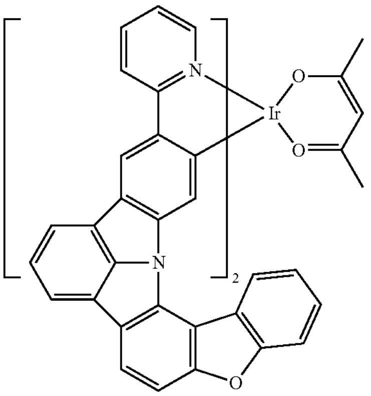
243
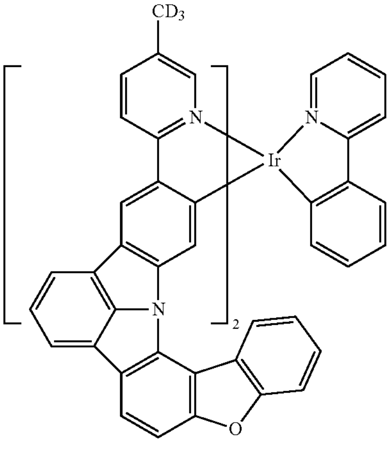
-continued
244
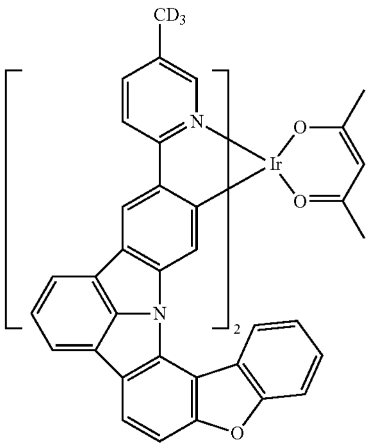
245
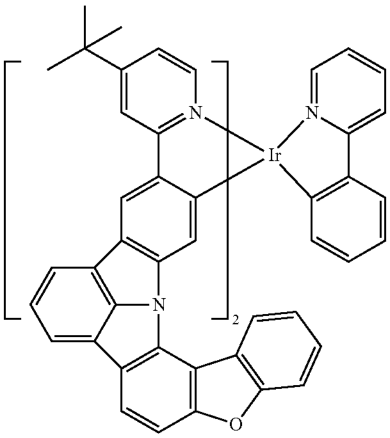
246
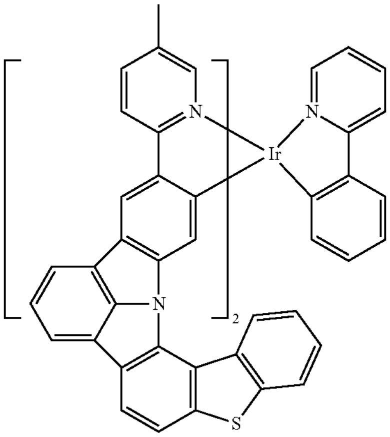

-continued
247
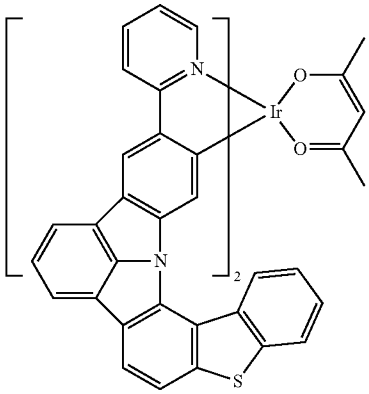
248
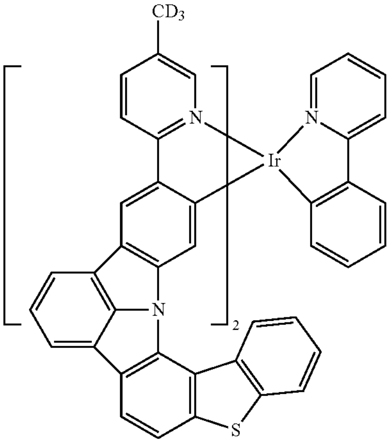
249
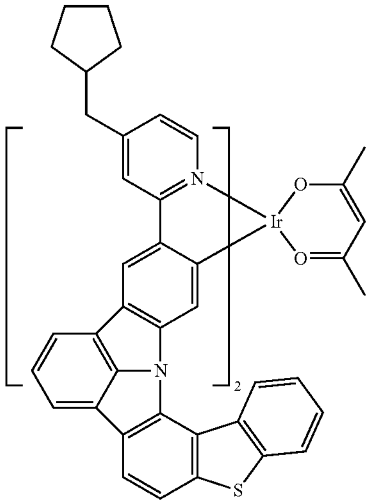
-continued
250
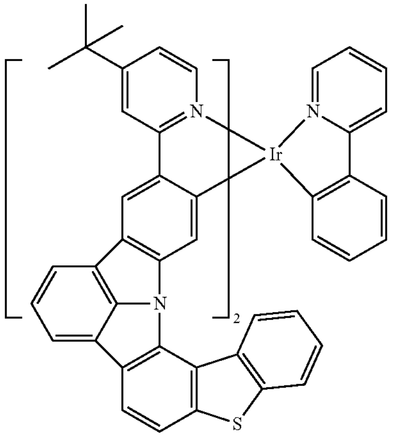
251
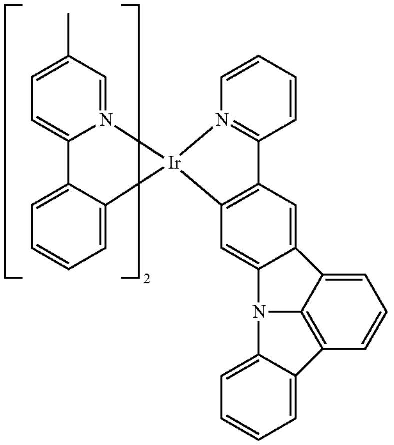
252
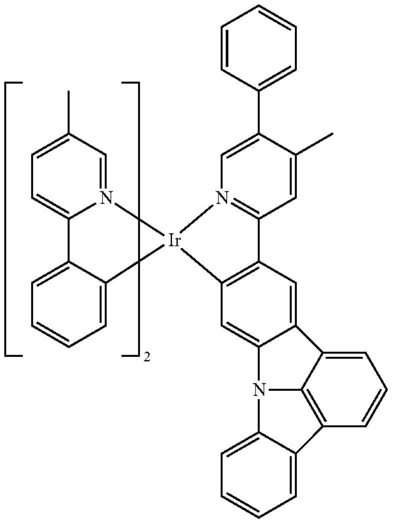

-continued
253
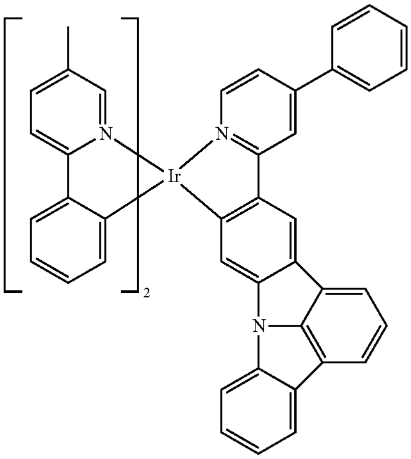
254
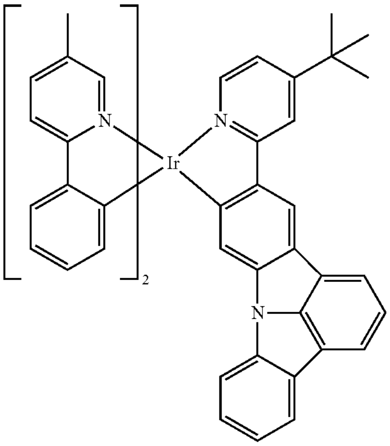
255
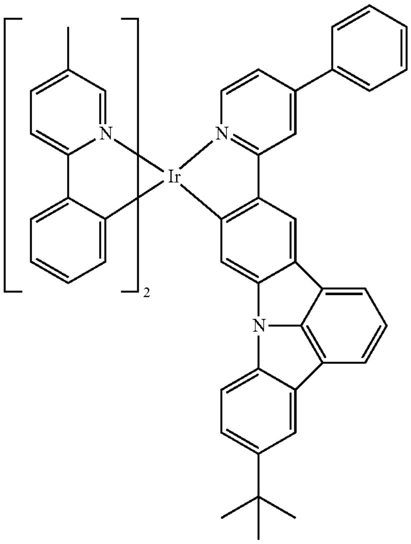
-continued
256
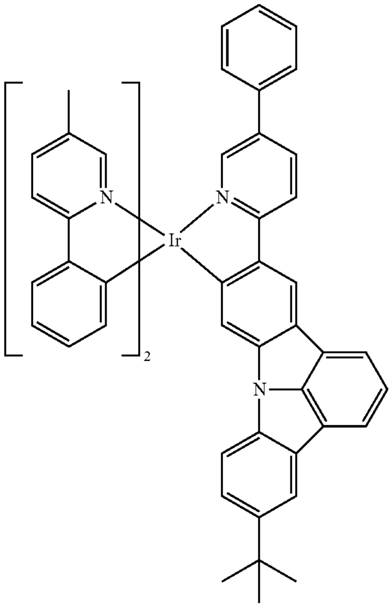
257
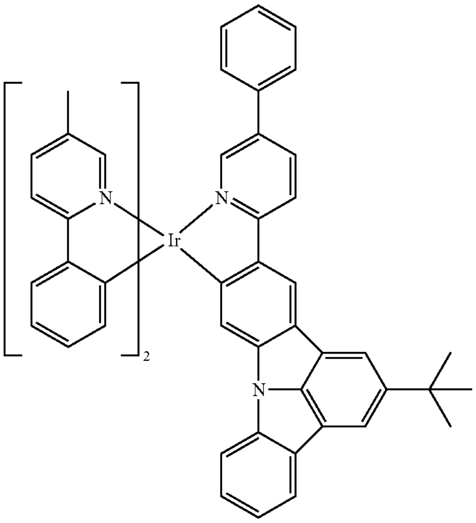
.

7. The organic light emitting diode of claim 1, wherein the first host is selected from the following compounds:
GHH1
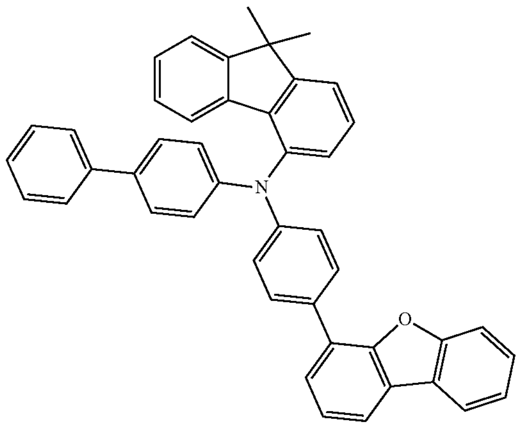
GHH2
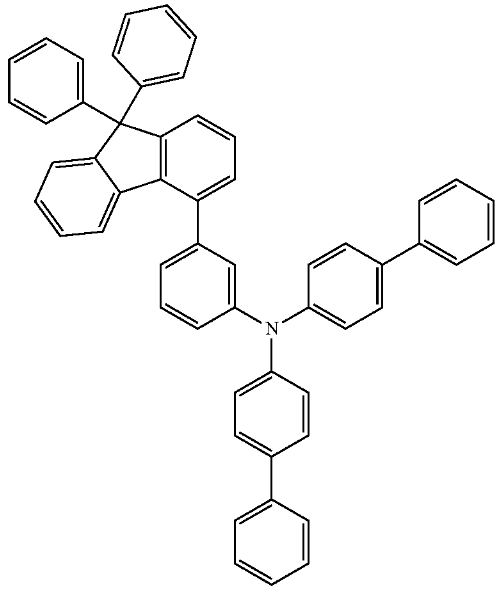
-continued
GHH3
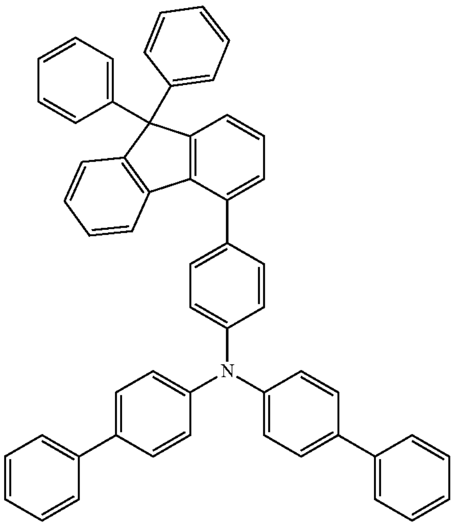
GHH4
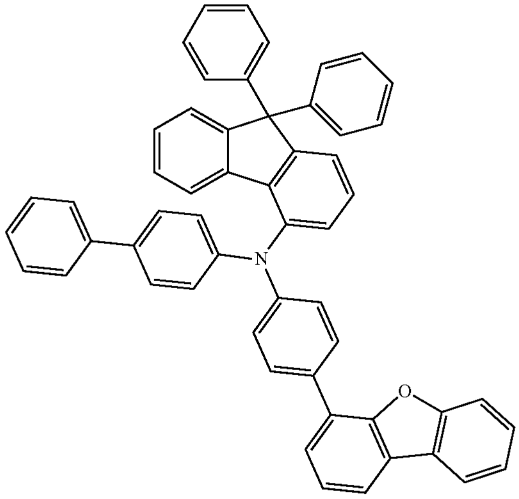
GHH5
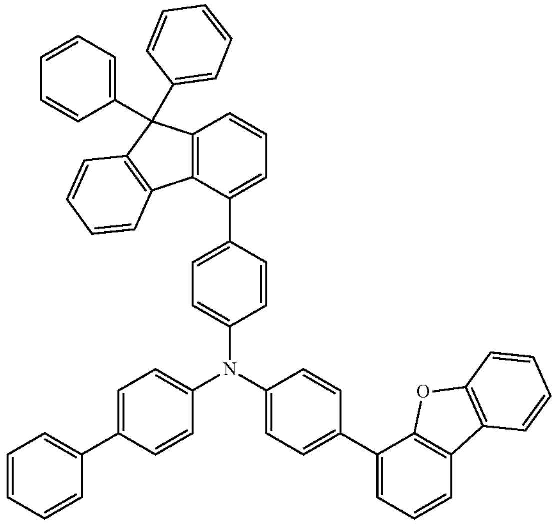

-continued
GHH6
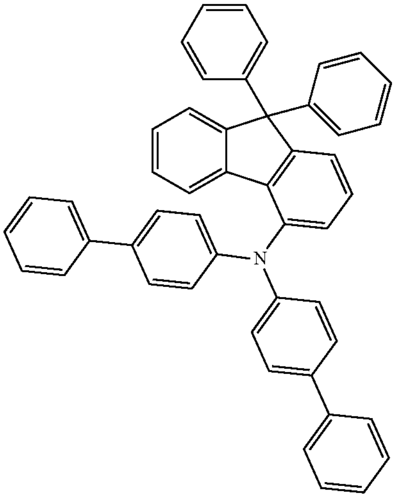
GHH7
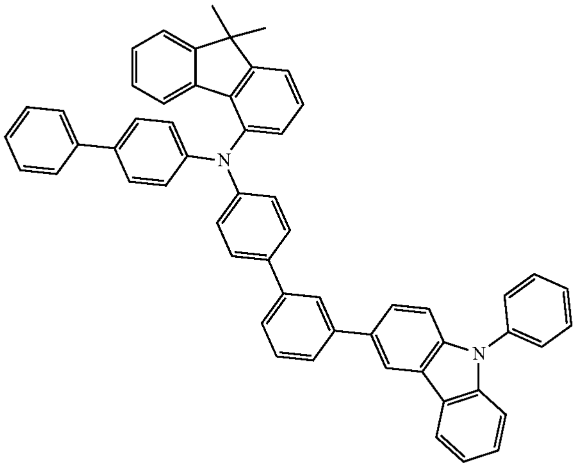
GHH8
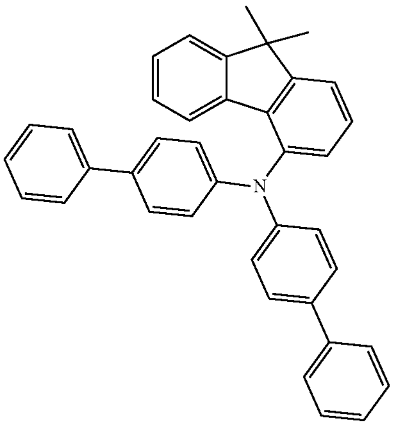
-continued
GHH9
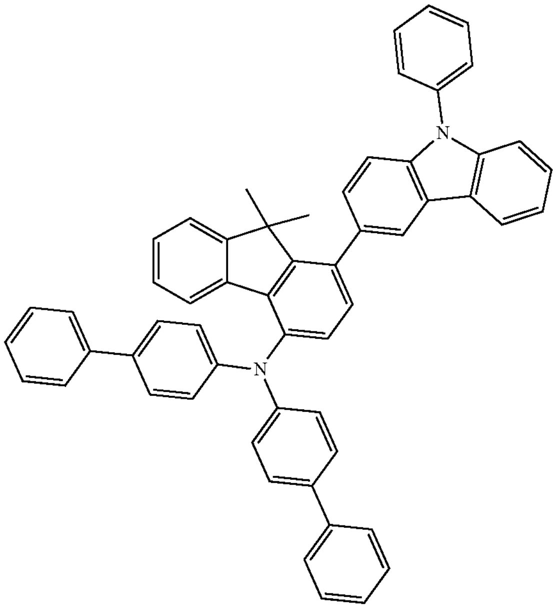
GHH10
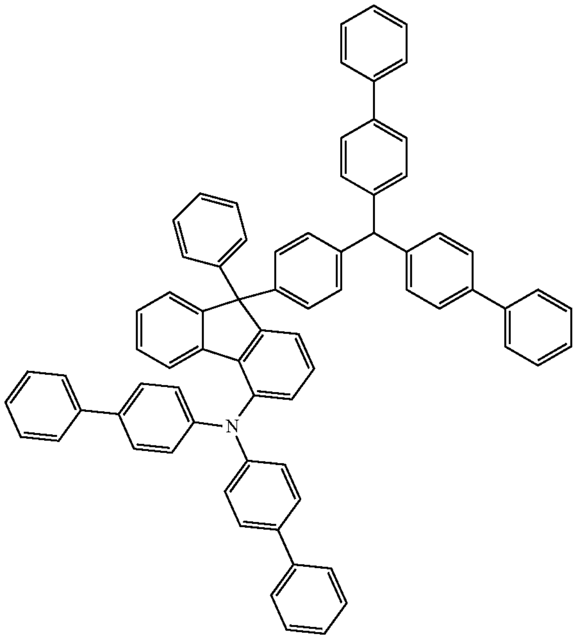

-continued
GHH11
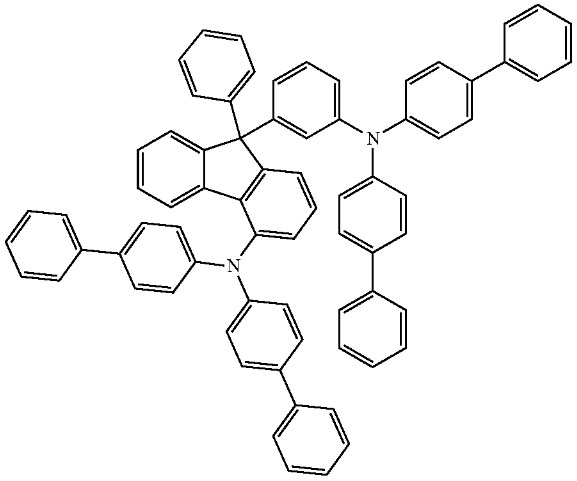
GHH12
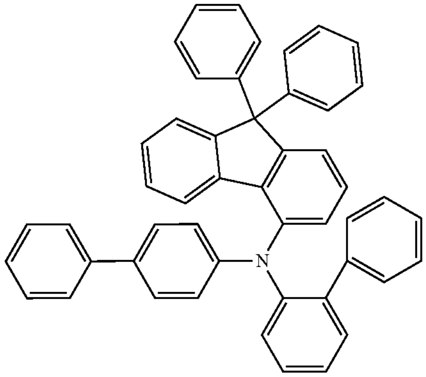
GHH13
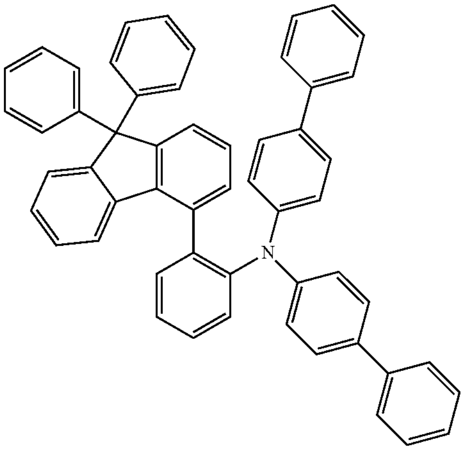
-continued
GHH14
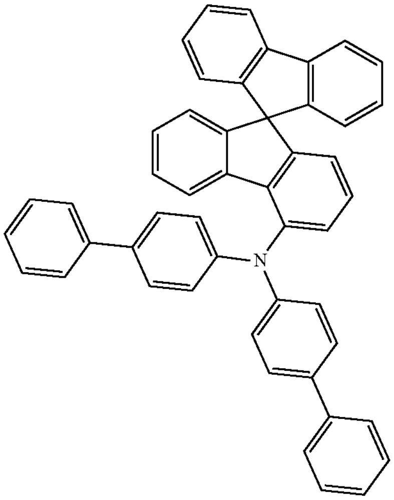
GHH15
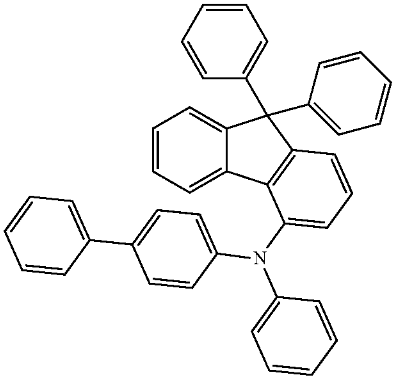
GHH16
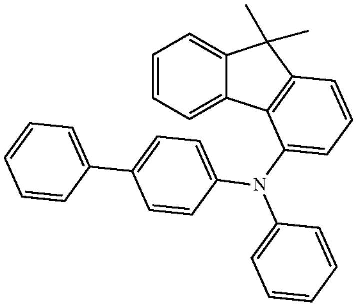

-continued
GHH17
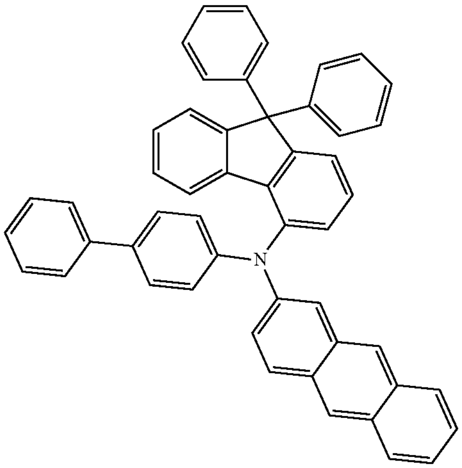
GHH18
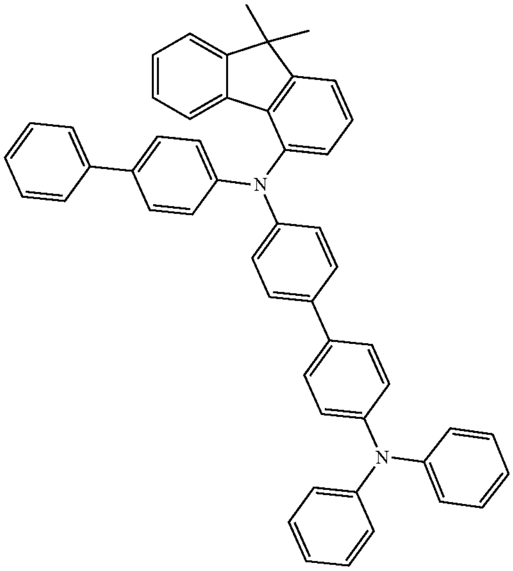
GHH19
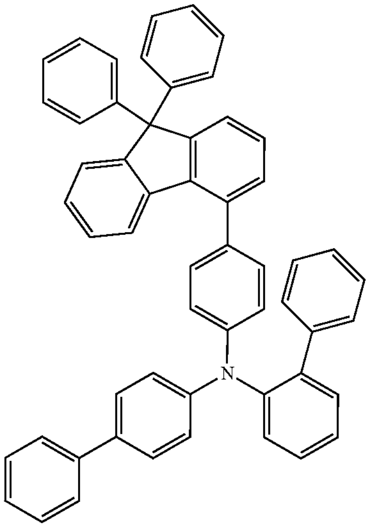
-continued
GHH20
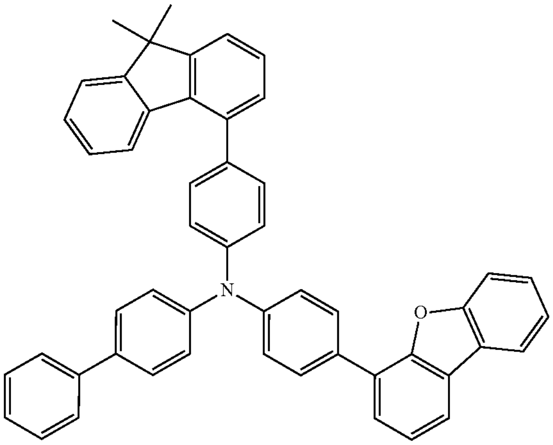
GHH21
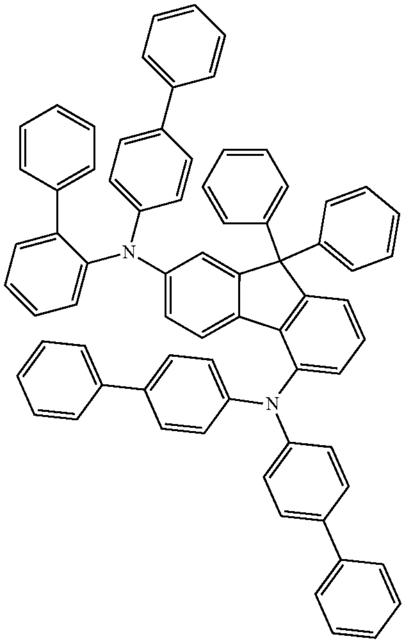

-continued
GHH22
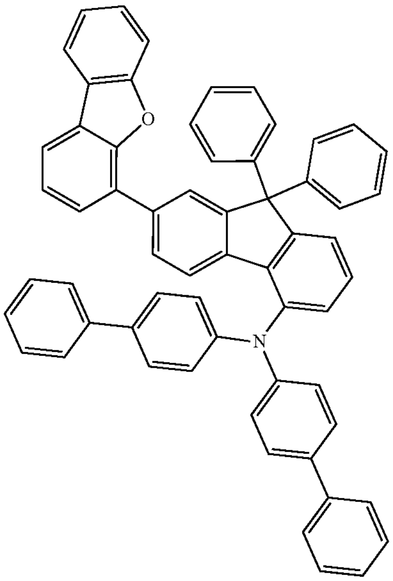
GHH23
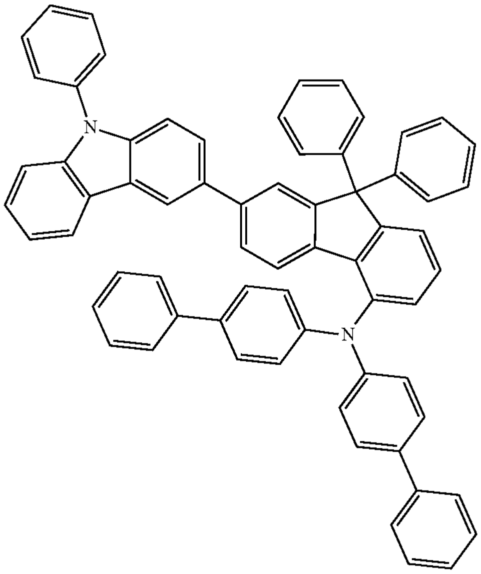
GHH24
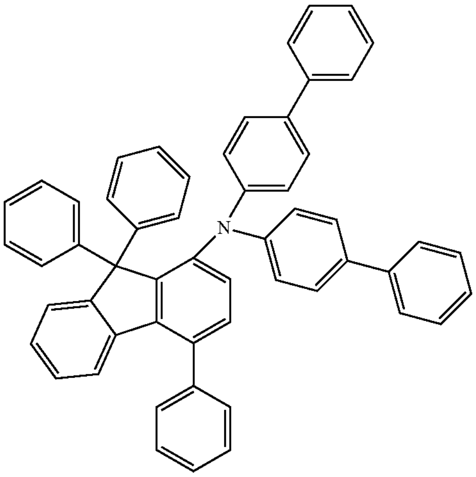
-continued
GHH25
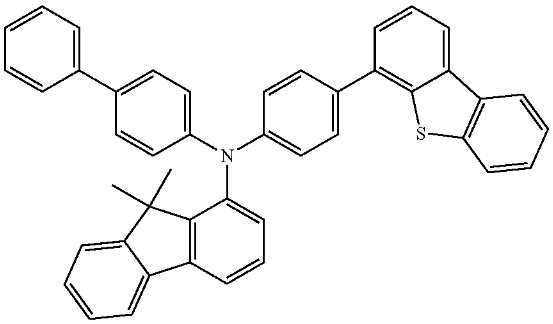
GHH26
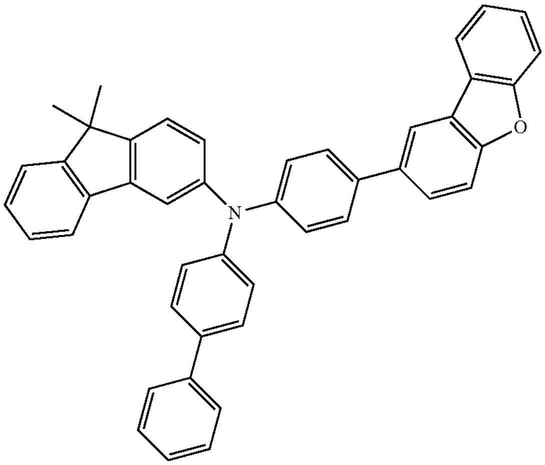
GHH27
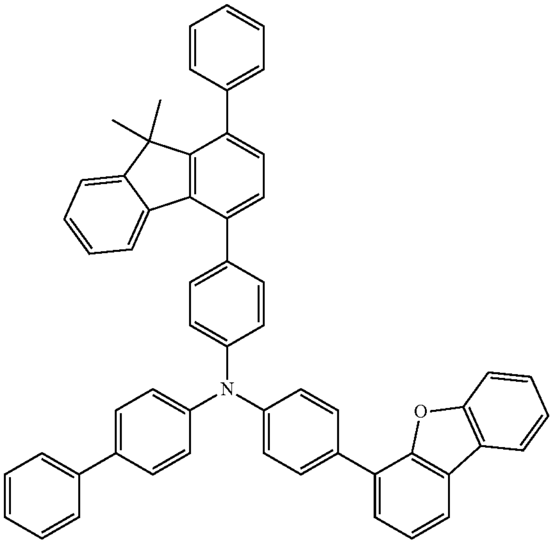

-continued
GHH28
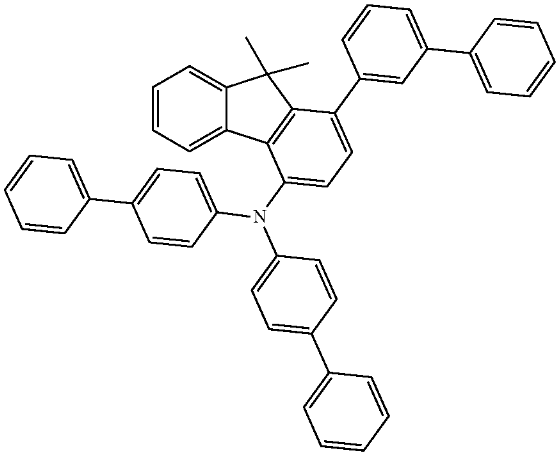
GHH29
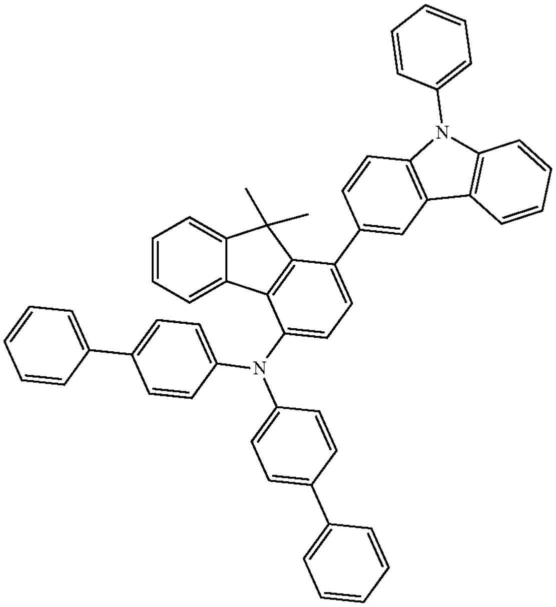
GHH30
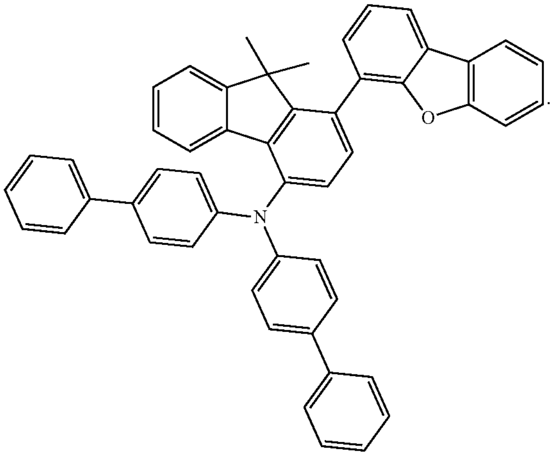
8. The organic light emitting diode of claim 1, wherein the second host is selected from the following compounds:
GEH1
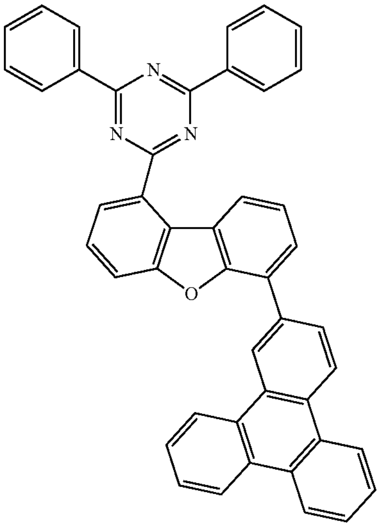
GEH2
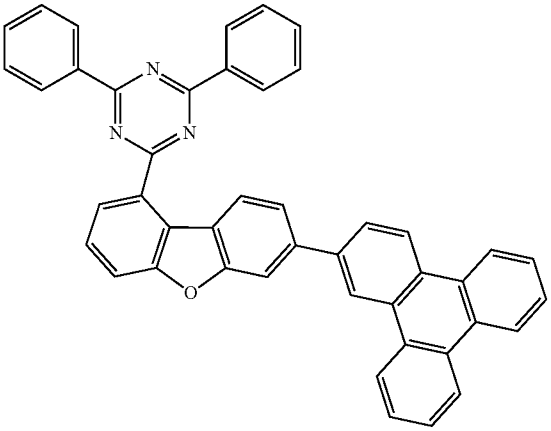
GEH3
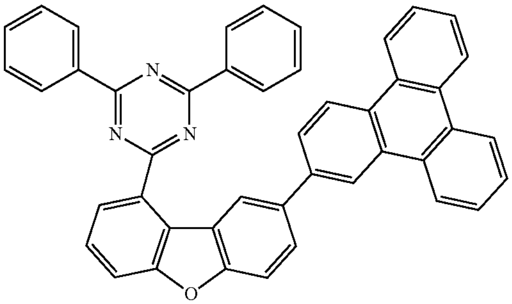

GEH4
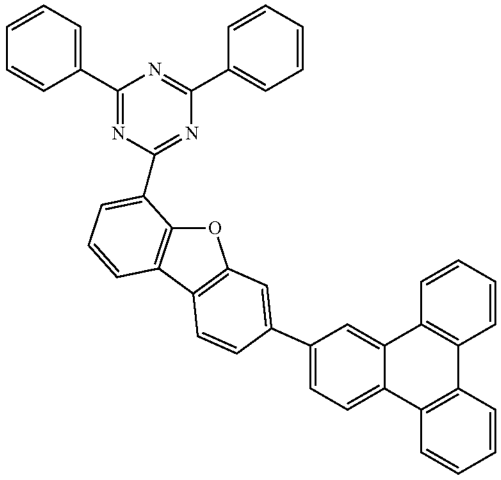
GEH5
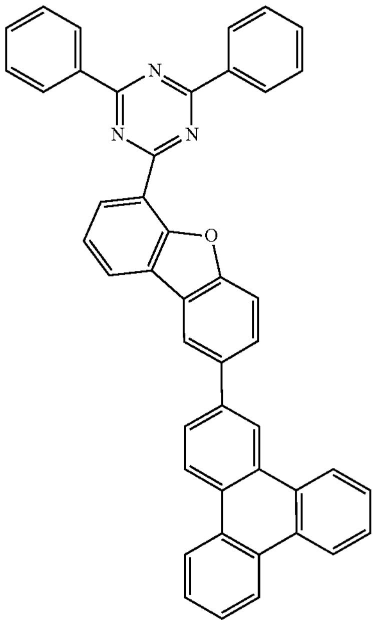
GEH6
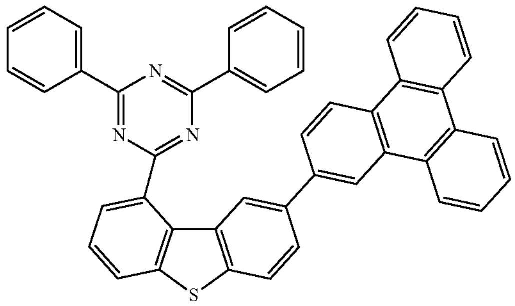
GEH7
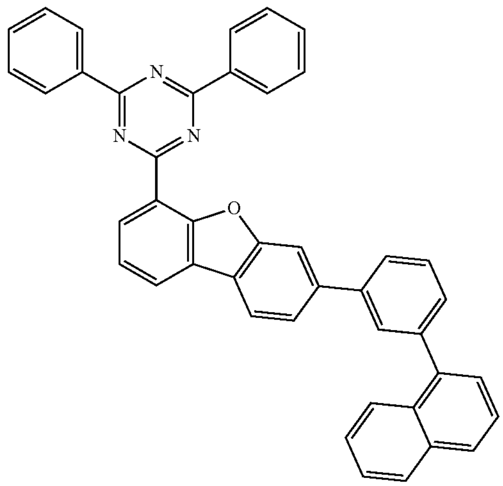
GEH8
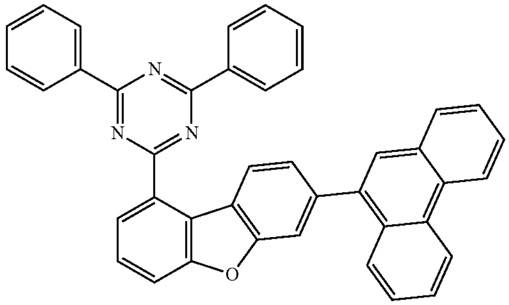
GEH9
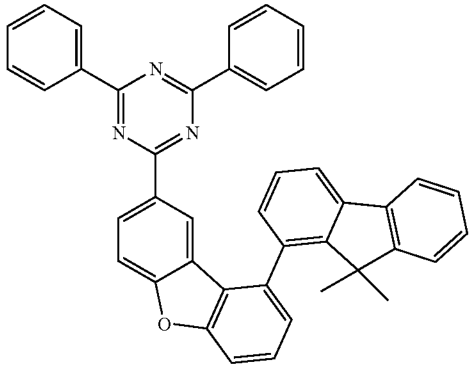
GEH10
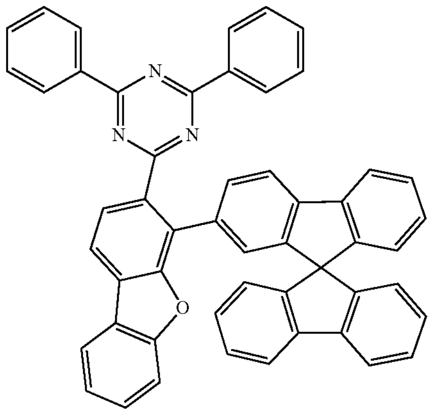

GEH11
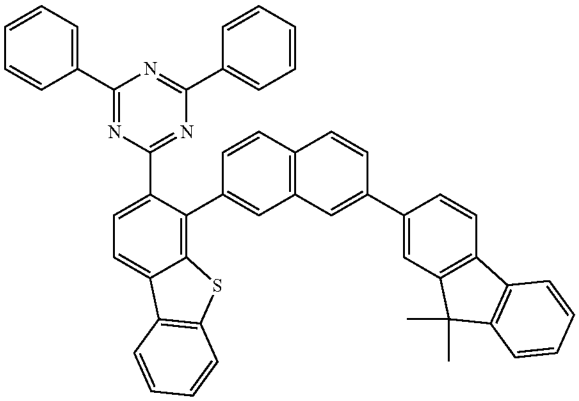
GEH12
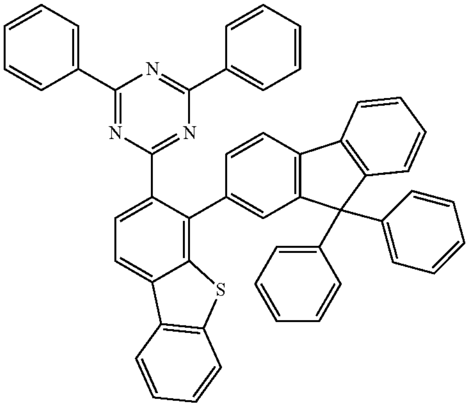
GEH13
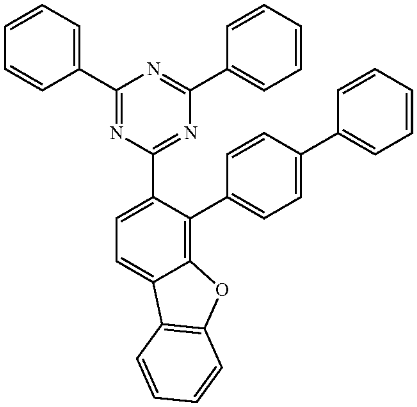
GEH14
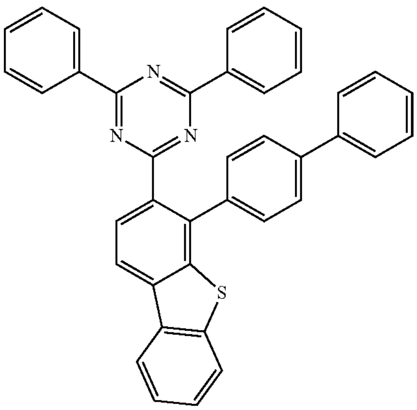
GEH15
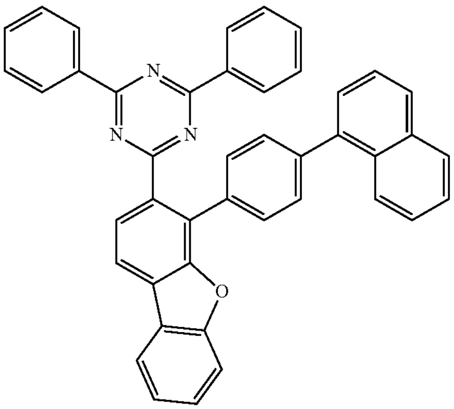
GEH16
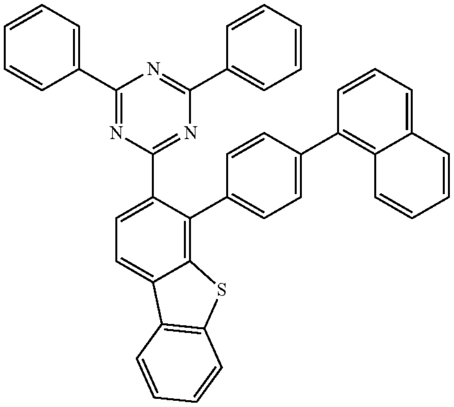
GEH17
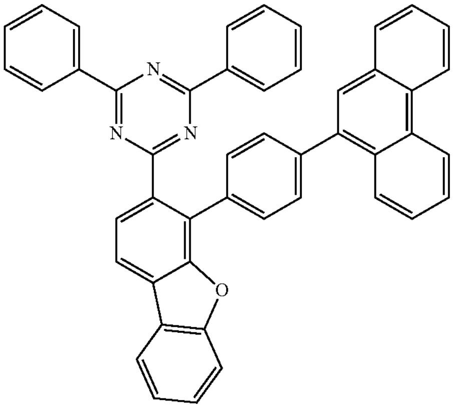

-continued
GEH18
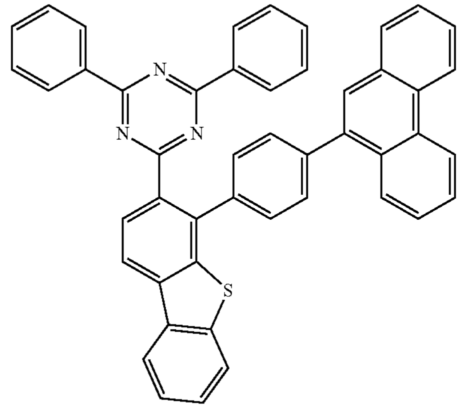
GEH19
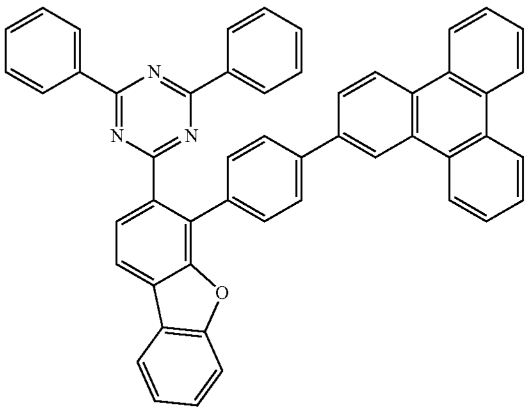
GEH20
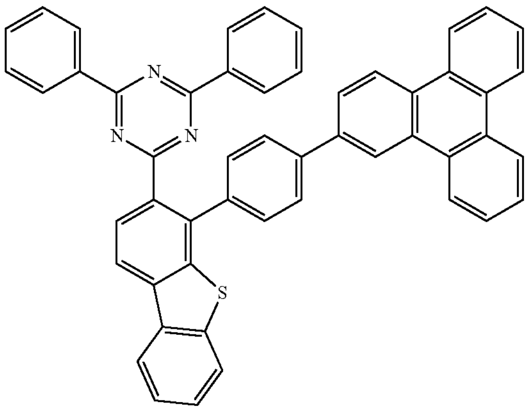
-continued
GEH21
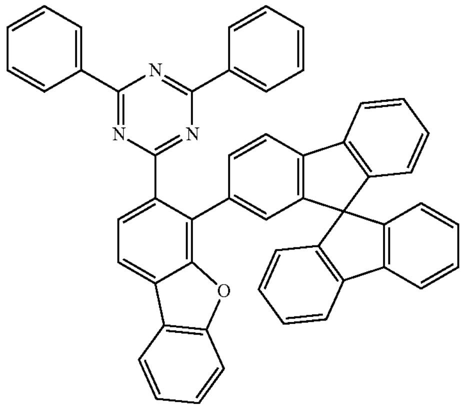
GEH22
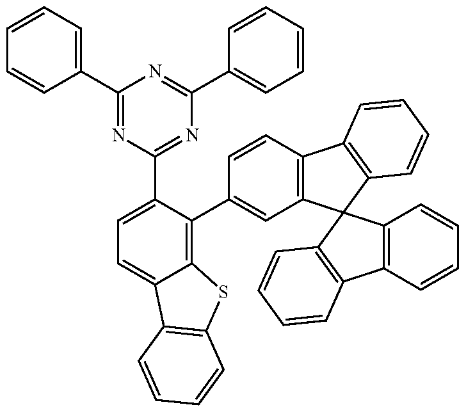
GEH23
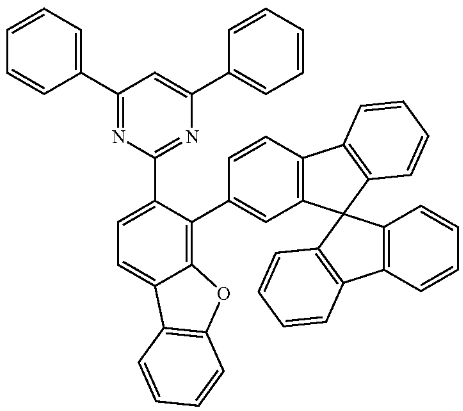

GHE24
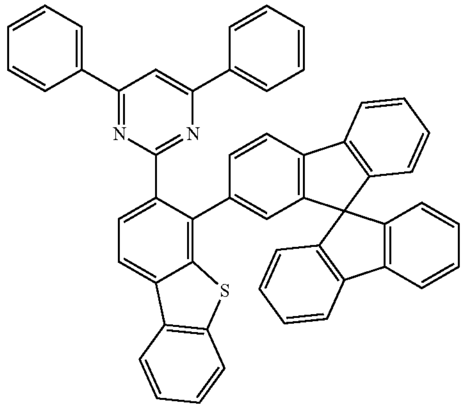
GEH25
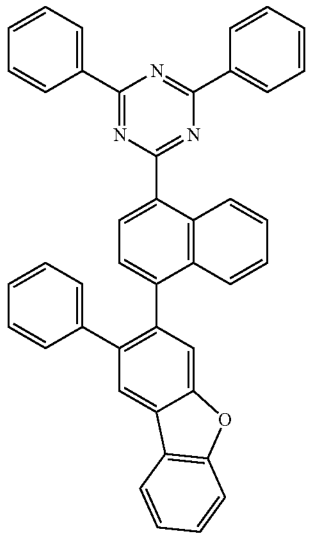
GEH26
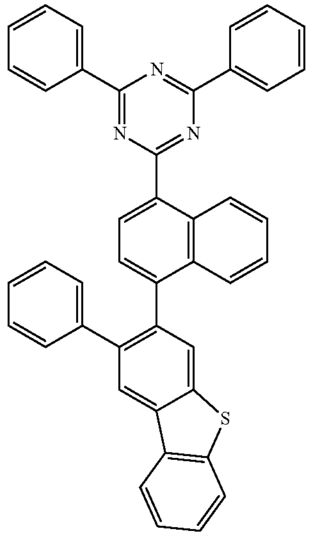
GEH27
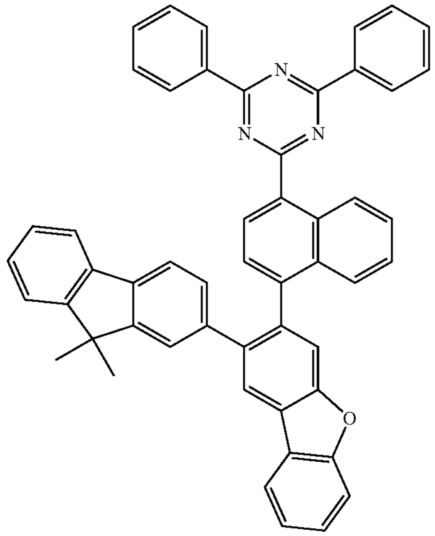
GEH28
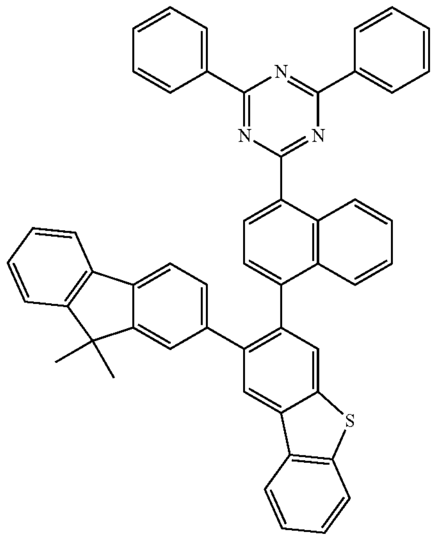
GEH29
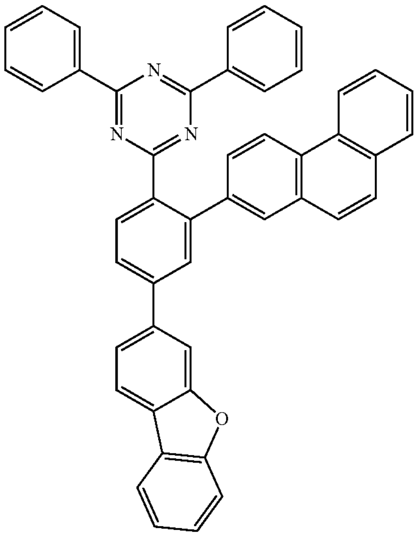

-continued

GEH30

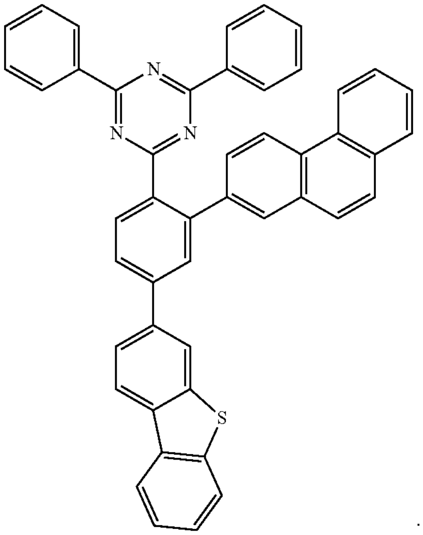

9. The organic light emitting diode of claim 1, wherein the emissive layer includes:

a first emitting part disposed between the first and second electrodes and including a first emitting material layer;

a second emitting part disposed between the first emitting part and the second electrode and including a second emitting material layer; and a first charge generation layer disposed between the first and second emitting parts, and wherein at least one of the first emitting material layer and the second emitting material layer includes the host and the dopant.

10. The organic light emitting diode of claim 9, wherein the second emitting material layer includes a first layer disposed between the first charge generation layer and the second electrode and a second layer disposed between the first layer and the second electrode, and wherein one of the first layer and the second layer includes the host and the dopant.

11. The organic light emitting diode of claim 10, wherein the second emitting material layer further includes a third layer disposed between the first layer and the second layer.

12. The organic light emitting diode of claim 9, wherein the emissive layer further includes a third emitting part disposed between the second emitting part and the second electrode and including a third emitting material layer, and a second charge generation layer disposed between the second and third emitting parts.

13. The organic light emitting diode of claim 12, wherein the second emitting material layer includes a first layer disposed between the first charge generation layer and the second electrode and a second layer disposed between the first layer and the second electrode, and wherein one of the first layer and the second layer includes the host and the dopant.

14. An organic light emitting diode including:

a first electrode;

a second electrode facing the first electrode; and an emissive layer disposed between the first and second electrodes, wherein the emissive layer includes:

a first emitting part disposed between the first and second electrodes and including a blue emitting material layer;

a second emitting part disposed between the first emitting part and the second electrode and including at least one emitting material layer; and a first charge generation layer disposed between the first and second emitting parts, wherein the at least one emitting material layer includes a host and a dopant, wherein the dopant includes an organic metal compound having the following structure of Formula 1:

$$Ir(L_A)_m(L_B)_n \quad \text{[Formula 1]}$$

wherein, in Formula 1, $L_A$ has the following structure of Formula 2;

$L_B$ is an auxiliary ligand having the following structure of Formula 3;

m is an integer of 1 to 3;

n is an integer of 0 to 2; and m+n is 3;

[Formula 2]

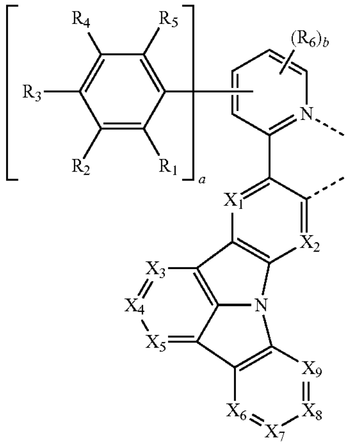

wherein, in Formula 2, each of $X_1$ and $X_2$ is independently $CR_7$ or N;

each of $X_3$ to $X_5$ is independently $CR_8$ or N and at least one of $X_3$ to $X_5$ is $CR_8$;

each of $X_6$ to $X_9$ is independently is $CR_9$ or N and at least one of $X_6$ to $X_9$ is $CR_9$;

each of $R_1$ to $R_9$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group, and wherein each $R_6$ is identical to or different from each other when b is an integer of 2 or more;

optionally, two adjacent groups among $R_1$ to $R_5$, and/or two adjacent $R_6$ when b is an integer of 2 or more, and/or $X_3$ and $X_4$ or $X_4$ and $X_5$, and/or $X_6$ and $X_7$, $X_7$ and $X_8$, or $X_8$ and $X_9$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

a is an integer of 0 to 2; and b is an integer of 0 to 4,

[Formula 3]

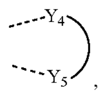

and wherein the host includes a first host having the following structure of Formula 7 and a second host having the following structure of Formula 9:

[Formula 7]

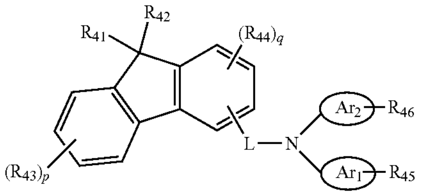

wherein, in Formula 7, each of $R_{41}$ and $R_{42}$ is independently hydrogen, deuterium, unsubstituted or substituted $C_1$-$C_{20}$ alkyl, unsubstituted or substituted $C_6$-$C_{30}$ aryl or unsubstituted or substituted $C_3$-$C_{30}$ hetero aryl, optionally, each substituent on the $C_6$-$C_{30}$ aryl and $C_3$-$C_{30}$ hetero aryl is independently unsubstituted or further substituted with at least one of $C_6$-$C_{30}$ aryl and $C_3$-$C_{30}$ hetero aryl, or $R_{41}$ and $R_{42}$ form an unsubstituted or substituted $C_6$-$C_{30}$ spiro aromatic ring or an unsubstituted or substituted spiro $C_3$-$C_{30}$ hetero aromatic ring;

each of $R_{43}$ to $R_{46}$ is independently hydrogen, deuterium, unsubstituted or substituted $C_1$-$C_{20}$ alkyl, unsubstituted or substituted $C_6$-$C_{30}$ aryl, unsubstituted or substituted $C_3$-$C_{30}$ hetero aryl, unsubstituted or substituted $C_6$-$C_{30}$ aryl amino or unsubstituted or substituted $C_3$-$C_{30}$ hetero aryl amino, optionally, each substituent on the $C_6$-$C_{30}$ aryl, $C_3$-$C_{30}$ hetero aryl, $C_6$-$C_{30}$ aryl amino and $C_3$-$C_{30}$ hetero aryl amino is independently unsubstituted or further substituted with at least one of $C_6$-$C_{30}$ aryl and $C_3$-$C_{30}$ hetero aryl, wherein each $R_{43}$ is identical to or different from each other when p is an integer of 2 or more and each $R_{44}$ is identical to or different from each other when q is an integer of 2 or more;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Ar_1$ and $Ar_2$ is independently unsubstituted or substituted $C_6$-$C_{30}$ aromatic ring or unsubstituted or substituted $C_3$-$C_{30}$ hetero aromatic ring;

p is an integer of 0 to 4; and q is an integer of 0 to 3,

[Formula 9]

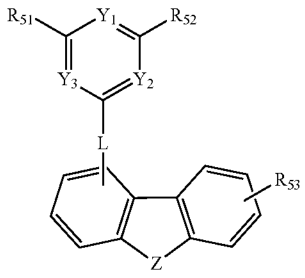

wherein, in Formula 9, each of $R_{51}$ and $R_{52}$ is independently unsubstituted or substituted $C_6$-$C_{30}$ aryl or unsubstituted or substituted $C_3$-$C_{30}$ hetero aryl;

$R_{53}$ is hydrogen or unsubstituted or substituted $C_6$-$C_{30}$ aryl, optionally, the $C_6$-$C_{30}$ aryl forms a spiro structure with an unsubstituted or substituted $C_6$-$C_{30}$ aromatic ring or an unsubstituted or substituted $C_3$-$C_{30}$ hetero aromatic ring;

L is a single bond, unsubstituted or substituted $C_6$-$C_{30}$ arylene or unsubstituted or substituted $C_3$-$C_{30}$ hetero arylene, optionally, each of the $C_6$-$C_{30}$ arylene and the $C_3$-$C_{30}$ hetero arylene independently forms a spiro structure with an unsubstituted or substituted $C_6$-$C_{30}$ aromatic ring or an unsubstituted or substituted $C_3$-$C_{30}$ hetero aromatic ring;

each of $Y_1$, $Y_2$ and $Y_3$ is independently $CR_{54}$ or N, wherein at least one of $Y_1$, $Y_2$ and $Y_3$ is N;

$R_{54}$ is independently hydrogen, unsubstituted or substituted $C_6$-$C_{30}$ aryl or unsubstituted or substituted $C_3$-$C_{30}$ hetero aryl, optionally, each of the $C_6$-$C_{30}$ aryl and the $C_3$-$C_{30}$ hetero aryl independently forms a spiro structure with an unsubstituted or substituted $C_6$-$C_{30}$ aromatic ring or an unsubstituted or substituted $C_3$-$C_{30}$ hetero aromatic ring; and Z is O or S.

15. The organic light emitting diode of claim 14, wherein $L_4$ has the following structure of Formula 4A or Formula 4B:

[Formula 4A]

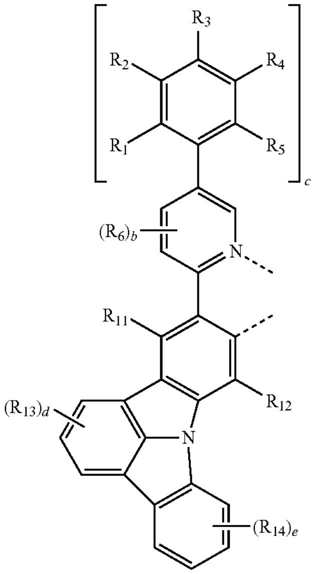

-continued

[Formula 4B]

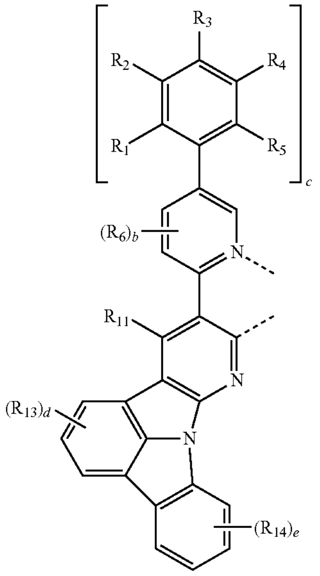

wherein, in Formulae 4A and 4B, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d an integer of 2 or more, and/or two adjacent $R_{14}$ when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is an integer of 0 or 1;

d is an integer of 0 to 3; and e is an integer of 0 to 4.

16. The organic light emitting diode of claim 14, wherein $L_A$ has the following structure of Formula 4C or Formula 4D:

[Formula 4C]

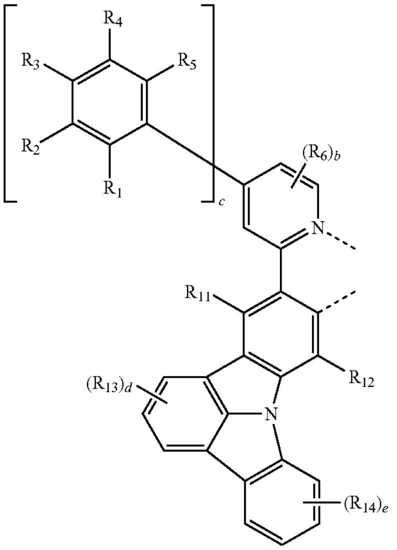

[Formula 4D]

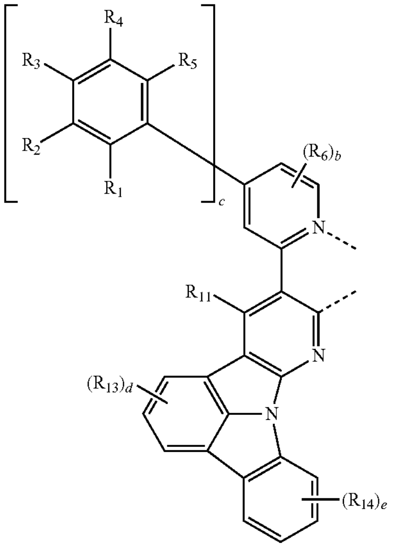

wherein, in Formulae 4C and 4D, each of $R_1$ to $R_6$ and b is a same as defined in Formula 2;

each of $R_{11}$ to $R_{14}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{13}$ when d is an integer of 2 or more, and/or two adjacent $R_{14}$ when e is an integer of 2 or more form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring;

c is an integer of 0 or 1;

d is an integer of 0 to 3; and e is an integer of 0 to 4.

17. The organic light emitting diode of claim 14, wherein $L_B$ has the following structure of Formula 5A or Formula 5B:

[Formula 5A]

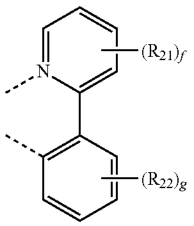

[Formula 5B]

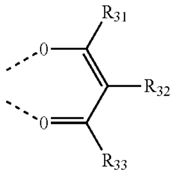

wherein, in Formulae 5A and 5B, each of $R_{21}$, $R_{22}$ and $R_{31}$ to $R_{33}$ is independently protium, deuterium, unsubstituted or substituted $C_1$-$C_{20}$ alkyl, unsubstituted or substituted $C_1$-$C_{20}$ hetero alkyl, unsubstituted or substituted $C_2$-$C_{20}$ alkenyl, unsubstituted or substituted $C_2$-$C_{20}$ hetero alkenyl, unsubstituted or substituted $C_1$-$C_{20}$ alkoxy, a carboxylic group, nitrile, isonitrile, sulfanyl, phosphine, unsubstituted or substituted $C_1$-$C_{20}$ alkyl amino, unsubstituted or substituted $C_1$-$C_{20}$ alkyl silyl, an unsubstituted or substituted $C_4$-$C_{30}$ alicyclic group, an unsubstituted or substituted $C_3$-$C_{30}$ hetero alicyclic group, an unsubstituted or substituted $C_6$-$C_{30}$ aromatic group or an unsubstituted or substituted $C_3$-$C_{30}$ hetero aromatic group;

optionally, two adjacent $R_{21}$ when f is an integer of 2 or more, and/or two adjacent $R_{22}$ when g is an integer of 2, and/or $R_{31}$ and $R_{32}$ or $R_{32}$ and $R_{33}$ form an unsubstituted or substituted $C_4$-$C_{20}$ alicyclic ring, an unsubstituted or substituted $C_3$-$C_{20}$ hetero alicyclic ring, an unsubstituted or substituted $C_6$-$C_{30}$ aromatic ring or an unsubstituted or substituted $C_3$-$C_{30}$ hetero aromatic ring; and each of f and g is an integer of 0 to 4.

18. The organic light emitting diode of claim 14, wherein $X_1$ is $CR_7$, $X_2$ is $CR_7$ or N, each of $X_3$ to $X_5$ is independently $CR_8$ and each of $X_6$ to $X_9$ is independently $CR_9$, each of $R_7$ to $R_9$ is the same as defined in Formula 2.

19. The organic light emitting diode of claim 14, wherein the at least one emitting material layer includes a first layer disposed between the first charge generation layer and the second electrode and a second layer disposed between the first layer and the second electrode, wherein the first layer includes a red emitting material layer, and wherein the second layer includes the host and the dopant.

20. The organic light emitting diode of claim 19, wherein the at least one emitting material layer further includes a third layer disposed between the first layer and the second layer, and wherein the third layer includes a yellow green emitting material layer.

21. The organic light emitting diode of claim 14, wherein the emissive layer further includes a third emitting part disposed between the second emitting part and the second electrode and including a blue emitting material layer, and a second charge generation layer disposed between the second and third emitting parts.

22. The organic light emitting diode of claim 21, wherein the at least one emitting material layer includes a first layer disposed between the first charge generation layer and the second electrode and a second layer disposed between the first layer and the second electrode, wherein the first layer includes a red emitting material layer, and wherein the second layer includes the host and the dopant.

23. The organic light emitting diode of claim 22, wherein the at least one emitting material layer further includes a third layer disposed between the first layer and the second layer, and wherein the third layer includes a yellow green emitting material layer.

24. An organic light emitting device, including:

a substrate; and the organic light emitting diode of claim 1 disposed over the substrate.

25. An organic light emitting device, including:

a substrate; and the organic light emitting diode of claim 14 disposed over the substrate.

* * * * *